(12) United States Patent
Nishimura et al.

(10) Patent No.: US 8,207,526 B2
(45) Date of Patent: Jun. 26, 2012

(54) ORGANIC EL DEVICE

(75) Inventors: Kazuki Nishimura, Sodegaura (JP); Toshihiro Iwakuma, Sodegaura (JP); Kenichi Fukuoka, Sodegaura (JP); Yukitoshi Jinde, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 317 days.

(21) Appl. No.: 12/532,369

(22) PCT Filed: Mar. 24, 2008

(86) PCT No.: PCT/JP2008/055383
§ 371 (c)(1),
(2), (4) Date: Sep. 21, 2009

(87) PCT Pub. No.: WO2008/123178
PCT Pub. Date: Oct. 16, 2008

(65) Prior Publication Data
US 2010/0044689 A1      Feb. 25, 2010

(30) Foreign Application Priority Data
Mar. 23, 2007   (JP) ................................. 2007-077611

(51) Int. Cl.
*H01L 51/54*   (2006.01)
(52) U.S. Cl. ................... 257/40; 257/E51.026; 313/504
(58) Field of Classification Search .................. 313/504; 257/40, E51.001–E51.052; 438/99
See application file for complete search history.

(56) References Cited

U.S. PATENT DOCUMENTS

| 7,037,601 B2 | 5/2006 | Hatwar |
| 7,193,361 B2 | 3/2007 | Kinoshita et al. |
| 7,233,105 B2 | 6/2007 | Itai et al. |

(Continued)

FOREIGN PATENT DOCUMENTS
EP   1 753 268 A1   2/2007
(Continued)

OTHER PUBLICATIONS

Communication (Supplementary EP Search Report) in EP Appln No. 08 72 2699.9 dated May 19, 2011.

(Continued)

*Primary Examiner* — Matthew W Such
(74) *Attorney, Agent, or Firm* — Foley & Lardner LLP

(57) ABSTRACT

A phosphorescent-emitting layer contains a phosphorescent host and a phosphorescent dopant for providing phosphorescence, and a fluorescent-emitting layer contains a fluorescent host and a fluorescent dopant for providing fluorescence. A charge blocking layer blocks electrons injected into the fluorescent host of the fluorescent-emitting layer from being injected toward the charge blocking layer from the fluorescent-emitting layer, and also injects holes into the fluorescent-emitting layer from the phosphorescent-emitting layer. A triplet energy gap $Eg_{PD}$ of the phosphorescent dopant of the phosphorescent-emitting layer, a triplet energy gap $Eg_{EB}$ of the charge blocking layer and a triplet energy gap $Eg_{FH}$ of the fluorescent host of the fluorescent-emitting layer satisfy the following formula (1).

$$Eg_{PD} < Eg_{EB} \leq Eg_{FH} \qquad (1)$$

24 Claims, 6 Drawing Sheets

U.S. PATENT DOCUMENTS

| | | |
|---|---|---|
| 7,422,800 B2 | 9/2008 | Mishima et al. |
| 7,466,073 B2 | 12/2008 | Kishino et al. |
| 7,504,657 B2 | 3/2009 | Suzuri et al. |
| 7,504,771 B2 | 3/2009 | Yamazaki et al. |
| 7,576,486 B2 | 8/2009 | Iwakuma et al. |
| 2002/0182441 A1 | 12/2002 | Lamansky et al. |
| 2002/0197511 A1 | 12/2002 | D'Andrade et al. |
| 2005/0206302 A1 | 9/2005 | Noguchi et al. |
| 2006/0024526 A1* | 2/2006 | Thompson et al. ........... 428/690 |
| 2006/0110622 A1 | 5/2006 | Uchida et al. |
| 2006/0175958 A1* | 8/2006 | Gerhard et al. ............... 313/504 |
| 2006/0279203 A1* | 12/2006 | Forrest et al. ................. 313/504 |
| 2008/0246391 A1 | 10/2008 | Iwakuma et al. |
| 2008/0258606 A1 | 10/2008 | Butler et al. |
| 2008/0303415 A1* | 12/2008 | Suzuri et al. .................. 313/504 |

FOREIGN PATENT DOCUMENTS

| | | |
|---|---|---|
| JP | 2004-273128 A | 9/2004 |
| JP | 2004-281087 A | 10/2004 |
| JP | 2005-276583 A | 10/2005 |
| JP | 2005-294250 A | 10/2005 |
| JP | 2006-049570 A | 2/2006 |
| JP | 2006-128632 A | 5/2006 |
| JP | 2006-352106 A | 12/2006 |
| WO | 2004/060026 A1 | 7/2004 |
| WO | 2004/060027 A1 | 7/2004 |
| WO | 2004/060028 A1 | 7/2004 |
| WO | 2005/099313 A1 | 10/2005 |
| WO | 2006/009024 A1 | 1/2006 |
| WO | 2006/013738 A1 | 2/2006 |
| WO | WO 2006013738 A1 * | 2/2006 |
| WO | WO-2006/033492 A1 | 3/2006 |
| WO | 2006/038020 A1 | 4/2006 |
| WO | WO-2006/130883 A2 | 12/2006 |

OTHER PUBLICATIONS

Yiru Sun et al, "Management of singlet and triplet excitons for efficient white organic light-emitting devices", Nature, vol. 440, Apr. 13, 2006, p. 908-912.

Communication (Supplementary EP Search Report) in EP Appln No. 08 72 2699 dated May 19, 2011.

* cited by examiner

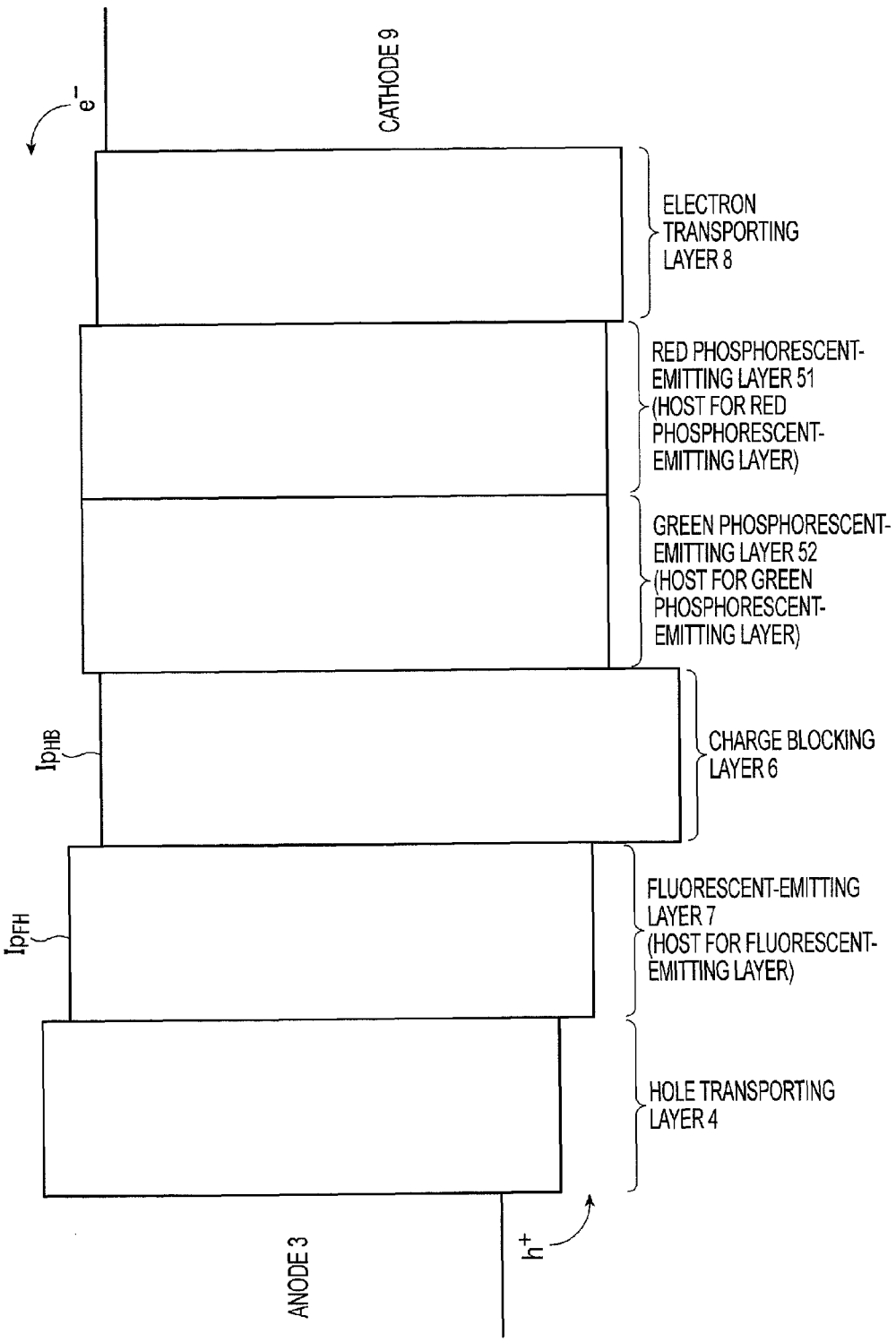

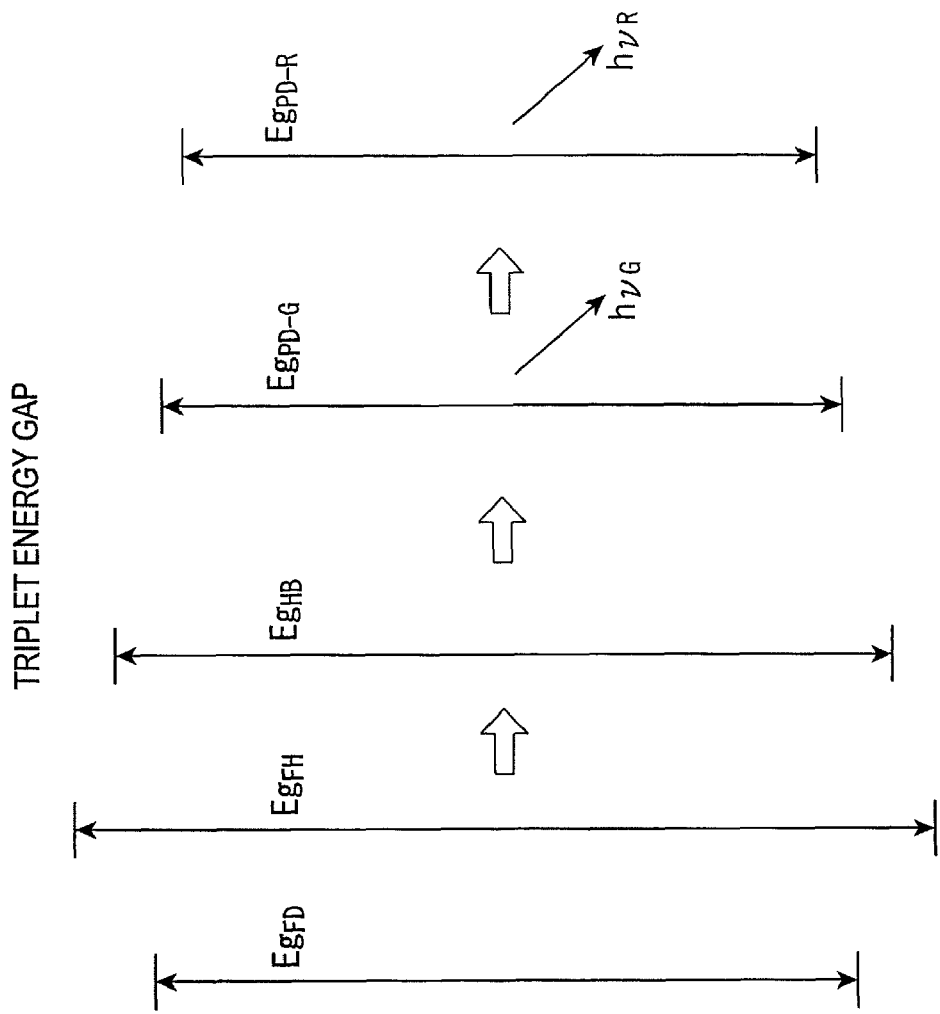

US 8,207,526 B2

ORGANIC EL DEVICE

CROSS-REFERENCE TO PRIOR APPLICATION

This is the U.S. National Phase Application under 35 U.S.C. §371 of International Patent Application No. PCT/JP2008/055383 filed Mar. 24, 2008, which claims the benefit of Japanese Patent Application No. 2007-077611 filed Mar. 23, 2007, both of which are incorporated by reference herein. The International Application was published in Japanese on Oct. 16, 2008 as WO/2008/123178 A1 under PCT Article 21(2).

TECHNICAL FIELD

The present invention relates to an organic EL device. In particular, the invention relates to an organic EL device including a plurality of emitting layers each of which emits different color light and from which mixed-color emission is obtainable.

BACKGROUND ART

To date, organic EL (electro-luminescence) devices including a plurality of emitting layers each of which emits light of a different wavelength are known. Such organic EL devices are also known to provide light of mixed color in which the light emitted by the emitting layers are mixed together. An example of such organic EL devices includes a red emitting layer, green emitting layer and blue emitting layer, and provides white-color light in which the light emitted by the emitting layers are mixed together.

Excited state of organic compounds encompasses excited singlet state and excited triplet state. Emission obtained from excited singlet state is called fluorescence while emission obtained from excited triplet state is called phosphorescence. Excited singlet state and excited triplet state typically occur in a ratio of 1:3.

In typical organic EL devices, fluorescent materials for mainly emitting fluorescence have been used. According to organic EL devices that use such fluorescence emission, excited singlet, which occupies 25% of the excitation generated in emitting layers, only contributes to the emission, so that excited triplet occupying the remaining 75% is deactivated without emitting.

In order to enhance luminous efficiency of organic EL devices, developments are being made on phosphorescent materials for emitting phosphorescence, i.e., emission from excited triplet (e.g., patent document 1). Reports have been made on, for instance, red-emitting phosphorescent materials and green-emitting phosphorescent material. It should be noted that no practically-applicable blue-emitting phosphorescent material has been obtained.

With application of the above phosphorescent materials, organic EL devices for mixed-color emission are capable of enhancing luminous efficiency.

For instance, a known organic EL device provides white-color emission with use of blue-emitting fluorescent materials and red-to-green-emitting phosphorescent materials. According to such a device, enhancement of quantum efficiency in emission of red to green color contributes to enhancement of luminous efficiency of the entire organic EL device.

In such an organic EL device for mixed-color emission, however, while emission is obtained from excited triplet in the red to green emitting layers, excited triplet in the blue emitting layer is deactivated without contributing to emission due to small energy gap.

Accordingly, proposals have been made on an organic EL device in which excited triplet in the blue emitting layer is diffused in the red and green emitting layers so that red and green phosphorescence is obtained therefrom (e.g., patent documents 2 and 3 and non-patent document 1). According to such an organic EL device, the energy of excited triplet in the blue emitting layer, which has been typically to be deactivated without contributing to emission, can be utilized for obtaining red and green phosphorescence. Thus, luminous efficiency of the entire organic EL device can be enhanced.

The organic EL device disclosed in the non-patent document 1 includes a blue fluorescent-emitting layer, blocking layer, red phosphorescent-emitting layer, green phosphorescent-emitting layer, blocking layer and blue fluorescent-emitting layer in this order. According to the document, blue fluorescence is obtained from the excited singlet in the blue fluorescent-emitting layers, and the excited triplet in the blue fluorescent-emitting layers is diffused in the red and green phosphorescent-emitting layers via the blocking layers. Then, excited triplet in the red and green phosphorescent-emitting layers is generated, from which red and green phosphorescence is obtained. According to the report, the blue fluorescence and the red and green phosphorescence are mixed together, thereby providing white-color emission as a whole.

In the organic EL device disclosed in the non-patent document 1, however, holes and electrons are injected into not only the blue fluorescent-emitting layers but also red and green phosphorescent-emitting layers, thereby generating exciton. In this organic EL device, generation of sufficient exciton in the blue fluorescent-emitting layer is prevented, so that the blue emission intensity is reduced. Thus, the organic EL device may not be able to produce white-color emission as the whole.

According to a known exemplary organic EL device, a charge blocking layer having a smaller affinity level than a first emitting layer for blue emission is provided between the first emitting layer and a second emitting layer for another color emission. According to the proposal, the charge blocking layer can facilitate the retention of electrons in the first emitting layer, thereby increasing the probability of the exciton generation in the first emitting layer and raising the intensity of the blue emission (e.g., patent document 4).

The above organic EL device, however, concentrates the charges in the first emitting layer (i.e., the layer of which blue-color emission is weak in terms of intensity) for the sake of balancing the blue-color emission with the red-color emission, so that the charge blocking layer is defined only in terms of affinity level.

Thus, even if a phosphorescent material is used in the second emitting layer, the above device configuration is not adoptable in a device configured to obtain the phosphorescence of the second emitting layer from triplet energy transferred from the first emitting layer.

According to the organic EL devices disclosed in the patent documents 2 and 3, fluorescent host contained in the fluorescent emitting layer exhibits a small triplet energy gap, and the triplet energy is not transferred to the green phosphorescent material. Thus, green phosphorescence is not obtainable.

Further, a patent document 5 discloses in FIG. 6 an organic EL device for emitting white light with use of triplet energy transfer. However, α-NPD (4,4'-bis[N-(1-naphthyl)-N-phenyl-amino]-biphenyl) used in the device exhibits a smaller triplet energy gap than a green phosphorescent material (e.g., Ir(ppy)$_3$(fac-tris(2-phenylpyridine) iridium)). Thus, green phosphorescence is not obtainable.

Patent Document 1: US2002/182441
Patent Document 2: WO2006/038020
Patent Document 3: WO2004/060026
Patent Document 4: WO2005/099313
Patent Document 5: US2002/197511
Non-Patent Document 1: nature vol 440 p. 908

DISCLOSURE OF THE INVENTION

Problems to be Solved by the Invention

As described above, organic EL devices capable of mixed-color emission at high luminous efficiency are not obtainable simply by layering blue fluorescent-emitting layers and red and green phosphorescent-emitting layers. Accordingly, organic EL devices capable of mixed-color emission at high luminous efficiency have been yet to be realized, so that developments of such devices have been demanded.

An object of the invention is to provide an organic EL device capable of mixed-color emission at high luminous efficiency for solution of the above problems.

Means for Solving the Problems

An organic EL device according to an aspect of the invention includes: an anode for injecting holes; a phosphorescent-emitting layer; a charge blocking layer; a fluorescent-emitting layer; and a cathode for injecting electrons, in this order, the phosphorescent-emitting layer containing a phosphorescent host and a phosphorescent dopant for providing phosphorescence, the fluorescent-emitting layer containing a fluorescent host and a fluorescent dopant for providing fluorescence, the charge blocking layer blocking the electrons injected into the fluorescent-emitting layer from being injected toward the charge blocking layer from the fluorescent-emitting layer, the charge blocking layer also injecting the holes into the fluorescent-emitting layer from the phosphorescent-emitting layer, a triplet energy gap Eg$_{PD}$ of the phosphorescent dopant, a triplet energy gap Eg$_{EB}$ of the charge blocking layer and a triplet energy gap Eg$_{FH}$ of the fluorescent host satisfying a formula (1) as follows, $$Eg_{PD} < Eg_{EB} \leq Eg_{FH} \qquad (1).$$

According to the above arrangement, electrons injected into the fluorescent-emitting layer from the cathode are trapped within the fluorescent-emitting layer by the charge blocking layer.

Holes injected from the anode are injected into the fluorescent-emitting layer via the phosphorescent-emitting layer and the charge blocking layer.

Then, the electrons and the holes are recombined in the fluorescent host in the fluorescent-emitting layer, so that excited singlet and excited triplet are generated.

Excited singlet energy of the fluorescent host is transferred to the fluorescent dopant, and the transferred energy is emitted as light (fluorescence).

Since the excited singlet has a shorter lifetime, it is less likely that the excited singlet energy is transferred to the phosphorescent-emitting layer through the charge blocking layer. Thus, the excited singlet energy of the fluorescent host can be efficiently transferred to the fluorescent dopant and emitted as fluorescence.

The excited triplet energy generated in the fluorescent host is transferred to the phosphorescent-emitting layer through the charge blocking layer.

This is because the excited triplet is of longer life and capable of being transferred to the charge blocking layer to the phosphorescent-emitting layer over a long distance, and also because the triplet energy gap Eg$_{PD}$ of the phosphorescent dopant of the phosphorescent-emitting layer, the triplet energy gap Eg$_{EB}$ of the charge blocking layer and the triplet energy gap Eg$_{FH}$ of the fluorescent host of the fluorescent-emitting layer satisfy the above formula (1).

In other words, because Eg$_{EB}$ is equal to or smaller than Eg$_{FH}$, the excited triplet energy is transferable from the fluorescent host to the charge blocking layer. In addition, because Eg$_{PD}$ is smaller than Eg$_{EB}$, the excited triplet energy is transferable from the charge blocking layer to the phosphorescent dopant.

By the above-described transfer of the excited triplet energy of the fluorescent host, the excited triplet of the phosphorescent dopant is generated, from which the phosphorescence is obtainable.

Accordingly, with use of the fluorescence and the phosphorescence, the generated energy can be converted into the emission at the maximum efficiency, thereby considerably enhancing the luminous efficiency.

Also in the prior art, it has been known to enhance the luminous efficiency of devices with use of fluorescence and phosphorescence.

According to an exemplary arrangement, fluorescent blue emitting layers and phosphorescent red emitting layers are layered, so that blue emission is provided by fluorescence and red emission is provided by phosphorescence. However, while there are a variety of host materials for fluorescent-emitting layer that have been typically used for a reason of their long lifetime (e.g., anthracene host material), such materials typically exhibit a wide singlet energy gap but a narrow triplet energy gap.

Therefore, simply applying the typically-used host of fluorescent-emitting layer to the invention cannot satisfy the relationship represented by the above formula (1), nor provide an advantage of the invention that the triplet energy of the fluorescent-emitting layer is diffused to be used in emission of the phosphorescent dopant.

Unlike conventional ideas, the aspect of the invention adopts a material exhibiting a wide triplet energy gap as the host of the fluorescent-emitting layer, and realizes considerably highly-efficient emission with use of fluorescence and phosphorescence.

The triplet energy gap of the fluorescent host is preferably greater than 2.55 eV, more preferably 2.6 eV or more, further more preferably 2.7 eV or more.

When the triplet energy gap Eg$_{FH}$ of the fluorescent host is wide, a range of material choices for the charge blocking layer that satisfies the above formula (1) can be expanded.

According to another known device, a singlet blocking layer for blocking the transfer of excited singlet energy is exemplarily provided between a phosphorescent-emitting layer and a fluorescent-emitting layer, so that mixed-color emission can be obtained at high efficiency by transferring only excited triplet energy of the fluorescent-emitting layer to the phosphorescent-emitting layer (e.g., the patent document 2).

However, simply providing the singlet blocking layer exhibiting a wide singlet energy gap does not lead to efficient transferring of the excited triplet energy from the fluorescent-emitting layer to the phosphorescent-emitting layer. Consequently, the luminous efficiency is not improved.

According to the aspect of the invention, the layers that satisfy the relationship represented by the formula (1) are layered in order to efficiently transfer the excited triplet energy generated in the fluorescent host to the phosphorescent-emitting layer.

In addition, since such a singlet blocking layer does not serve as a charge blocking layer unlike the invention, the singlet blocking layer does not lead to efficient generation of exciton in the fluorescent-emitting layer or to enhancement of luminous efficiency.

Triplet energy gap Eg of each material may be exemplarily defined based on the phosphorescence spectrum. For instance, in the invention, the triplet energy gap Eg may be defined as follows.

Specifically, each material is dissolved in an EPA solvent (diethylether:isopentane:ethanol=5:5:2 in volume ratio) at a concentration of 10 μmol/L, thereby forming a sample for phosphorescence measurement.

Then, the sample for phosphorescence measurement is put into a quartz cell, cooled to 77K and irradiated with exciting light, so that phosphorescence radiated therefrom is measured in terms of its wavelength.

A tangent line is drawn to be tangent to a rising section adjacent to short-wavelength of the obtained phosphorescence spectrum, a wavelength value thereof is converted into energy value, and the converted energy value is defined as the triplet energy gap Eg.

For the measurement, a commercially-available measuring machine F-4500 (manufactured by Hitachi) is usable.

However, the triplet energy gap does not need to be defined by the above method, but may be defined by any other suitable method as long as such a method is compatible with the invention.

Preferably in the aspect of the invention, the charge blocking layer exhibits a smaller affinity level than the fluorescent host, and an affinity level $Af_{EB}$ of the charge blocking layer and an affinity level $Af_{FH}$ of the fluorescent host satisfy a formula (2) as follows, $$Af_{EB} < Af_{FH} - 0.1 \text{ eV} \tag{2}$$

According to the above arrangement, as in the relationship represented by the formula (2), the affinity level $Af_{EB}$ of the charge blocking layer is smaller than the affinity level $Af_{FH}$ of the fluorescent host.

With this arrangement, the electrons become less injectable from the fluorescent host into the charge blocking layer, and trapped in the fluorescent-emitting layer.

Consequently, exciton can be efficiently generated in the fluorescent-emitting layer, thereby enhancing the luminous efficiency.

Herein, the affinity level Af (electron affinity) means energy emitted or absorbed when an electron is fed to a molecule of a material. The affinity level is defined as "positive" when energy is emitted while being defined as "negative" when energy is absorbed.

The affinity level Af is defined as follows, with use of ionization potential Ip and optical energy gap Eg'.

$$Af = Ip - Eg'$$

The ionization potential Ip means energy required for ionizing the compound of each material by removing the electron therefrom. For instance, values measured by a ultraviolet photoelectron spectrometry machine (AC-3, manufactured by Riken Keiki Co., Ltd.) are usable.

The optical energy gap Eg' is a difference between a conduction level and a valence level. For instance, the optical energy gap is exemplarily obtainable by converting into energy a wavelength value at an intersection of a long-wavelength-side tangent line in an absorbing spectrum of a toluene-diluted solution of each material and a base line in the absorbing spectrum (zero absorption).

However, the ionization potential and the optical energy gap do not need to be defined by the above method, but may be defined by any other suitable method as long as such a method is compatible with the invention.

As one example, it has been known to provide between a first emitting layer for blue emission and a second emitting layer for another color emission a charge blocking layer having a smaller affinity level than the first emitting layer. According to the known arrangement, the charge blocking layer can facilitate the retention of electrons in the first emitting layer, thereby increasing the probability of the exciton generation in the first emitting layer and raising the intensity of the blue emission (e.g., patent document 4).

However, known techniques concentrate the charges in the first emitting layer (i.e., the layer of which blue-color emission is weak in terms of intensity) for the sake of balancing the blue-color emission with the red-color emission, so that the charge blocking layer is defined only in terms of affinity level.

Thus, even if a phosphorescent material is used in the second emitting layer, the above device configuration is not adoptable in a device configured to obtain the phosphorescent emission of the second emitting layer from triplet energy transferred from the first emitting layer.

According to the aspect of the invention, not only the affinity levels satisfy the formula (2), but also the fluorescent-emitting layer, the phosphorescent-emitting layer and the charge blocking layer satisfy the formula (1).

As a result, not only exciton can be efficiently generated in the fluorescent-emitting layer with the charges being concentrated, but also the triplet energy can be transferred from the fluorescent-emitting layer to the phosphorescent-emitting layer, thereby considerably enhancing the luminous efficiency.

In order to secure the injection of the holes into the fluorescent-emitting layer, the charge blocking layer is preferably a hole transporting material.

As the charge blocking layer, hole transporting materials such as a monoamine compound, diamine compound, triamine compound and tetramine compound are usable. For instance, a compound represented by the following formula is exemplified.

[Chemical Formula 1]

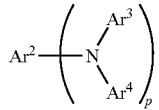

$Ar^2$ to $Ar^4$ each represent a substituted or unsubstituted aryl group or heteroaryl group having 5 to 50 atoms for forming the ring. P is an integer of 1 to 4. When P is 2 or less, $Ar^3$ and $Ar^4$ may be mutually the same or different.

$Ar^3$ and $Ar^4$ may be bonded together.

Examples of the aryl group or heteroaryl group having 5 to 50 ring-forming atoms are phenyl, naphthyl, anthracenyl, phenanthryl, pyrenyl, chrysenyl, coronyl, biphenyl, terphenyl, pyrrolyl, furanyl, thiophenyl, benzothiophenyl, oxadiazolyl, diphenylanthracenyl, indolyl, carbazolyl, pyridyl, benzoquinolyl, fluorenyl, fluoranthenyl, acenaphthofluoranthenyl and stilbene. As a matter of course, the charge blocking layer is not limited to amine compounds.

Preferably in the aspect of the invention, the holes injected into the fluorescent-emitting layer from the phosphorescent-emitting layer via the charge blocking layer are injected into HOMO of the fluorescent host.

According to the arrangement, the holes in the phosphorescent-emitting layer are injected into HOMO (highest occupied molecular orbital) of the fluorescent-emitting layer via the charge blocking layer.

Then, exciton is generated in the fluorescent host.

In an exemplary configuration where the charges (holes) are injected not into host of the fluorescent-emitting layer but into fluorescent dopant (e.g., configuration in the patent document 3), it is not possible to select a material for transferring energy to the phosphorescent-emitting layer because the fluorescent dopant typically exhibits a small triplet energy gap.

Even if a material exhibiting a sufficient triplet energy gap is used as the fluorescent dopant, such a material cannot generate energy enough for obtaining sufficient phosphorescence because the concentration of the fluorescent dopant is low.

According to the aspect of the invention, sufficient energy generation can be secured by exciting the fluorescent host, and realizability of material selection can also be secured.

Preferably in the aspect of the invention, a hole mobility of the phosphorescent host is $1.0 \times 10^{-5}$ cm$^2$/Vs or more in an electric field of $1.0 \times 10^4$ to $1.0 \times 10^6$ V/cm.

According to the arrangement, the use of the phosphorescent host exhibiting a high hole mobility can enhance the transferability of the holes, so that the holes can be injected into the fluorescent-emitting layer via the charge blocking layer.

While the exciton generation in the host of the fluorescent-emitting layer is important in the aspect of the invention, the holes are required to pass through the phosphorescent-emitting layer and the charge blocking layer to be transferred to the fluorescent-emitting layer because these layers are provided between the anode and the fluorescent-emitting layer.

According to the aspect of the invention, by enhancing the hole mobility of the phosphorescent host, the holes can be transferred to the fluorescent-emitting layer even when the charge blocking layer is provided to the fluorescent-emitting layer adjacently to the anode.

With this arrangement, while the electrons are blocked in the fluorescent-emitting layer by the charge blocking layer, the holes are injected into the fluorescent-emitting layer owing to the high transporting capabilities. Thus, probability of the exciton generation in the fluorescent-emitting layer (host thereof) can be increased, and the luminous efficiency can be enhanced.

With the need to promote the recombination of the charges in the emitting layer, it has been difficult to optimize the host of the emitting layer which exhibits a great charge mobility due to the difficulty in balancing the carriers. In contrast, the aspect of the invention is to obtain the emission with use of the energy diffused from the fluorescent-emitting layer, instead of obtaining the emission with use of the recombination of the charges in the phosphorescent-emitting layer. Accordingly, it is preferable to increase the hole mobility of the host in the phosphorescent-emitting layer, i.e., an emitting layer that is different from a conventional emitting layer. With this arrangement, the recombination of the charges in the fluorescent-emitting layer can be promoted, thereby enhancing the luminous efficiency as a whole.

The phosphorescent host preferably exhibits a greater hole mobility. For instance, hole mobility of $1.0 \times 10^{-4}$ cm$^2$/Vs or more is preferable, and hole mobility of $1.0 \times 10^{-3}$ cm$^2$/Vs or more is more preferable.

Alternatively, a hole transporting material may be used as the phosphorescent host, and the hole mobility may be greater than the electron mobility.

As a matter of course, the phosphorescent host is required to exhibit a greater energy gap than the phosphorescent dopant.

Further, in order to inject the holes into the fluorescent-emitting layer via the charge blocking layer, the charge blocking layer preferably exhibits a great hole mobility. Also, in order to prevent the retention of the holes injected into the charge blocking layer from the phosphorescent-emitting layer in the charge blocking layer, the ratio of the hole mobility $\mu_{EB}$ of the charge blocking layer to the hole mobility $\mu_{PH}$ of the phosphorescent host is preferably a predetermined ratio or more.

The hole mobility of the charge blocking layer is exemplarily $1.0 \times 10^{-5}$ cm$^2$/Vs or more, $1.0 \times 10^{-4}$ cm$^2$/Vs or more or $1.0 \times 10^{-3}$ cm$^2$/Vs or more in the electric field of $1.0 \times 10^4$ to $1.0 \times 10^6$ V/cm.

The hole mobility $\mu_{EB}$ of the charge blocking layer and the hole mobility $\mu_{PH}$ of the phosphorescent host exemplarily satisfy a relationship of $\mu_{EB}/\mu_{PH} \geq 0.1$, $\mu_{EB}/\mu_{PH} \geq 0.7$ or $\mu_{EB}/\mu_{PH} \geq 1$.

While the upper limit value is not specifically restricted, an exemplary upper limit value is approximately $10^3$ (i.e., $\mu_{EB}/\mu_{PH} < 10^3$).

When a hole transporting layer is provided between the anode and the phosphorescent-emitting layer, the hole mobility of the hole transporting layer is preferably $1.0 \times 10^{-5}$ cm$^2$/Vs or more in the electric field of $1.0 \times 10^4$ to $1.0 \times 10^6$ V/cm.

By providing the hole transporting layer exhibiting a high hole mobility as described above, the transporting capabilities of the holes can be enhanced, so that the holes can be injected into the fluorescent-emitting layer.

While the exciton generation in the host of the fluorescent-emitting layer is important in the aspect of the invention, the holes are required to pass through the phosphorescent-emitting layer and the charge blocking layer to be transferred to the fluorescent-emitting layer because these layers are provided between the anode and the fluorescent-emitting layer.

In this respect, by providing the hole transporting layer exhibiting a high hole mobility, the holes can be transferred to the fluorescent-emitting layer even when the charge blocking layer is provided to the fluorescent-emitting layer adjacently to the anode.

With this arrangement, while the electrons are blocked in the fluorescent-emitting layer by the charge blocking layer, the holes are injected into the fluorescent-emitting layer owing to the high transporting capabilities. Thus, probability of the exciton generation in the fluorescent-emitting layer (host thereof) can be increased, and the luminous efficiency can be enhanced.

The hole transporting layer preferably exhibits a greater hole mobility. For instance, hole mobility of $1.0 \times 10^{-4}$ cm$^2$/Vs or more is preferable, and hole mobility of $1.0 \times 10^{-3}$ cm$^2$/Vs or more is more preferable.

The organic EL device according to the aspect of the invention preferably further includes a hole transporting layer provided between the anode and the phosphorescent-emitting layer, in which ionization potential of the hole transporting layer is greater than ionization potential of the phosphorescent dopant.

According to the arrangement, the hole transporting layer for assisting the hole injection from the anode is provided between the anode and the phosphorescent-emitting layer. Thus, a hole-injection barrier can be reduced and the driving voltage can be lowered.

However, while the holes are not to be injected into the phosphorescent dopant but to be injected into the phosphorescent host in the phosphorescent-emitting layer, the holes may be possibly injected into the phosphorescent dopant from the hole transporting layer, a consequence of which is that the charges (holes) are directly consumed in the recombination at the phosphorescent dopant and not to be transferred to the fluorescent-emitting layer.

In particular, in order to reduce the hole injection barrier, the work function of the anode and the ionization potential Ip of the hole transporting layer are typically set to be approximated. Thus, it is often the case to provide a hole transporting layer of which Ip is smaller than Ip of the phosphorescent dopant. As a result of providing such a hole transporting layer, many of the holes may be directly consumed in the phosphorescent dopant, and the luminous efficiency may be reduced.

In this respect, according to the aspect of the invention, Ip of the hole transporting layer is set to be greater than Ip of the phosphorescent dopant, so that the consumption of the charges by the phosphorescent dopant can be prevented. Thus, the probability of the exciton generation in the phosphorescent-emitting layer can be increased, and the luminous efficiency can be enhanced as a whole.

Preferably in the aspect of the invention, ionization potential $Ip_{PH}$ of the phosphorescent host of the phosphorescent-emitting layer, ionization potential $Ip_{PD}$ of the phosphorescent dopant of the phosphorescent-emitting layer and ionization potential $Ip_{HT}$ of the hole transporting layer satisfy a formula (3) as follows, $$(Ip_{PH}+Ip_{PD})/2<Ip_{HT} \quad (3).$$

When the relationship represented by the formula (3) is satisfied, the ionization potential $Ip_{HT}$ of the hole injecting layer is more approximate to Ip of the phosphorescent host than the intermediate level $((Ip_{PH}+Ip_{PD})/2)$ between Ip of the phosphorescent dopant and Ip of the phosphorescent host.

Thus, the holes injected into the phosphorescent-emitting layer from the hole transporting layer becomes more easily injectable in the phosphorescent host than in the phosphorescent dopant.

The consumption of the charges by the phosphorescent dopant can be consequently prevented. Accordingly, the probability of the exciton generation in the fluorescent-emitting layer can be increased, and the luminous efficiency can be enhanced as a whole.

The upper limit value to Ip of the hole transporting layer is exemplarily about Ip of the phosphorescent host.

Further, in order to reduce the direct consumption of the charges in the phosphorescent-emitting layer, the concentration of the phosphorescent dopant is preferably reduced exemplarily down to less than 4 mass %.

For instance, when two or more phosphorescent-emitting layers are provided, the concentration of the phosphorescent dopant in a phosphorescent-emitting layer located closer to the anode is preferably set to be less than 4 mass %.

The phosphorescent dopant is typically used at a high concentration (e.g., approximately 8 mass %). However, the more the charges are directly recombined with the phosphorescent dopant (i.e., the more the charges are consumed by the phosphorescent dopant), the less the probability of the recombination in the fluorescent-emitting layer (i.e., the primary recombination region) accordingly becomes, which is detrimental to the enhancement of the luminous efficiency.

In this respect, according to the aspect of the invention, by reducing the doping concentration of the phosphorescent dopant, the exciton can be efficiently generated in the fluorescent-emitting layer, and the triplet energy can also be transferred from the fluorescent-emitting layer to the phosphorescent-emitting layer. Thus, the luminous efficiency can be considerably enhanced.

Preferably in the aspect of the invention, the fluorescent-emitting layer is a blue emitting layer, the phosphorescent-emitting layer includes: a red phosphorescent-emitting layer for providing red emission; and a green phosphorescent-emitting layer for providing green emission, and the red phosphorescent-emitting layer is closer to the anode than the green phosphorescent-emitting layer.

According to this arrangement, it is possible to obtain white-color light in which the blue light of the fluorescent-emitting layer and red light and green light of the phosphorescent-emitting layers are mixed together at high luminous efficiency.

Specifically, the excited singlet of the fluorescent-emitting layer provides blue emission, and the excited triplet energy of the fluorescent host is transferred to the green phosphorescent dopant. Excited triplet energy of the green phosphorescent dopant generated therefrom is partially emitted as green phosphorescence. The remainder of the excited triplet energy of the green phosphorescent dopant is transferred to the red phosphorescent dopant, so that excited triplet of the red phosphorescent dopant generated therefrom is emitted as red phosphorescence. These emissions are mixed together to provide white-color light.

Exemplarily herein, the blue emission means light having a wavelength of 430 to 500 nm, the red emission means light having a wavelength of 550 to 650 and the green emission means light having 500 to 550 nm. Phosphorescent materials for providing emissions having wavelengths of 550 to 650 nm and 500 to 550 nm (i.e., red emission and green emission) are typically known. Thus, without use of specific materials, organic EL device for providing mixed-color emission at high luminous efficiency can be provided.

An organic EL device according to another aspect of the invention includes: an anode for injecting holes; a fluorescent-emitting layer; a charge blocking layer; a phosphorescent-emitting layer; and a cathode for injecting electrons, in this order, the phosphorescent-emitting layer containing a phosphorescent host and a phosphorescent dopant for providing phosphorescence, the fluorescent-emitting layer containing a fluorescent host and a fluorescent dopant for providing fluorescence, the charge blocking layer blocking the holes injected into the fluorescent-emitting layer from being injected toward the charge blocking layer from the fluorescent-emitting layer, the charge blocking layer also injecting the electrons into the fluorescent-emitting layer from the phosphorescent-emitting layer, a triplet energy gap $Eg_{PD}$ of the phosphorescent dopant, a triplet energy gap $Eg_{HB}$ of the charge blocking layer and a triplet energy gap $Eg_{FH}$ of the fluorescent host satisfying a formula (4) as follows, $$Eg_{PD}<Eg_{HB}\leq Eg_{FH} \quad (4).$$

The organic EL device according to this aspect of the invention is different from the above-described organic EL device in that: the fluorescent-emitting layer is provided adjacent to the anode; the phosphorescent-emitting layer is provided adjacent to the cathode; and the charge blocking layer blocks the transfer of the holes. However, the principle is the same as the above-described aspect of the invention.

Specifically, in the organic EL device according to this aspect of the invention, the holes injected into the fluorescent-emitting layer from the anode are trapped in the fluorescent-emitting layer by the charge blocking layer. The electrons injected from the cathode are injected into the fluorescent-emitting layer via the phosphorescent-emitting layer and the charge blocking layer.

Then, the electrons and the holes are recombined in the fluorescent host in the fluorescent-emitting layer, so that excited singlet and excited triplet are generated.

Excited singlet energy of the fluorescent host is transferred to the fluorescent dopant, and the transferred energy is emitted as light (fluorescence).

The excited triplet energy generated in the fluorescent host is transferred to the phosphorescent-emitting layer through the charge blocking layer.

This is because the triplet energy gap $Eg_{PD}$ of the phosphorescent dopant in the phosphorescent-emitting layer, the triplet energy gap $Eg_{HB}$ of the charge blocking layer and the triplet energy gap $Eg_{FH}$ of the fluorescent host of the fluorescent-emitting layer satisfy the above formula (4).

By the above-described transfer of the excited triplet energy of the fluorescent host, the excited triplet of the phosphorescent dopant is generated, from which the phosphorescence is obtainable.

Accordingly, with use of the fluorescence and the phosphorescence, the generated energy can be converted into the emission at the maximum efficiency, thereby considerably enhancing the luminous efficiency.

Preferably in the aspect of the invention, the charge blocking layer exhibits a smaller ionization potential than the fluorescent host, and ionization potential $Ip_{HB}$ of the charge blocking layer and ionization potential $Ip_{FH}$ of the fluorescent host satisfy a formula (5) as follows, $$Ip_{HB} > Ip_{FH} - 0.1 \text{ eV} \quad (5).$$

Preferably in the aspect of the invention, the electrons injected into the fluorescent-emitting layer from the phosphorescent-emitting layer via the charge blocking layer are injected into LUMO (lowest unoccupied molecular orbital) of the fluorescent host.

Preferably in the aspect of the invention, an electron mobility of the phosphorescent host is $1.0 \times 10^{-5}$ cm$^2$/Vs or more in an electric field of $1.0 \times 10^4$ to $1.0 \times 10^6$ V/cm.

Preferably in the aspect of the invention, the fluorescent-emitting layer is a blue emitting layer, the phosphorescent-emitting layer comprises: a red phosphorescent-emitting layer for providing red emission; and a green phosphorescent-emitting layer for providing green emission, and the red phosphorescent-emitting layer is closer to the cathode than the green phosphorescent-emitting layer.

The organic EL device according to this aspect of the invention, which is arranged as above, can provide the same advantages as the above-described organic EL device.

Preferably in either one of the aspects of the invention, the fluorescent-emitting layer is a blue emitting layer, and the phosphorescent-emitting layer contains: the phosphorescent host; a red phosphorescent dopant for providing red phosphorescence; and a green phosphorescent dopant for providing green phosphorescence.

According to this arrangement, blue emission is obtainable from the fluorescent-emitting layer, and red emission and green emission are obtainable from the phosphorescent-emitting layer, so that white-color emission is obtainable as a whole.

However, in an exemplary arrangement where a single phosphorescent-emitting layer contains both of the red phosphorescent dopant and the green phosphorescent dopant, energy transfer is more likely to be caused from the green phosphorescent dopant to the red phosphorescent dopant, which leads to increase in intensity of red color as compared with green color. Thus, it is preferable to suppress the energy transfer from the green phosphorescent dopant to the red phosphorescent dopant by setting the concentration of the red phosphorescent dopant to be lower than that of the green phosphorescent dopant.

Preferably in the aspect of the invention, the phosphorescent-emitting layer includes: a red phosphorescent-emitting layer for providing red emission; and a green phosphorescent-emitting layer for providing green emission, the red phosphorescent-emitting layer contains a red phosphorescent host and a red phosphorescent dopant for providing red phosphorescence, and the green phosphorescent-emitting layer contains a green phosphorescent host and a green phosphorescent dopant for providing green phosphorescence.

According to this arrangement, the separation of the red phosphorescent-emitting layer and the green phosphorescent-emitting layer from each other can suppress the energy transfer from the green phosphorescent dopant to the red phosphorescent dopant. Thus, favorable white-color emission is obtainable.

Preferably in the aspect of the invention, the red phosphorescent host of the red phosphorescent-emitting layer and the green phosphorescent host of the green phosphorescent-emitting layer are made of the same material.

According to this arrangement, since the red phosphorescent host and the green phosphorescent host are made of the same material, the number of the materials used in the manufacturing of the organic EL device can be reduced, thereby facilitating the manufacturing.

Further, when a hole transporting layer is provided between the anode and the phosphorescent-emitting layer in a configuration where the phosphorescent-emitting layer is located closer to the anode than the charge blocking layer, the hole transporting layer, the red phosphorescent host and the green phosphorescent host may be made of the same material. With this arrangement, the manufacturing of the organic EL device can be further facilitated.

The organic EL device according to the aspect of the invention preferably further includes an intermediate layer between the red phosphorescent-emitting layer and the green phosphorescent-emitting layer, the intermediate layer containing no phosphorescent material.

Since excited triplet energy can be diffused for a long distance, the energy transfer from the green phosphorescent-emitting layer to the red phosphorescent-emitting layer is more likely to be caused when the red phosphorescent-emitting layer and the green phosphorescent-emitting layer are adjoining to each other.

The consequence may be greater intensity in the red emission and smaller intensity in the green emission.

Accordingly, by providing the intermediate layer containing no phosphorescent material between the red phosphorescent-emitting layer and the green phosphorescent-emitting layer, the transfer of the excited triplet energy from the green phosphorescent-emitting layer to the red phosphorescent-emitting layer can be suppressed as needed. Thus, chromaticity of the emission can be easily adjusted.

The intermediate layer, the red phosphorescent host and the green phosphorescent host may be made of the same material. When these components are made of the same material, the host can be standardized in the phosphorescent-emitting layer. Thus, manufacturing process can be considerably simplified.

Further, when a hole transporting layer is provided between the anode and the phosphorescent-emitting layer in a configuration where the phosphorescent-emitting layer is located closer to the anode than the charge blocking layer, the hole transporting layer, the intermediate layer, the red phosphorescent host and the green phosphorescent host may be made of the same material.

Preferably in the aspect of the invention, the fluorescent host and the phosphorescent host are made of the same material. Alternatively, the charge blocking layer and the phosphorescent host are preferably made of the same material.

According to the arrangement, the number of the materials used in the manufacturing of the organic EL device can be reduced. Thus, the manufacturing can be facilitated.

Preferably in the aspect of the invention, a thickness of the charge blocking layer is 3 to 9 nm.

This will be described later with reference to, for instance, a configuration where the fluorescent-emitting layer is provided adjacently to the cathode (FIG. 1).

When the thickness of the charge blocking layer is 3 to 9 nm, the charge blocking layer can retain some thickness. Thus, the charge blocking layer can sufficiently block the electrons, thereby trapping the electrons in the fluorescent-emitting layer.

On the other hand, the holes are injected into the fluorescent-emitting layer via the charge blocking layer.

In other words, while the injection of the electrons from the fluorescent-emitting layer toward the charge blocking layer can be blocked, the holes can be injected into HOMO of the fluorescent host.

With this arrangement, the probability of the charge recombination in the fluorescent-emitting layer can be increased, and the luminous efficiency of the fluorescent-emitting layer can also be enhanced. In addition, it is possible to obtain emission from the phosphorescent-emitting layer by the energy transfer.

In a typical arrangement, the thickness of the layer is to be reduced in order not to raise the driving voltage. However, according to the aspect of the invention, increase of the probability of the recombination in the fluorescent-emitting layer is important, so that the thickness of the charge blocking layer is increased.

Accordingly, the probability of the exciton generation in the fluorescent-emitting layer can be increased and the luminous efficiency as a whole can be considerably enhanced with the use of phosphorescence due to the energy transfer. As a consequence, driving voltage required in the organic EL device can be possibly reduced as compared with a conventional EL device for providing only fluorescence emission, as long as the obtained luminous intensity is the same therebetween.

When the charge blocking layer is desired to be thick, it is preferable that the hole mobility of the phosphorescent host is increased. Alternatively, it is preferable to increase the hole mobility of the charge blocking layer.

With this arrangement, even when the charge blocking layer is provided, the holes can be efficiently injected into the fluorescent-emitting layer (host therein). Accordingly, by conducting a charge blocking as well as efficient hole injection in the fluorescent-emitting layer, the luminous efficiency can be considerably enhanced and the driving voltage can be reduced.

The charge blocking layer preferably exhibits a smaller affinity level than the fluorescent host in order to block the electrons from being injected toward the charge blocking layer from the fluorescent-emitting layer. However, since the largeness of the energy gap between the affinity level and the ionization potential is limited, materials having a smaller affinity level typically exhibit small ionization potential.

Also, the charge blocking layer and the fluorescent host are required to satisfy the above formula (1) and the triplet excited energy gap $Eg_{EB}$ of the charge blocking layer is required to be equal to or less than the triplet excited energy gap $Eg_{FH}$ of the fluorescent host (i.e., $Eg_{EB} \leq Eg_{FH}$). Thus, increase of the energy gap of the charge blocking layer is limited.

Accordingly, such a charge blocking layer that exhibits a small affinity level and satisfies the above formula (1) cannot help but exhibit a small ionization potential.

While the holes would be more likely to be injected into the fluorescent dopant by the use of a material exhibiting a small ionization potential as the charge blocking layer, holes are not preferred to be injected into the fluorescent dopant but preferred to be injected into the fluorescent host.

In view of the above, the thickness of the charge blocking layer is accordingly set to be 9 nm or less. With this arrangement, even when a material exhibiting small ionization potential is used as the charge blocking layer, level of the holes is not reduced at the time of passing through the charge blocking layer. Thus, the holes of the phosphorescent-emitting layer can be injected into HOMO of the fluorescent host.

On the other hand, in order to block the injection of the electrons toward the charge blocking layer from the fluorescent-emitting layer, the thickness of the charge blocking layer is preferably 3 nm or more.

Accordingly, the organic EL device, in which the thickness of the charge blocking layer is 3 to 9 nm, is capable of blocking the injection of the electrons toward the charge blocking layer from the fluorescent-emitting layer and also capable of injecting the holes of the phosphorescent-emitting layer into HOMO of the fluorescent host.

The thickness of the charge blocking layer is more preferably 4 to 8 nm, further more preferably 5 to 7 nm.

When the fluorescent-emitting layer is provided adjacently to the anode (as shown in FIG. 4), it is possible to suppose that the functions of the electrons and holes are interchanged. For instance, when the thickness of the charge blocking layer is 3 to 9 nm, the charge blocking layer can retain some thickness. Thus, the charge blocking layer can sufficiently block the holes, thereby trapping the holes in the fluorescent-emitting layer.

On the other hand, the electrons are injected into the fluorescent-emitting layer via the charge blocking layer.

In other words, while the injection of the holes from the fluorescent-emitting layer toward the charge blocking layer can be blocked, the electrons can be injected into LUMO of the fluorescent host. With this arrangement, the probability of the charge recombination in the fluorescent-emitting layer can be increased, and the luminous efficiency of the fluorescent-emitting layer can also be enhanced. In addition, it is possible to obtain emission from the phosphorescent-emitting layer by the energy transfer.

In a typical arrangement, the thickness of the layer is to be reduced in order not to raise the driving voltage. However, according to the aspect of the invention, increase of the probability of the recombination in the fluorescent-emitting layer is important, so that the thickness of the charge blocking layer is increased.

Accordingly, the probability of the exciton generation in the fluorescent-emitting layer can be increased and the luminous efficiency as a whole can be considerably enhanced with the use of phosphorescence due to the energy transfer. As a consequence, driving voltage required in the organic EL device can be possibly reduced as compared with a conventional EL device for providing only fluorescence emission, as long as the obtained luminous intensity is the same therebetween.

When the charge blocking layer is desired to be thick, it is preferable that the electron mobility of the phosphorescent host is increased. Alternatively, it is preferable to increase the electron mobility of the charge blocking layer.

With this arrangement, even when the charge blocking layer is provided, the electrons can be efficiently injected into the fluorescent-emitting layer (host therein). Accordingly, by performing the charge blocking as well as efficient electron injection in the fluorescent-emitting layer, the luminous efficiency can be considerably enhanced and the driving voltage can be reduced.

In order to block the injection of the holes toward the charge blocking layer from the fluorescent-emitting layer, the charge blocking layer preferably exhibits smaller ionization potential than the fluorescent host.

Also, the charge blocking layer and the fluorescent host are required to satisfy the above formula (4) and the triplet excited energy gap $Eg_{HB}$ of the charge blocking layer is required to be equal to or less than the triplet excited energy gap $Eg_{FH}$ of the fluorescent host (i.e., $Eg_{EB} \leqq Eg_{FH}$). Thus, increase of the energy gap of the charge blocking layer is limited.

In either one of the aspects of the invention, the wavelength of the emission of the fluorescent-emitting layer is shorter than that of the emission of the phosphorescent-emitting layer. The fluorescent-emitting layer preferably provides emission of a wavelength of 430 to 500 nm, and the phosphorescent-emitting layer preferably provides emission of a wavelength of 500 to 650 nm.

Such an arrangement is capable of providing mixed-color light in which the emission of a short wavelength from the fluorescent-emitting layer and the emission of a long wavelength from the phosphorescent-emitting layer are mixed together, at high luminous efficiency.

Typically, no phosphorescent material favorable for short-wavelength emission (blue emission) has been practically known. Even when fluorescent materials are used, luminous efficiency of blue emission is typically low.

Accordingly, an arrangement where emitting layers are layered for producing mixed-color light (e.g., white-color light) has provided blue emission of low intensity, so that white emission having favorable chromaticity has not been obtainable.

In this respect, the aspect of the invention uses fluorescent materials for providing the blue emission which is not realizable by phosphorescent materials, and concentrates the exciton generation in the fluorescent-emitting layer. Thus, the blue emission of sufficient intensity can be obtained from fluorescence.

Then, the energy is transferred from blue-emission host to the phosphorescent-emitting layer, such that phosphorescence (e.g., red emission) is obtained at high efficiency.

Accordingly, the aspect of the invention can provide such an innovative advantage that white emission of favorable color can be realized at high efficiency, which has been conventionally difficult.

Fluorescent materials for emission of a wavelength of 430 to 500 nm and phosphorescent materials for emission of a wavelength of 500 to 650 nm are typically known. Thus, without relying on special materials, organic EL devices for providing mixed-color emission at high luminous efficiency can be provided.

Preferably in the aspect of the invention, the charge blocking layer has a triplet energy gap that is greater than that of the fluorescent dopant.

According to the aspect of the invention, the exciton generation is required to be carried out in the fluorescent host, and excited triplet energy in the exciton energy is required to be transferred to the phosphorescent-emitting layer via the charge blocking layer.

In view of the above, it would be inexpedient if the excited triplet energy of the fluorescent host should be transferred to the fluorescent dopant and deactivated, instead of being transferred toward the charge blocking layer. In such a case, the luminous efficiency would not be enhanced.

Specifically, since the fluorescent dopant is to be doped to the fluorescent host, the energy of the fluorescent host is easily transferred to the fluorescent dopant.

In this respect, according to the aspect of the invention, the charge blocking layer has a triplet energy gap that is greater than that of the fluorescent dopant so that a difference in the triplet energy gap between the charge blocking layer and the fluorescent host is smaller than a difference in the triplet energy gap between the fluorescent host and the fluorescent dopant.

With this arrangement, the excited triplet energy of the fluorescent host is more apt to be transferred toward the charge blocking layer than to the triplet energy of the fluorescent dopant, and the energy transfer to the phosphorescent-emitting layer via the charge blocking layer is promoted.

Consequently, the excited triplet energy deactivated by the fluorescent dopant can be minimized, thereby enhancing the luminous efficiency.

BRIEF DESCRIPTION OF DRAWINGS

FIG. 5 shows a band diagram of the organic EL device according to the second exemplary embodiment of the invention.

FIG. 6 shows triplet energy gaps of layers in the organic EL device according to the second exemplary embodiment of the invention.

BEST MODE FOR CARRYING OUT THE INVENTION

First Exemplary Embodiment

Figure 1:
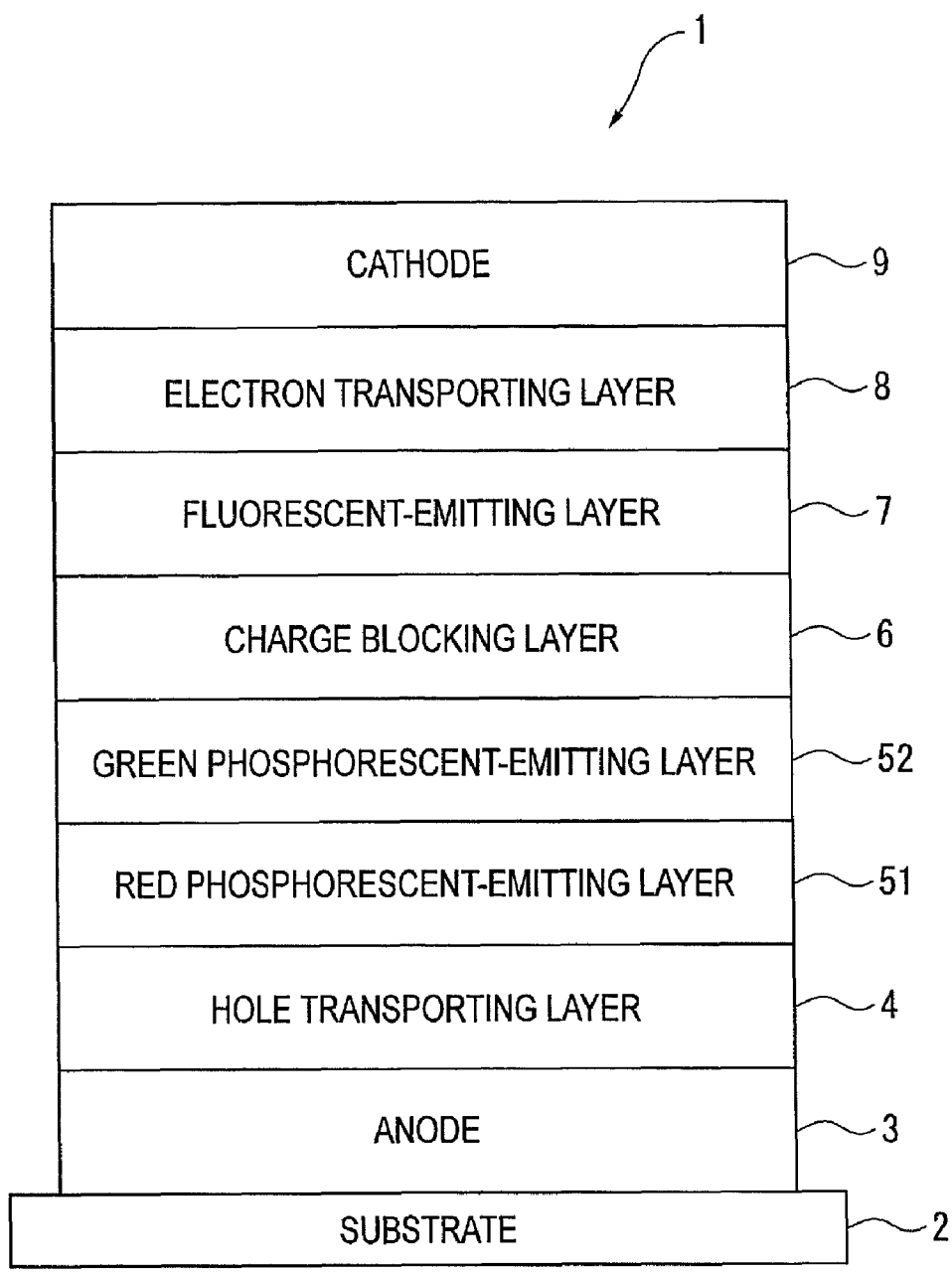
FIG. 1 shows an arrangement of an organic EL device according to a first exemplary embodiment of the invention.

The first exemplary embodiment of the invention will be shown in the drawings and described with reference to numerals allotted to components shown in the drawings.

(1) Arrangement of Organic EL Device

The followings are representative arrangement examples of the organic EL device:

(a) anode/emitting layer/cathode;
(b) anode/hole injecting layer/emitting layer/cathode;
(c) anode/emitting layer/electron injecting layer/cathode;
(d) anode/hole injecting layer/emitting layer/electron injecting layer/cathode;
(e) anode/organic semiconductor layer/emitting layer/cathode;
(f) anode/organic semiconductor layer/electron blocking layer/emitting layer/cathode;

(g) anode/organic semiconductor layer/emitting layer/adhesion improving layer/cathode;
(h) anode/hole injecting layer/hole transporting layer/emitting layer/electron injecting layer/cathode;
(i) anode/insulating layer/emitting layer/insulating layer/cathode;
(j) anode/inorganic semiconductor layer/insulating layer/emitting layer/insulating layer/cathode;
(k) anode/organic semiconductor layer/insulating layer/emitting layer/insulating layer/cathode;
(l) anode/insulating layer/hole injecting layer/hole transporting layer/emitting layer/insulating layer/cathode; and
(m) anode/insulating layer/hole injecting layer/hole transporting layer/emitting layer/electron injecting layer/cathode.

Among the above, the arrangement (h) is typically preferably used.

(2) Light-Transmissive Substrate

The organic EL device is formed on a light-transmissive substrate. The light-transmissive plate, which supports the organic EL device, is preferably a smoothly-shaped substrate that transmits 50% or more of light in a visible region of 400 nm to 700 nm.

The light-transmissive plate is exemplarily a glass plate, a polymer plate or the like.

For the glass plate, materials such as soda-lime glass, barium/strontium-containing glass, lead glass, aluminosilicate glass, borosilicate glass, barium borosilicate glass and quartz can be used.

For the polymer plate, materials such as polycarbonate, acryl, polyethylene terephthalate, polyether sulfide and polysulfone can be used.

(3) Anode

The anode of the organic EL device is used for injecting holes into the hole transporting layer or the emitting layer. It is effective that the anode has a work function of 4.5 eV or more. Exemplary materials for the anode are alloys of indium-tin oxide (ITO), tin oxide (NESA), indium zinc oxide (IZO), gold, silver, platinum and copper.

The anode may be made by forming a thin film from these electrode materials through a method such as vapor deposition or sputtering.

When light from the emitting layer is to be emitted through the anode as herein, the anode preferably transmits more than 10% of the light. Although depending on the material of the anode, thickness of the anode is typically in a range of 10 nm to 1 μm, and preferably in a range of 10 to 200 nm.

(4) Emitting Layer

The emitting layer of the organic EL device has functions as follows,
namely:
(A) injecting function: a function for accepting, when an electrical field is applied, the holes injected by the anode or the hole injecting layer, or the electrons injected by the cathode or the electron injecting layer;
(B) transporting function: a function for transporting injected electric charges (the electrons and the holes) by the force of the electrical field; and
(C) emitting function: a function for providing a condition for recombination of the electrons and the holes to emit light.

Injectability of the holes may differ from that of the electrons and transporting capabilities of the hole and the electrons (represented by mobilities of the holes and the electrons) may differ from each other. However, it is preferable that at least either one of the charges is moved.

As a method of forming the emitting layer, known methods such as vapor deposition, spin coating and an LB (Langmuir Blodgett) method may be employed.

The emitting layer is particularly preferably a molecular deposit film.

The molecular deposit film means a thin film formed by depositing a material compound in gas phase or a film formed by solidifying a material compound in a solution state or in liquid phase. The molecular deposit film is typically distinguished from a thin film formed by the LB method (molecular accumulation film) by differences in aggregation structures and higher order structures and functional differences arising therefrom.

As disclosed in JP-A-57-51781, the emitting layer can be formed from a thin film formed by spin coating or the like, the thin film being formed from a solution prepared by dissolving a binder (e.g. a resin) and a material compound in a solvent.

The thickness of the emitting layer is preferably 5 to 50 nm, more preferably 6 to 50 nm. The thickness below 5 nm may cause difficulty in forming the emitting layer and in controlling chromaticity, while the thickness above 50 nm may increase driving voltage.

The organic EL device according to the aspect of the invention includes: an anode for injecting holes; a phosphorescent-emitting layer; a charge blocking layer; a fluorescent-emitting layer; and a cathode for injecting electrons, in this order.

As described above, in the organic EL device of this exemplary embodiment, the emitting layer includes the phosphorescent-emitting layer and the fluorescent-emitting layer, and the charge blocking layer is provided between the phosphorescent-emitting layer and the fluorescent-emitting layer.

The phosphorescent-emitting layer contains a phosphorescent host and a phosphorescent dopant for providing phosphorescence, and the fluorescent-emitting layer contains a fluorescent host and a fluorescent dopant for providing fluorescence.

Further, when the fluorescent-emitting layer is provided adjacently to the cathode as in this exemplary embodiment (FIG. 1), the charge blocking layer blocks the electrons injected into the fluorescent host in the fluorescent-emitting layer from being injected toward the charge blocking layer from the fluorescent-emitting layer, and also injects the holes from the phosphorescent-emitting layer into the fluorescent-emitting layer.

The triplet energy gap $Eg_{PD}$ of the phosphorescent dopant in the phosphorescent-emitting layer, the triplet energy gap $Eg_{EB}$ of the charge blocking layer and the triplet energy gap $Eg_{FH}$ of the fluorescent host of the fluorescent-emitting layer satisfy the following formula (1).

$$Eg_{PD} < Eg_{EB} \leq Eg_{FH} \tag{1}$$

The phosphorescent-emitting layer, the fluorescent-emitting layer and the charge blocking layer will be respectively described below.

(4.1) Phosphorescent-Emitting Layer

The phosphorescent-emitting layer contains the phosphorescent host and the phosphorescent dopant for providing phosphorescence. The phosphorescent-emitting layer may be structured such that one or more host and one or more phosphorescent dopants are mixed. Further, two or more phosphorescent-emitting layers may be provided, and one or more phosphorescent dopants may be mixed in each layer.

When a plurality of phosphorescent-emitting layers are used, the plurality of phosphorescent-emitting layers preferably include a red phosphorescent-emitting layer for red emission and a green phosphorescent-emitting layer for green emission.

When the fluorescent-emitting layer is provided adjacently to the cathode as in this exemplary embodiment (FIG. 1), the red phosphorescent-emitting layer is provided closer to the anode than the green phosphorescent-emitting layer. The red phosphorescent-emitting layer contains a red phosphorescent host and a red phosphorescent dopant for providing red phosphorescence.

The green phosphorescent-emitting layer contains a green phosphorescent host and a green phosphorescent dopant for providing green phosphorescence.

The red phosphorescent host in the red phosphorescent-emitting layer and the green phosphorescent host in the green phosphorescent-emitting layer may be formed of the same material or different materials. When the hole transporting layer is provided, the hole transporting layer, the red phosphorescent host and the green phosphorescent host may be formed of the same material or different materials.

In order to transfer the excited triplet energy from the green phosphorescent dopant to the red phosphorescent dopant, the triplet energy gap of the red phosphorescent dopant is smaller than the triplet energy gap of the green phosphorescent dopant.

Examples of the red phosphorescent dopant are the following compounds such as PQIr (iridium(III) bis(2-phenyl quinolyl-N,$C^{2'}$) acetylacetonate).

[Chemical Formula 2]

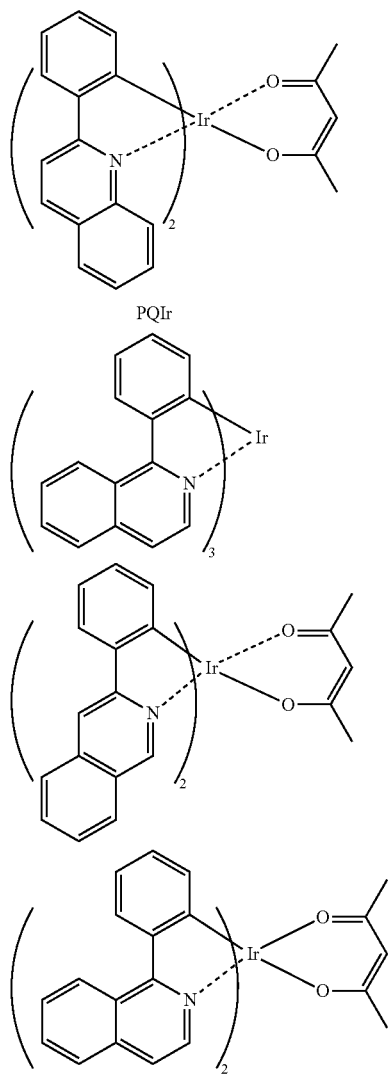

PQIr

Examples of the green phosphorescent dopant are the following compounds such as Ir(ppy)$_3$.

[Chemical Formula 3]

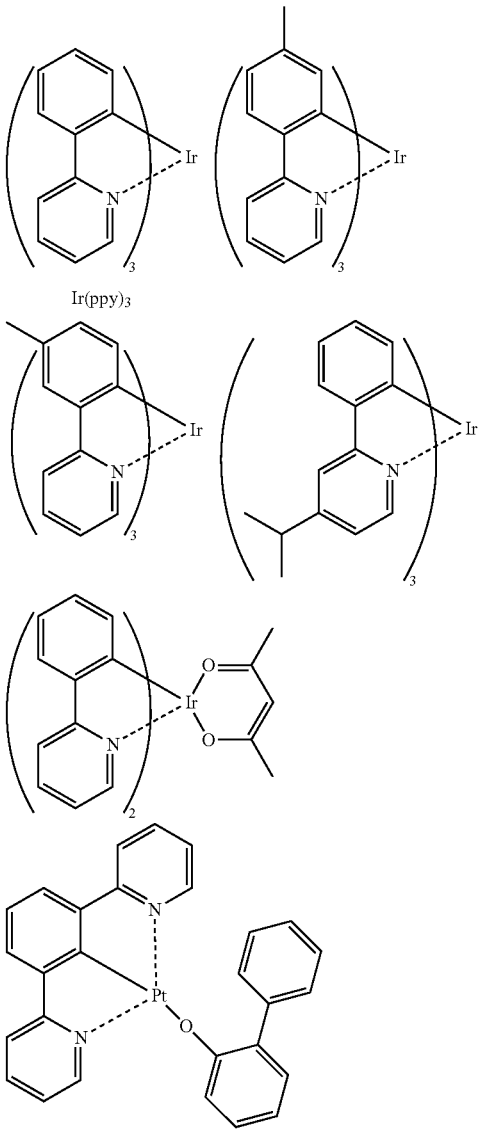

Ir(ppy)$_3$

For adjustment of chromaticity of emission, an intermediate layer containing no phosphorescent material is preferably provided between the red phosphorescent-emitting layer and the green phosphorescent-emitting layer.

While the intermediate layer, the red phosphorescent host and the green phosphorescent host may be made of the same material or different materials, they are particularly preferably made of the same material.

When the hole transporting layer is provided, the hole transporting layer, the intermediate layer, the red phosphorescent host and the green phosphorescent host are further preferably made of the same material.

With this arrangement, the number of the materials used in the manufacturing of the organic EL device can be reduced. Thus, the manufacturing can be facilitated.

When the fluorescent-emitting layer is provided adjacently to the cathode as in this exemplary embodiment (FIG. 1), the phosphorescent host is preferably made of a material that exhibits a greater triplet energy gap and greater hole mobility than the phosphorescent dopant.

The phosphorescent host preferably exhibits a great hole mobility. In an electric field of $1.0 \times 10^4$ to $1.0 \times 10^6$ V/cm, the hole mobility is preferably $1.0 \times 10^{-5}$ cm$^2$/Vs or more, further preferably $1.0 \times 10^{-4}$ cm$^2$/Vs or more, still further preferably $1.0 \times 10^{-3}$ cm$^2$/Vs or more.

Alternatively, the phosphorescent host may be formed of a so-called hole transporting material, and such a hole transporting material may exhibit a hole mobility that is greater than its electron mobility.

The materials of the phosphorescent host may be selected from such materials that have a high hole mobility and have been conventionally used for hole transporting layer. In other words, materials of which triplet energy gap and hole mobility are greater than those of the phosphorescent dopant are selectable.

Examples usable as the phosphorescent host are compounds represented respectively by the following formulae (101) to (105).

[Chemical Formula 4]

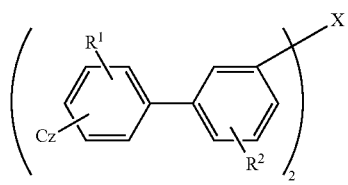
(101)

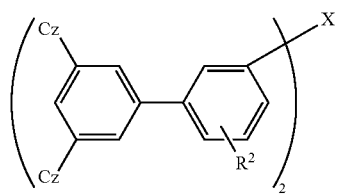
(102)

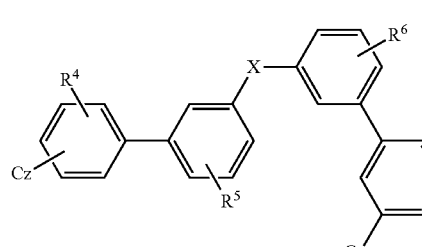
(103)

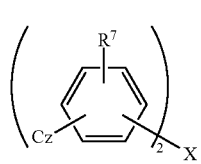
(104)

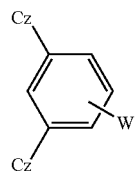
(105)

In particular, the compound represented by the formula (101) or (103) is favorably used as the phosphorescent host.

The structure represented by the formula (101) is any one of the following structures.

[Chemical Formula 5]

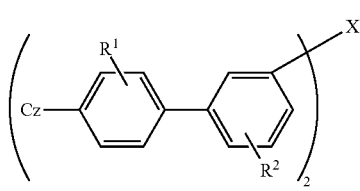
(101')

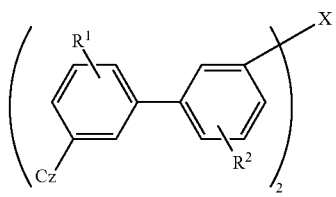
(101'')

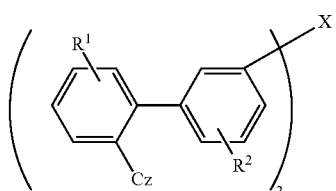
(101''')

The structure represented by the formula (103) is any one of the following structures.

[Chemical Formula 6]

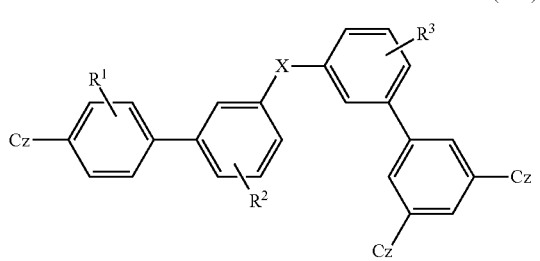
(103')

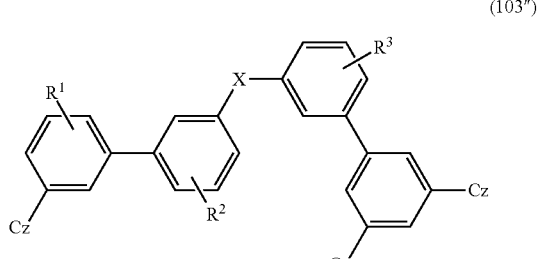
(103'')

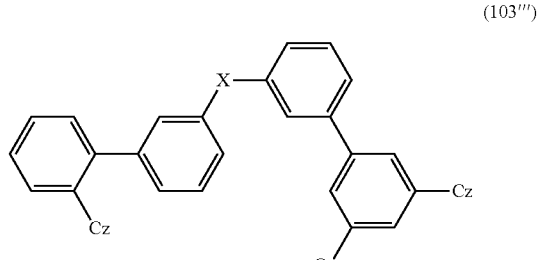
(103''')

Among the above, the phosphorescent host is particularly preferably made of the compound represented by the general formula (101') or (103').

In the formulae (101) to (104), $R^1$ to $R^7$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^1$ to $R^7$ may be each plural, and adjoining set thereof may form a saturated or unsaturated cyclic structure.

Examples of the halogen atom represented by $R^1$ to $R^7$ are fluorine, chlorine, bromine, iodine and the like.

Examples of the substituted or unsubstituted alkyl group having 1 to 40 carbon atoms represented by $R^1$ to $R^7$ are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydoroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-1-butyl group, 1,2,3-tricyanopropyl group, nitromethyl group, 1-nitroethyl group, 2-nitroethyl group, 1,2-dinitroethyl group, 2,3-dinitro-1-butyl group, 1,2,3-trinitropropyl group, cyclopentyl group, cyclohexyl group, cyclooctyl group and 3,5-tetramethylcyclohexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group or 3,5-tetramethylcyclohexyl group.

Examples of the substituted or unsubstituted heterocyclic group having 3 to 30 carbon atoms represented by $R^1$ to $R^7$ are 1-pyrrolyl group, 2-pyrrolyl group, 3-pyrrolyl group, pyrazinyl group, 2-pyrizinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyhdinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Among the above, the preferable compounds are 2-pyrizinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group and 9-carbazolyl group.

The substituted or unsubstituted alkoxy group having 1 to 40 carbon atoms represented by $R^1$ to $R^7$ is a group represented by —OY. Examples of Y are the same examples as described in relation to the alkyl group, and preferable examples are also the same.

Examples of the substituted or unsubstituted aryl group having 6 to 40 carbon atoms represented by $R^1$ to $R^7$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among the above, preferable compounds are phenyl group, 1-naphthyl group, 2-naphthyl group, 9-phenanthryl group, 2-biphenylyl group, 3-biphenylyl group, 4-biphenylyl group, p-tolyl group and 3,4-xylyl group.

The substituted or unsubstituted aryloxy group having 6 to 40 carbon atoms represented by $R^1$ to $R^7$ is a group represented by —OAr. Examples of Ar are the same examples as described in relation to the aryl group, and preferable examples are also the same.

Examples of the substituted or unsubstituted aralkyl group having 7 to 40 carbon atoms represented by $R^1$ to $R^7$ are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-melhylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxy benzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, 1-chloro-2-phenylisopropyl group and the like.

Among the above, a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group are preferable.

Examples of the substituted or unsubstituted alkenyl group having 2 to 40 carbon atoms represented by $R^1$ to $R^7$ are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-phenylvinyl group and 1,2-diphenylvinyl group are preferable.

The substituted or unsubstituted alkylamino group having 1 to 80 carbon atoms, the substituted or unsubstituted arylamino group having 6 to 80 carbon atoms and the substituted or unsubstituted aralkylamino group having 7 to 80 carbon atoms, each of which is represented by $R^1$ to $R^7$, are represented by —$NQ^1Q^2$. Examples of $Q^1$ and $Q^2$ are each independently the same examples as described in relation to the alkyl group, aryl group and aralkyl group. The preferable examples thereof are also the same.

Examples of the substituted or unsubstituted alkylsilyl group having 3 to 10 carbon atoms represented by $R^1$ to $R^7$ are a trimethylsilyl group, triethylsilyl group, t-butyldimethylsilyl group, vinyldimethylsilyl group and propyldimethylsilyl group.

Examples of the substituted or unsubstituted arylsilyl group having 6 to 30 carbon atoms represented by $R^1$ to $R^7$ are a triphenylsilyl group, phenyldimethylsilyl group and t-butyldiphenylsilyl group.

Examples of the cyclic structure formed by $R^1$ to $R^7$ when $R^1$ to $R^7$ are each plural are, in addition to a unsaturated six-membered ring such as benzene ring, saturated or unsaturated five-membered ring or seven-membered ring.

In the formulae (101) to (104), X represents a group represented by any one of the following formulae (111) to (116).

[Chemical Formula 7]

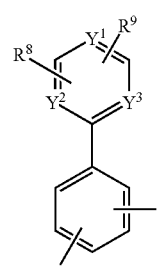

(111)

-continued (112)
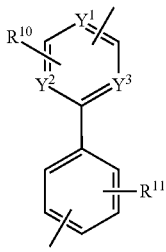

(113)
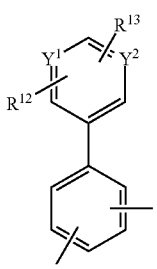

(114)
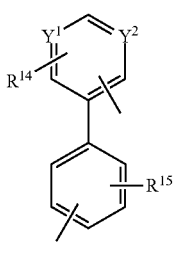

(115)
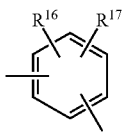

(116)
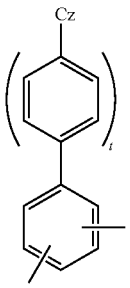

In the formulae (111) to (116), $R^8$ to $R^{17}$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^8$ to $R^{17}$ may be each plural, and adjoining set thereof may form a saturated or unsaturated cyclic structure.

Examples of the group represented by each of $R^8$ to $R^{17}$ are the same examples as described in relation to $R^1$ to $R^7$ above, and the preferable examples are the same.

In the formulae (111) to (114), $Y^1$ to $Y^3$ each independently represent —CR (R represents a hydrogen atom, the group bonded to X in the formula (101) to (104) or any one of $R^8$, $R^9$, $R^{10}$, $R^{12}$, $R^{13}$ and $R^{14}$), or a nitrogen atom. When $Y^1$ to $Y^3$ represent a nitrogen atom, the number of the nitrogen atoms is at least 2 in the same ring. Cz is the same as the following.

In the formula (116), t represents an integer of 0 to 1.

The group represented by the formula (111) is preferably any one of the following structures.

[Chemical Formula 8]

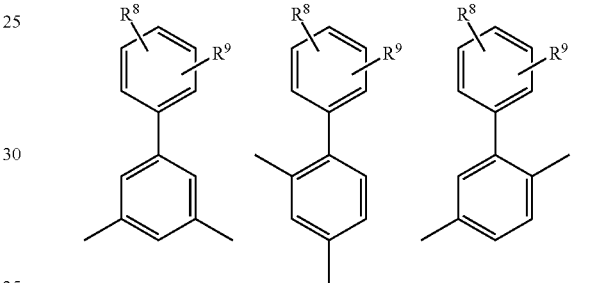

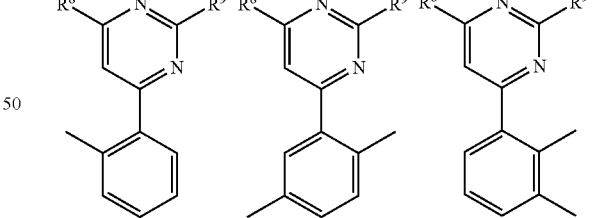

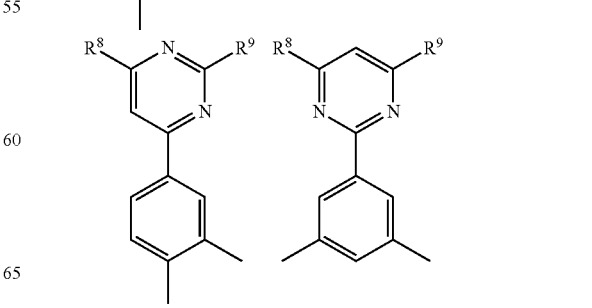

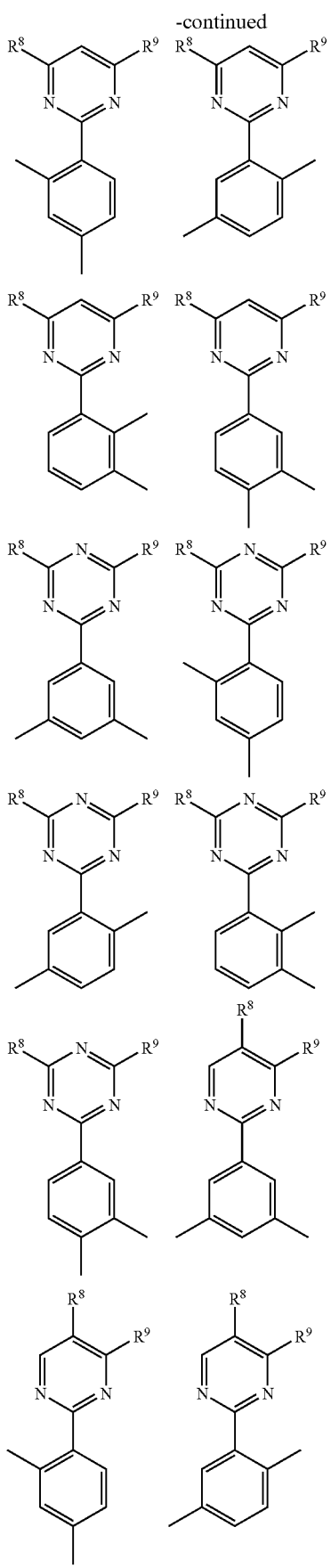
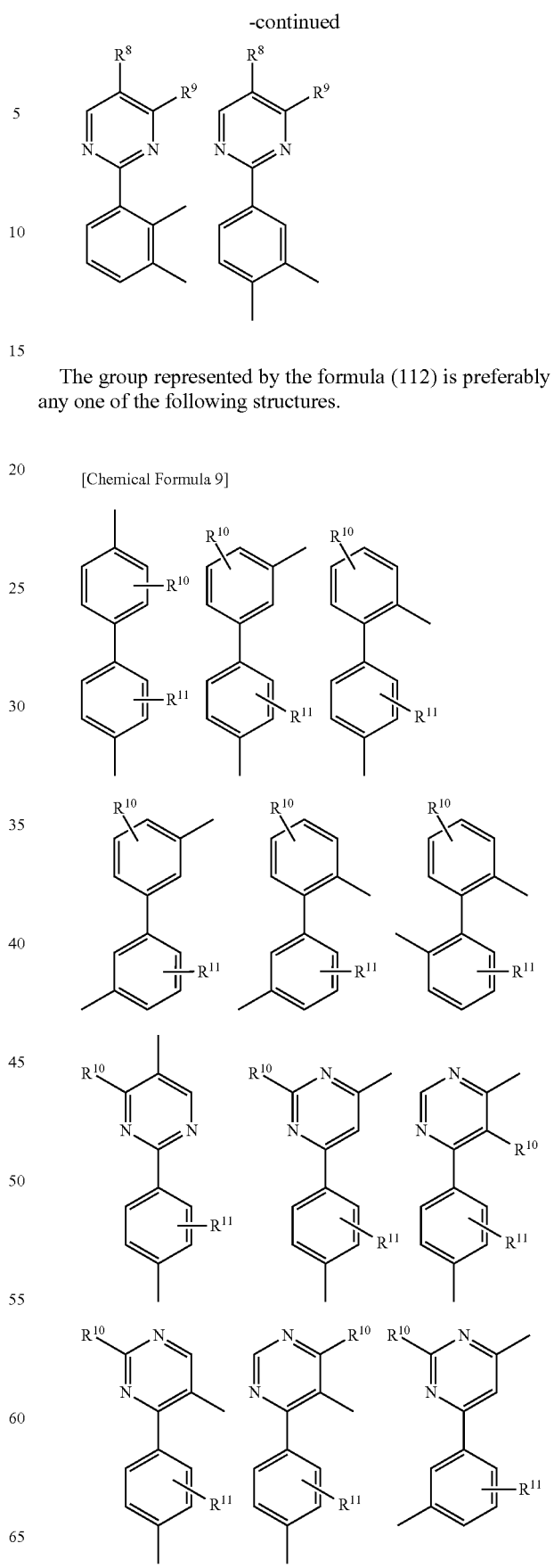
The group represented by the formula (112) is preferably any one of the following structures.
[Chemical Formula 9]
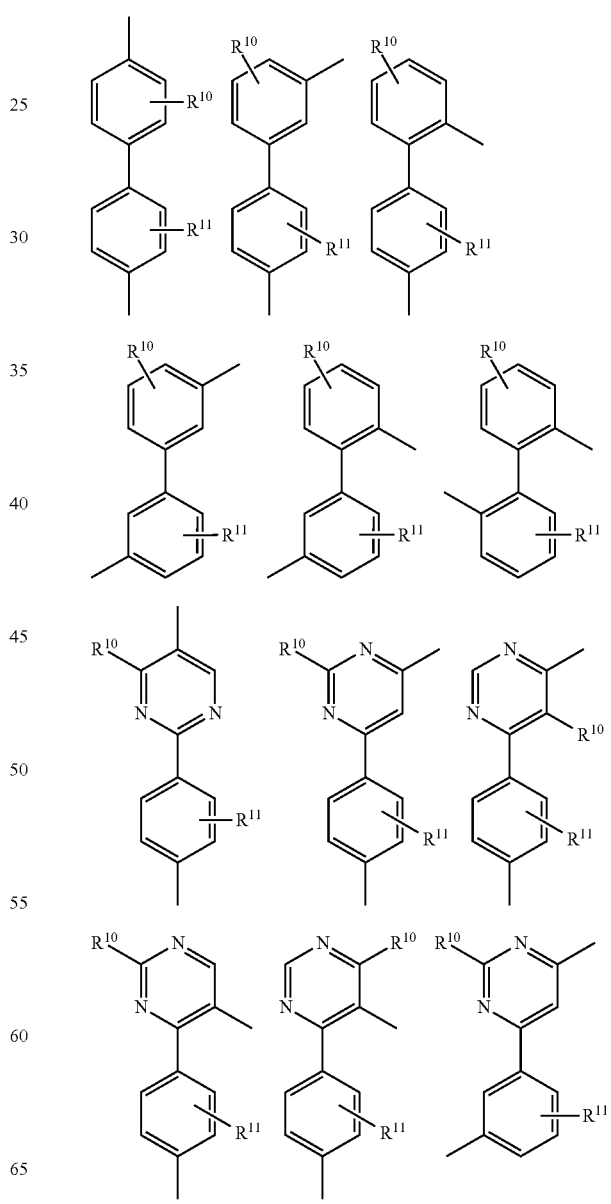

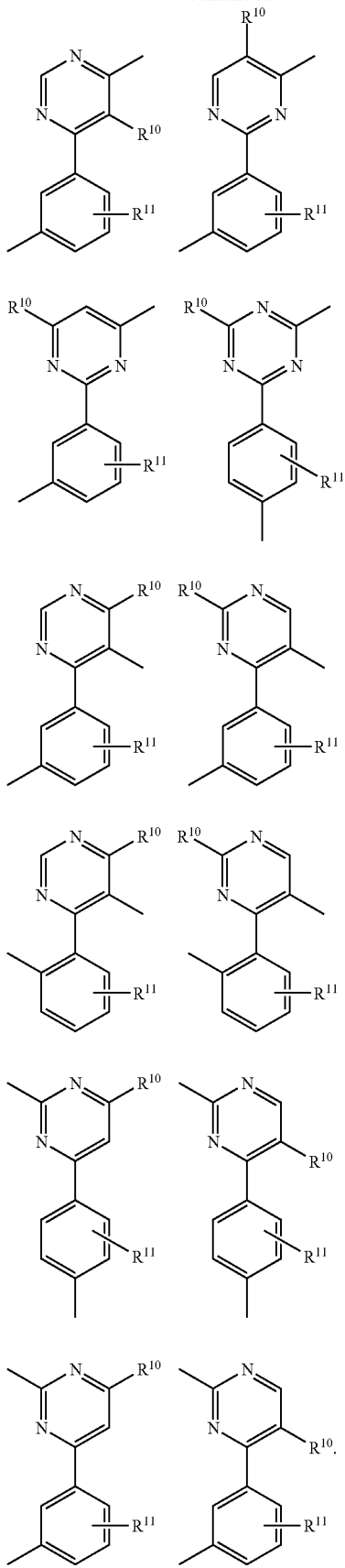
The group represented by the formula (113) is preferably any one of the following structures.
[Chemical Formula 10]
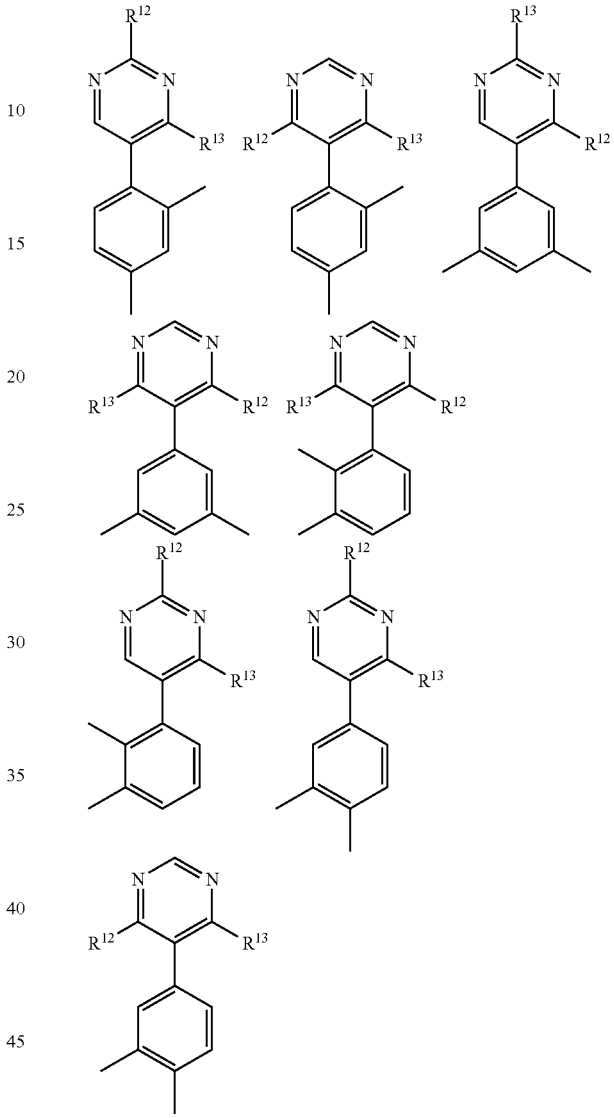
The group represented by the formula (114) is preferably any one of the following structures.
[Chemical Formula 11]
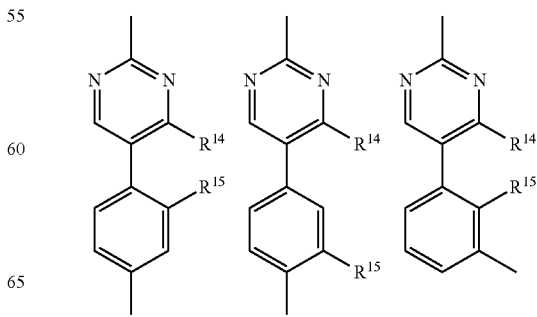

-continued
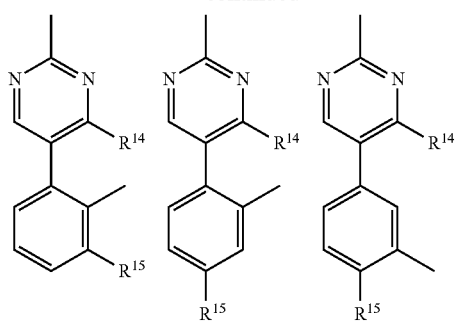
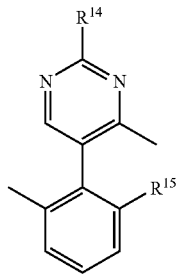
The group represented by the formula (115) is preferably any one of the following structures.
[Chemical Formula 12]
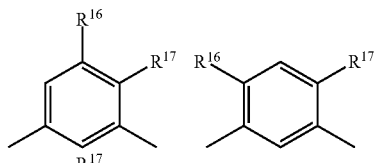
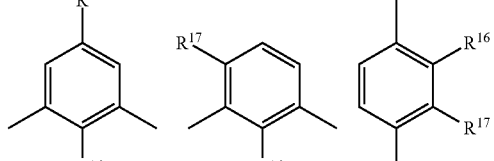
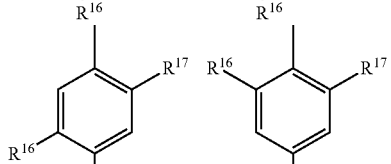
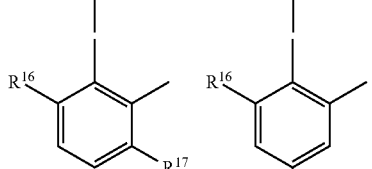
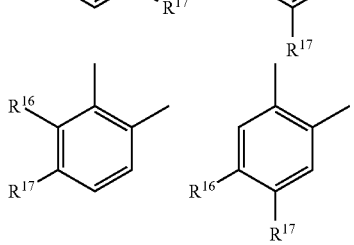
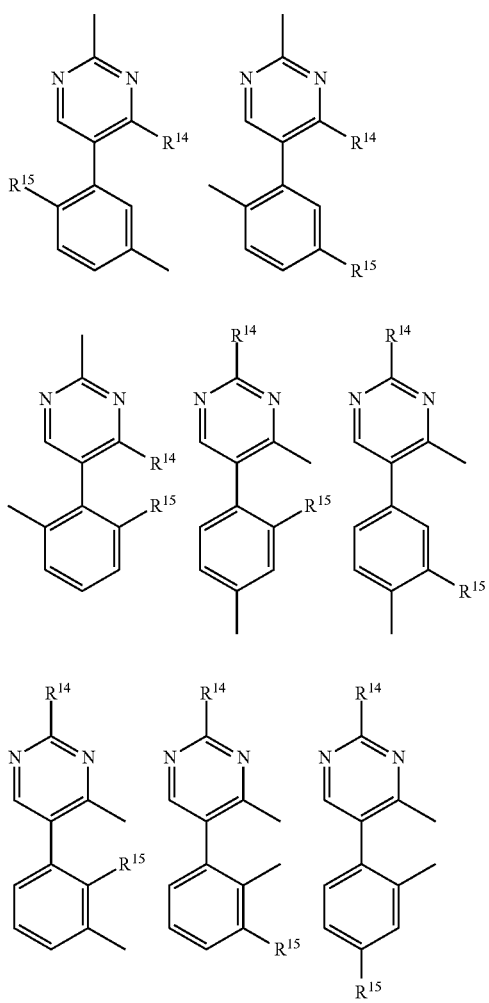
The group represented by the formula (116) is preferably any one of the following structures.
[Chemical Formula 13]
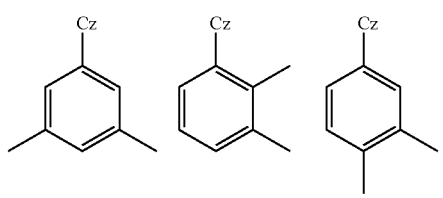
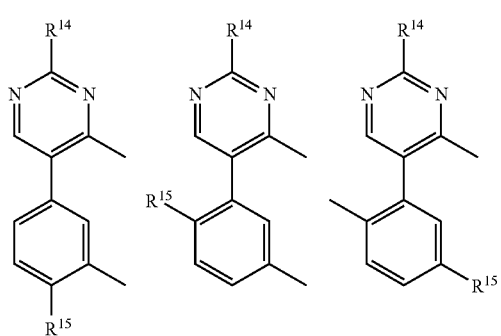

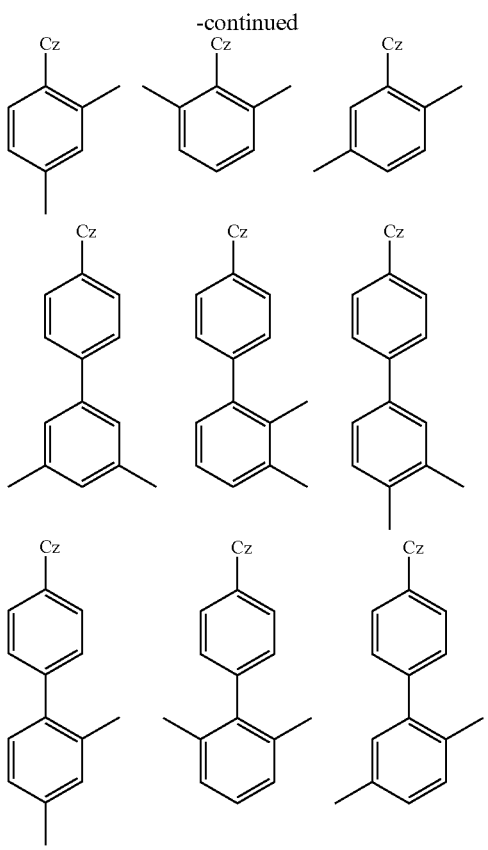

In the formula (105), W represents a group represented by any one of the following general formulae (121) to (125).

[Chemical Formula 14]

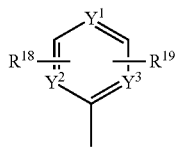
(121)

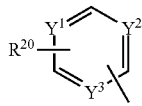
(122)

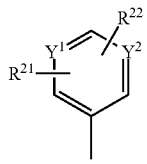
(123)

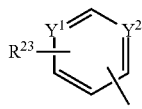
(124)

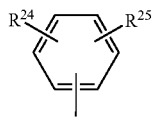
(125)

In the formulae (121) to (125), $R^{18}$ to $R^{25}$ are the same groups as $R^8$ to $R^{17}$. $Y^1$ to $Y^3$ are the same as $Y^1$ to $Y^3$ in the formulae (111) to (114).

Examples of the group represented by each of $R^{18}$ to $R^{25}$ are the same examples as described in relation to $R^1$ to $R^7$ above, and the preferable examples are the same.

In the formulae (101) to (105), Cz represents a group represented by the following general formula (131) or (132).

[Chemical Formula 15]

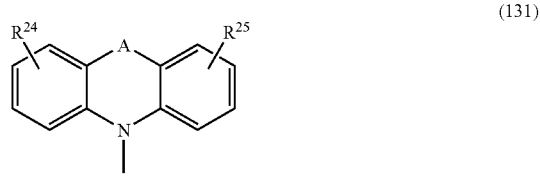
(131)

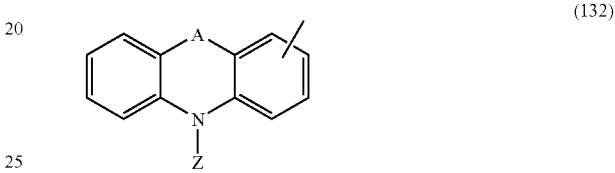
(132)

In the formulae (131) and (132), A represents a single bond, —$(CR^{26}R^{27})_n$— (n is an integer of 1 to 3), —$SiR^{28}R^{29}$—, —$NR^{30}$—, —O— or —S—. $R^{26}$ and $R^{27}$, and $R^{28}$ and $R^{29}$ may be bonded together to form a saturated or unsaturated cyclic structure. $R^{24}$ to $R^{30}$ each independently represent a hydrogen atom, halogen atom, substituted or unsubstituted alkyl group having 1 to 40 carbon atoms, substituted or unsubstituted heterocyclic group having 3 to 30 carbon atoms, substituted or unsubstituted alkoxy group having 1 to 40 carbon atoms, substituted or unsubstituted aryl group having 6 to 40 carbon atoms, substituted or unsubstituted aryloxy group having 6 to 40 carbon atoms, substituted or unsubstituted aralkyl group having 7 to 40 carbon atoms, substituted or unsubstituted alkenyl group having 2 to 40 carbon atoms, substituted or unsubstituted alkylamino group having 1 to 80 carbon atoms, substituted or unsubstituted arylamino group having 6 to 80 carbon atoms, substituted or unsubstituted aralkylamino group having 7 to 80 carbon atoms, substituted or unsubstituted alkylsilyl group having 3 to 10 carbon atoms, substituted or unsubstituted arylsilyl group having 6 to 30 carbon atoms and cyano group. $R^{24}$ to $R^{25}$ may be each plural, and adjoining set thereof may form a saturated or unsaturated cyclic structure.

In the formula (132), Z represents a substituted or unsubstituted alkyl group having 1 to 20 carbon atoms, substituted or unsubstituted aryl group having 6 to 18 carbon atoms or a substituted or unsubstituted aralkyl group having 7 to 40 carbon groups.

Examples of the alkyl group having 1 to 20 carbon atoms represented by Z are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-methylpentyl group, 2-methylpentyl group, 1-pentylhexyl group, 1-butylpentyl group, 1-heptyloctyl group and 3-methyl pentyl group. A methyl group, ethyl group, propyl group, n-hexyl group and n-heptyl group are preferable.

Examples of the aryl group represented by Z are a phenyl group, naphthyl group, tolyl group, biphenyl group and terphenyl group. A phenyl group, biphenyl group and tolyl group are preferable.

Examples of the aralkyl group represented by Z are an α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylpropyl group, benzyl group, p-cyanobenzyl group, m-cyanobenzyl group, o-cyanobenzyl group, 1-phenylethyl group, 2-phenylethyl group, 1-phenylisopropyl group and 2-phenylisopropyl group. A benzyl group and p-cyanobenzyl group are preferable.

Cz is preferably any one of the following structures.

[Chemical Formula 16]

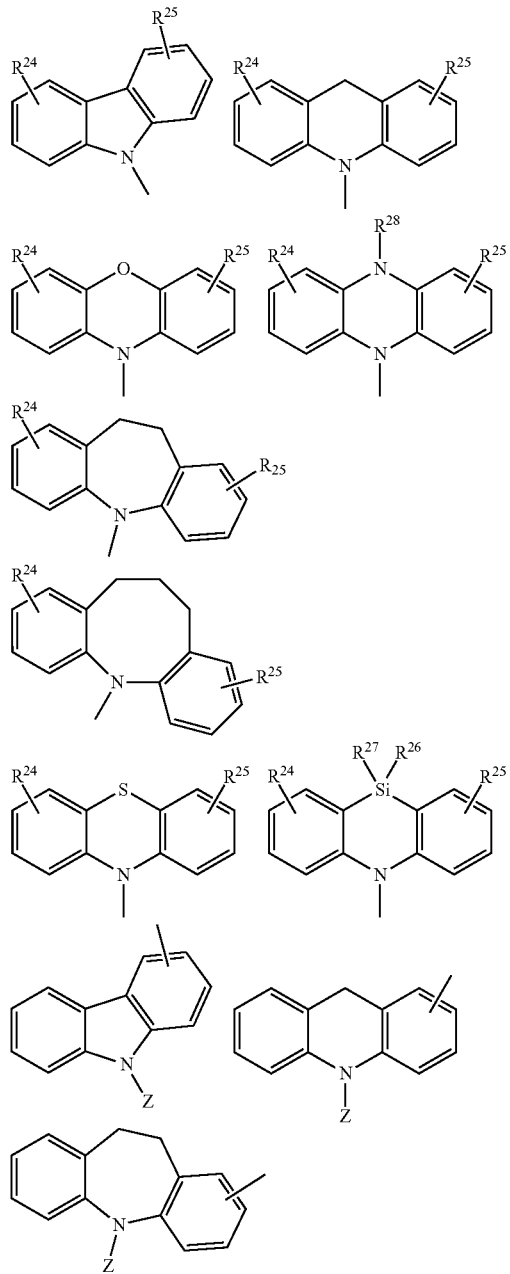
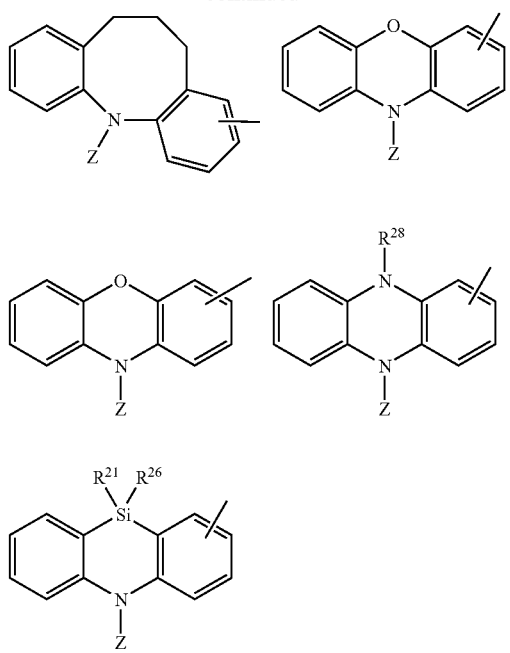

Cz is further preferably any one of the following structures.

[Chemical Formula 17]

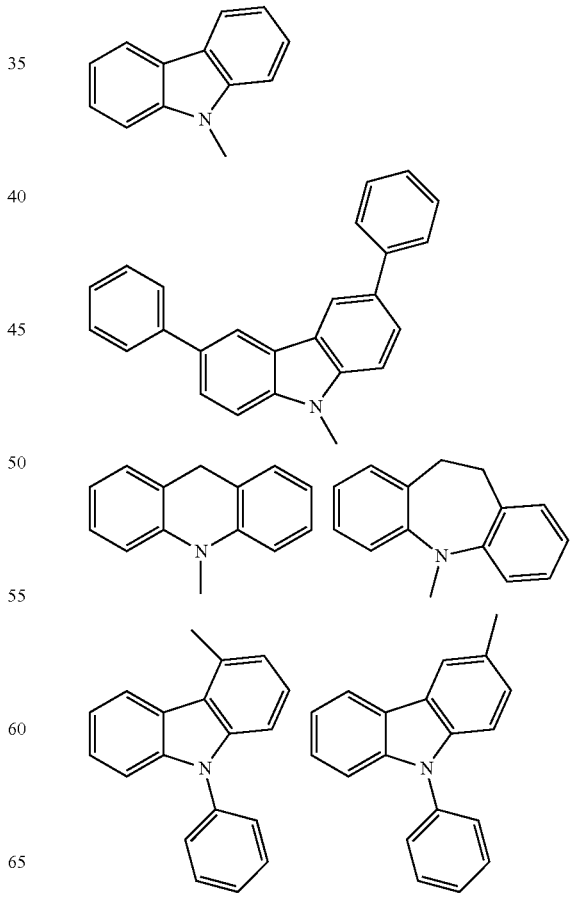

-continued

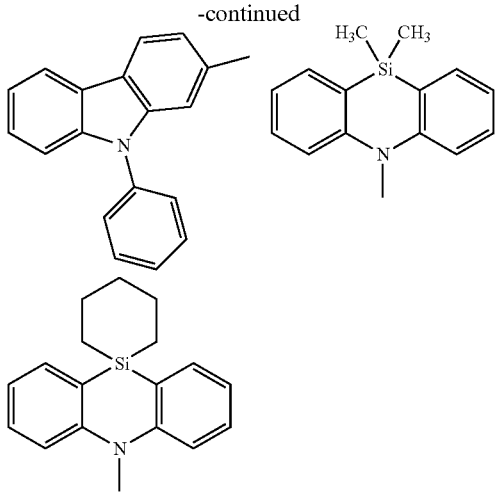

Further, Cz particularly preferably represents a substituted or unsubstituted carbazolyl group or a substituted or unsubstituted arylcarbazolyl group.

Examples of the substituents for the exemplified groups in the general formulae (101) to (105) are a halogen atom, hydroxyl group, amino group, nitro group, cyano group, alkyl group, alkenyl group, cycloalkyl group, alkoxy group, aromatic hydrocarbon group, aromatic heterocyclic group, aralkyl group, aryloxy group and alkoxycarbonyl group.

Examples of the material for the organic EL device according to the aspect of the invention, in which the compound represented by the any one of the following general formulae (101) to (105) is contained, will be shown below. However, the invention is not limited to these exemplified compounds.

[Chemical Formula 18]

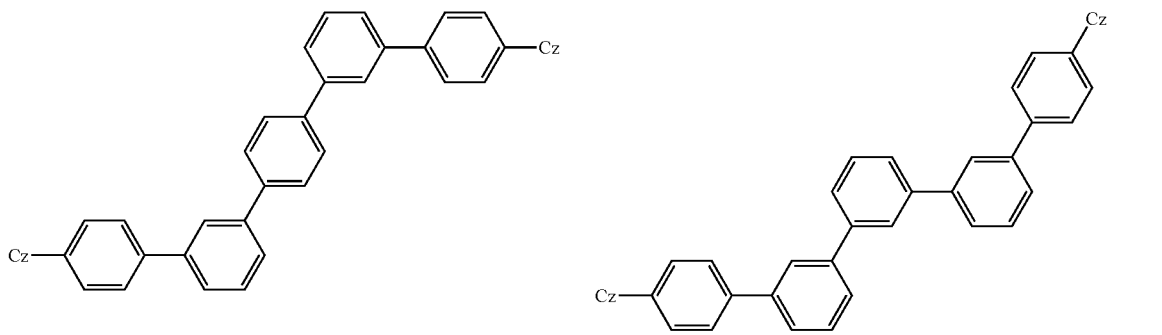

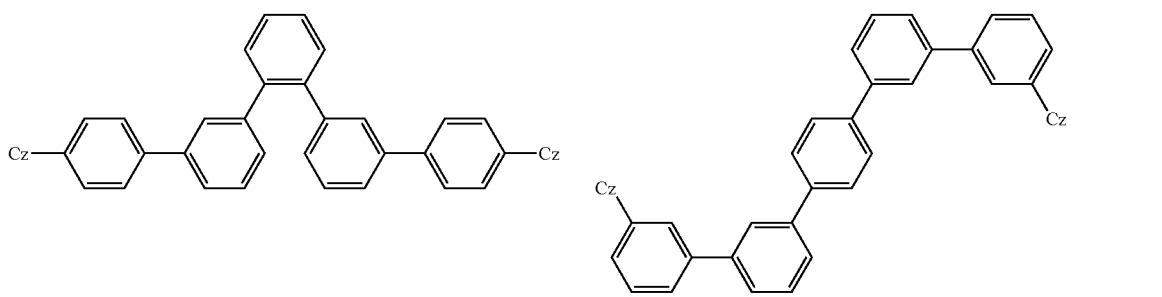

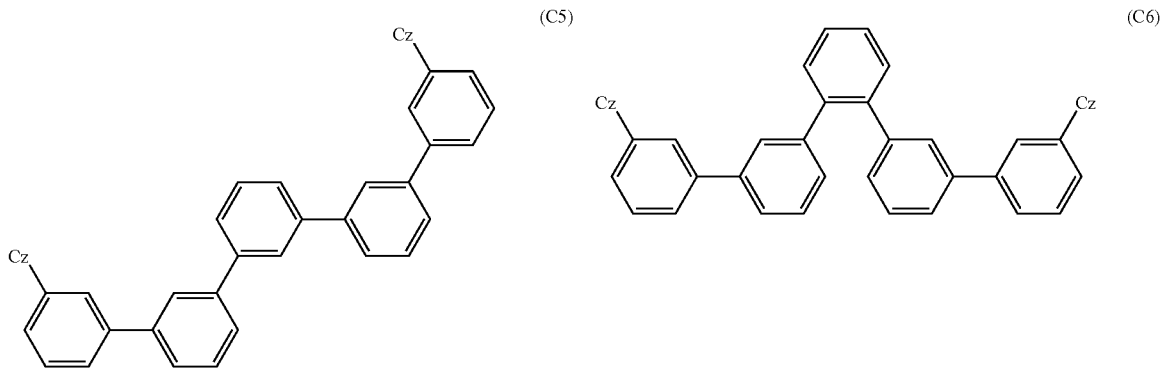

-continued
(C7)
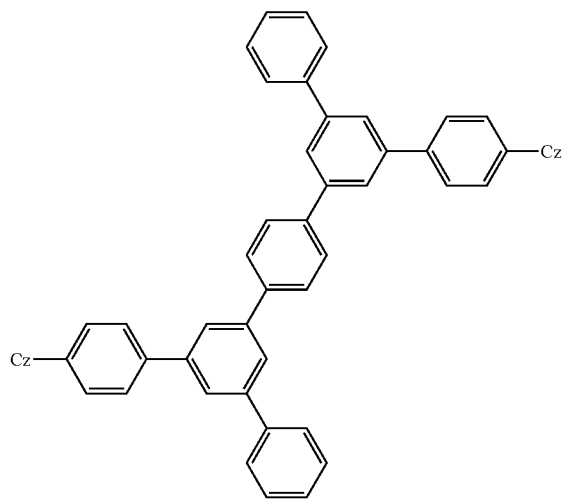
(C8)
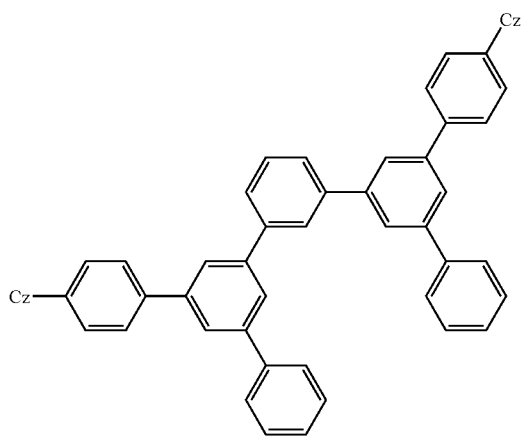
(C9)
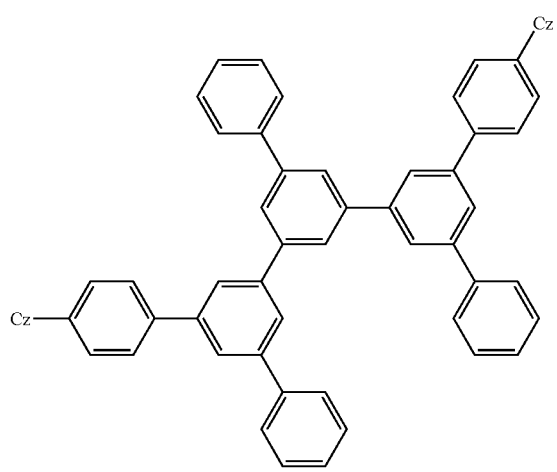
(C10)
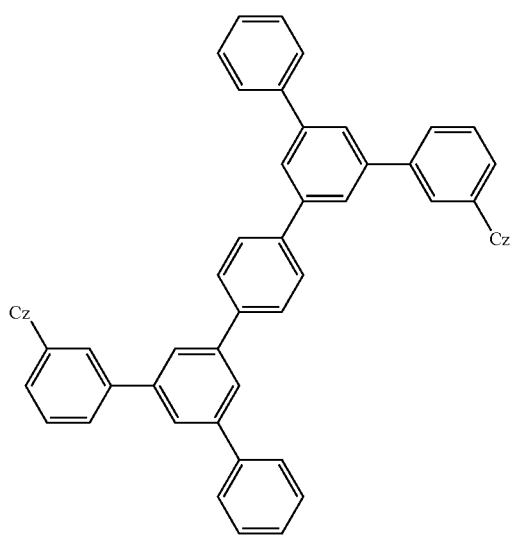
(C11)
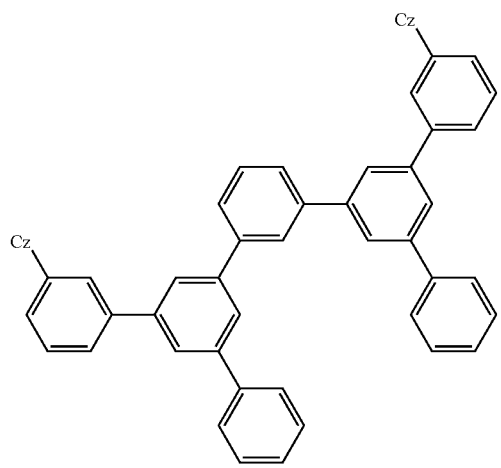
(C12)
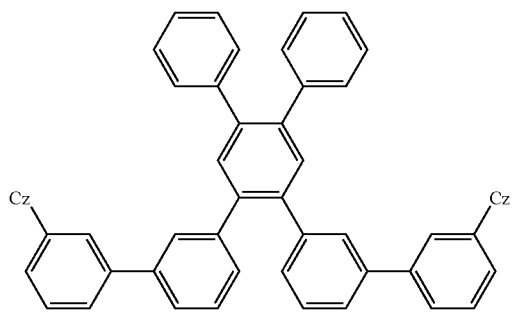

-continued
(C13)
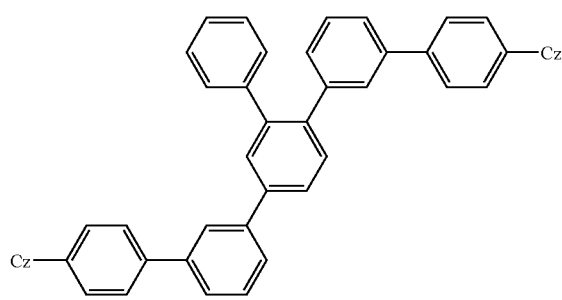
(C14)
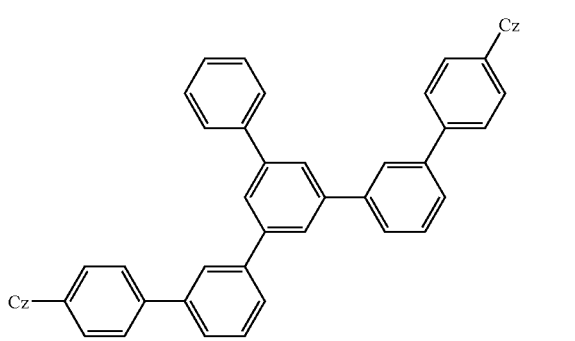
(C15)
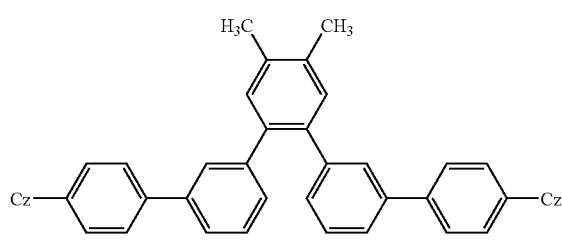
(C16)
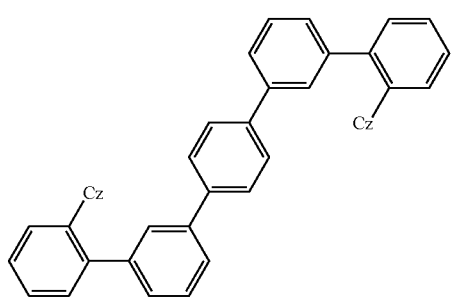
(C17)
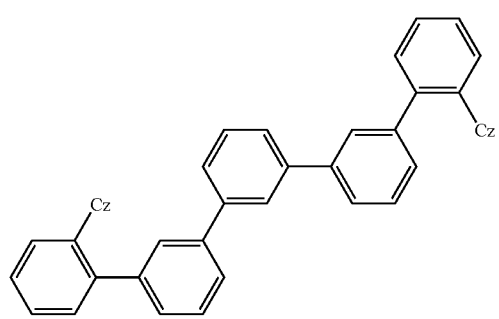
(C18)
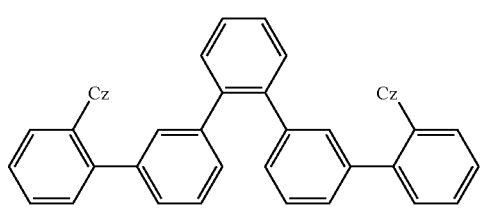
(C19)
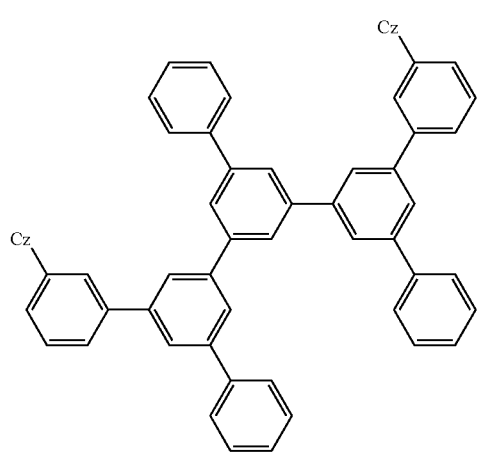
(C20)
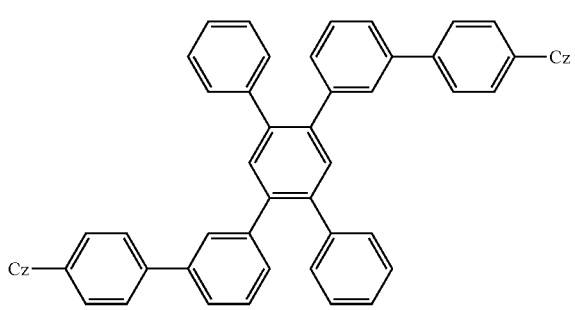

-continued
(C21) 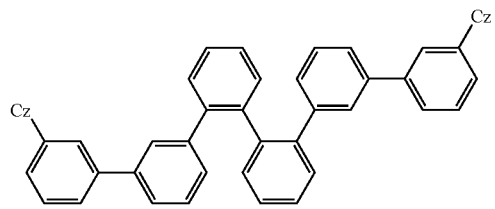
(C22) 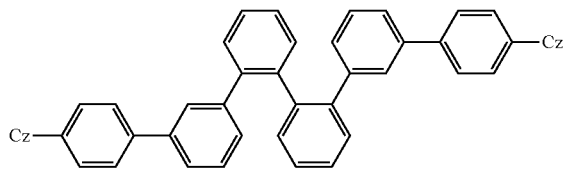
(C23) 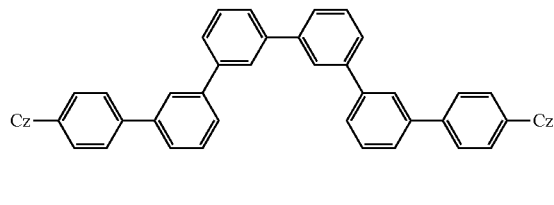
(C24) 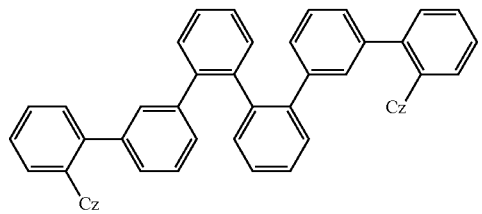
(C25) 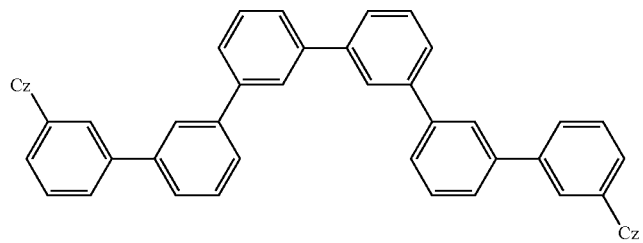
[Chemical Formula 19]
(C26) 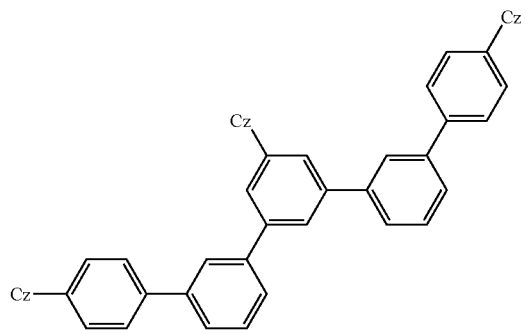
(C27) 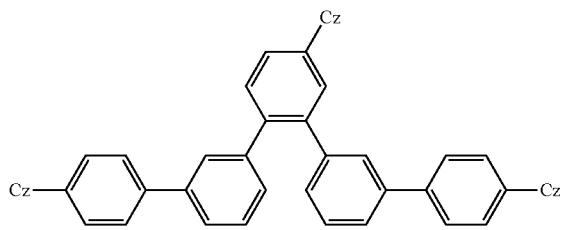
(C28) 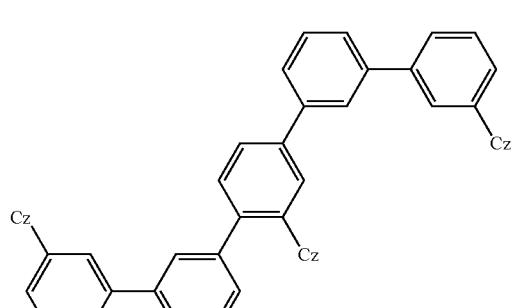
(C29) 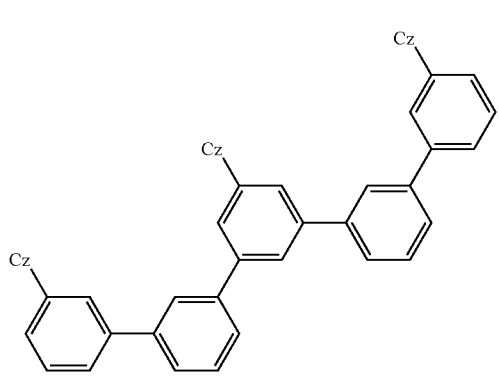

-continued
(C30)
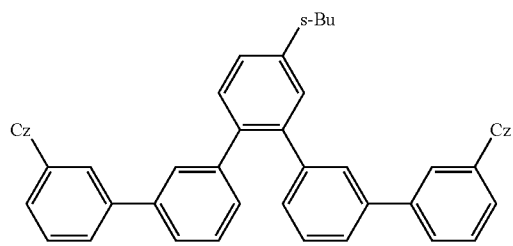
(C31)
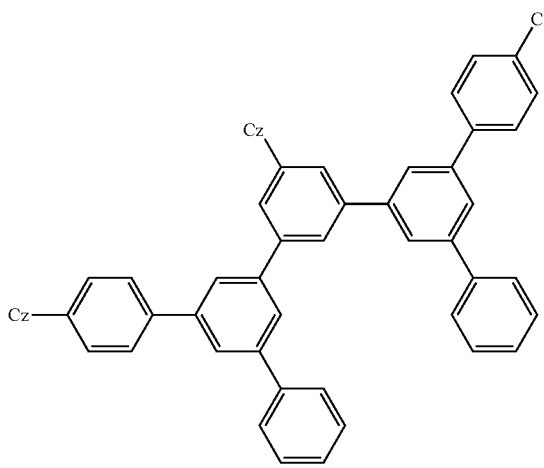
(C32)
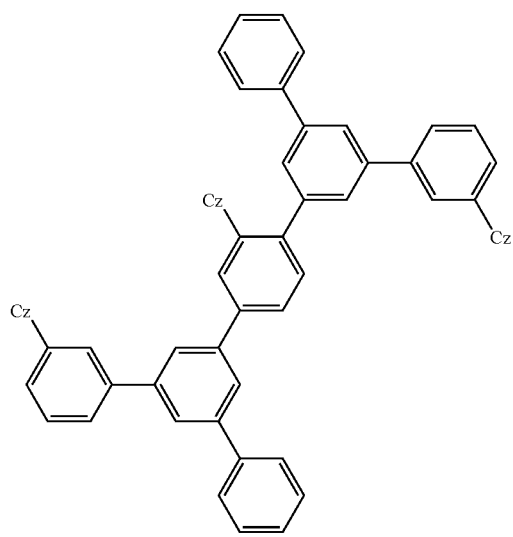
(C33)
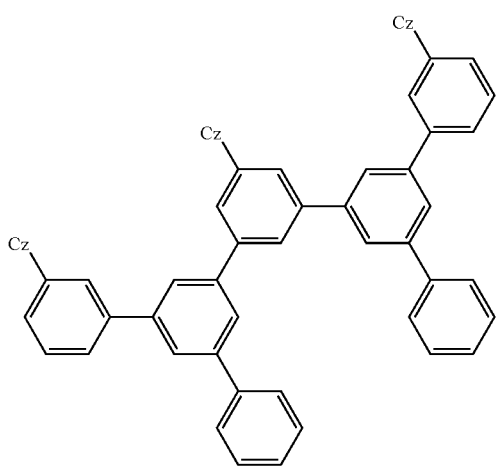
(C34)
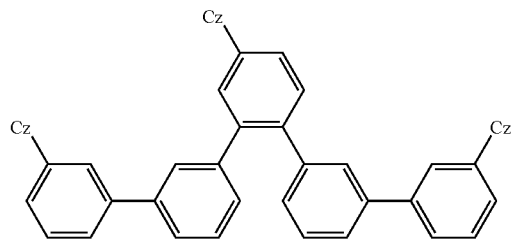
(C35)
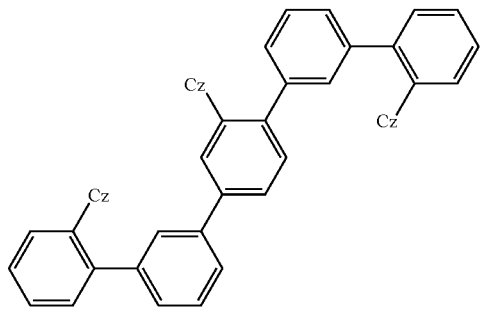
(C36)
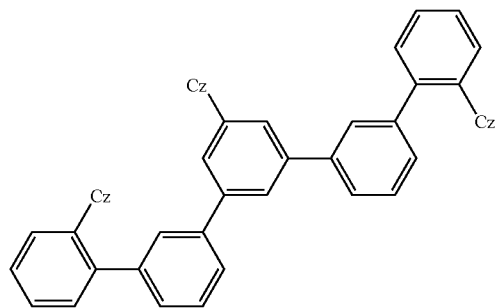
(C37)
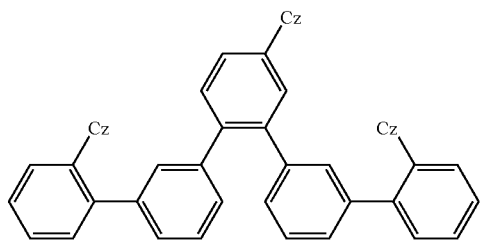

-continued
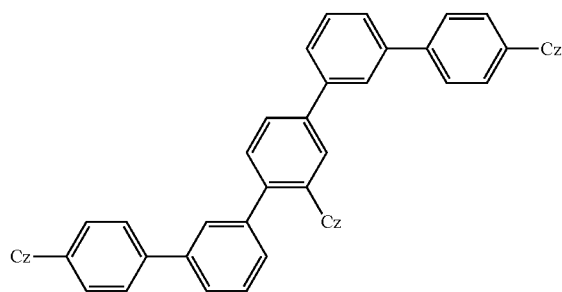
(C38)
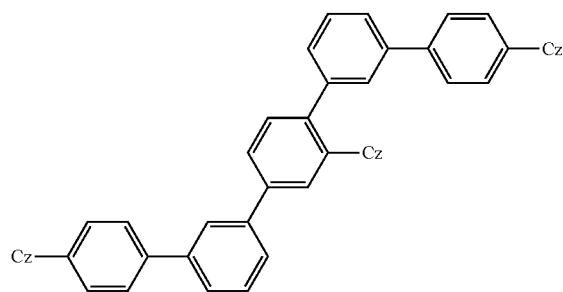
(C39)
[Chemical Formula 20]
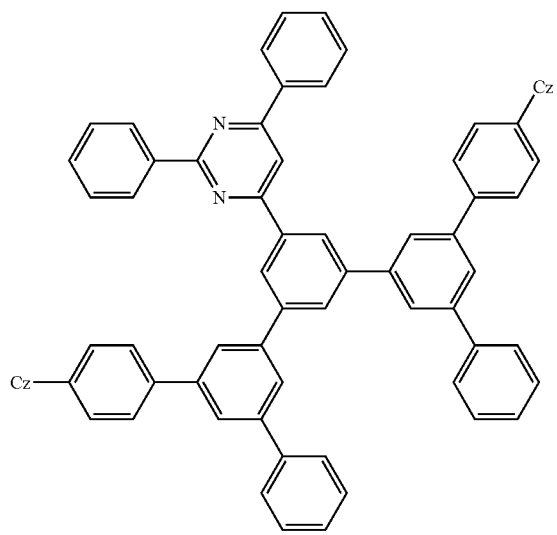
(C40)
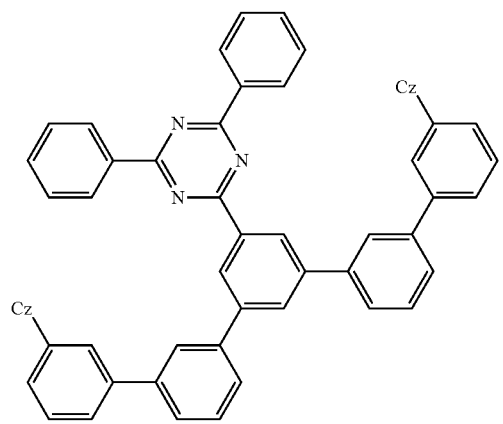
(C41)
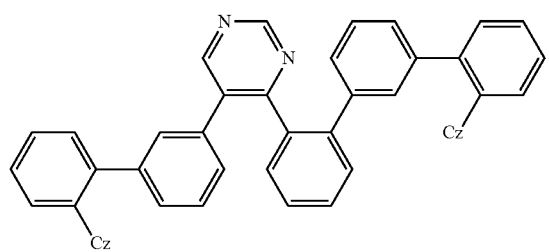
(C42)
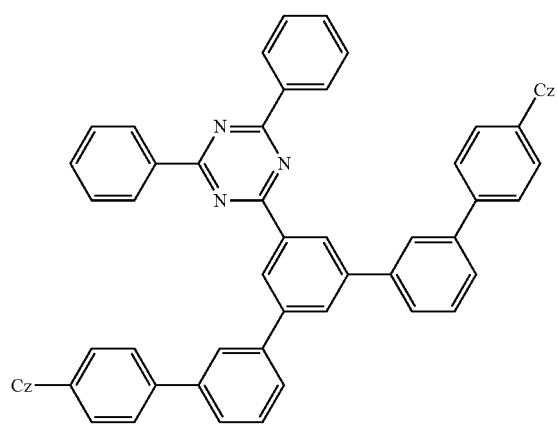
(C43)

-continued
(C44)
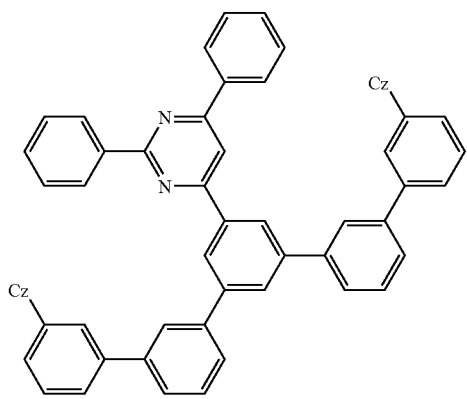
(C45)
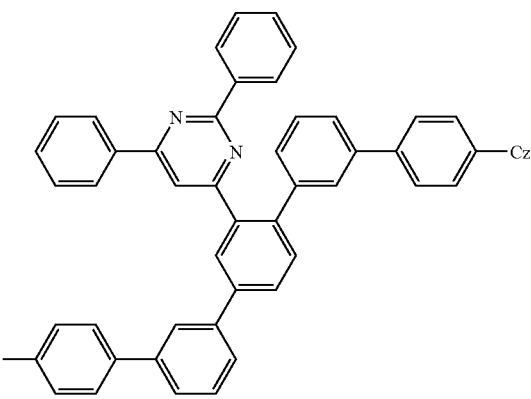
(C46)
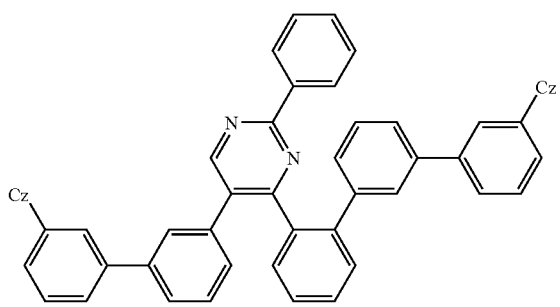
(C47)
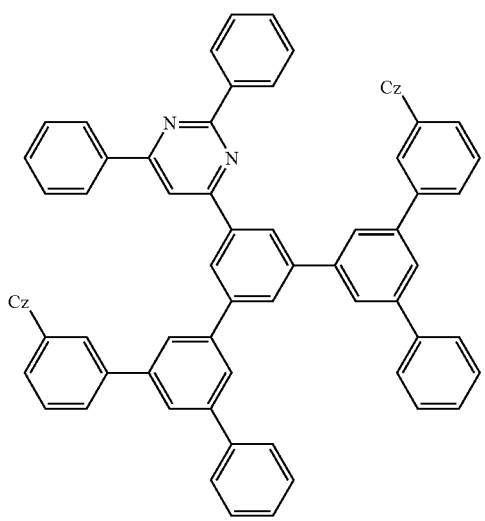
(C48)
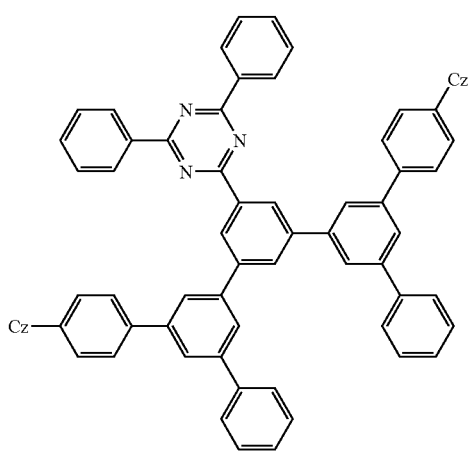
(C49)
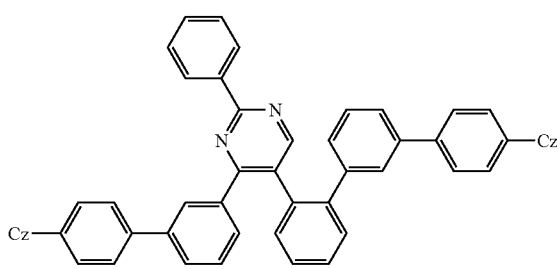

-continued
(C50)
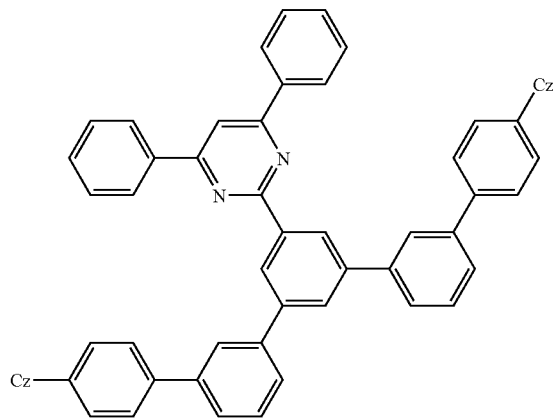
(C51)
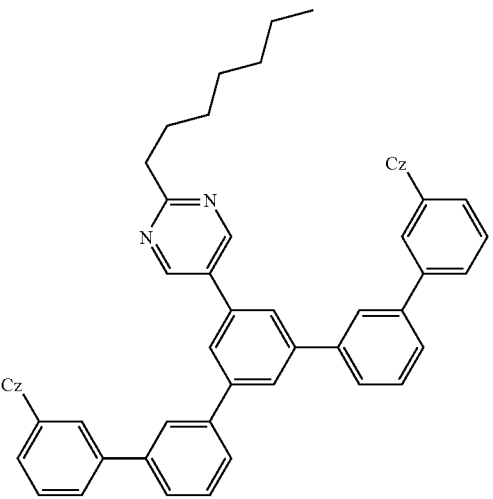
(C52)
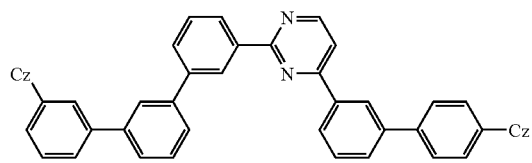
(C53)
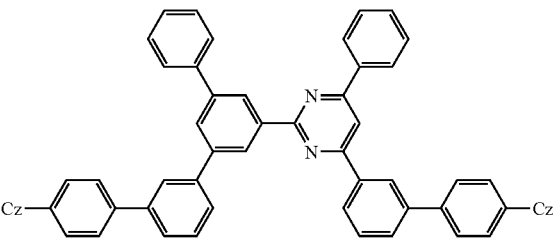
(C54)
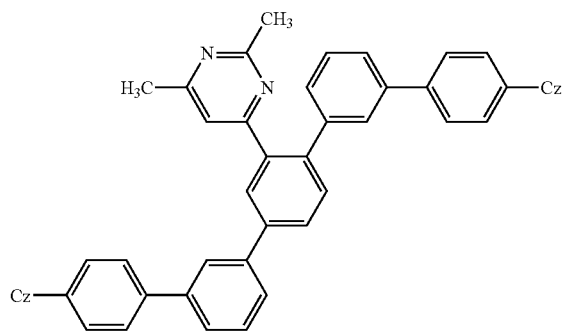
(C55)
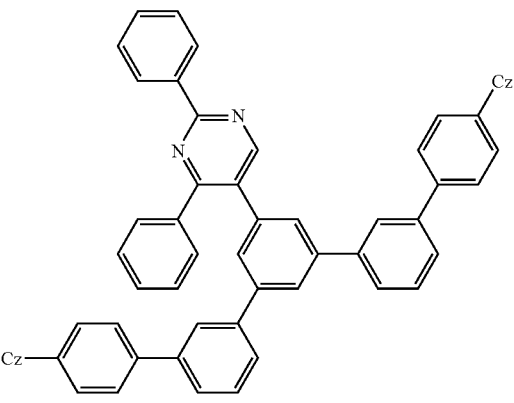
(C56)
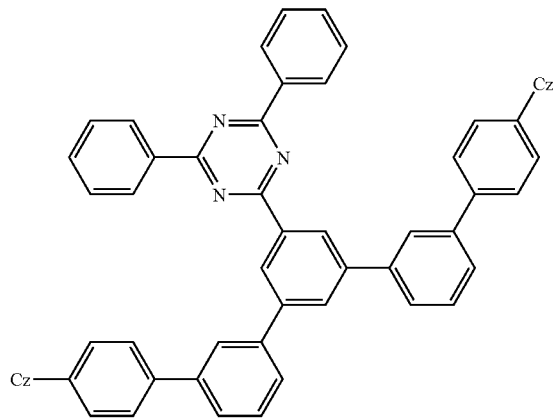
(C57)
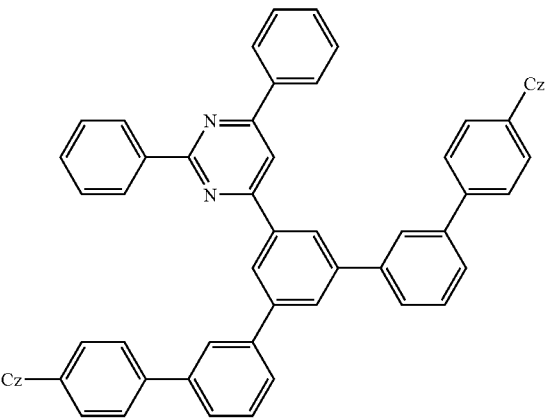

-continued
(C58)
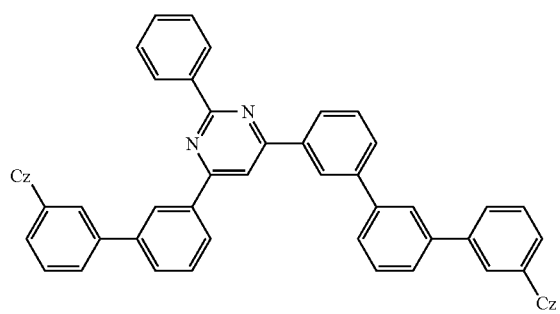
(C59)
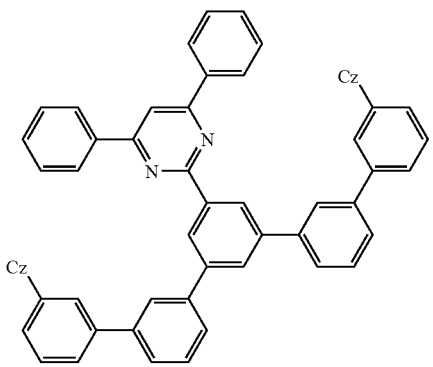
(C60)
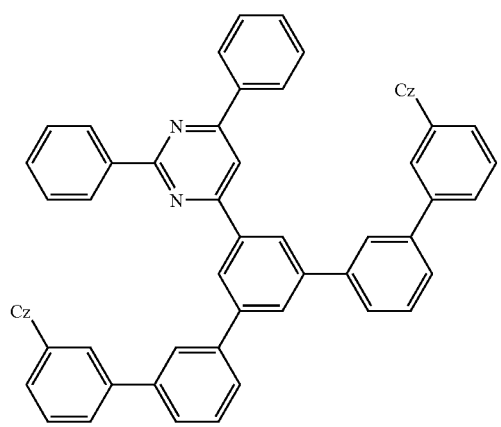
(C61)
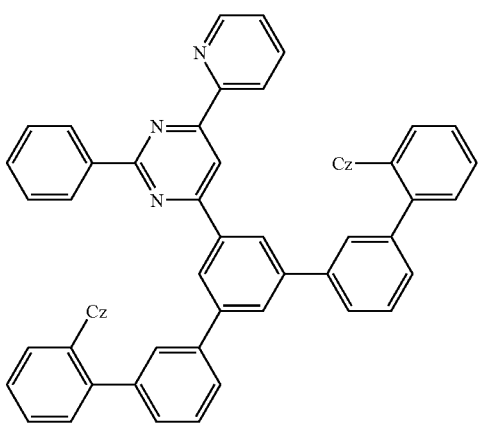
(C62)
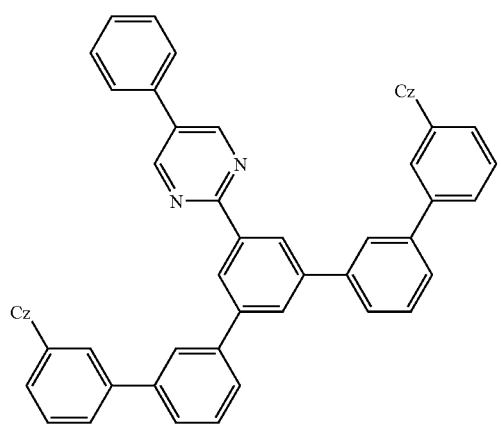
(C63)
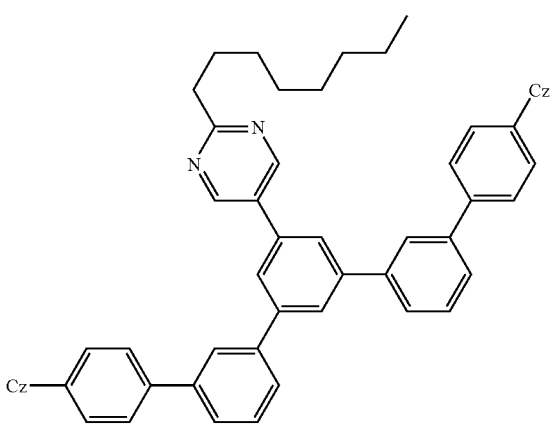

(C64)
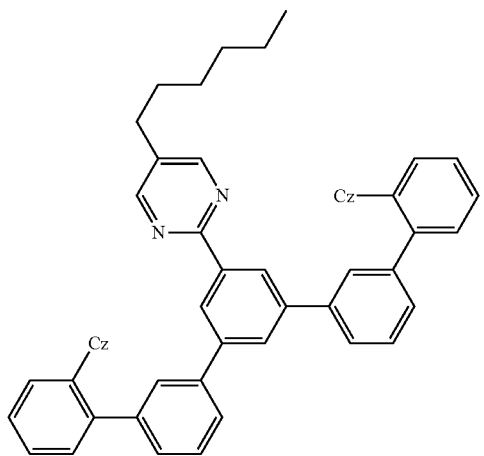
[Chemical Formula 21]
(C65)
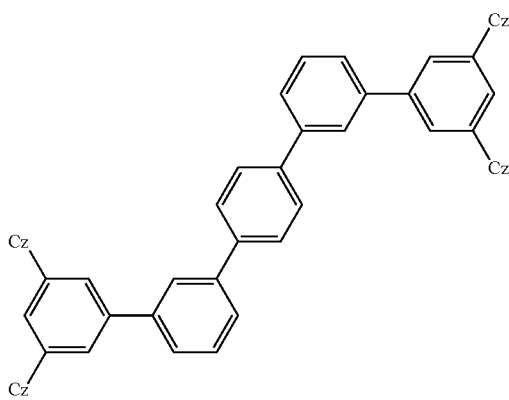
(C66)
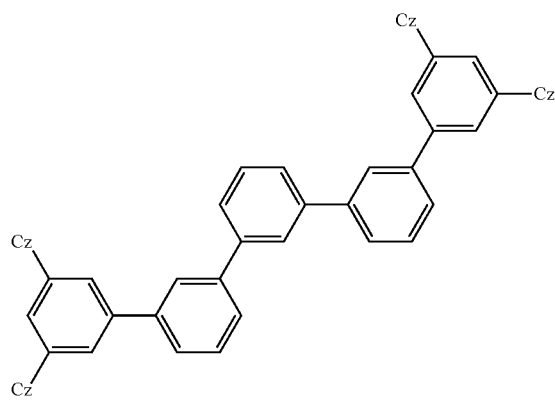
(C67)
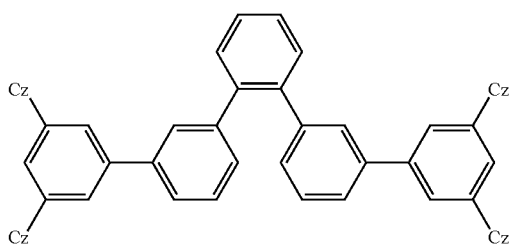
(C68)
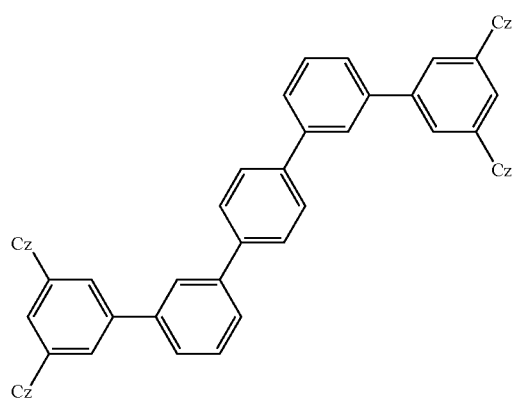

-continued
(C69)
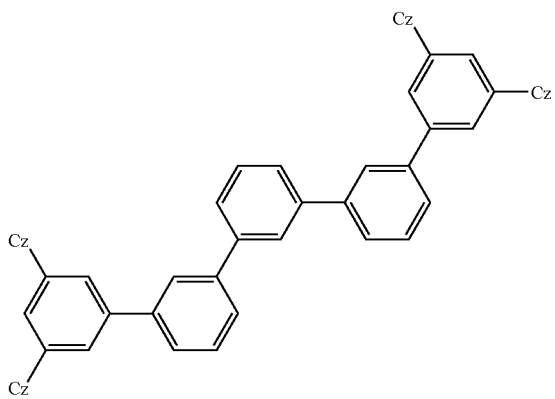
(C70)
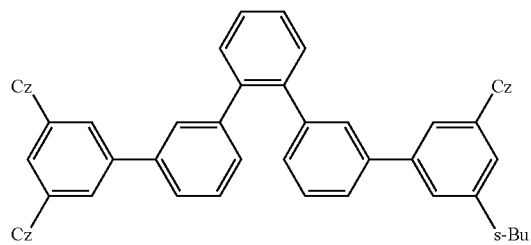
(C71)
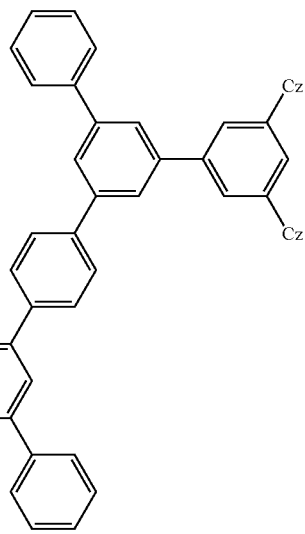
(C72)
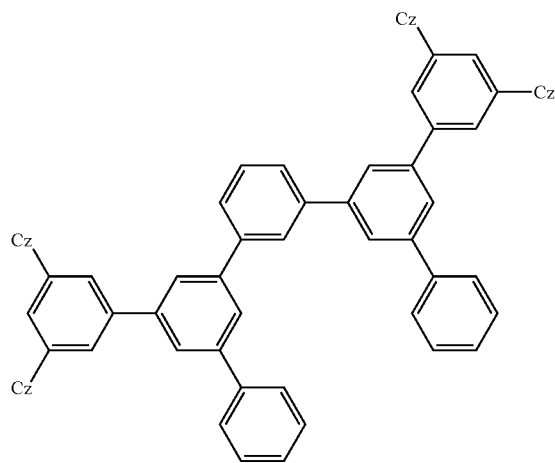
(C73)
(C74)
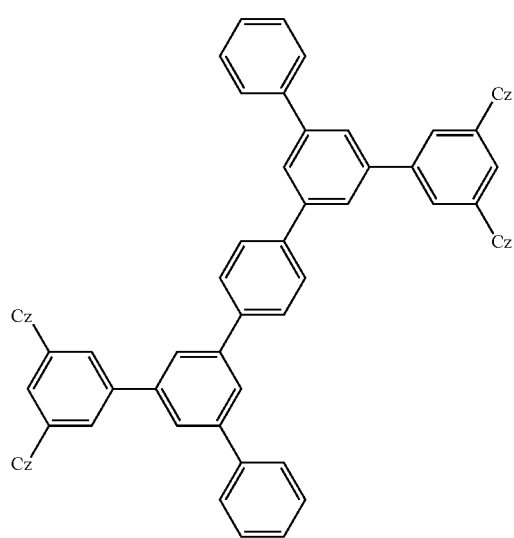

-continued
(C75)
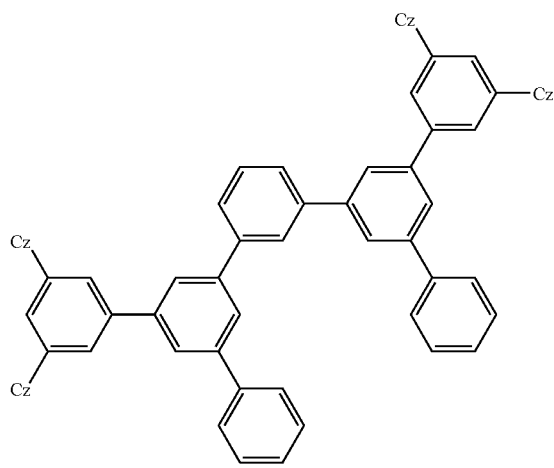
(C76)
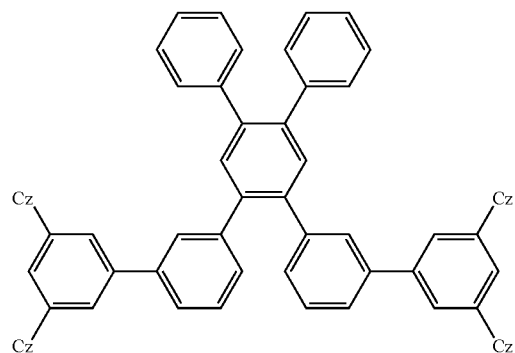
(C77)
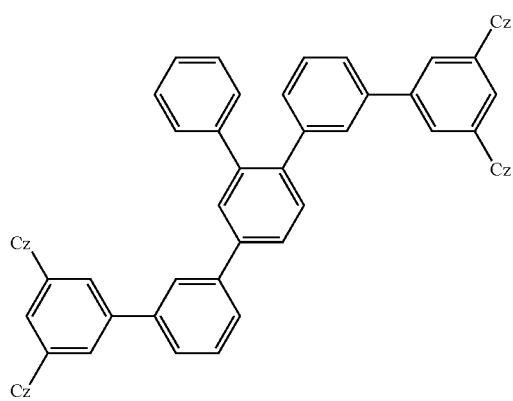
(C78)
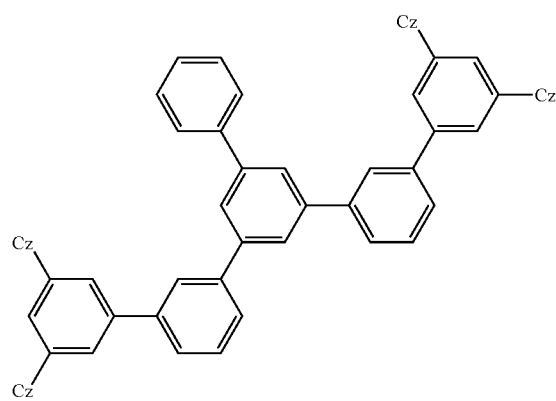
(C79)
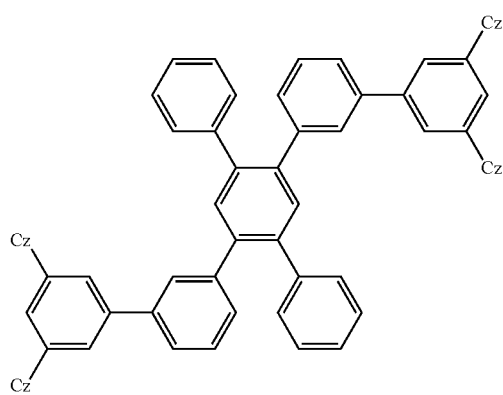
(C80)
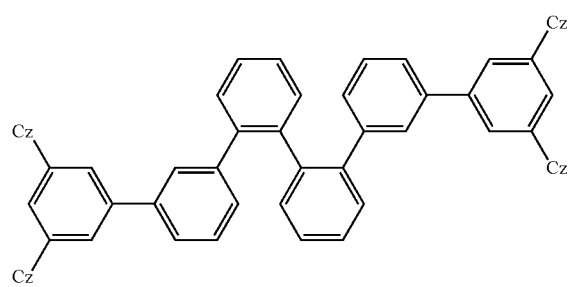

(C81) 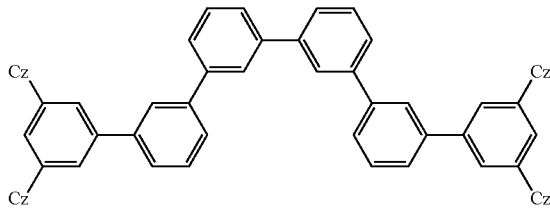
(C82) 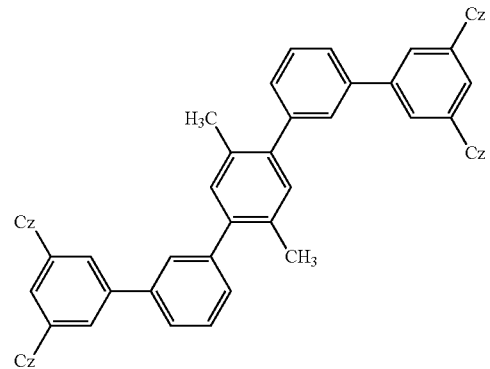
(C83) 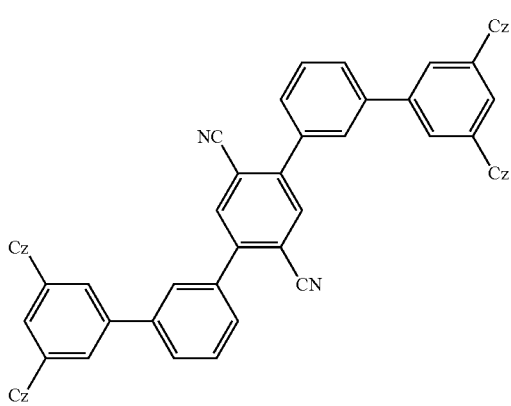
(C84) 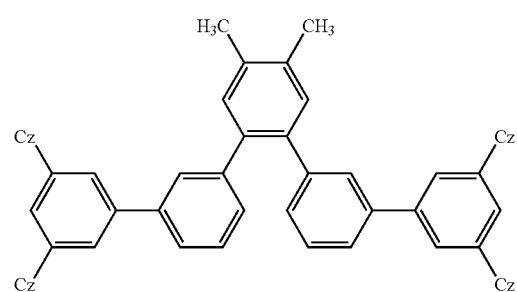
[Chemical Formula 22]
(C85) 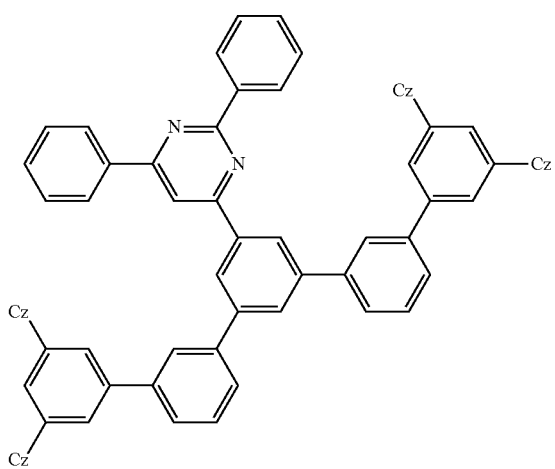
(C86) 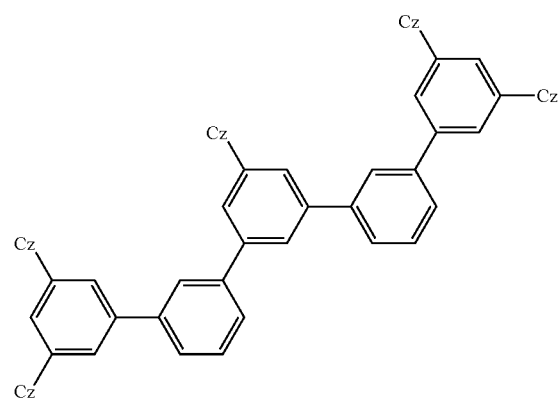

-continued
(C87)
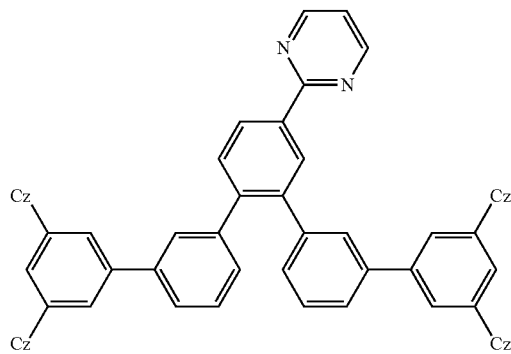
(C88)
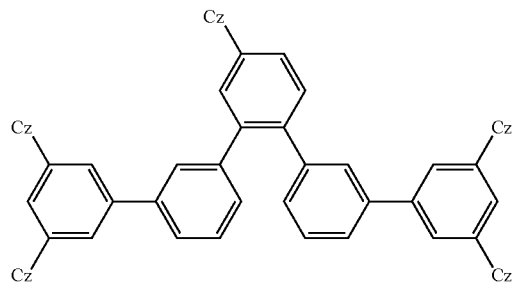
(C89)
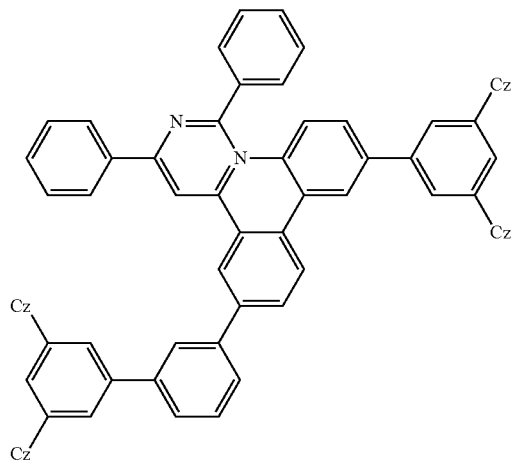
(C90)
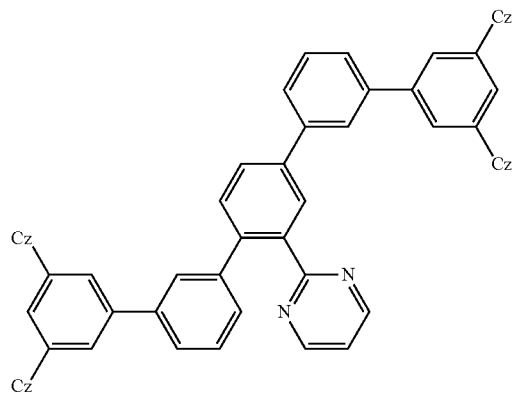
(C91)
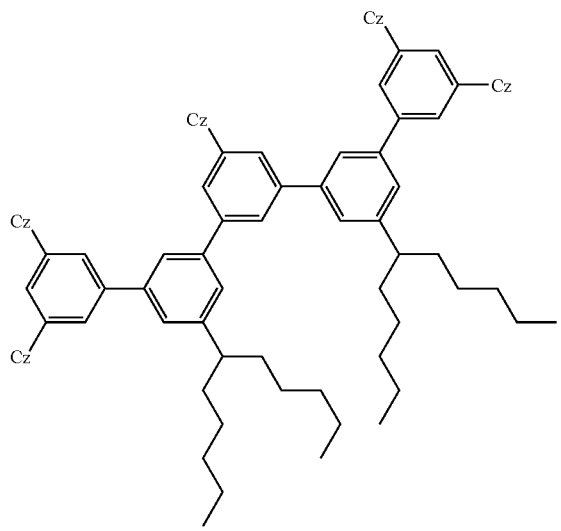
(C92)
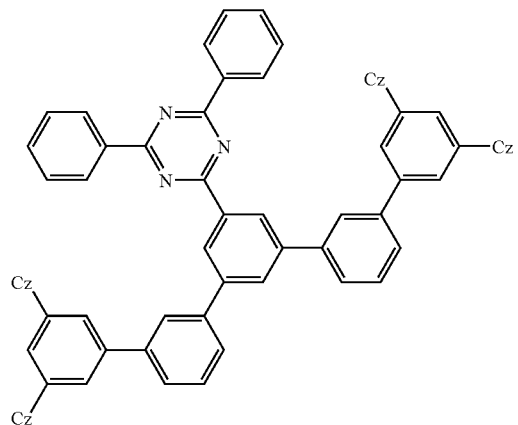

-continued
(C93)
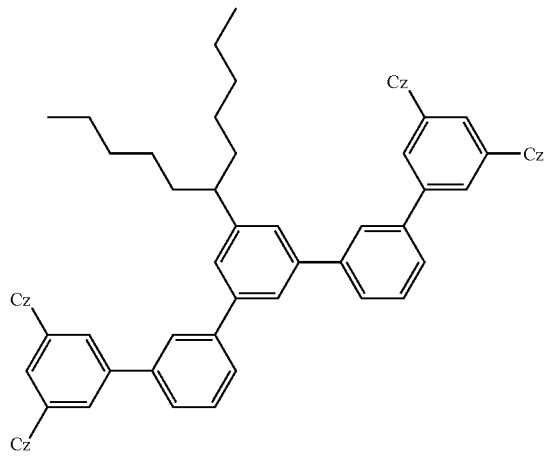
(C94)
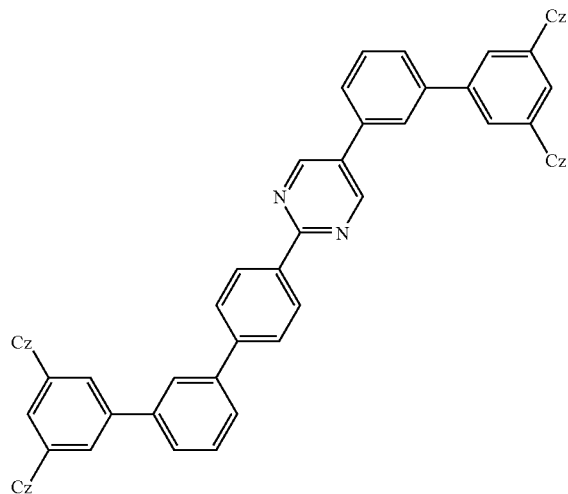
(C95)
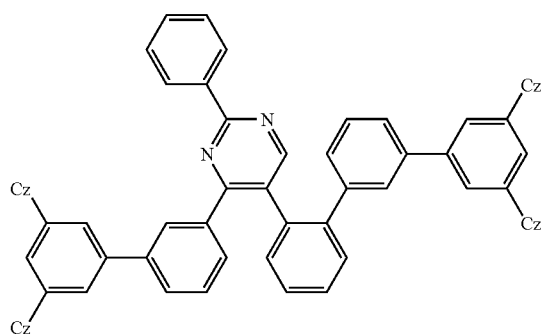
(C96)
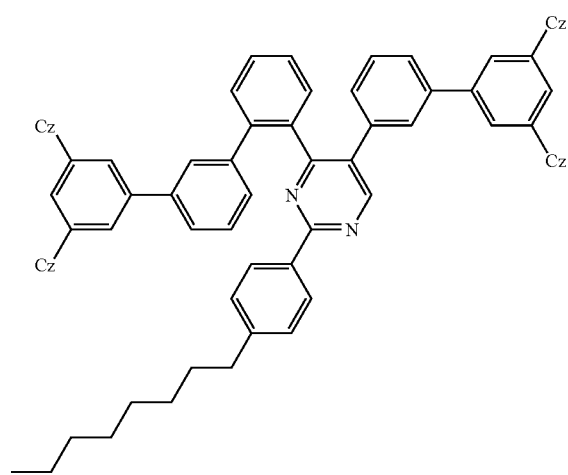
(C97)
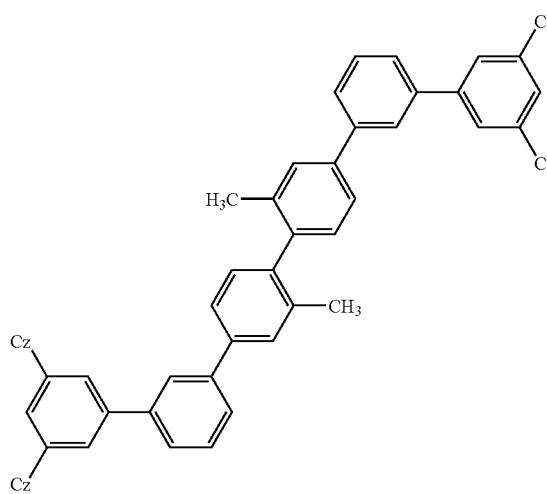
(C98)
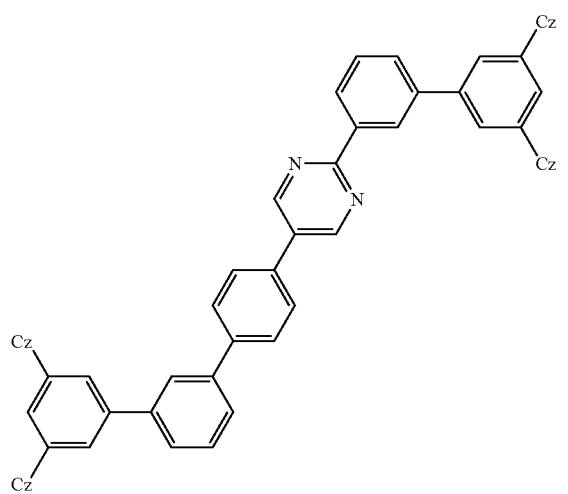

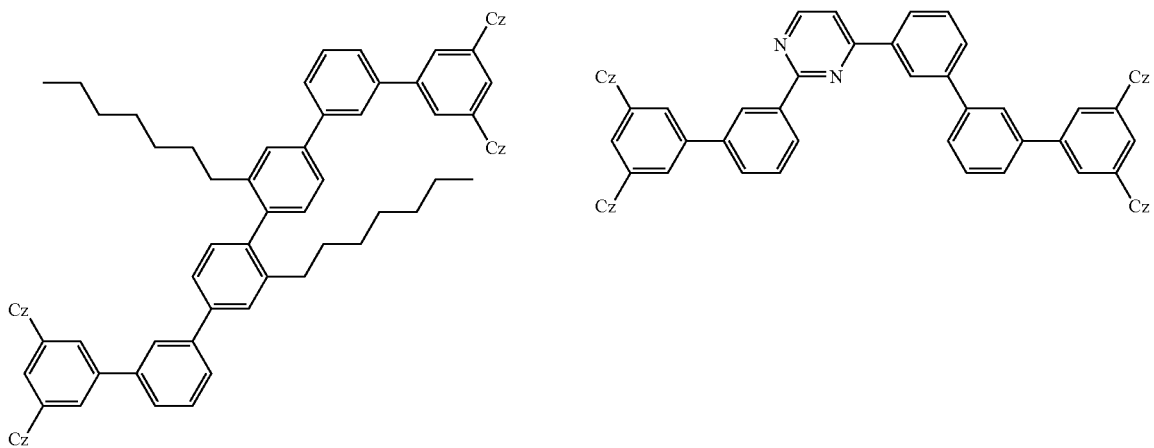
(C99)
(C100)
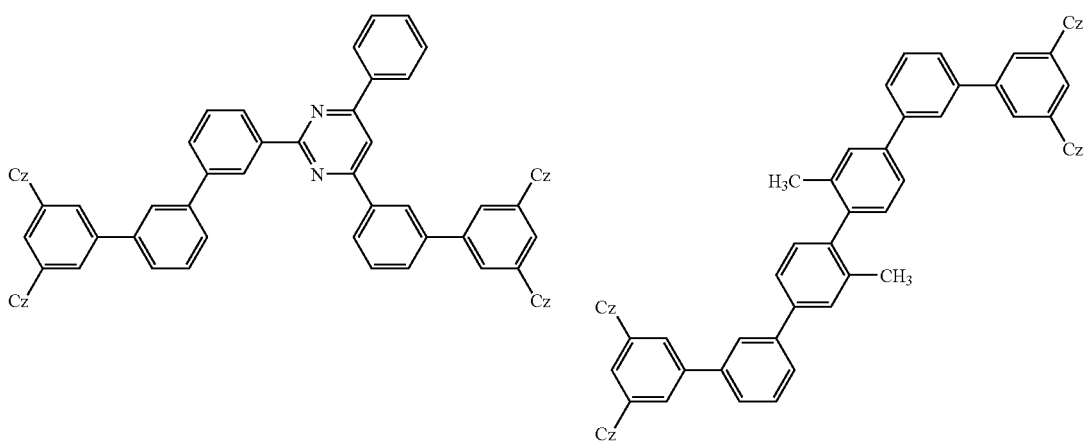
(C101)
(C102)
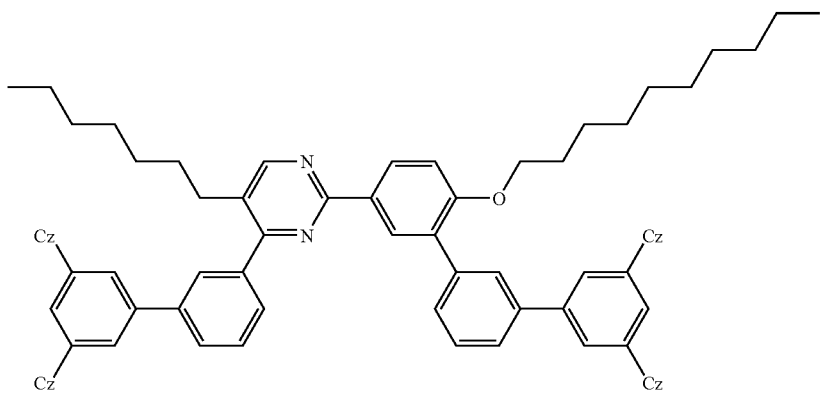
(C103)

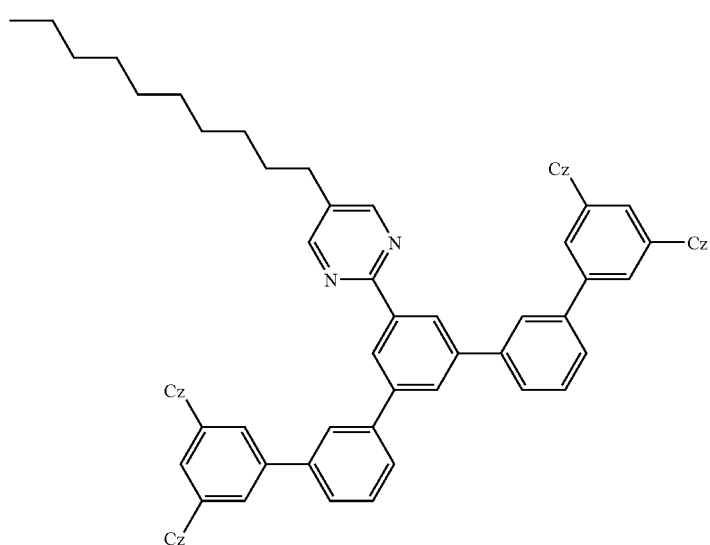
(C104)
[Chemical Formula 23]
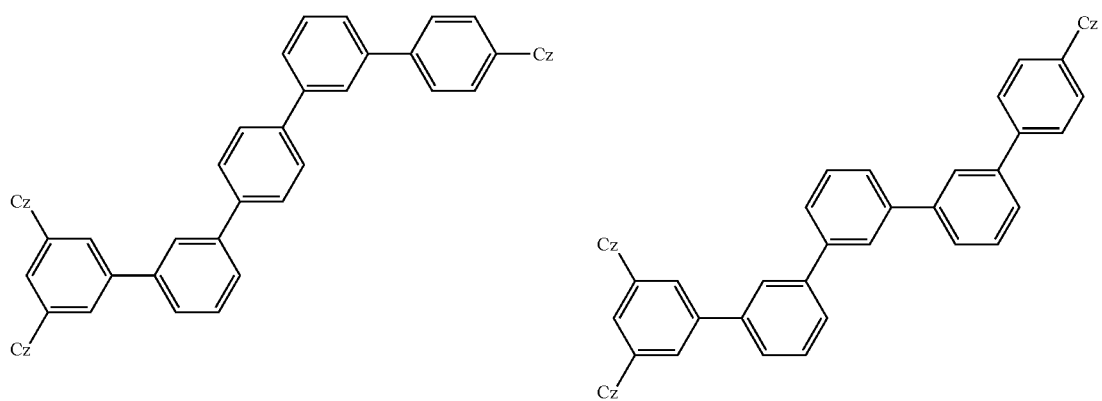
(C105)  (C106)
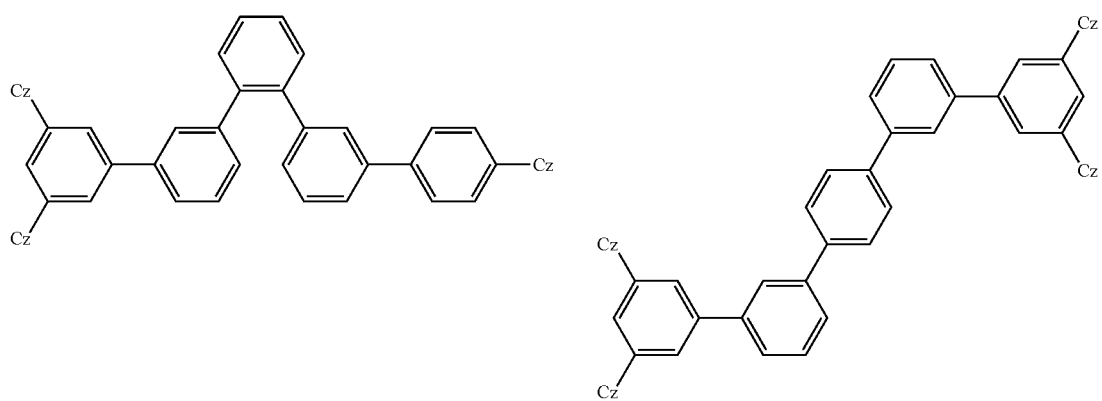
(C107)  (C108)

-continued
(C109)
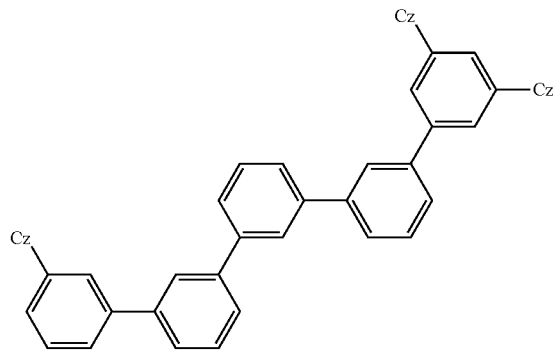
(C110)
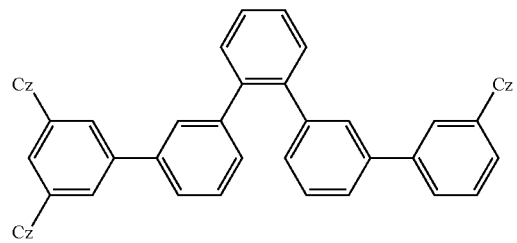
(C111)
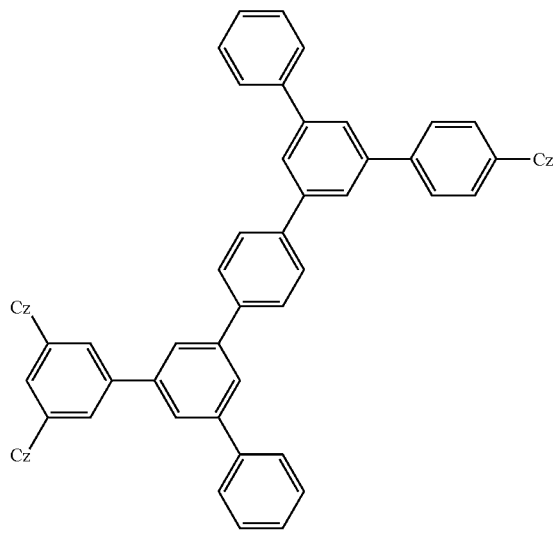
(C112)
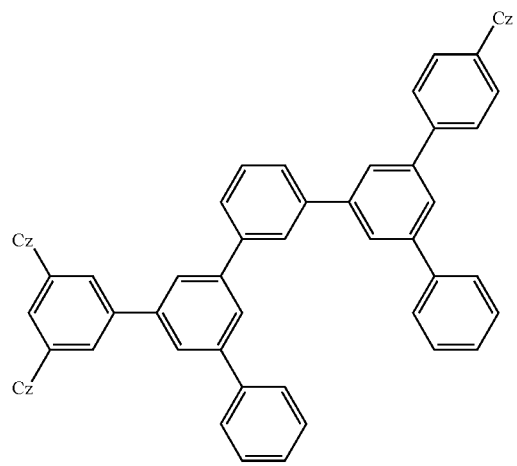
(C113)
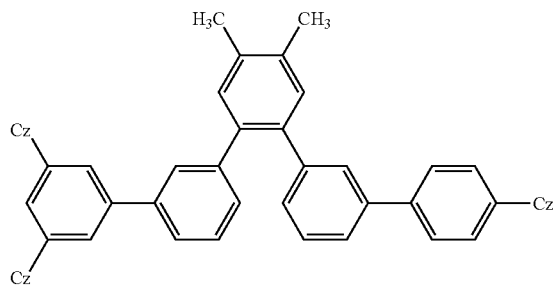
(C114)
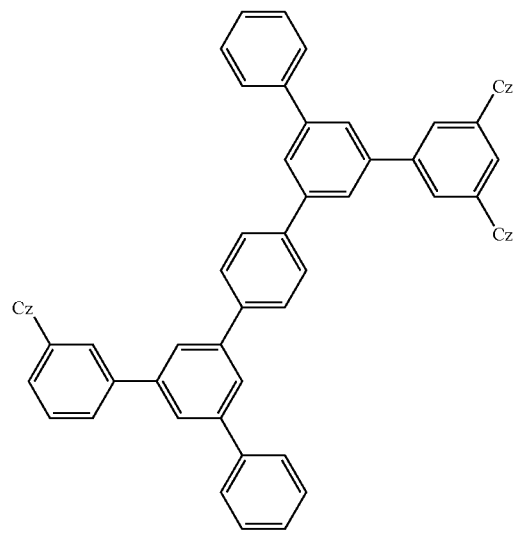

-continued
(C115)
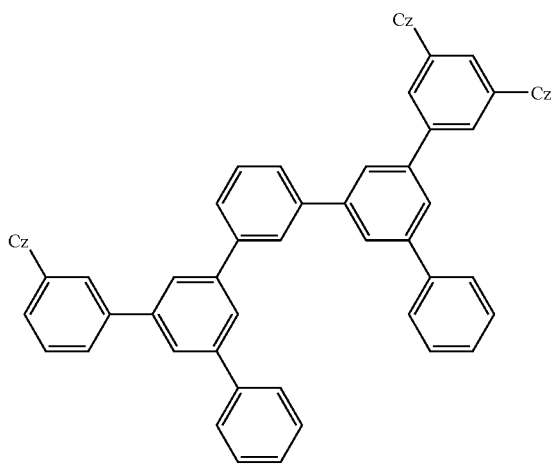
(C116)
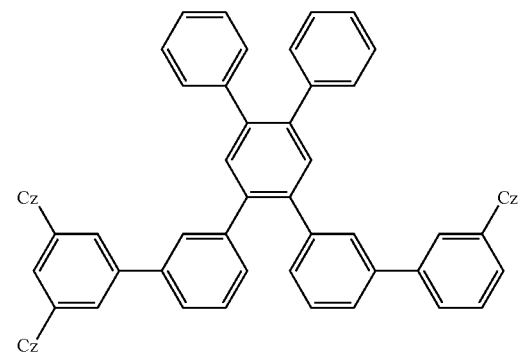
(C117)
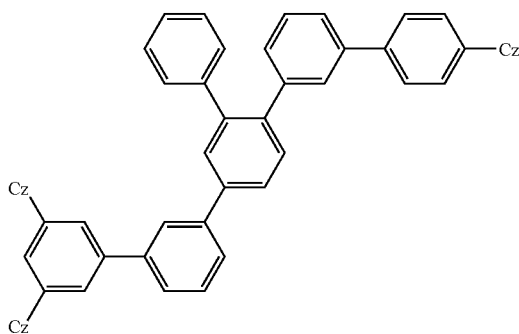
(C118)
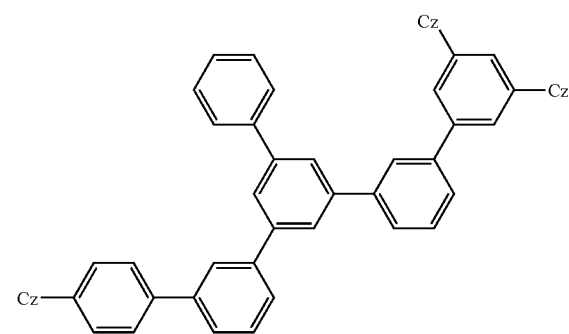
(C119)
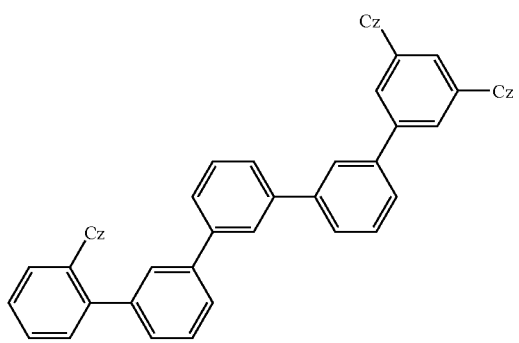
(C120)
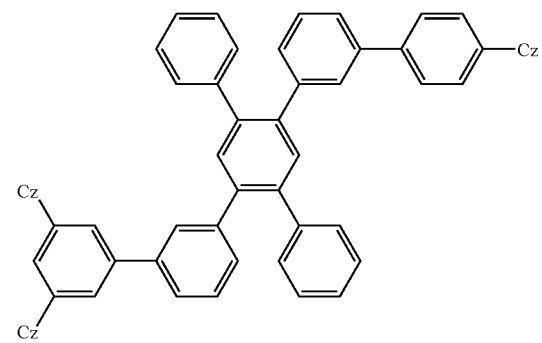
(C121)
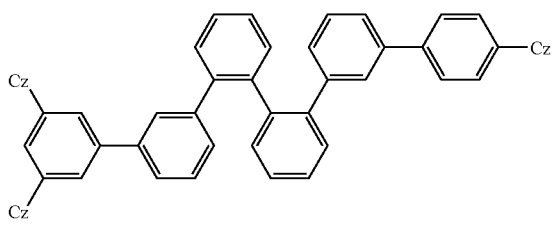
(C122)
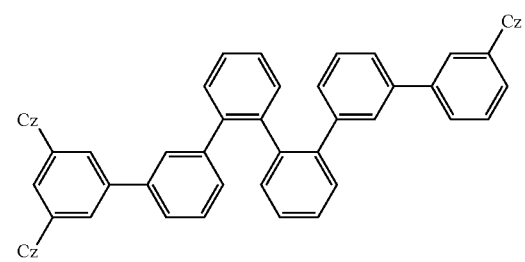

[Chemical Formula 24]
(C123) 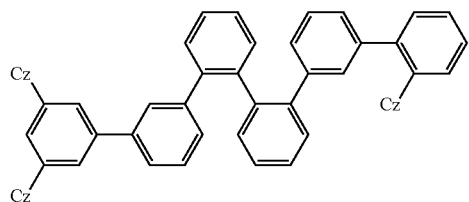
(C124) 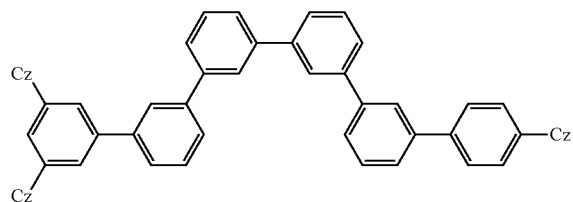
(C125) 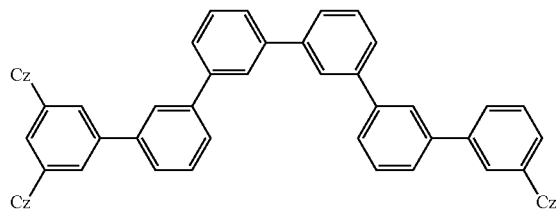
(C126) 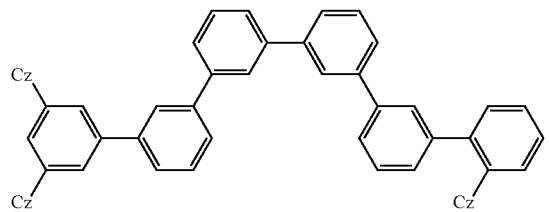
(C127) 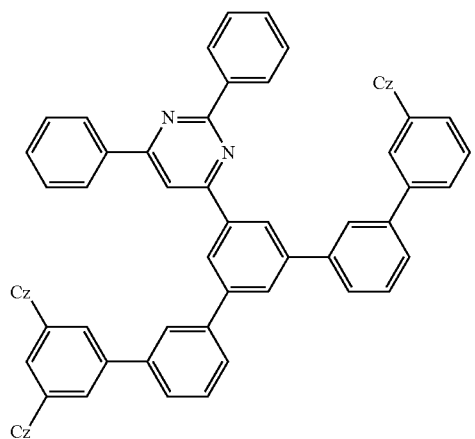
(C128) 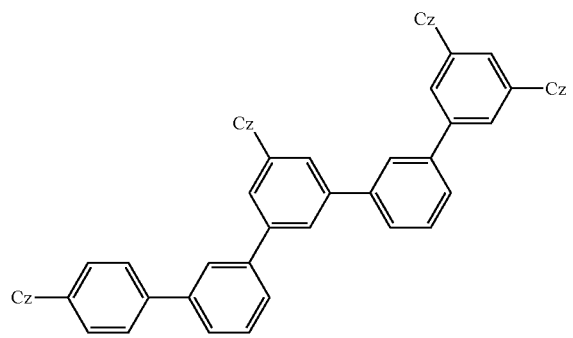
(C129) 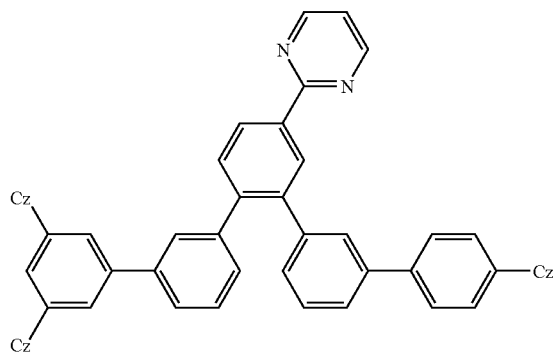
(C130) 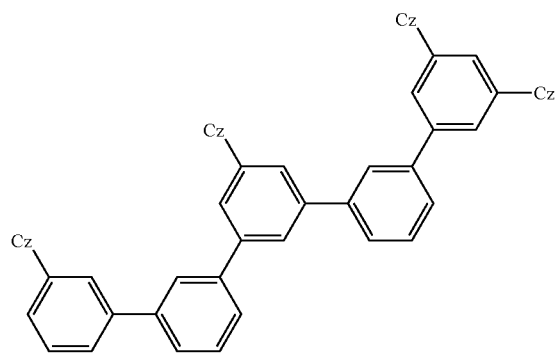

-continued
(C131)
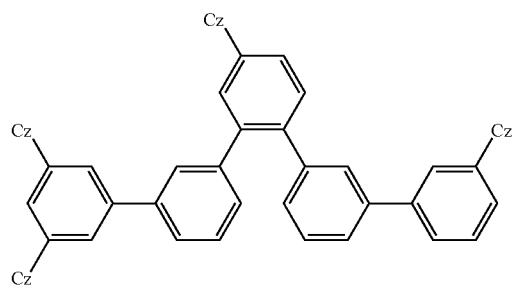
(C132)
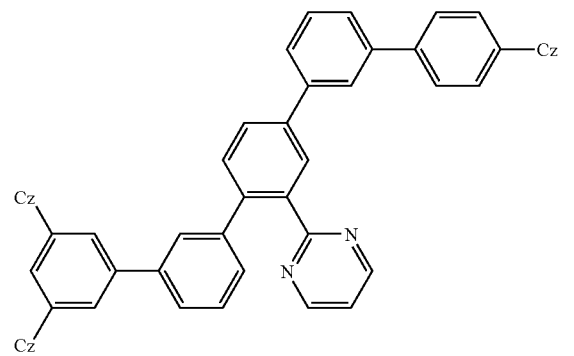
(C133)
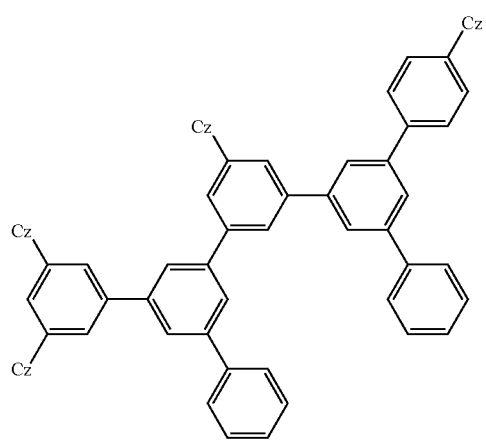
(C134)
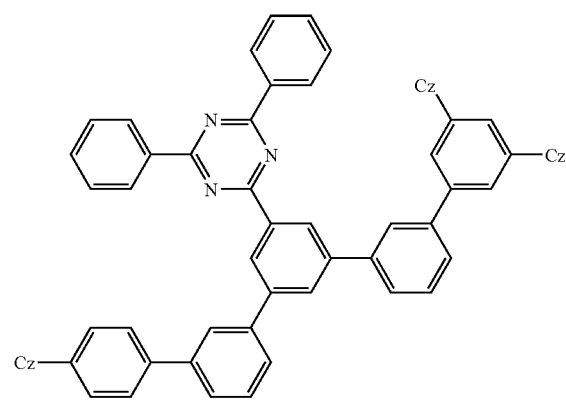
(C135)
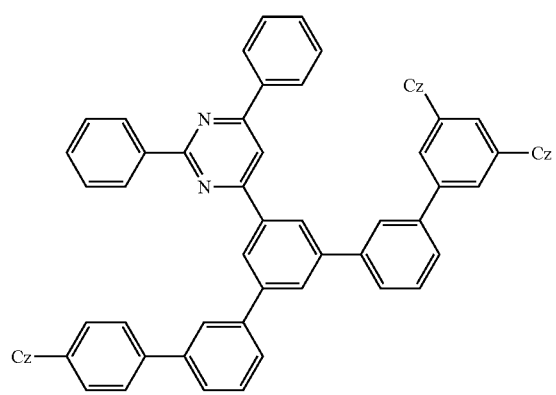
(C136)
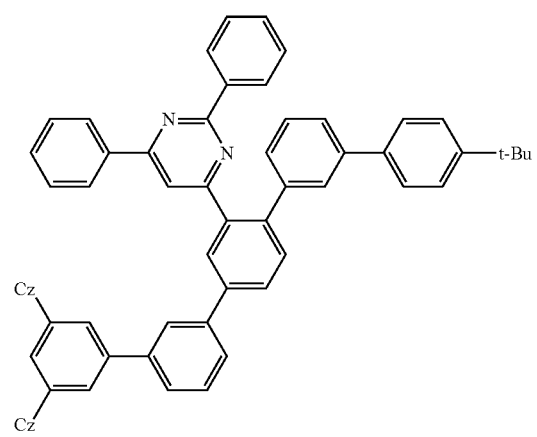

-continued
(C137)
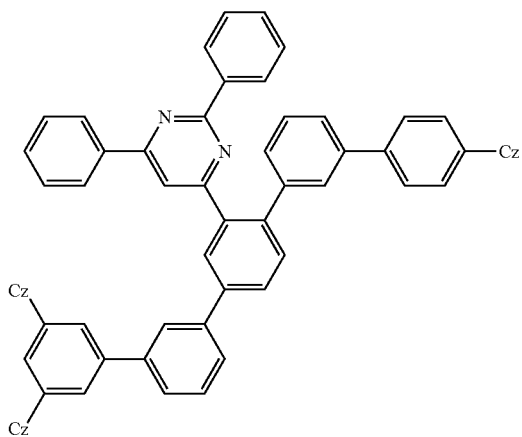
(C138)
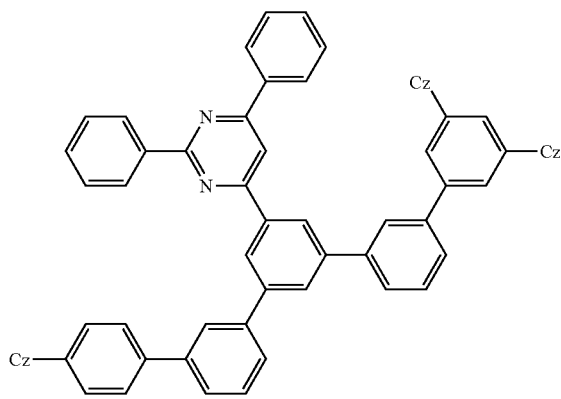
(C139)
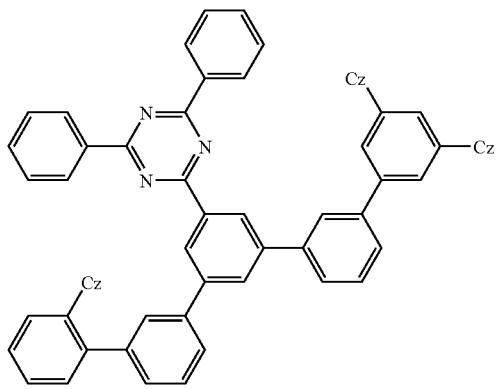
(C140)
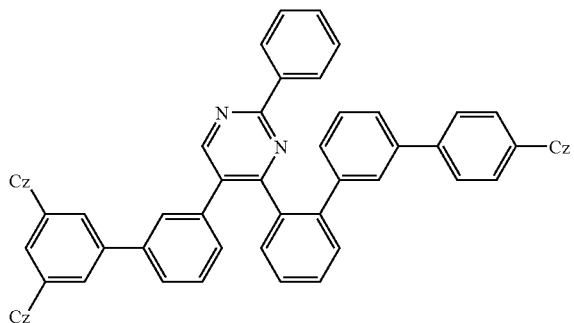
(C141)
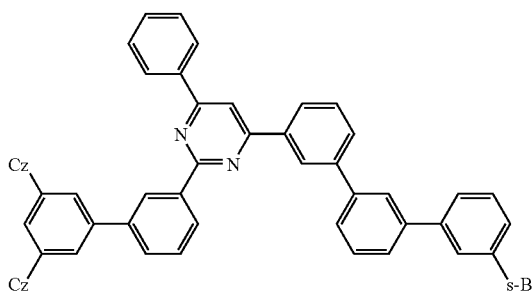
(C142)
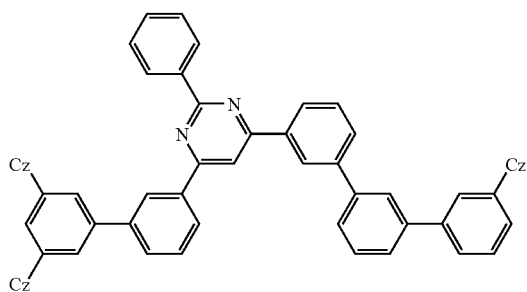
(C143)
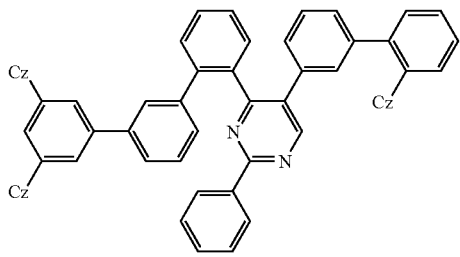
(C144)
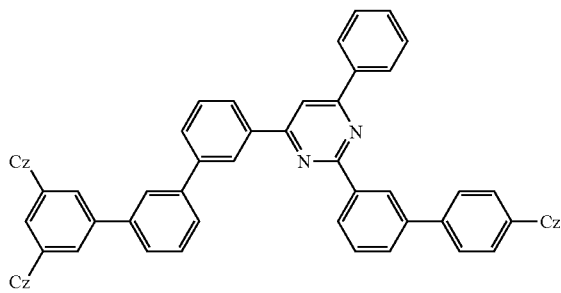

-continued
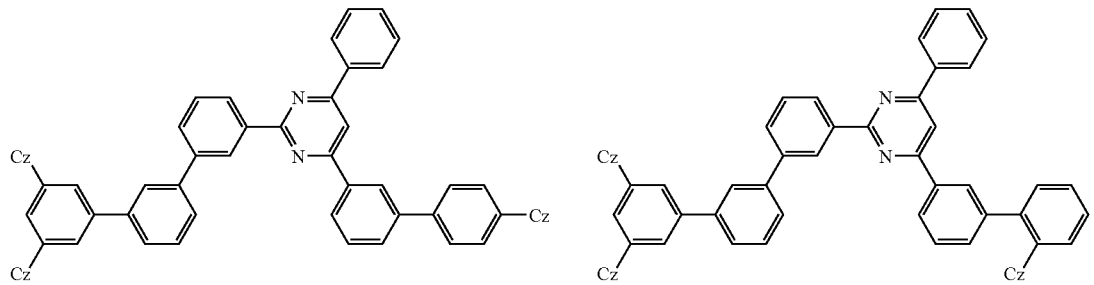
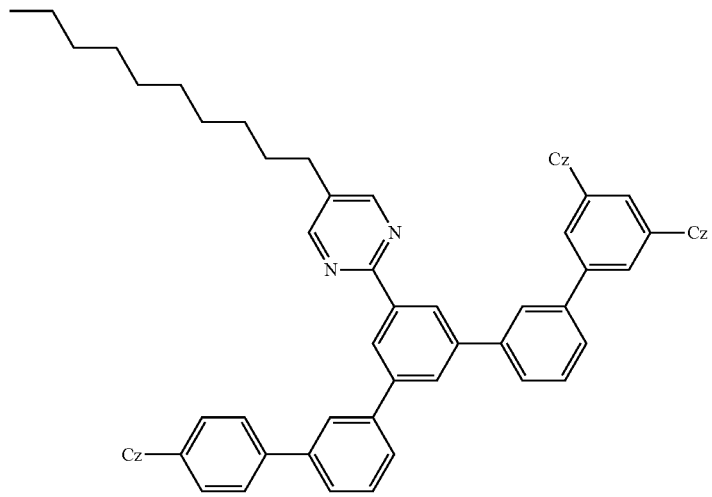
[Chemical Formula 25]
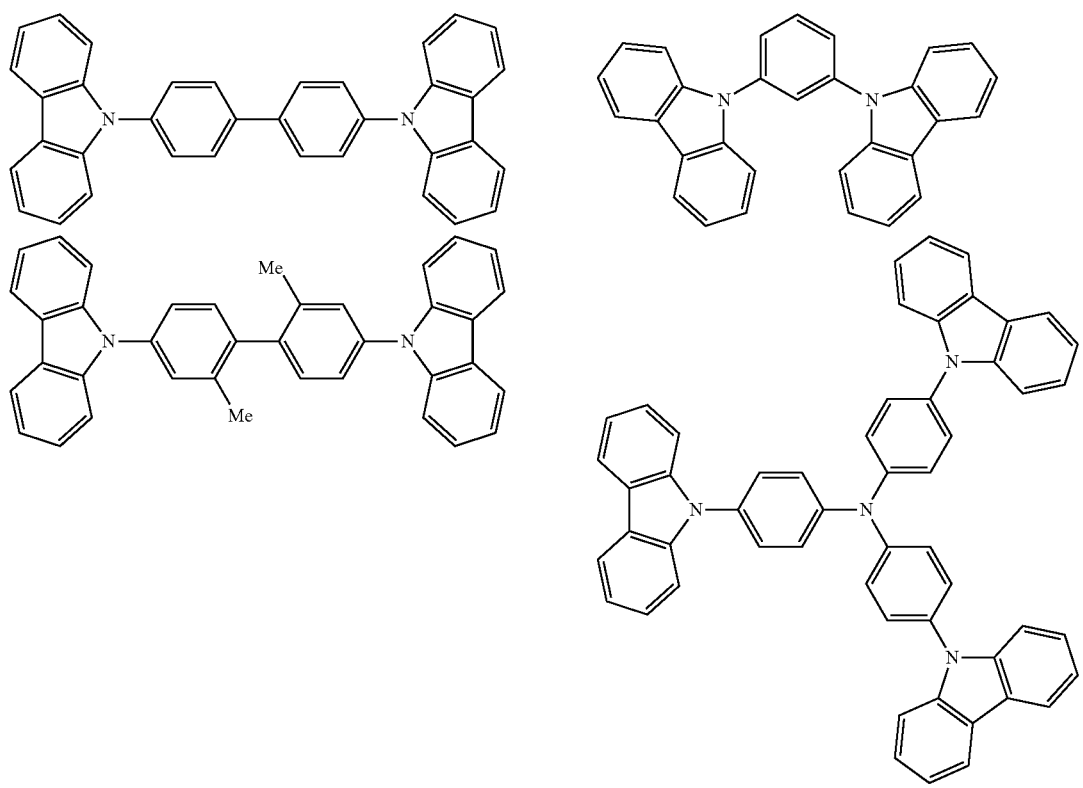

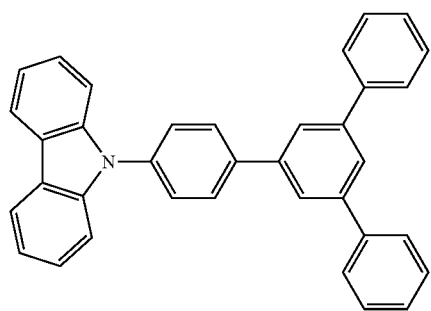
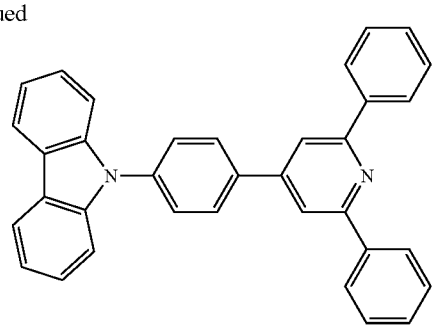
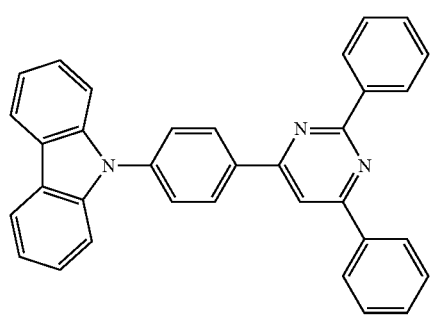
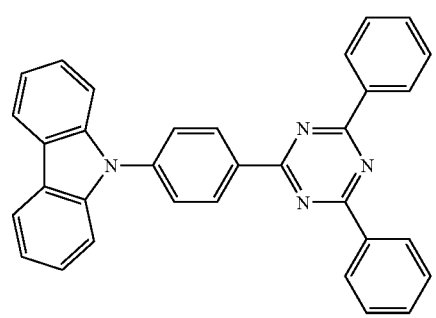
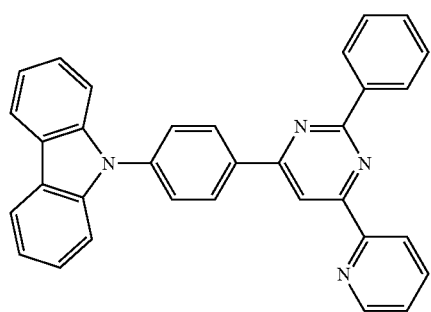
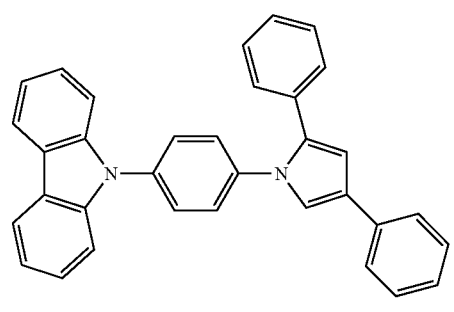
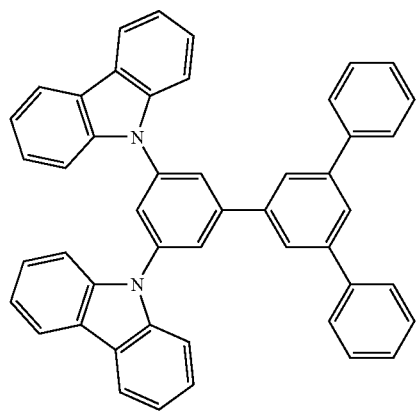
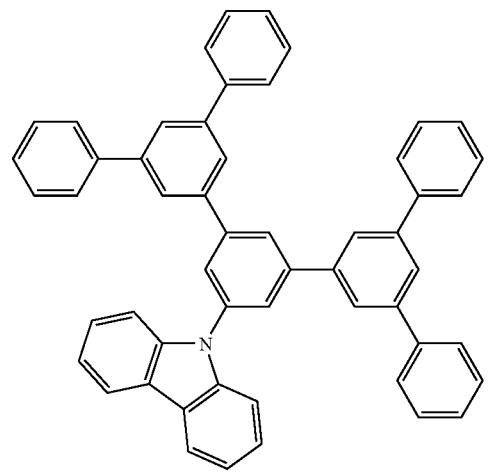

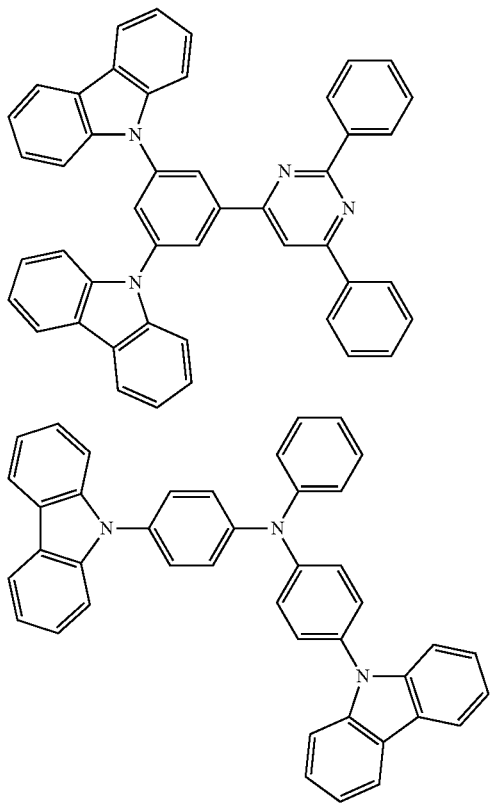
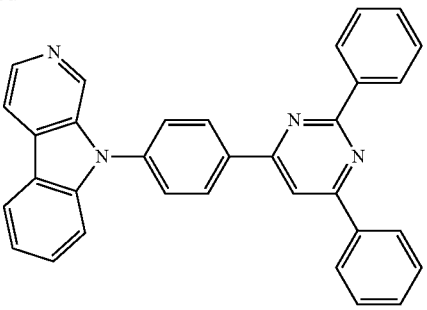
[Chemical Formula 26]
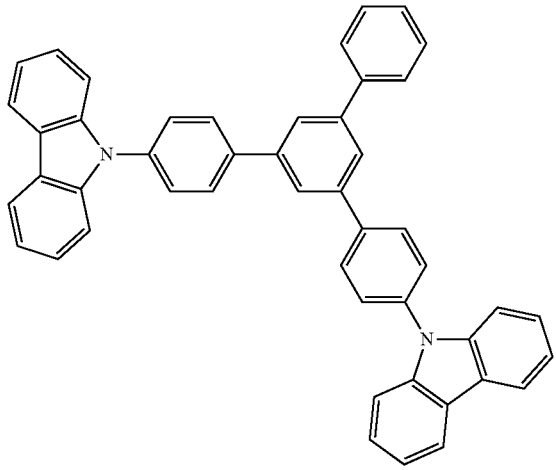
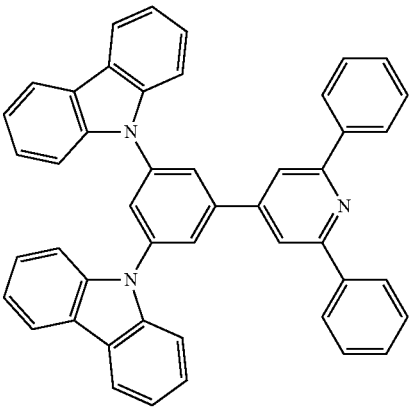
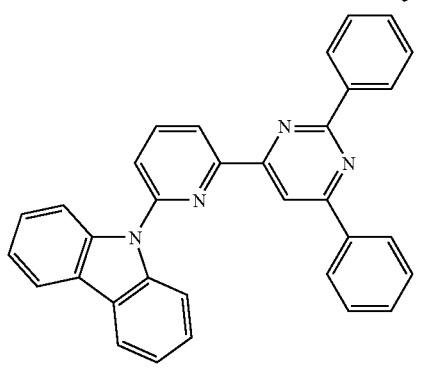
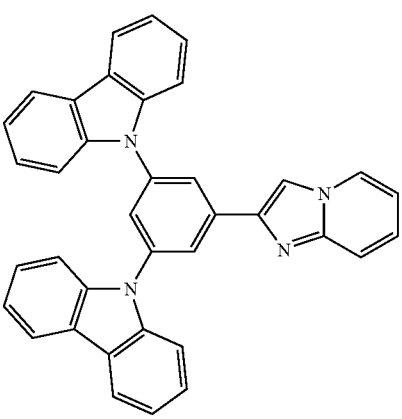

-continued
| 89 | 90 |
|---|---|
| 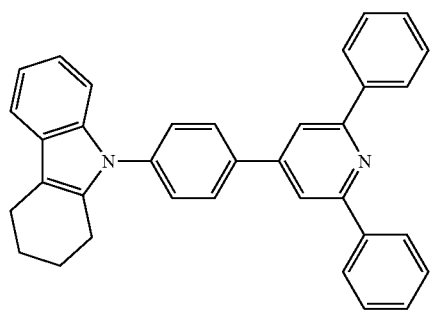 | 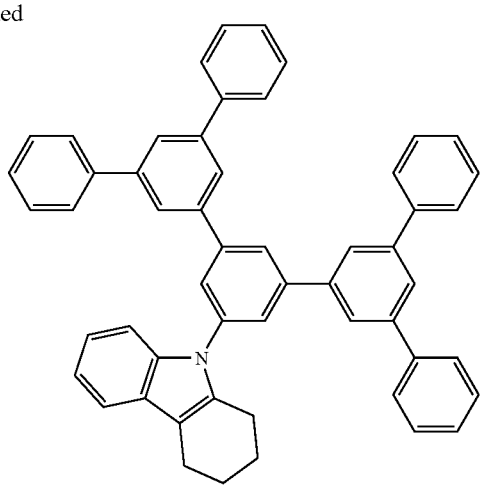 |
| 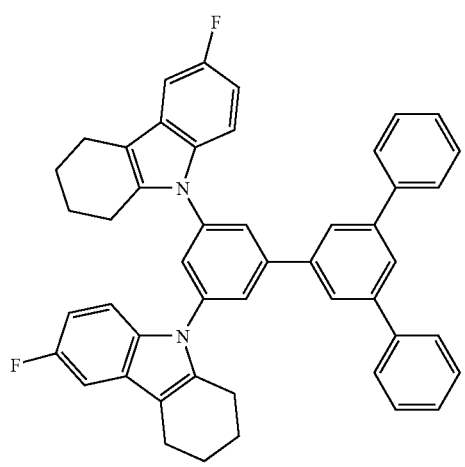 | 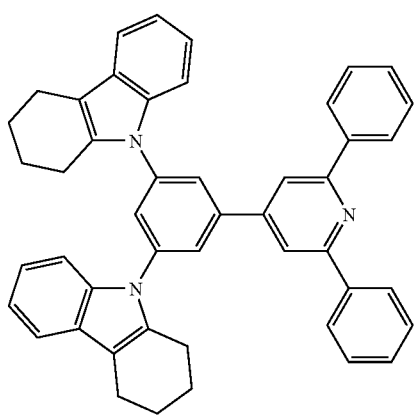 |
| 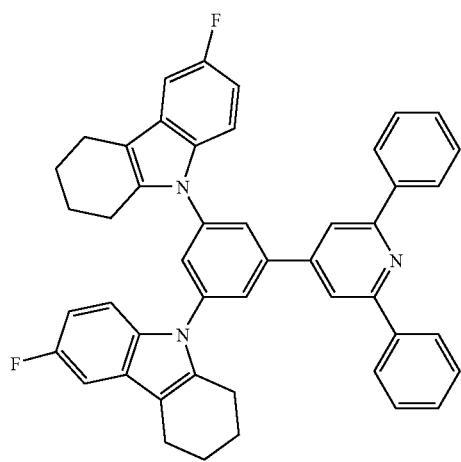 | 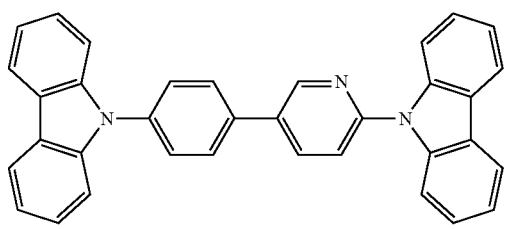 |

-continued
91
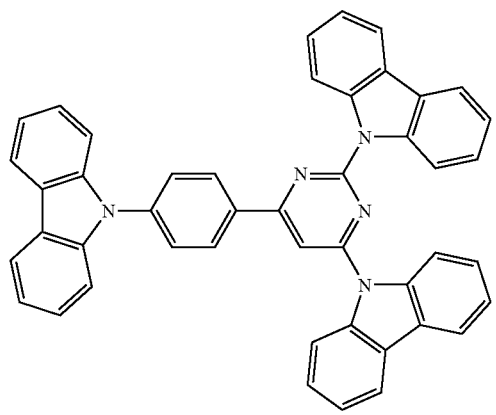
92
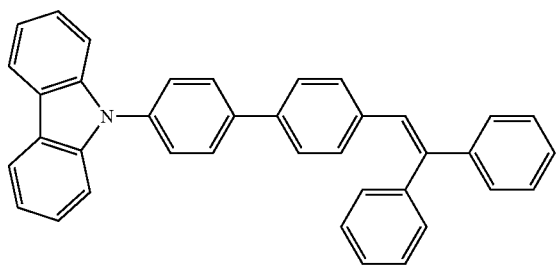
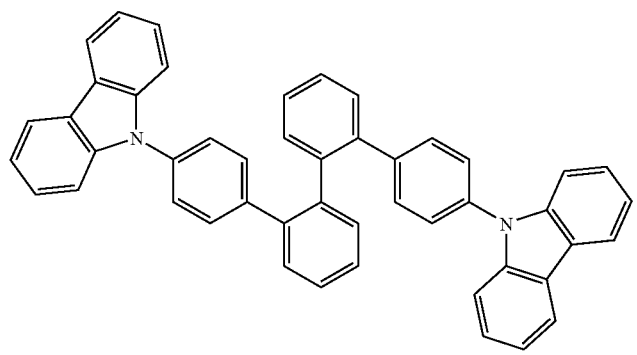
[Chemical Formula 27]
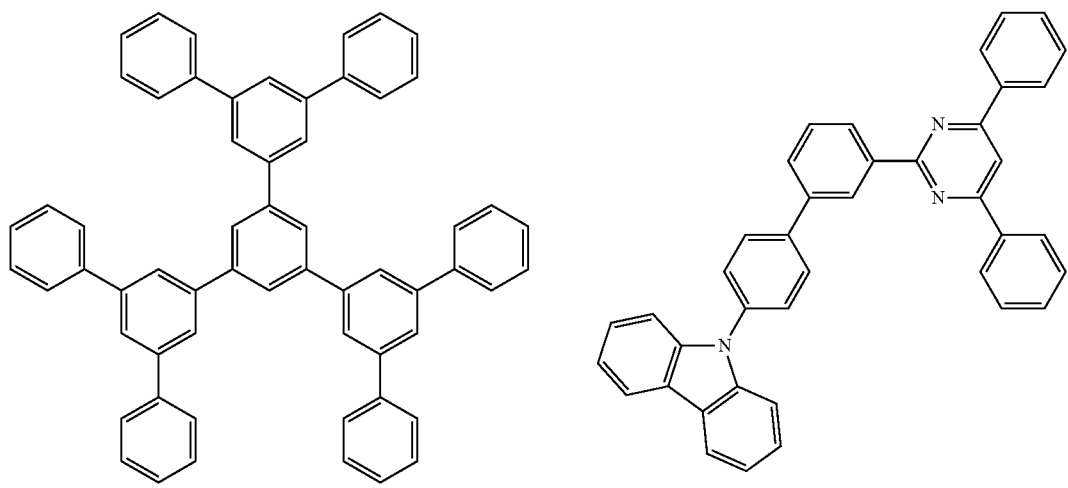

-continued

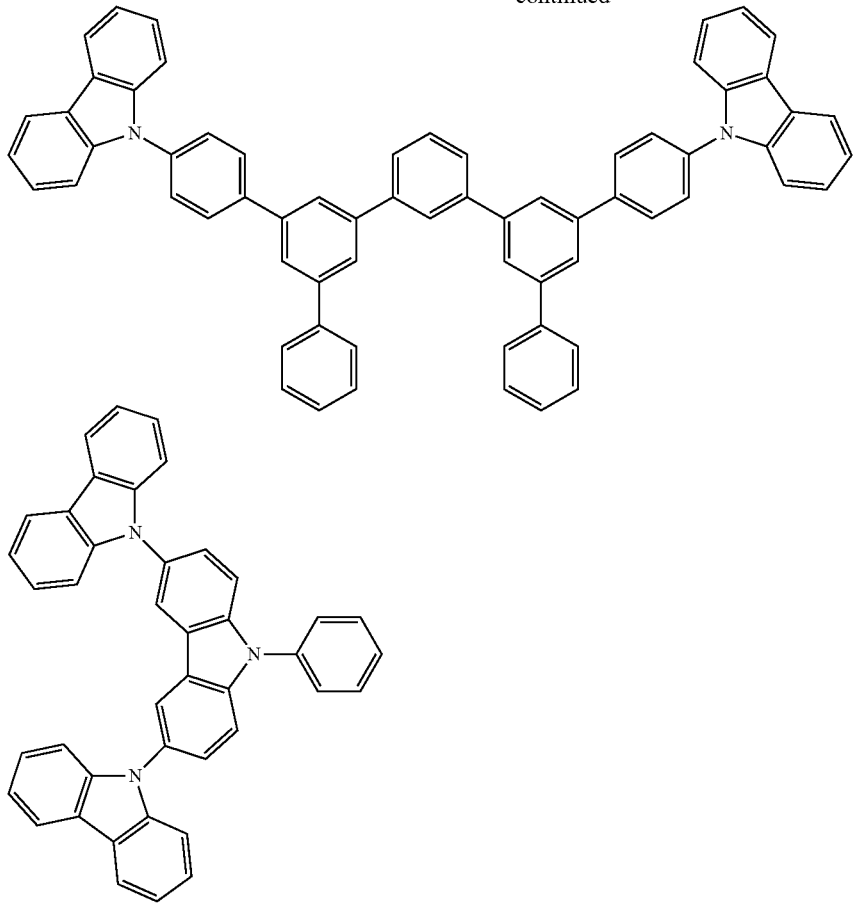

By using the compounds represented by the formulae (101) to (105) as the phosphorescent host, the organic EL device can be of high luminous efficiency, free from pixel defects, excellent in heat resistance and of long life.

(4.2) Fluorescent-Emitting Layer

The fluorescent-emitting layer contains a fluorescent host and a fluorescent dopant for blue fluorescence.

As the fluorescent host, the compounds represented by the above formulae (101) to (105) are exemplarily usable.

Examples of the fluorescent dopant are compounds represented by the following formula (201) and BCzVBi (4,4'-bis(9-ethyl-3-carbazovinylene)-1,1'-biphenyl).

[Chemical Formula 28]

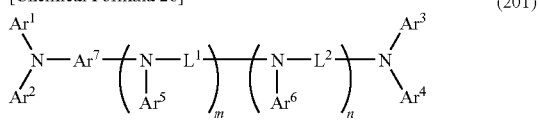

(201)

In the formula (201), $Ar^1$ to $Ar^7$ each represent an aryl group having 6 to 30 carbon atoms. $Ar^1$ to $Ar^7$ may be substituted, preferable substituents for which are an alkoxy group, dialkylamino group, alkyl group, fluoroalkyl group and silyl group.

$L^1$ and $L^2$ each represent an alkenylene group or divalent aromatic hydrocarbon group.

m and n each are 0 or 1.

Examples of the compound represented by the formula (201) are the following.

[Chemical Formula 29]

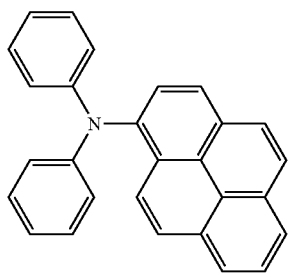

(A)-1

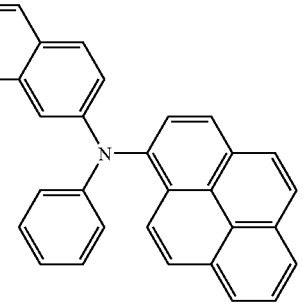

(A)-2

-continued
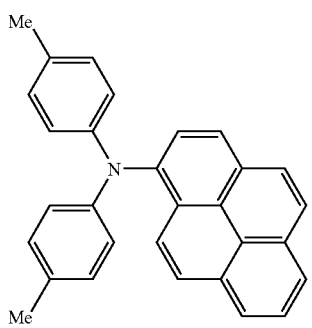
(A)-3
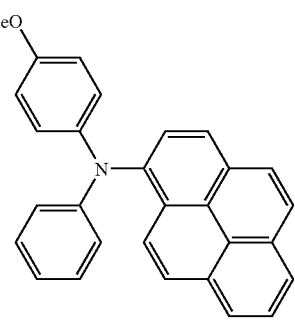
(A)-4
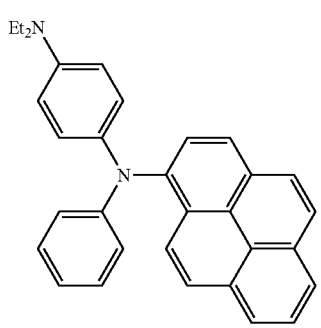
(A)-5
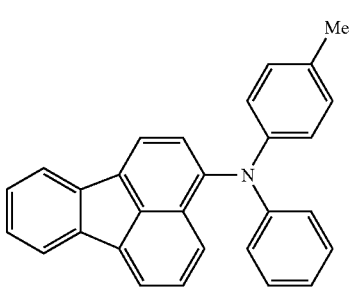
(A)-6
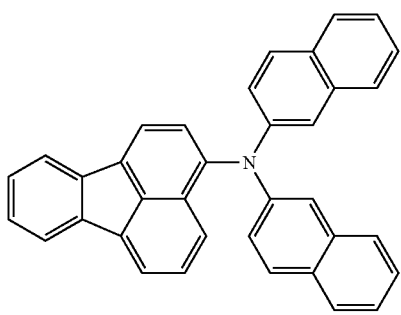
(A)-7
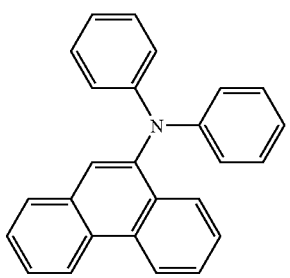
(A)-8
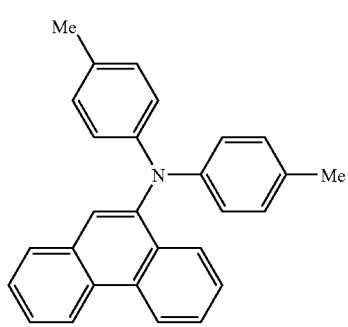
(A)-9
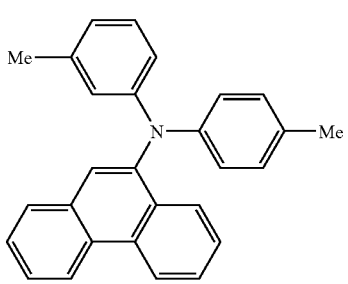
(A)-10
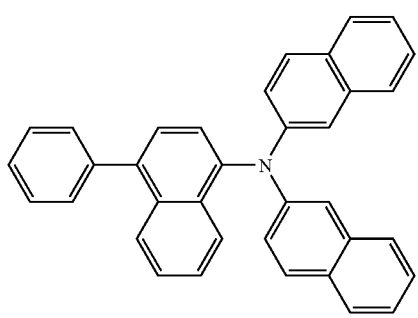
(A)-11
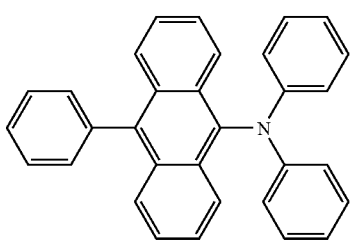
(A)-12

(A)-13 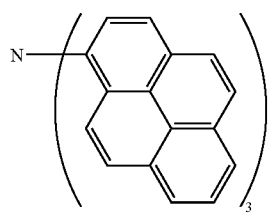
(A)-14 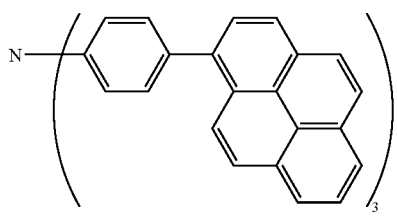
(A)-15 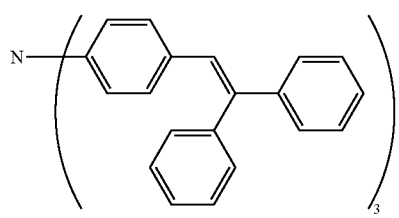
[Chemical Formula 30]
(A)-16 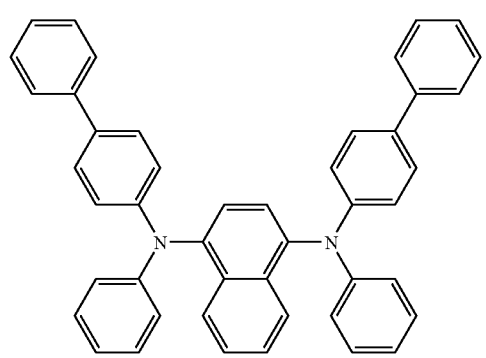
(A)-17 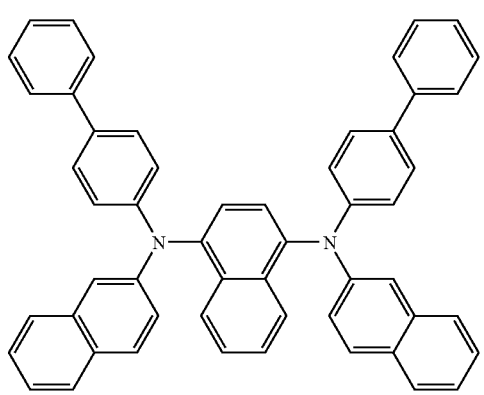
(A)-18 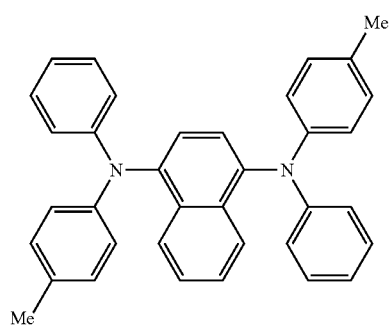
(A)-19 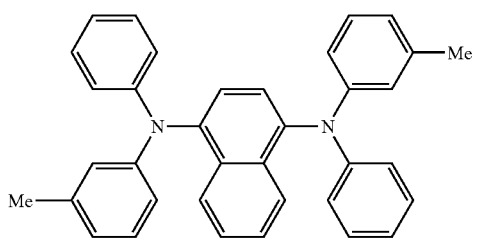
(A)-20 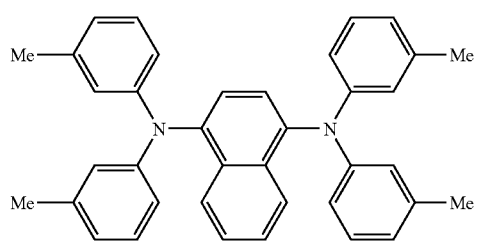
(A)-21 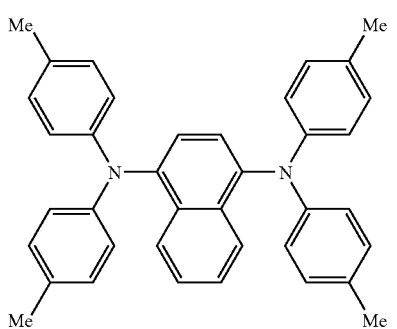

-continued
(A)-22
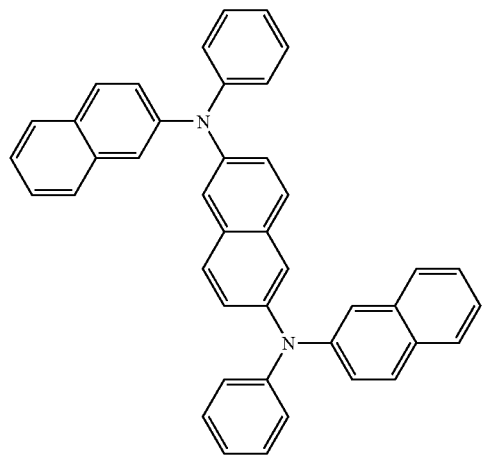
(A)-23
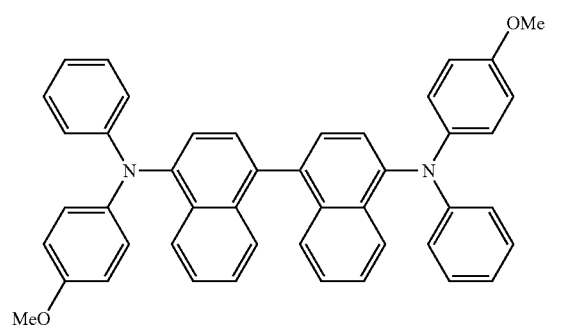
(A)-24
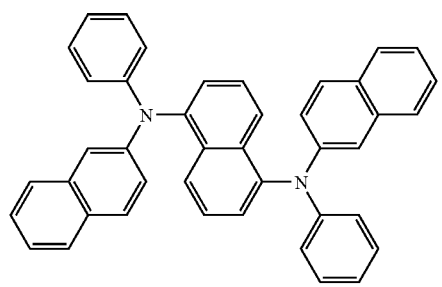
(A)-25
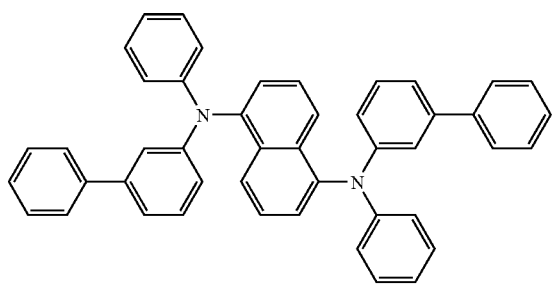
(A)-26
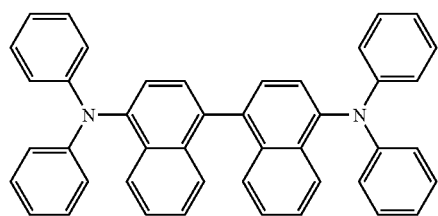
(A)-27
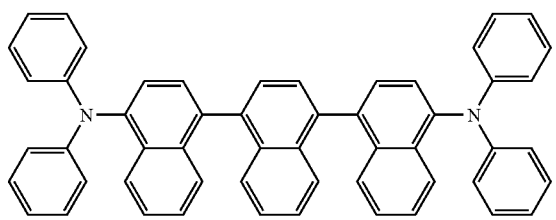
[Chemical Formula 31]
(A)-28
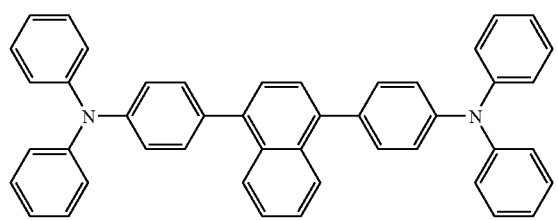
(A)-29
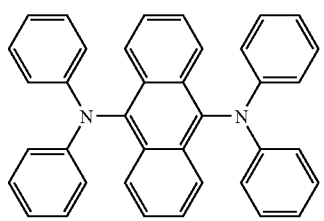

-continued
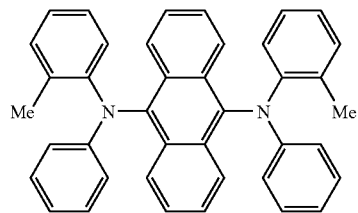
(A)-30
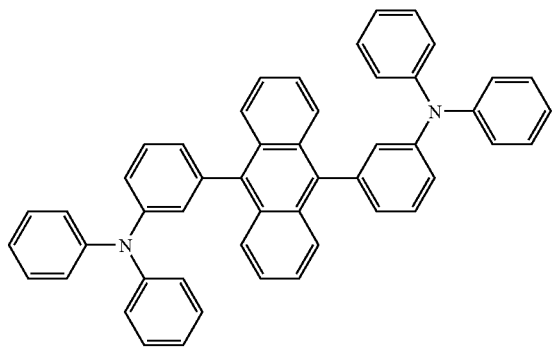
(A)-31
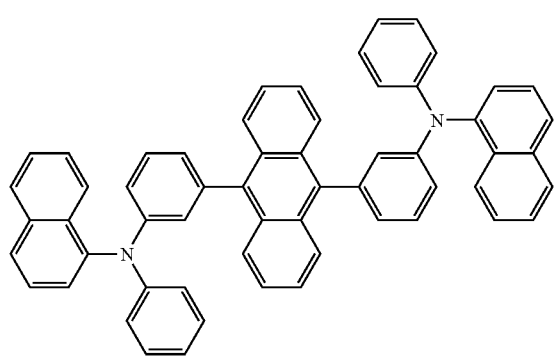
(A)-32
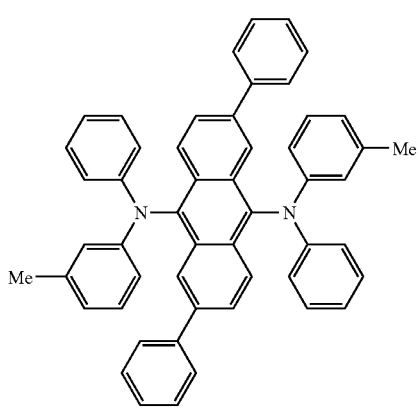
(A)-33
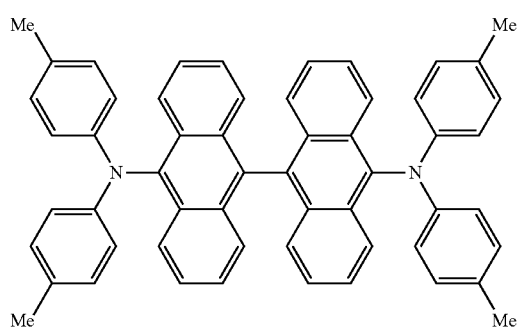
(A)-34
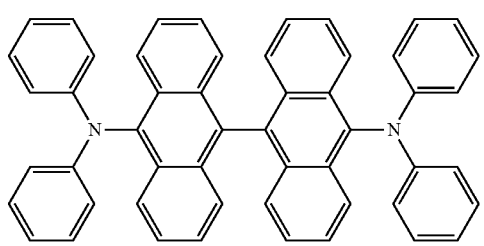
(A)-35
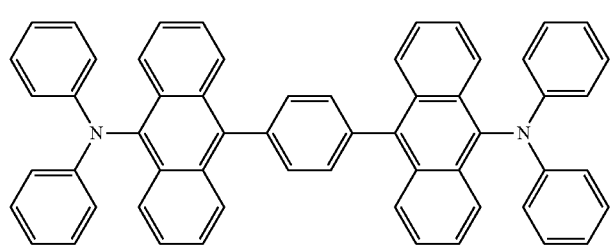
(A)-36

-continued
(A)-37
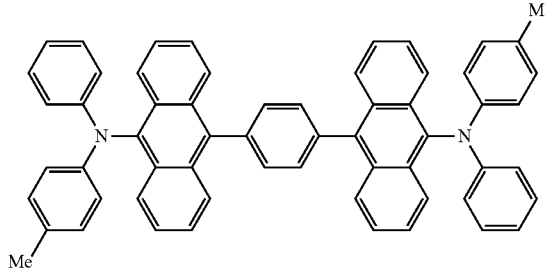
(A)-38
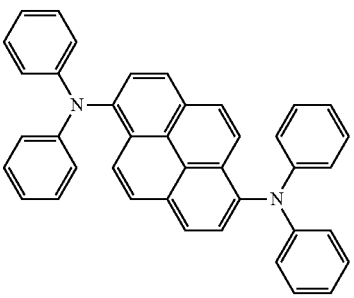
(A)-39
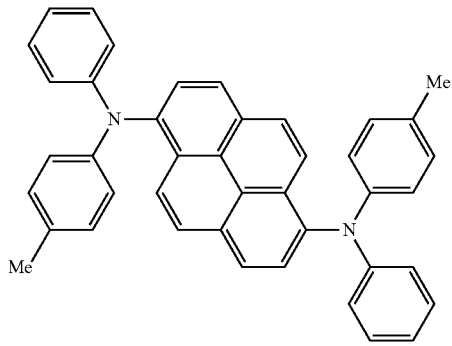
[Chemical Formula 32]
(A)-40
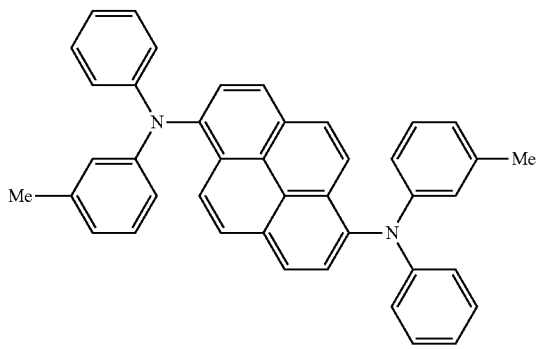
(A)-41
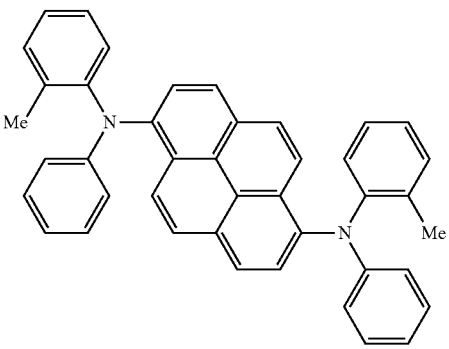
(A)-42
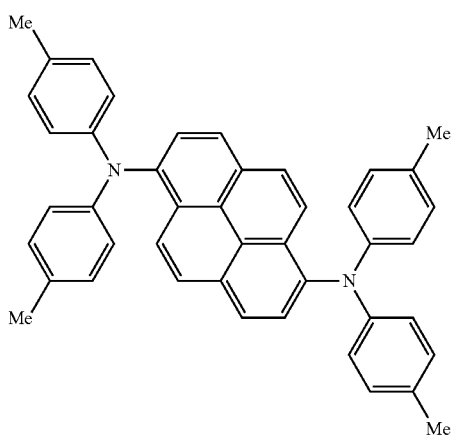
(A)-43
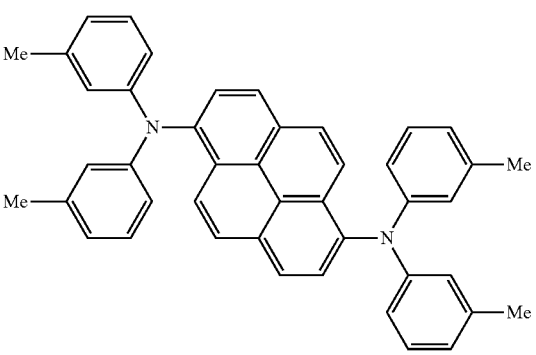

-continued
(A)-44
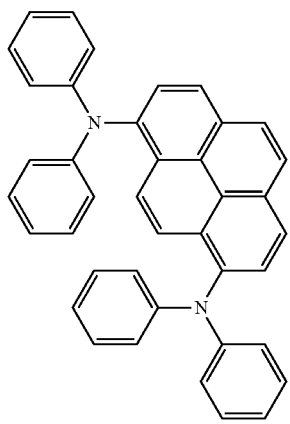
(A)-45
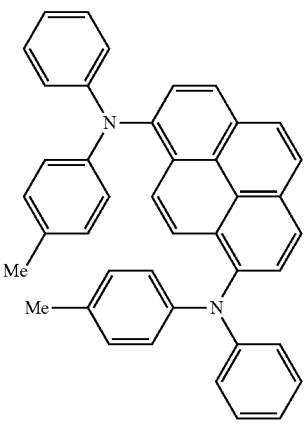
(A)-46
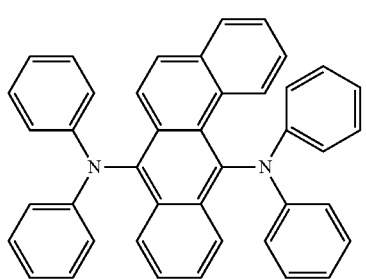
(A)-47
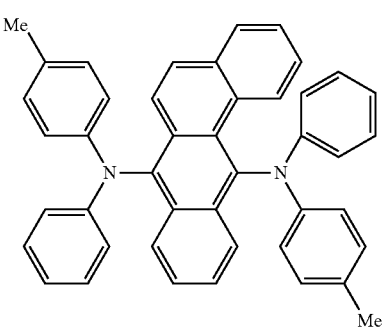
(A)-48
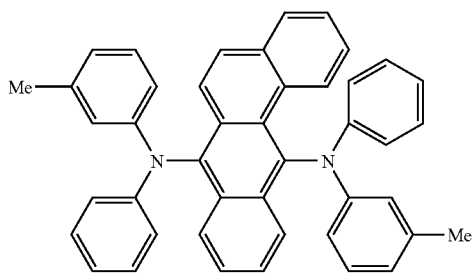
(A)-49
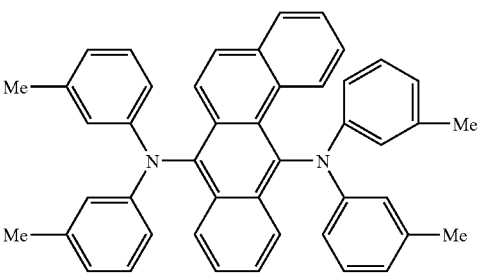
(A)-50
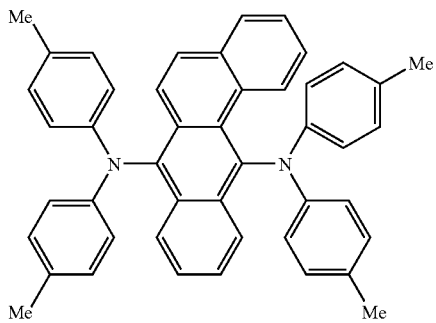
(A)-51
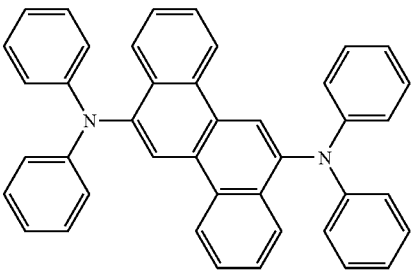
(A)-52
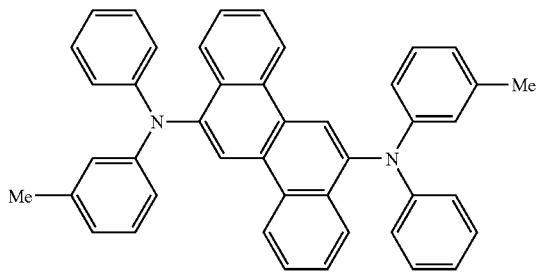

[Chemical Formula 33]
(A)-53
(A)-54
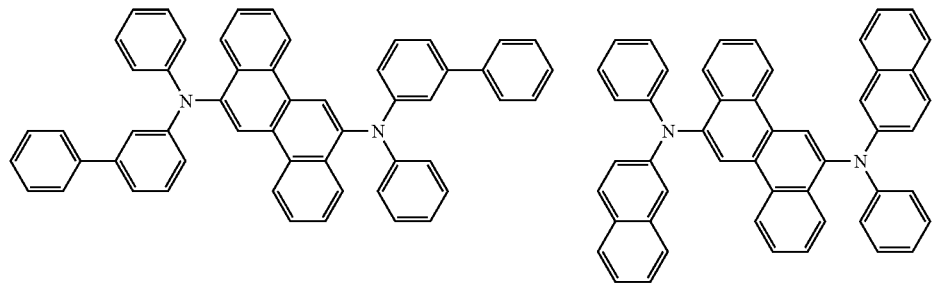
(A)-55
(A)-56
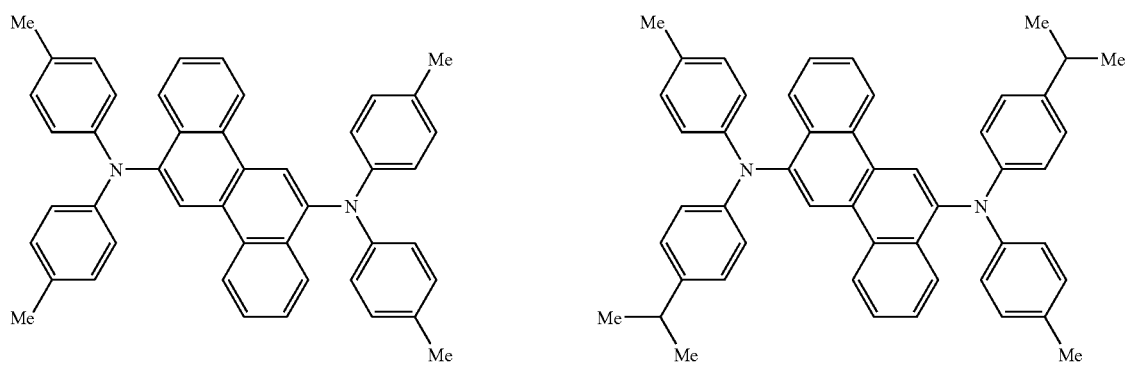
(A)-57
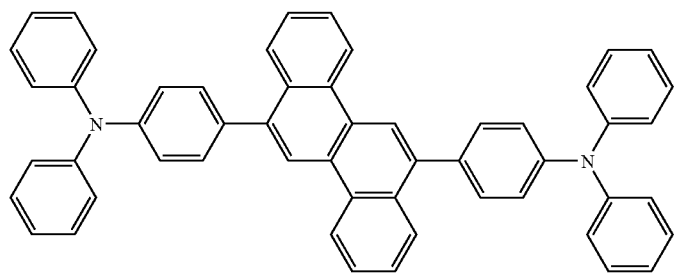
(A)-58
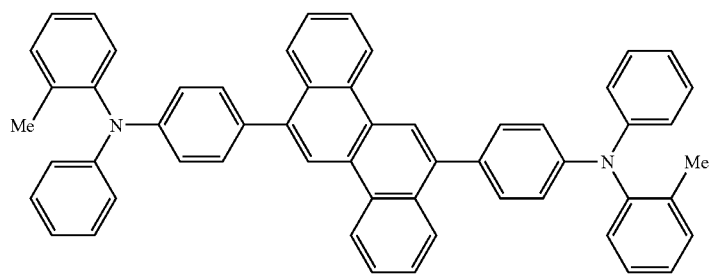
(A)-59
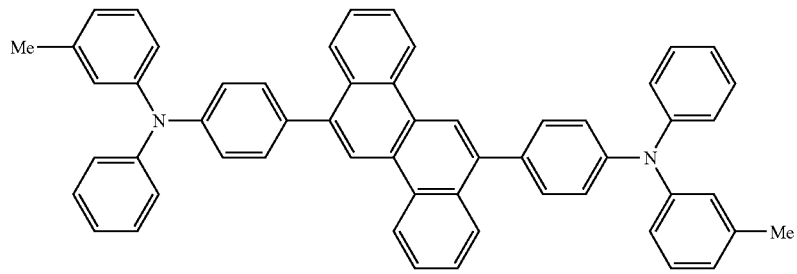

-continued
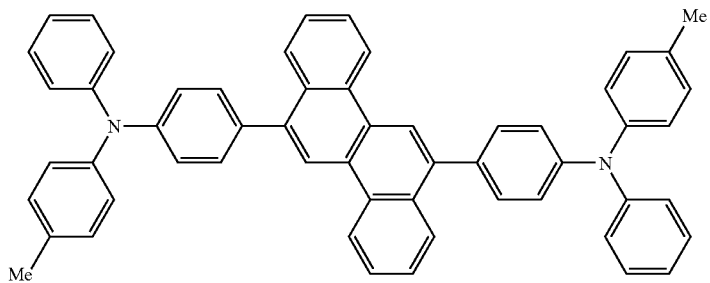
(A)-60
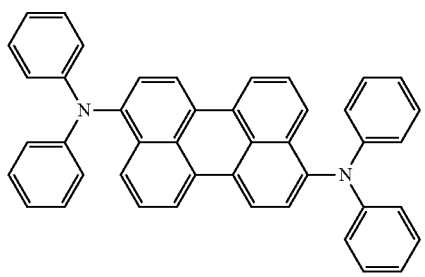
(A)-61
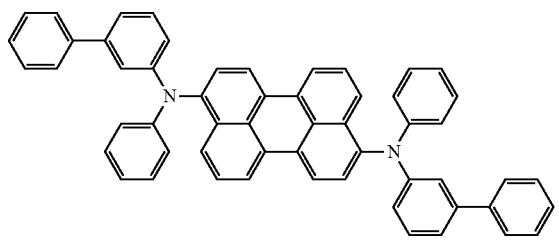
(A)-62
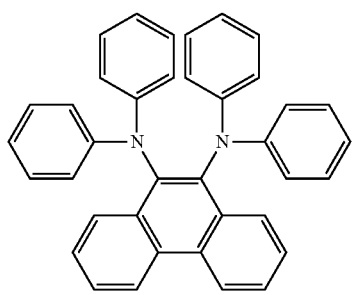
(A)-63
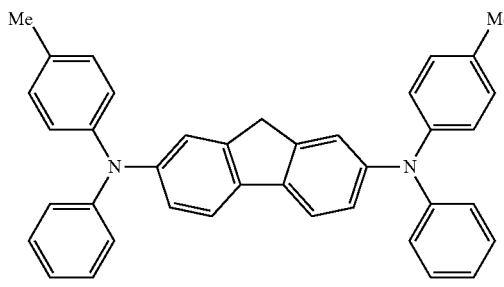
(A)-64
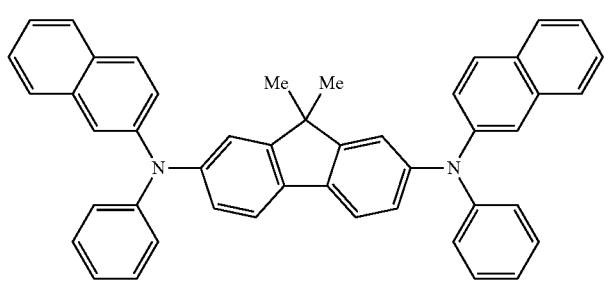
(A)-65
[Chemical Formula 34]
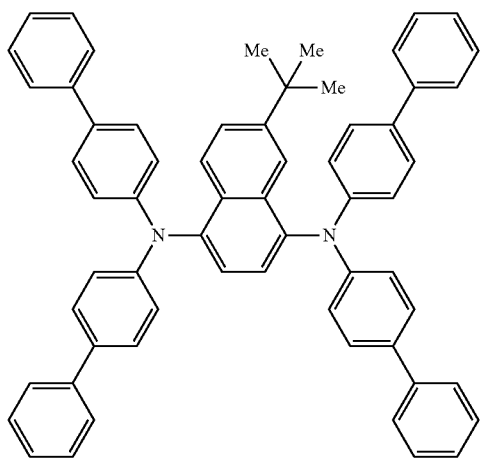
(A)-66
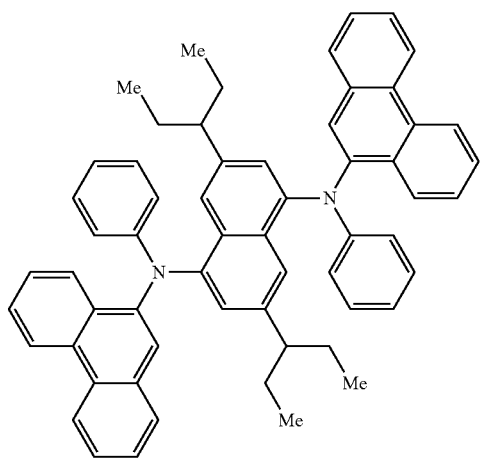
(A)-67

-continued
(A)-68
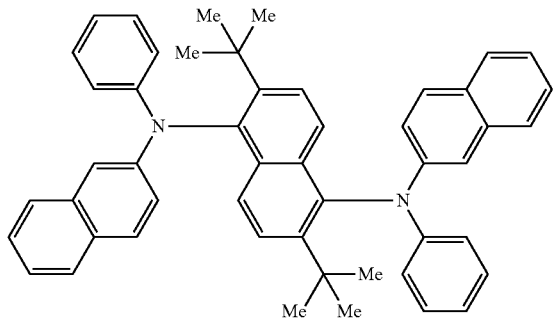
(A)-69
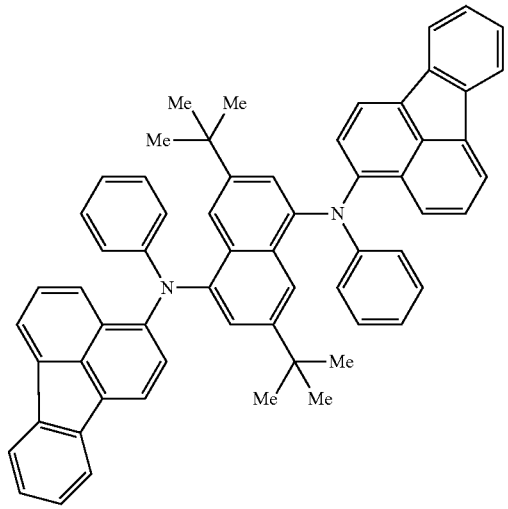
(A)-70
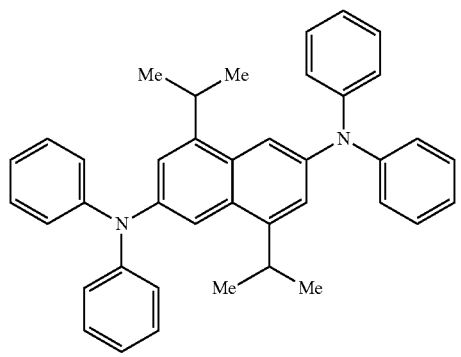
(A)-71
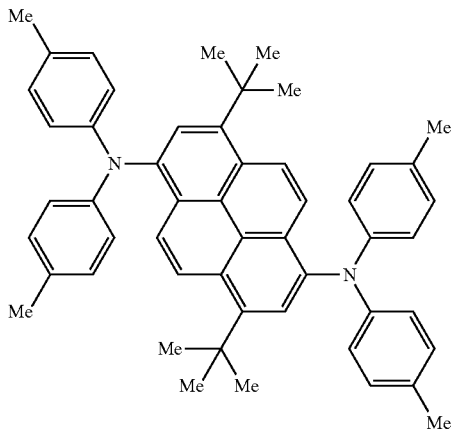
(A)-72
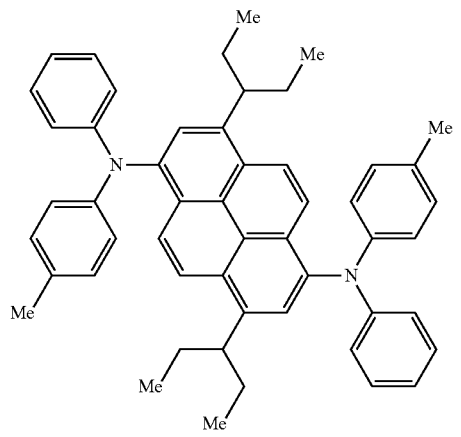
(A)-73
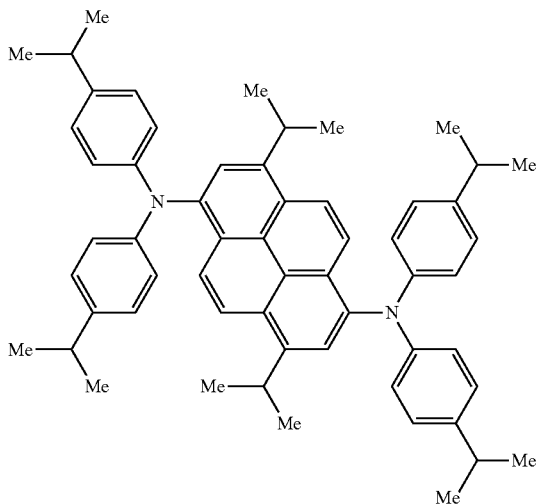

-continued
(A)-74
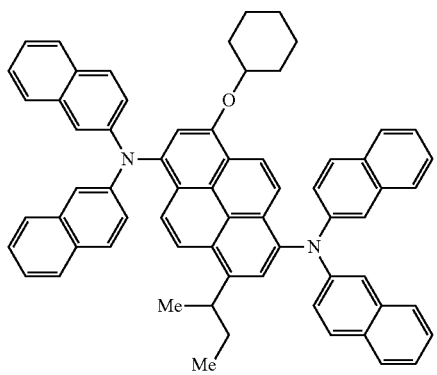
(A)-75
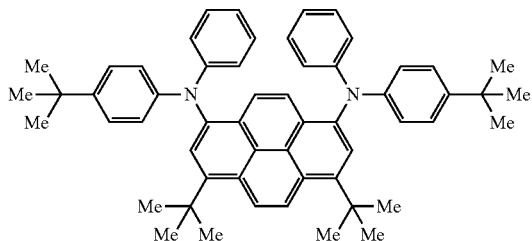
(A)-76
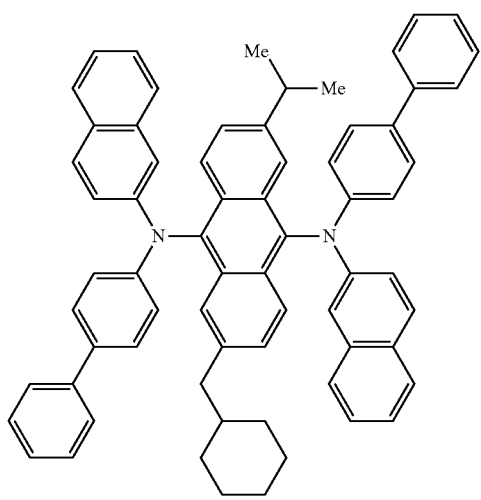
(A)-77
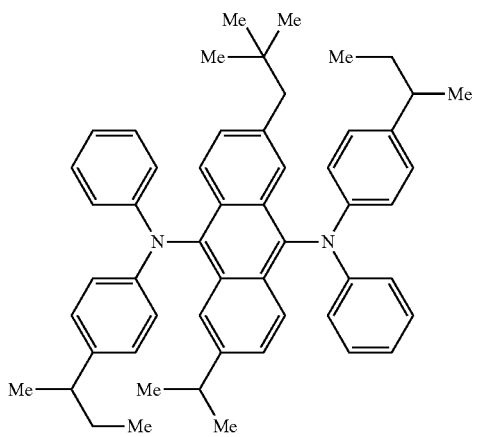
[Chemical Formula 35]
(A)-78
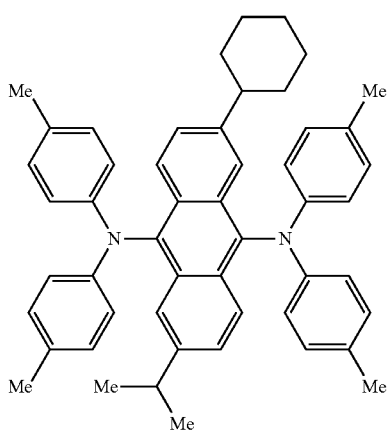
(A)-79
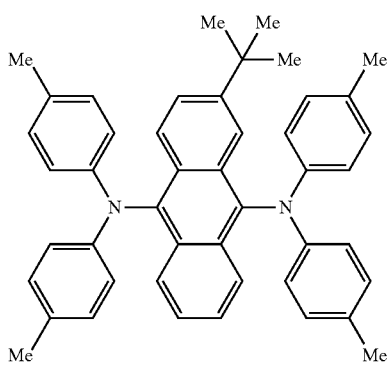

-continued
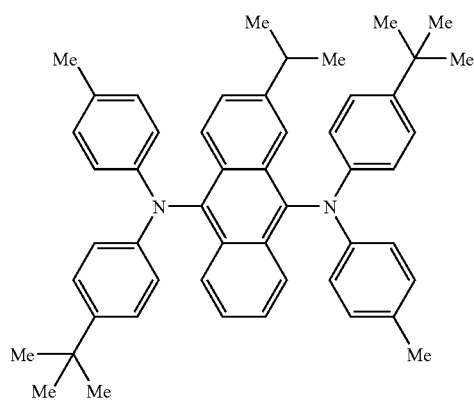
(A)-80
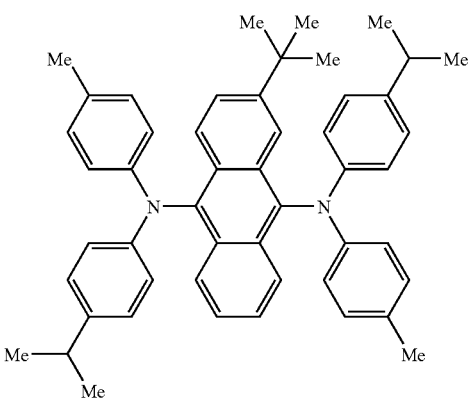
(A)-81
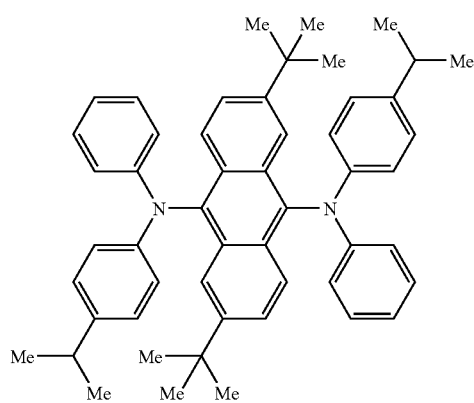
(A)-82
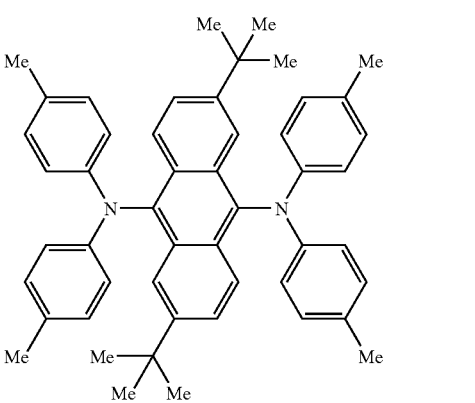
(A)-83
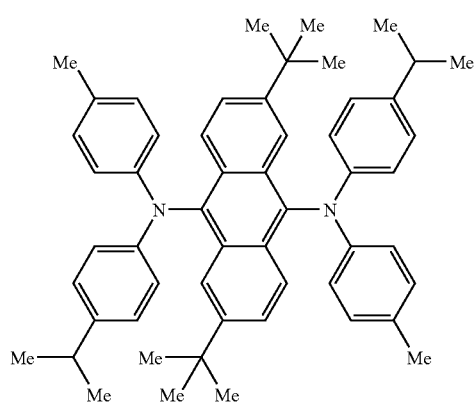
(A)-84
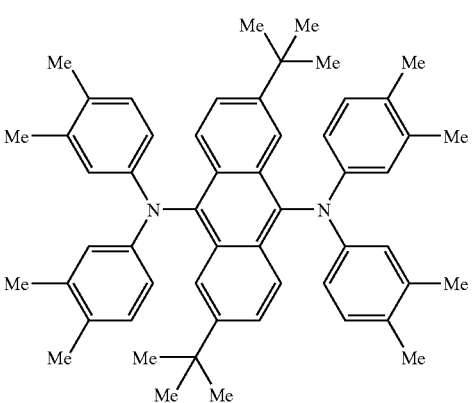
(A)-85
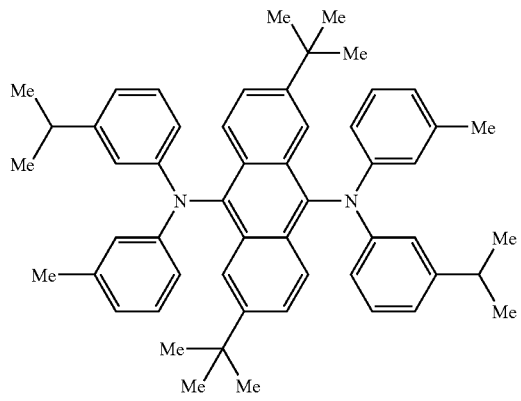
(A)-86
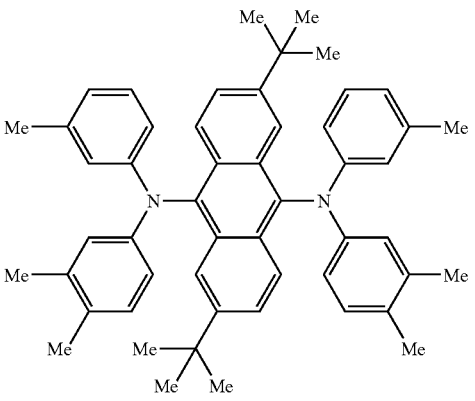
(A)-87

-continued
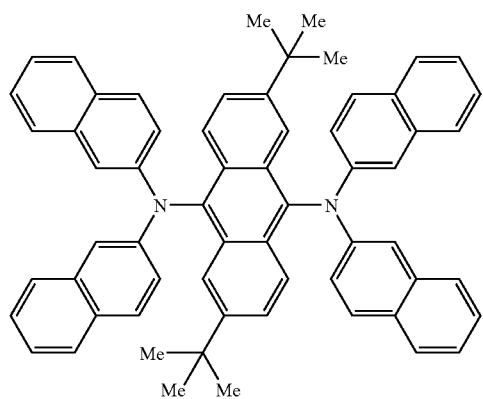
(A)-88
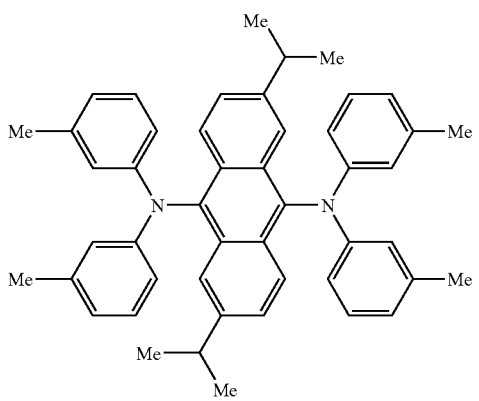
(A)-89
[Chemical Formula 36]
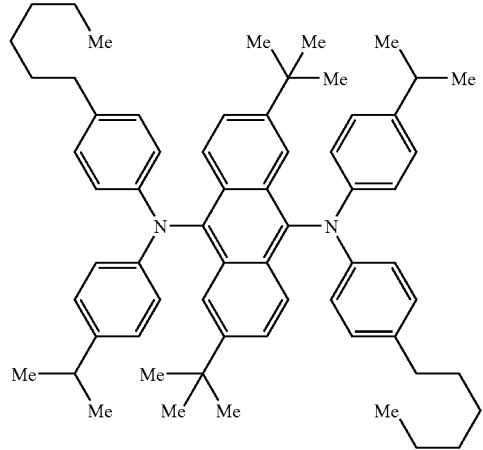
(A)-90
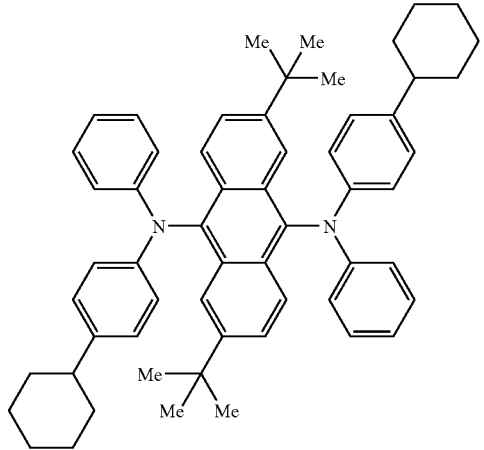
(A)-91
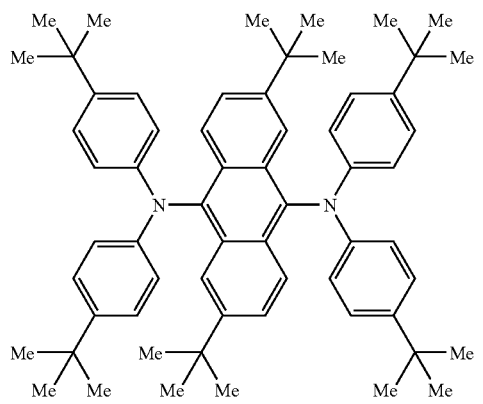
(A)-92
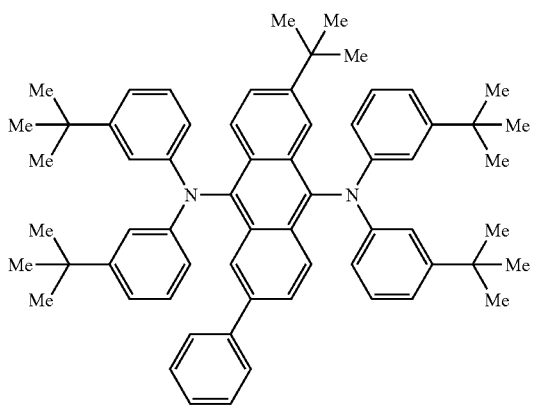
(A)-93

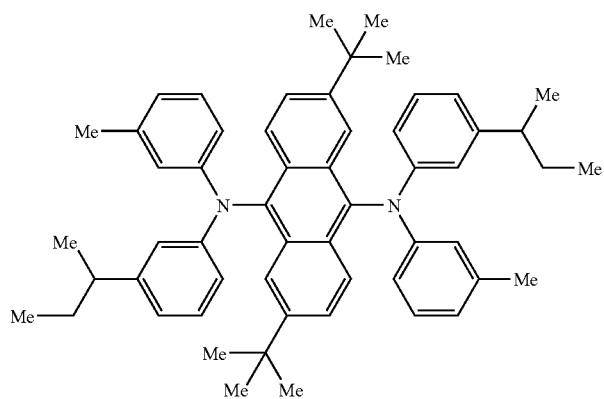
(A)-94
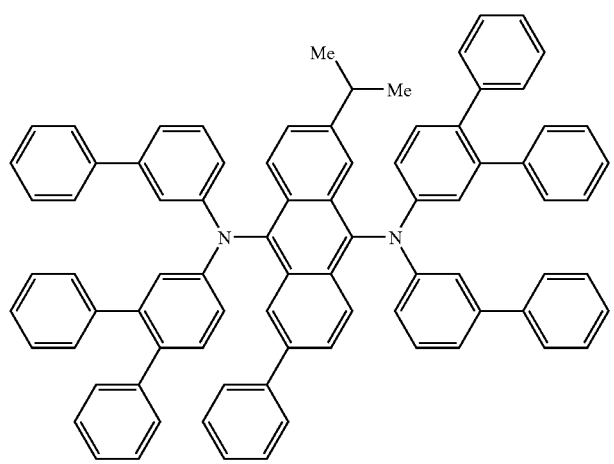
(A)-95
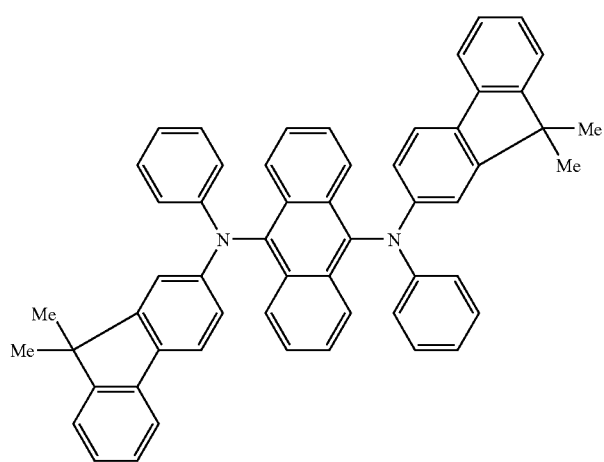
(A)-96

-continued
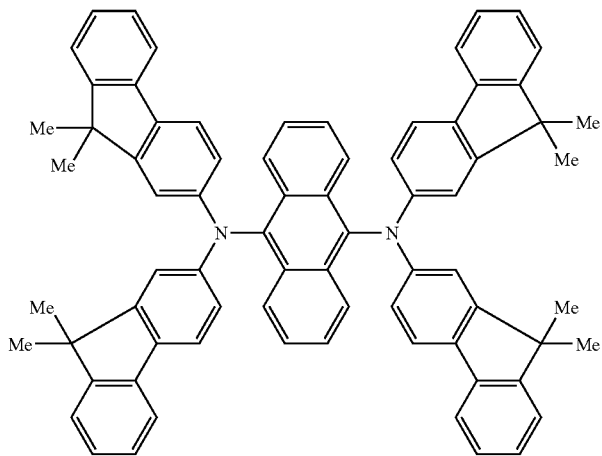
(A)-97
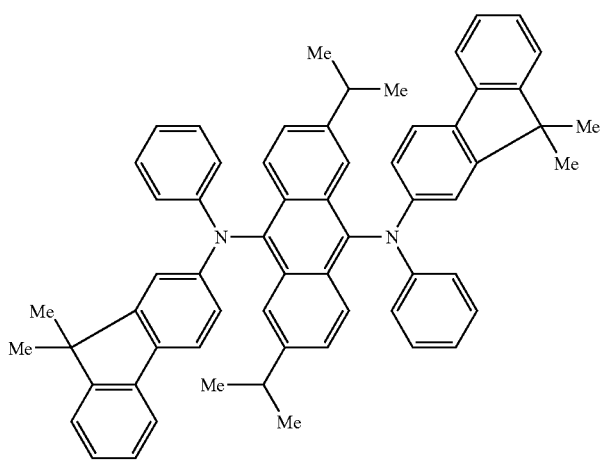
(A)-98
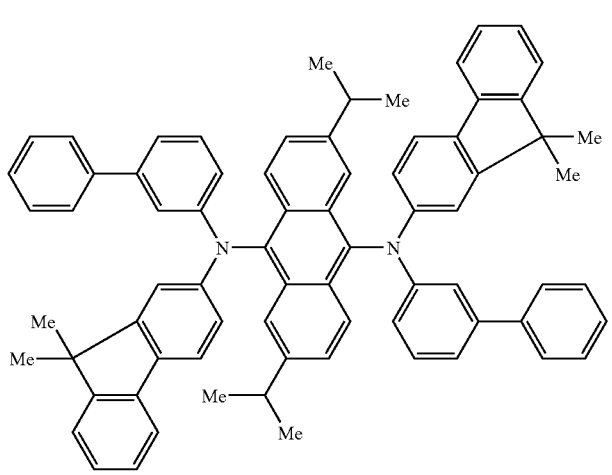
(A)-99

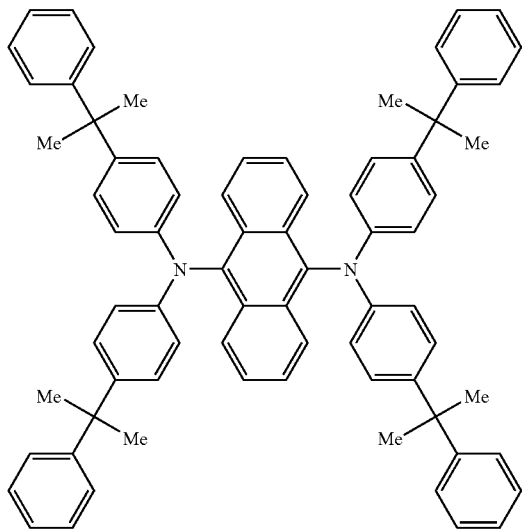
(A)-100
[Chemical Formula 37]
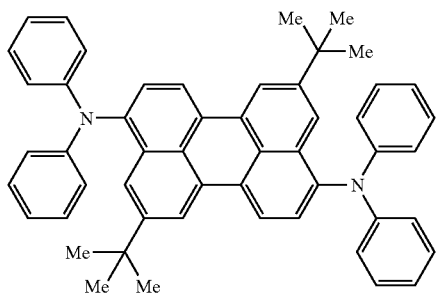
(A)-101
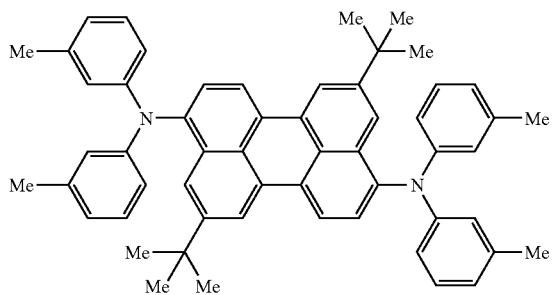
(A)-102
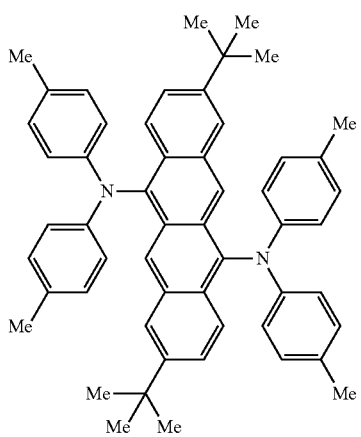
(A)-103
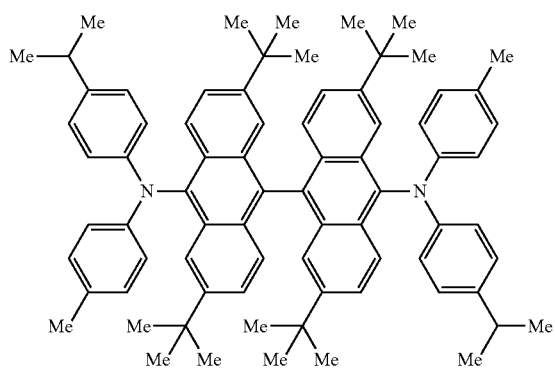
(A)-104

-continued
(A)-105
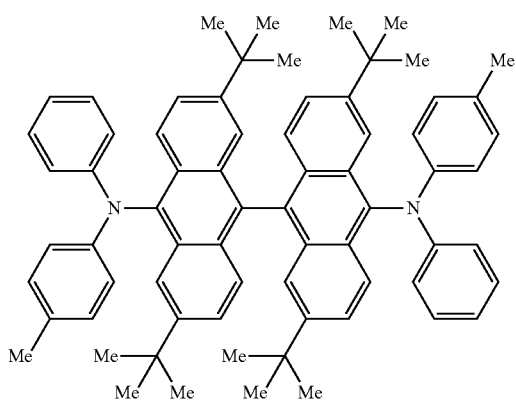
(A)-106
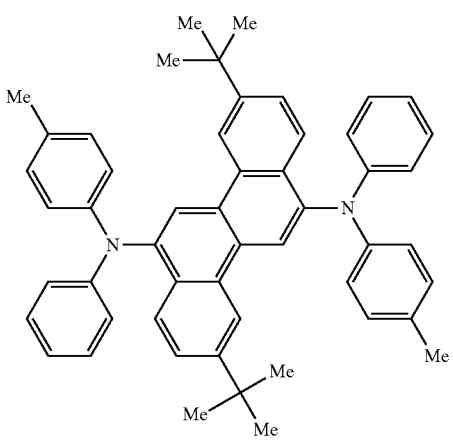
(A)-107
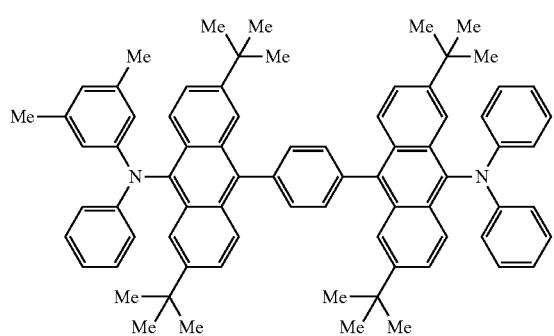
(A)-108
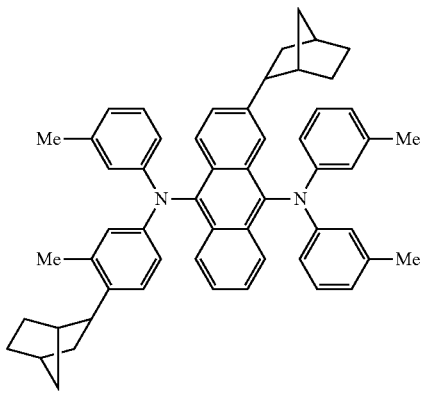
[Chemical Formula 38]
(A)-109
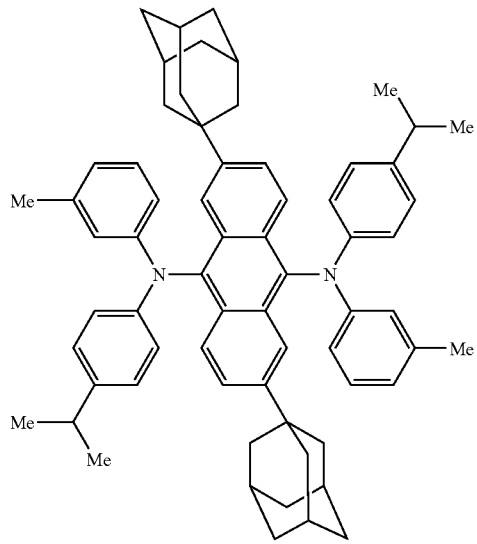
(A)-110
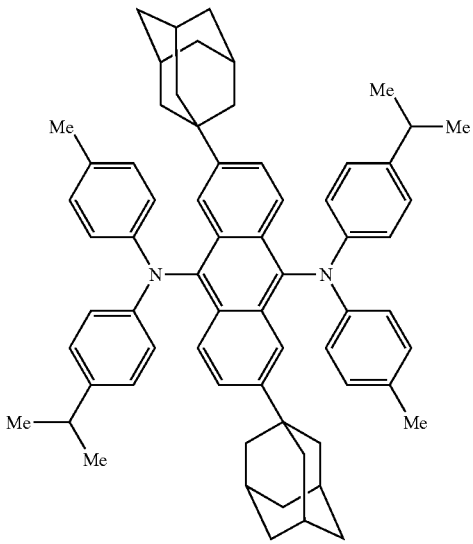

-continued
(A)-111
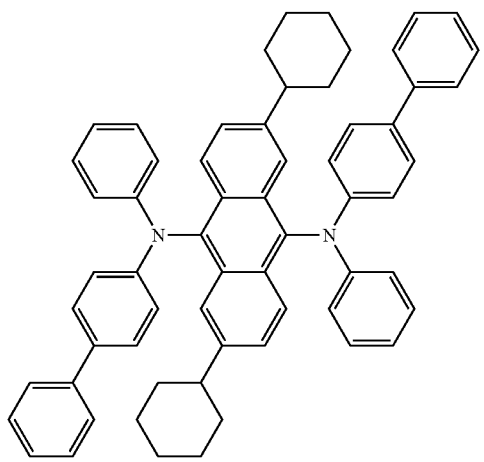
(A)-112
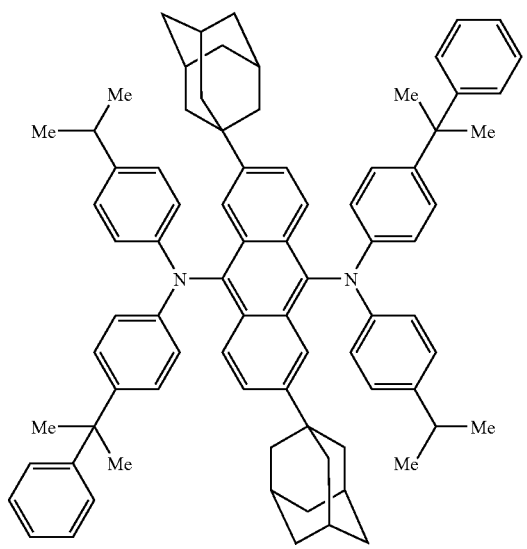
(A)-113
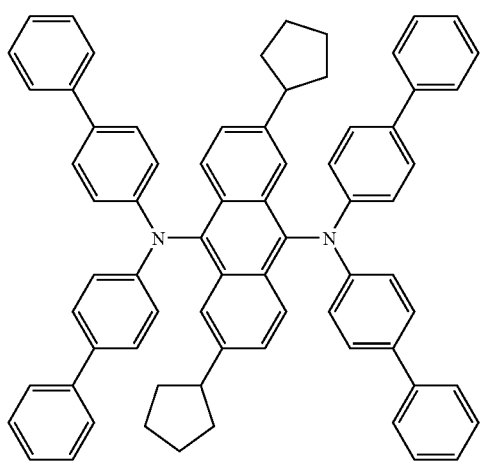
(A)-114
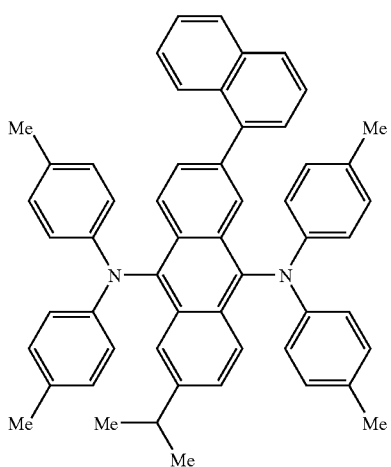
(A)-115
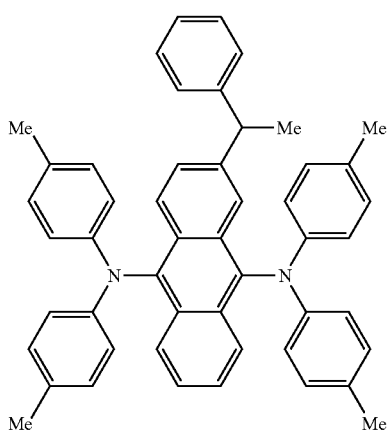
(A)-116
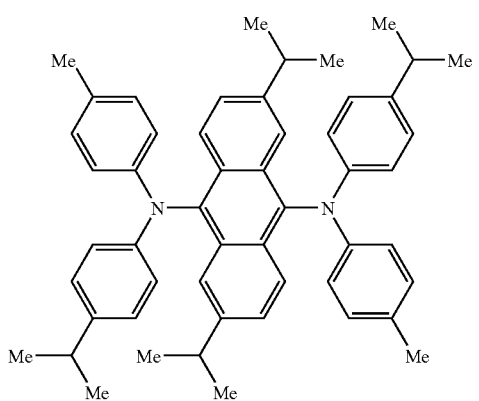

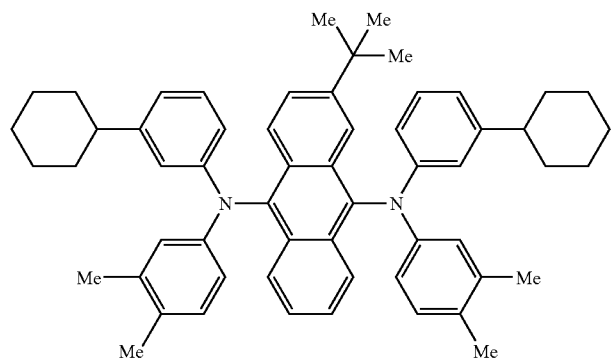
(A)-117
[Chemical Formula 39]
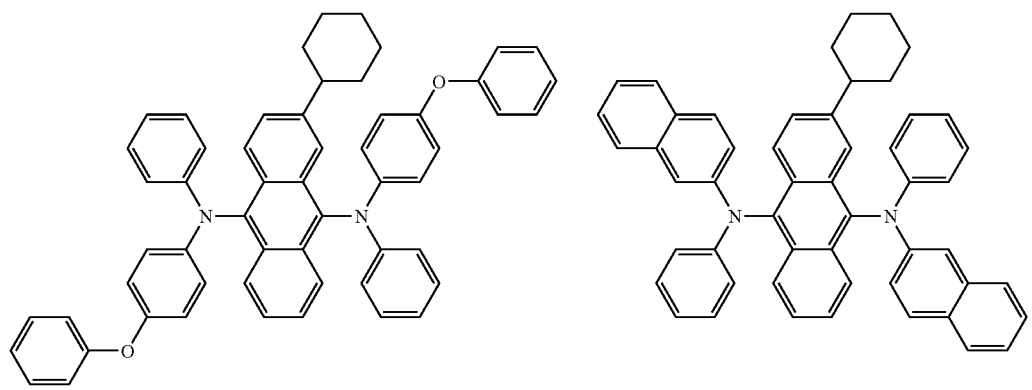
(A)-118 (A)-119
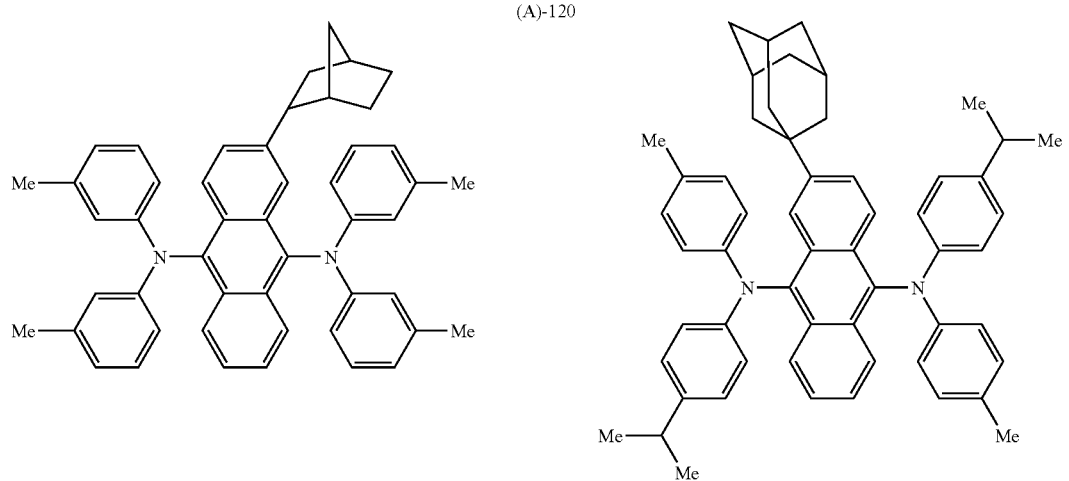
(A)-120 (A)-121

-continued
(A)-122
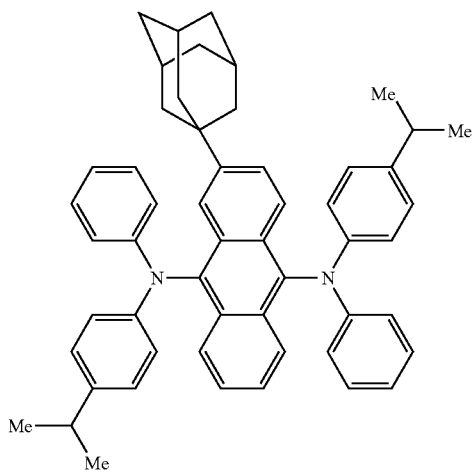
(A)-123
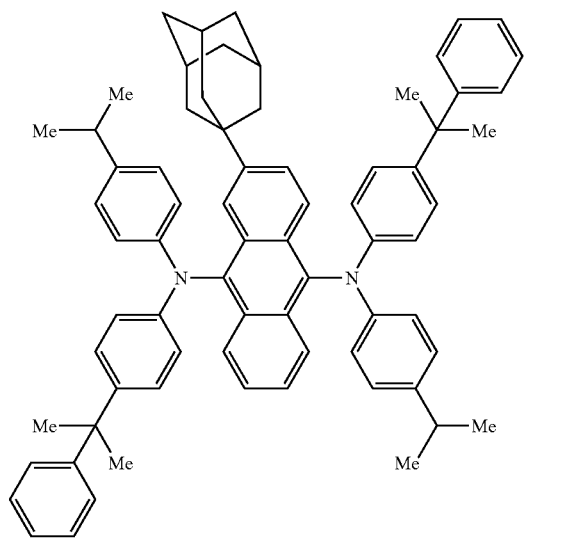
(A)-124
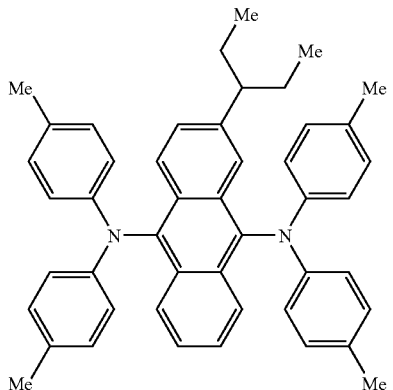
(A)-125
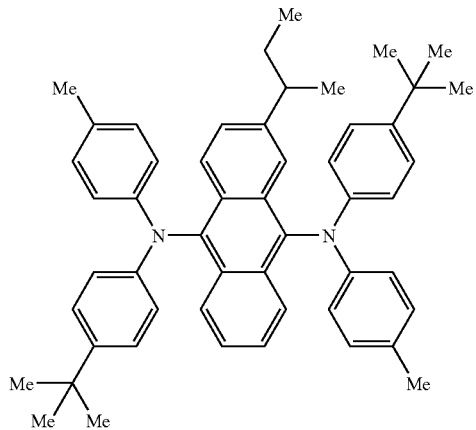
(A)-126
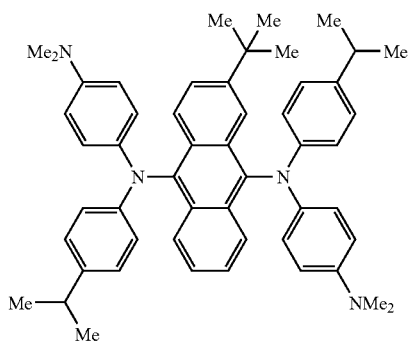
(A)-127
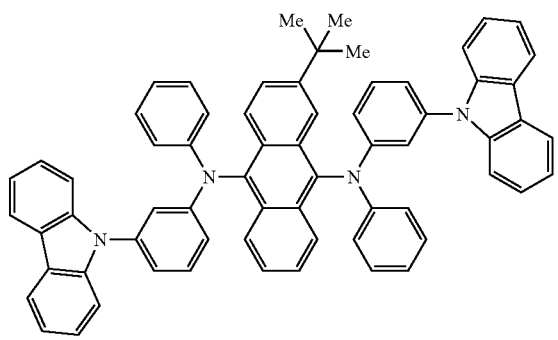

(A)-128
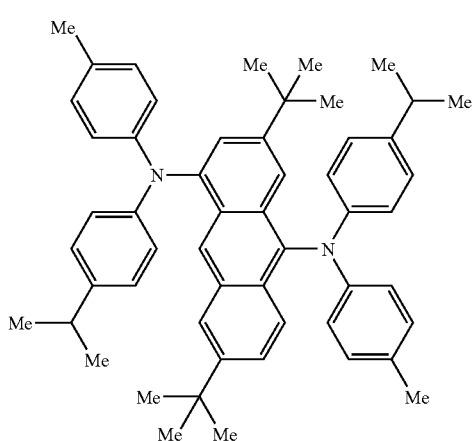
(A)-129
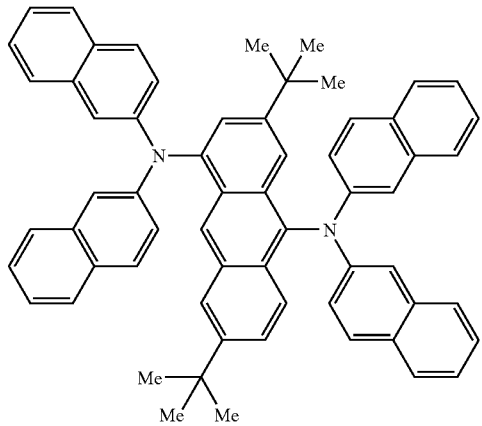
[Chemical Formula 40]
(A)-130
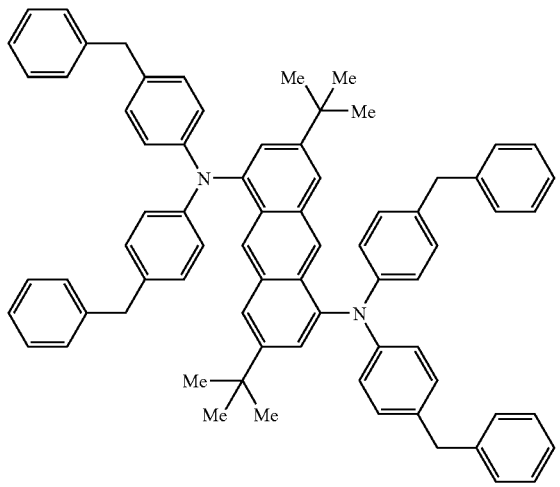
(A)-131
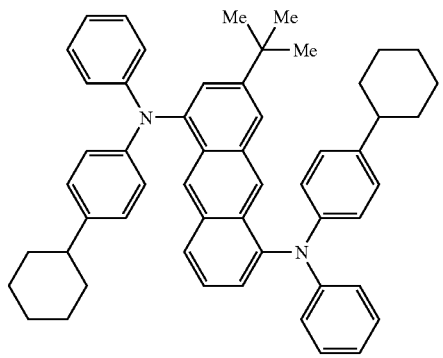
(A)-132
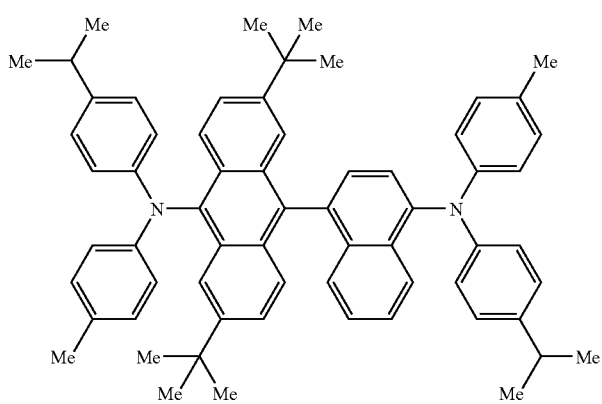

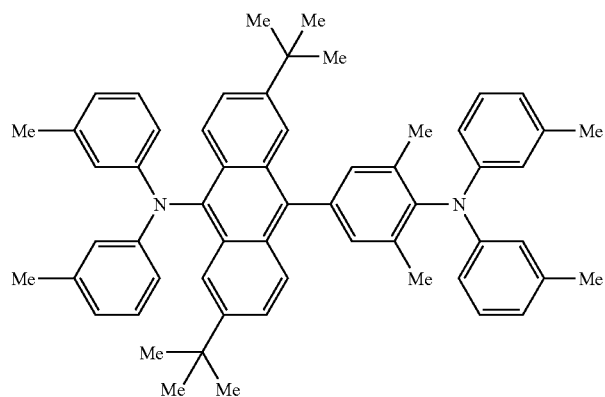
(A)-133
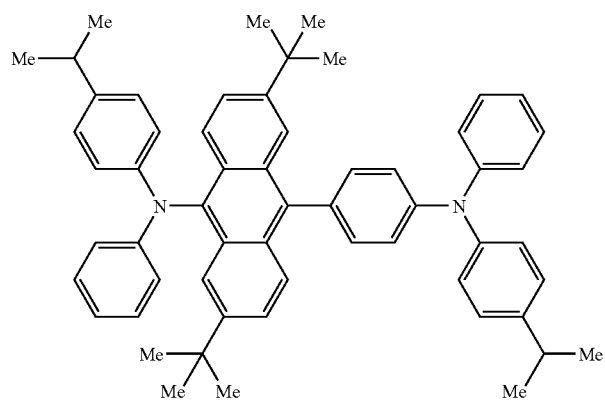
(A)-134
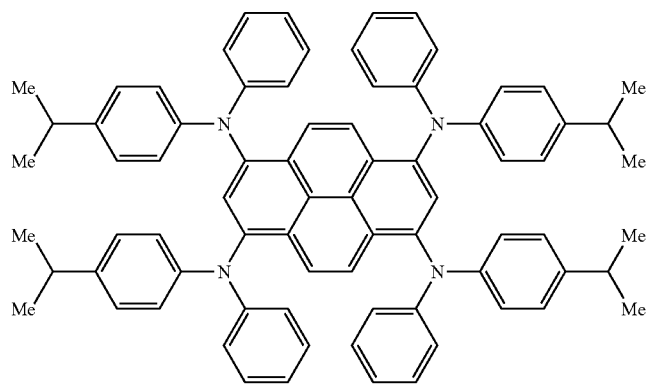
(A)-135
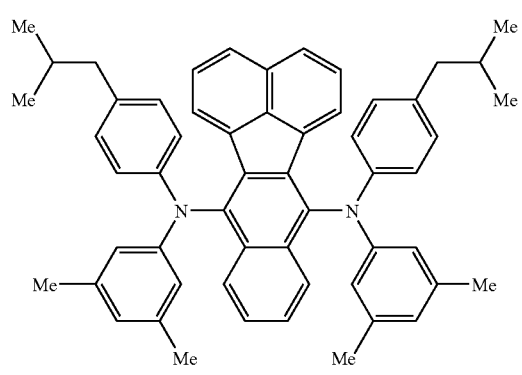
(A)-136
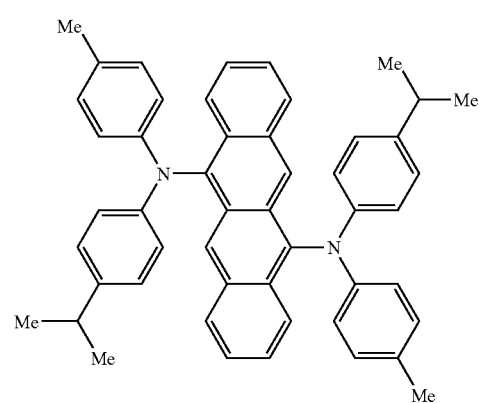
(A)-137

-continued
(A)-138
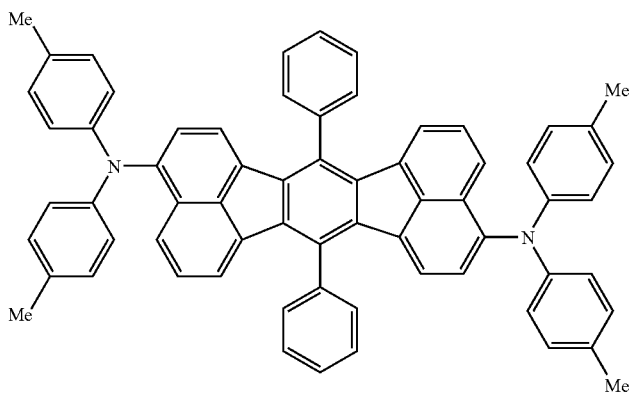
(A)-139
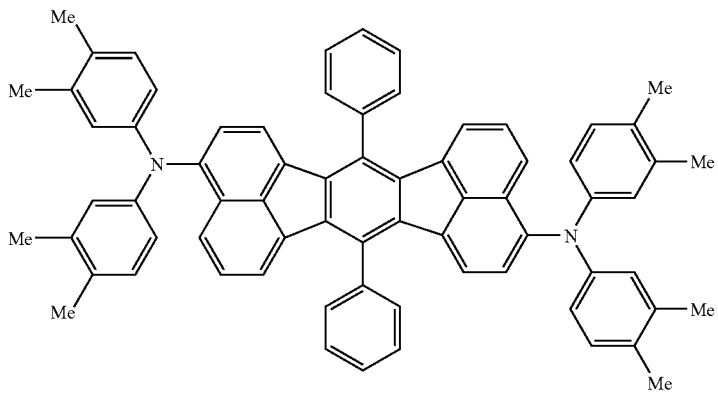
[Chemical Formula 41]
(A)-140
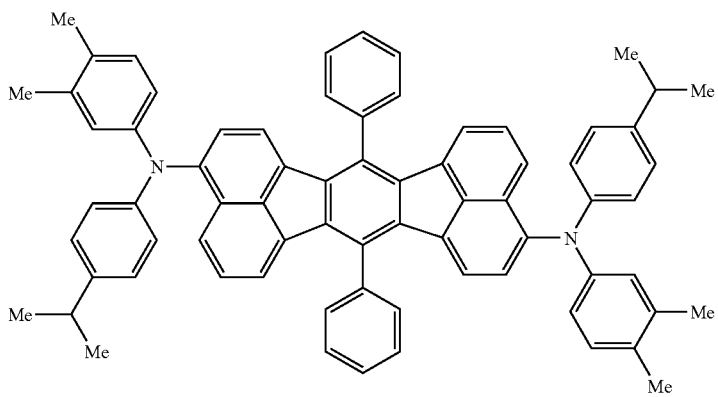
(A)-141
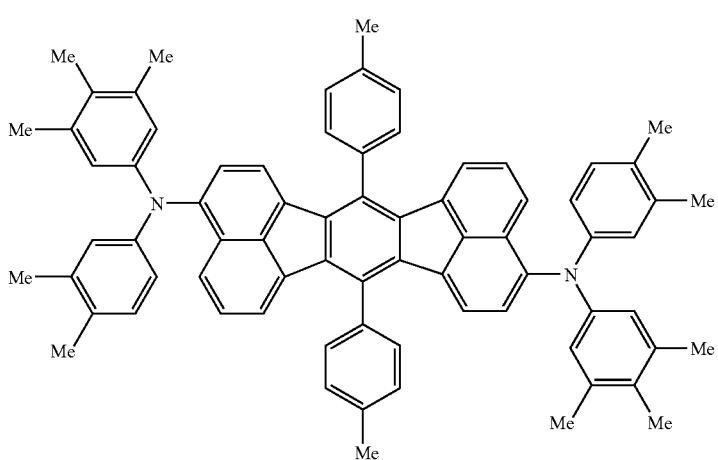

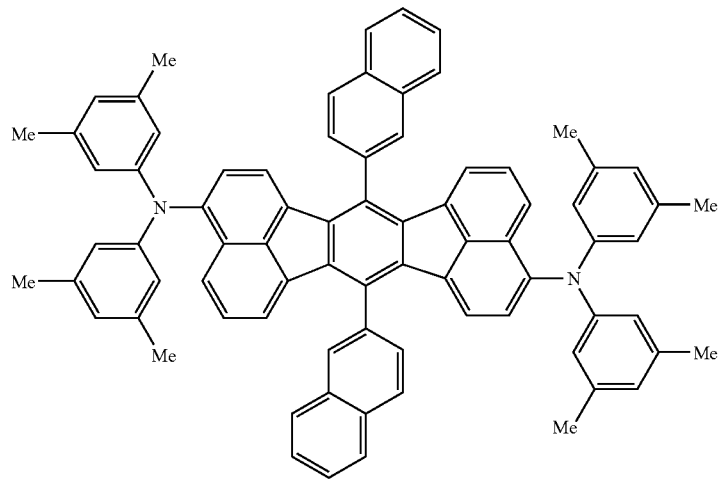
(A)-142
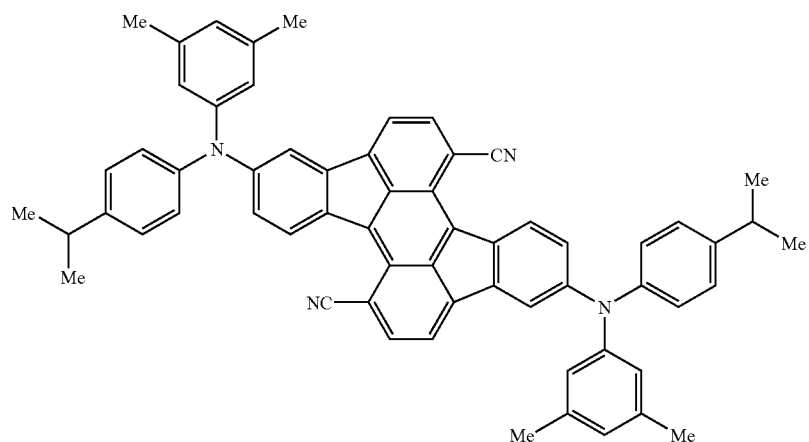
(A)-143
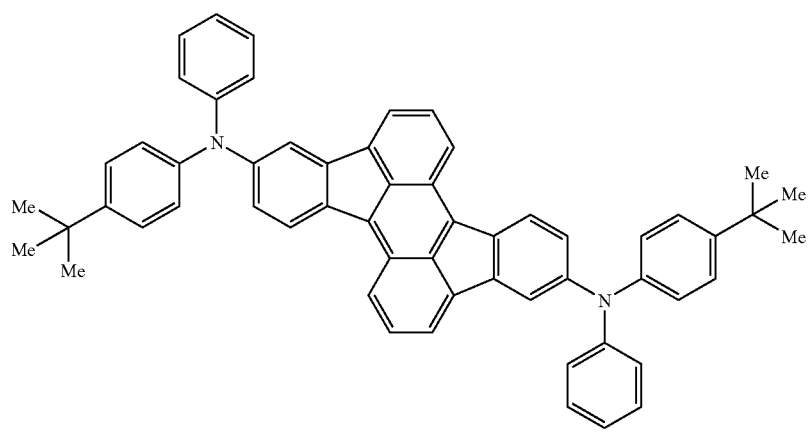
(A)-144

-continued
(A)-145
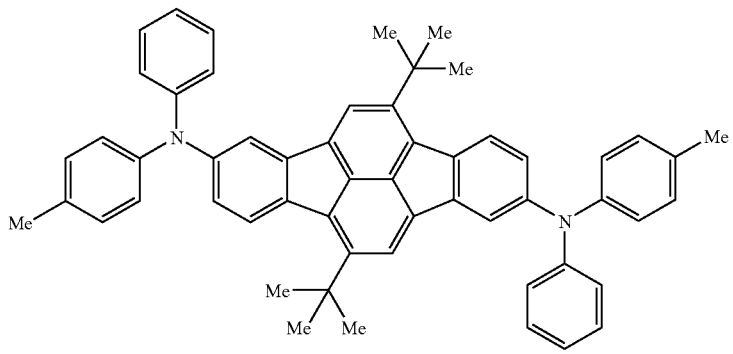
(A)-146
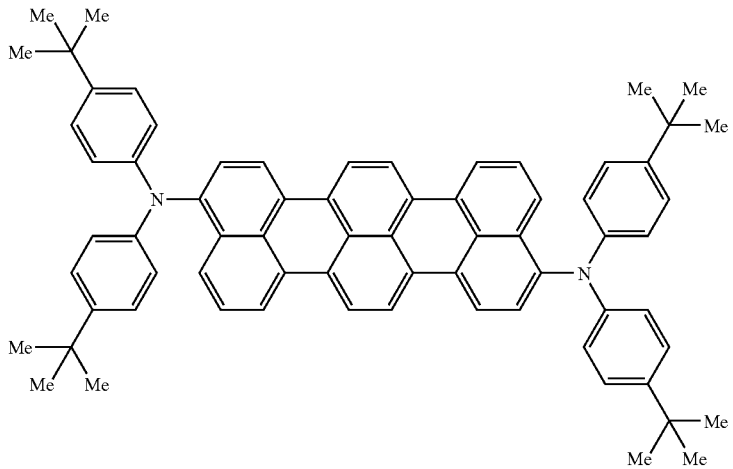
(A)-147
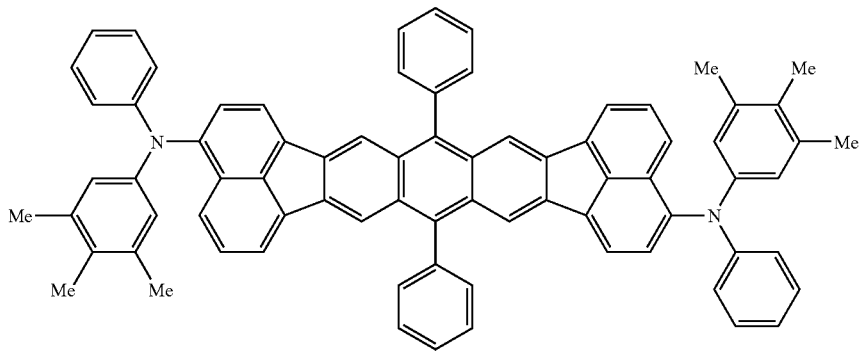
[Chemical Formula 42]
(A)-148 (A)-149
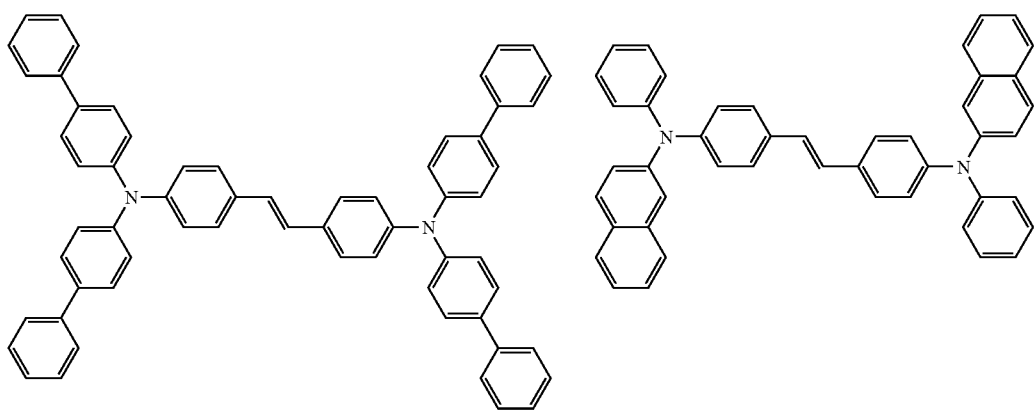

-continued
(A)-150
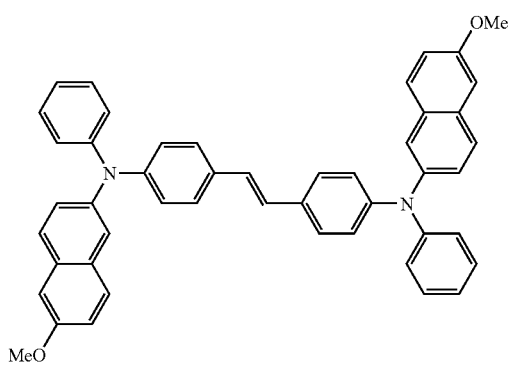
(A)-151
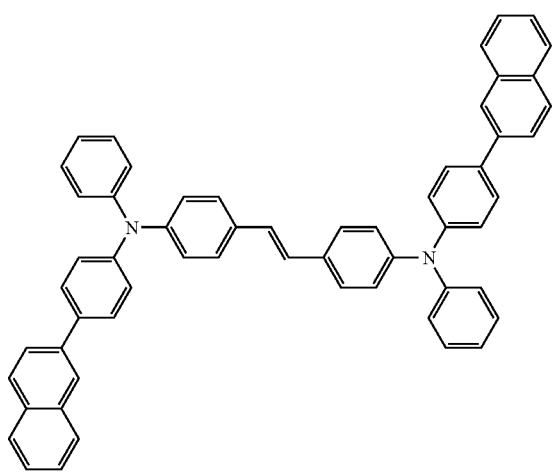
(A)-152
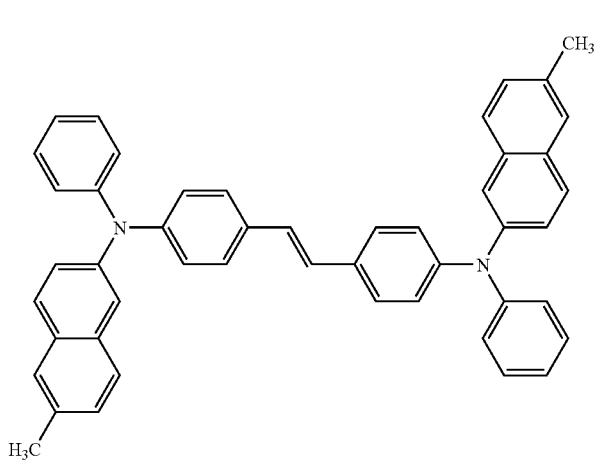
(A)-153
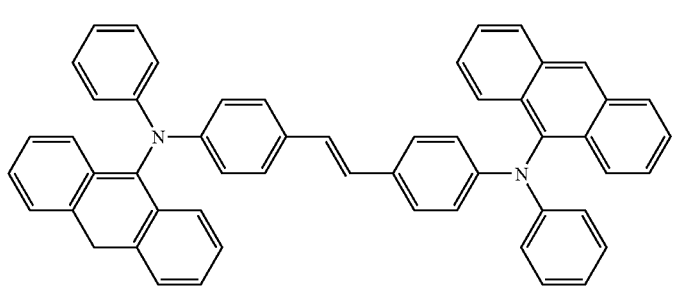
(A)-154
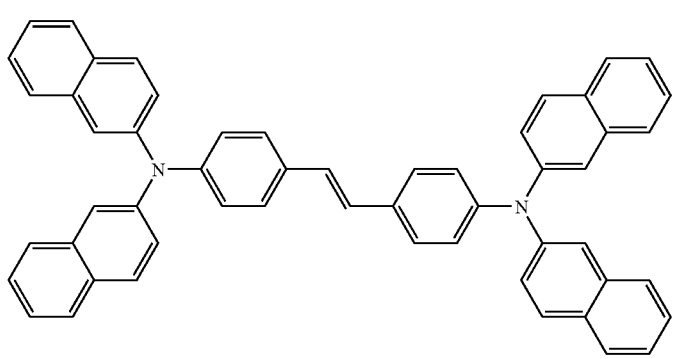

-continued
(A)-155
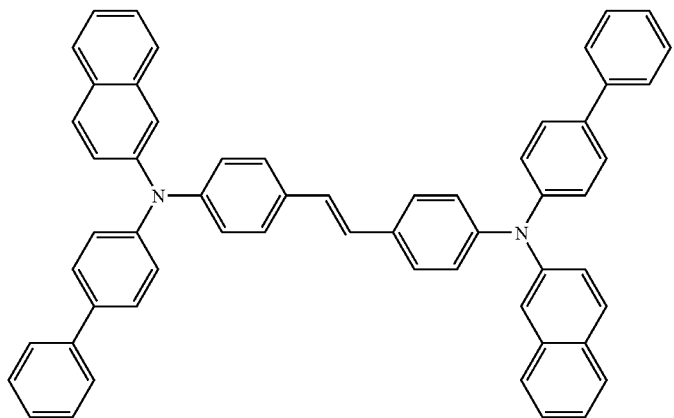
(A)-156
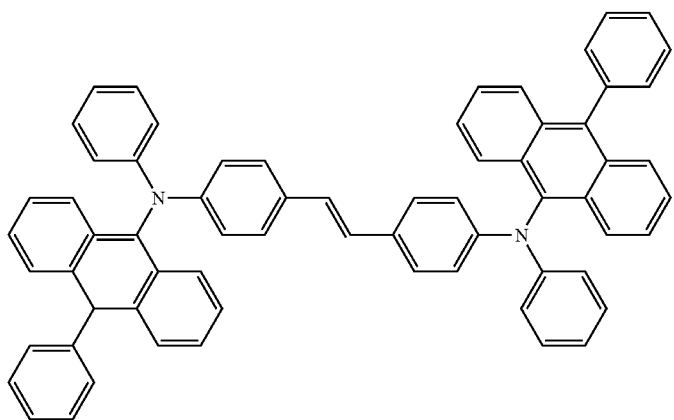
[Chemical Formula 43]
(A)-157
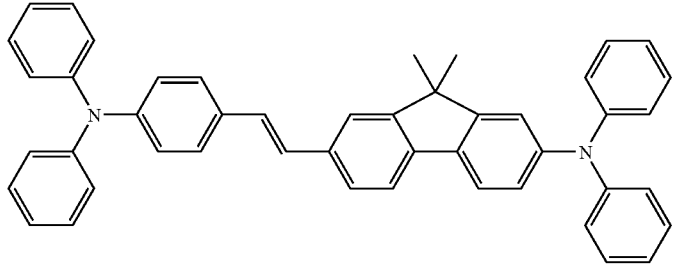
(A)-158
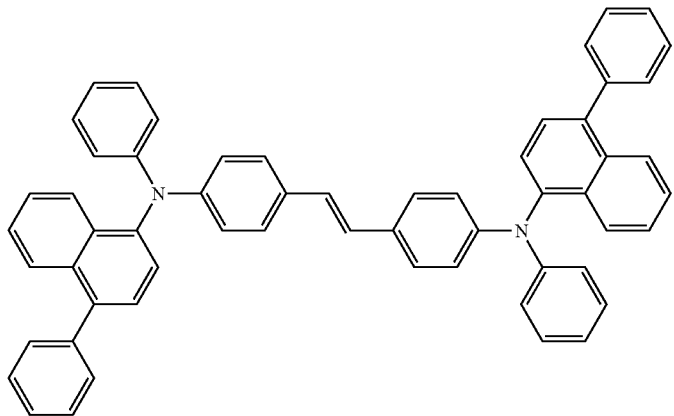

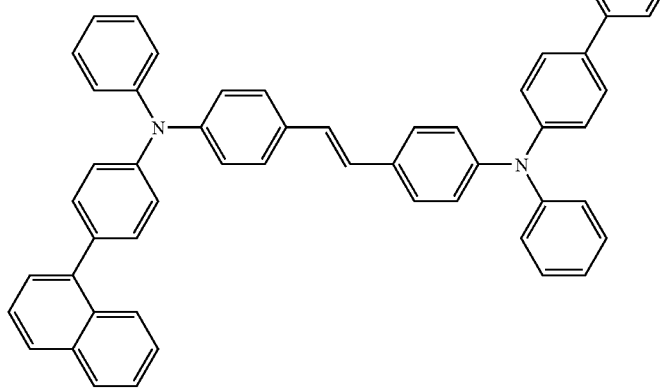
(A)-159
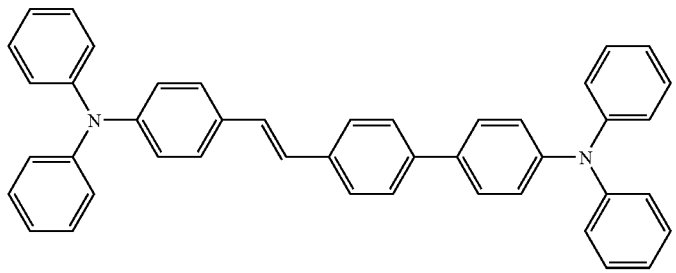
(A)-160
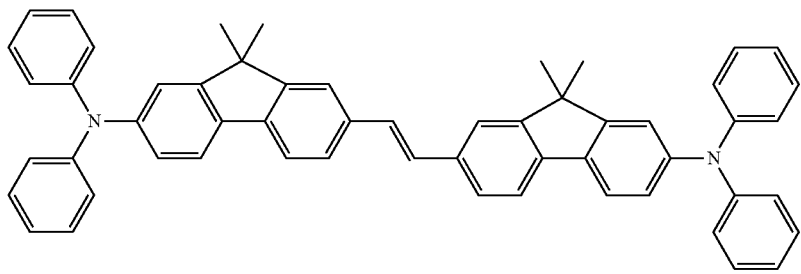
(A)-161
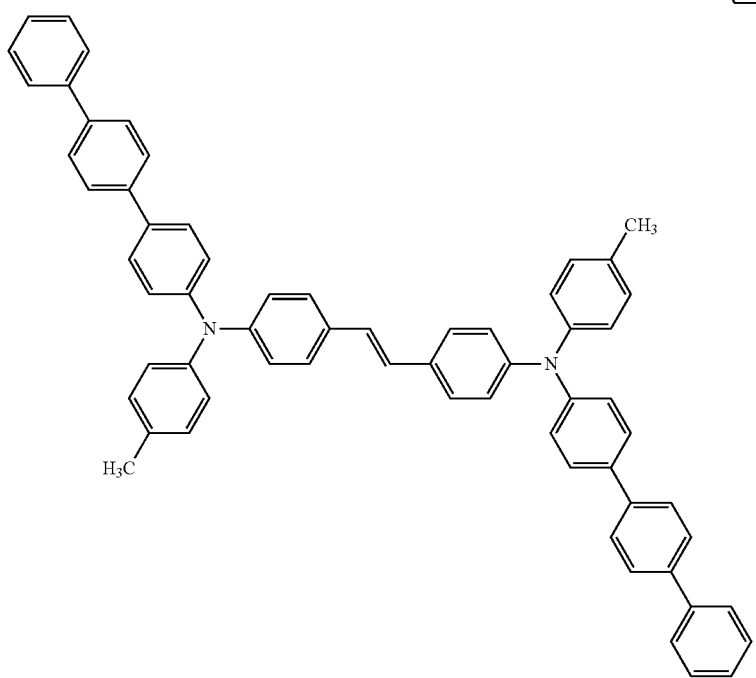
(A)-162

-continued
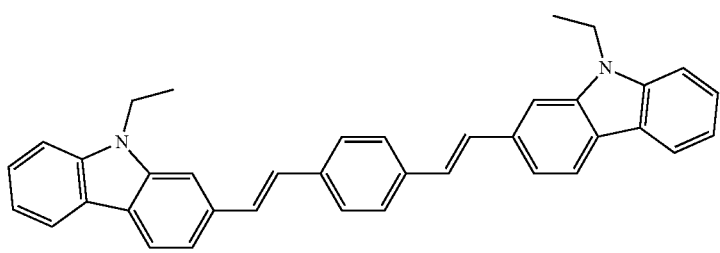
(A)-163
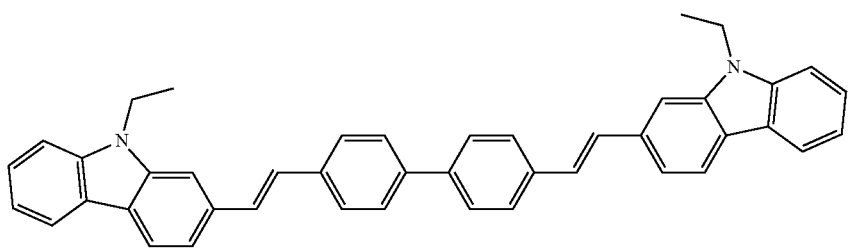
(A)-164
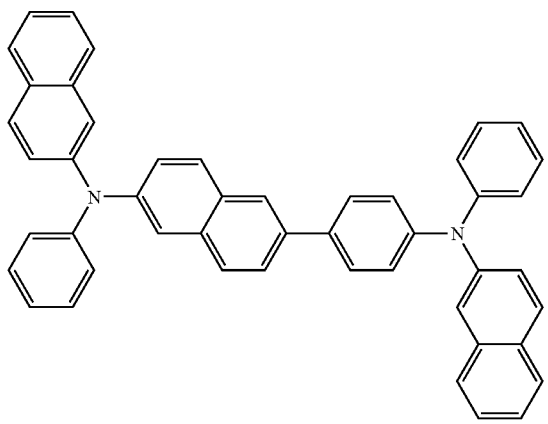
(A)-165
[Chemical Formula 44]
EM32
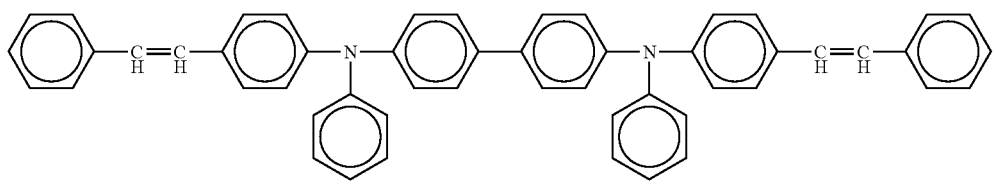
(A)-166
EM33
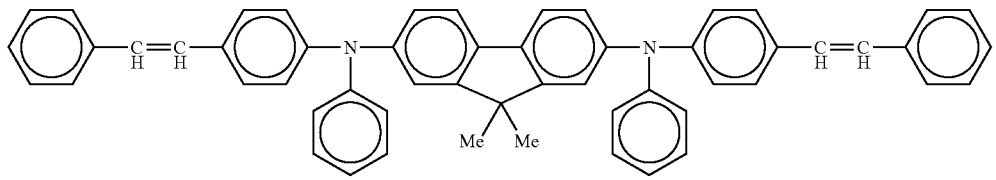
(A)-167

-continued
EM34 (A)-168
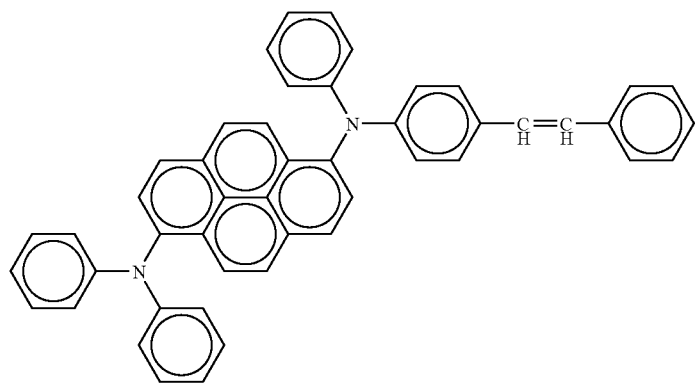
EM35 (A)-169
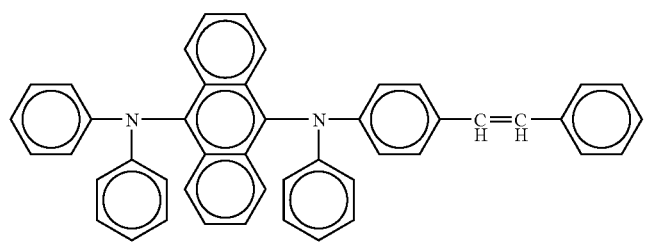
EM36 (A)-170
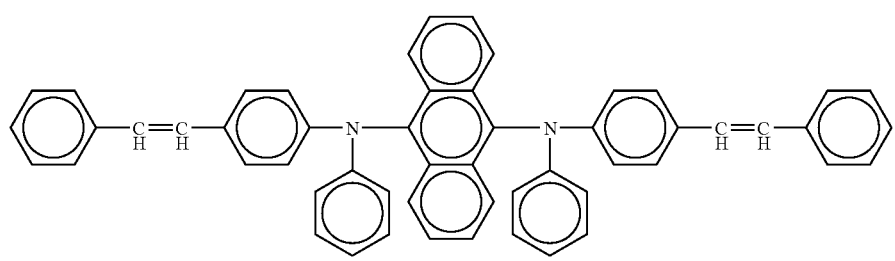
[Chemical Formula 45]
EM41 (A)-171
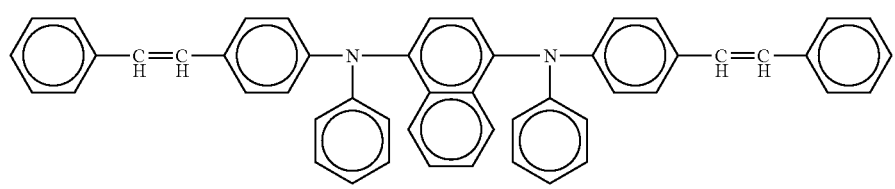
EM42 (A)-172
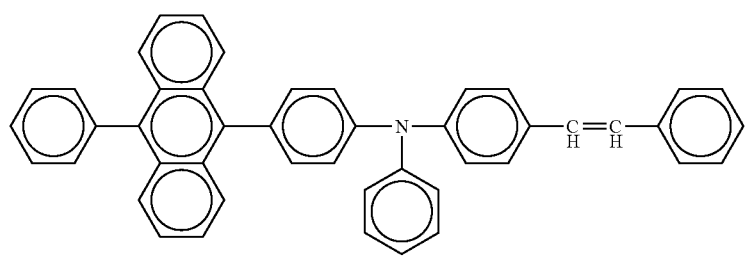

EM43
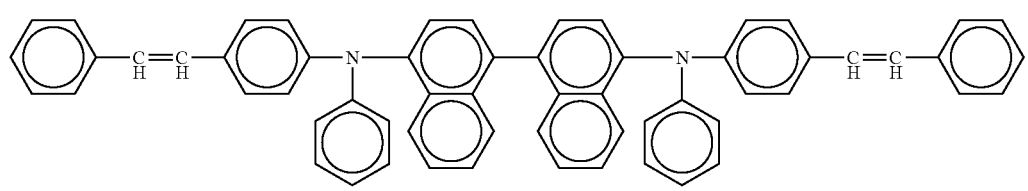
(A)-173
EM44
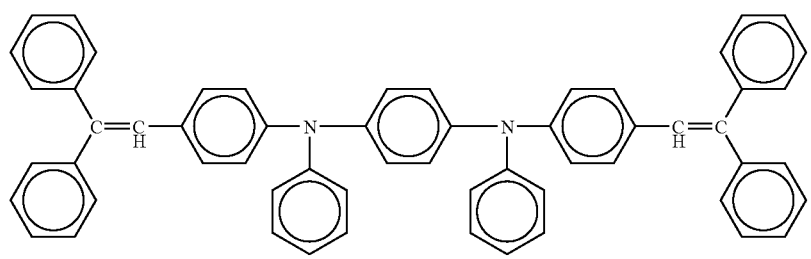
(A)-174
EM45
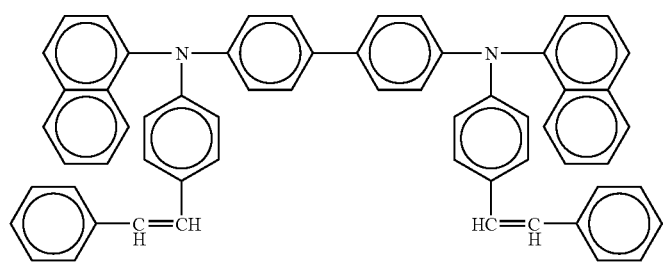
(A)-175
[Chemical Formula 46]
EM46
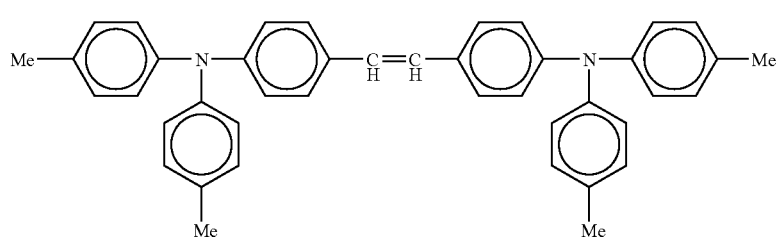
(A)-176
EM47
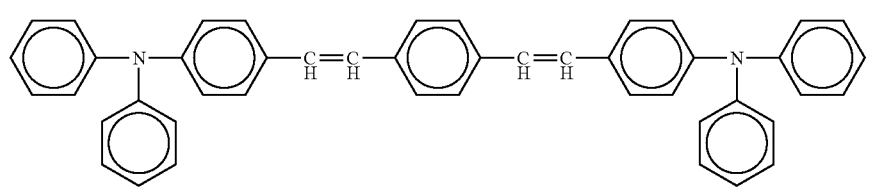
(A)-177
EM48
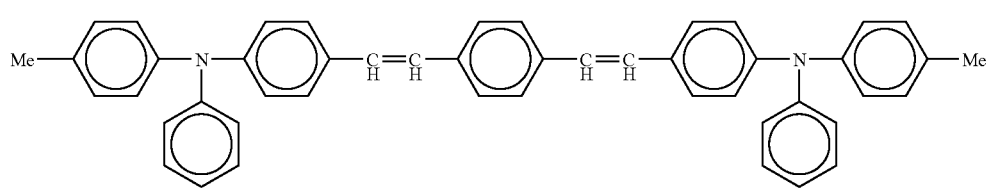
(A)-178

-continued
EM49
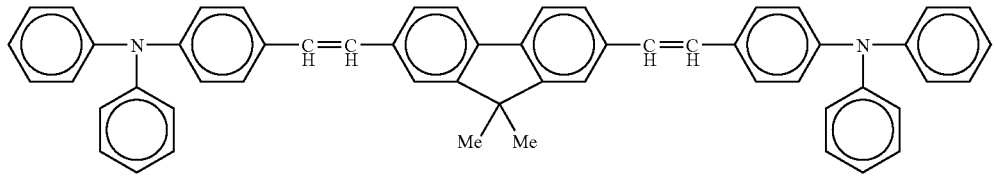
(A)-179
EM50
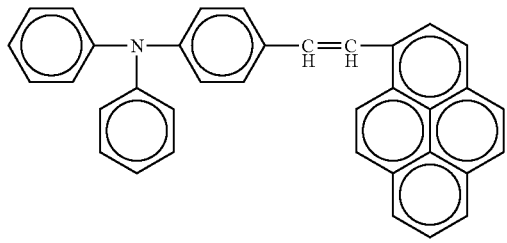
(A)-180
[Chemical Formula 47]
EM51
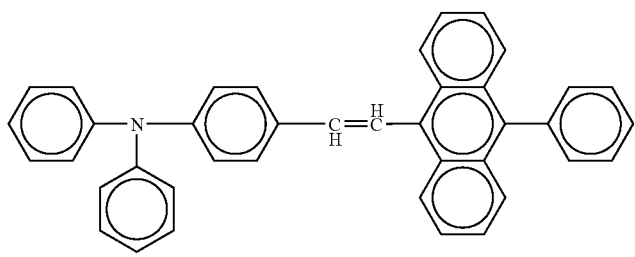
(A)-181
EM52
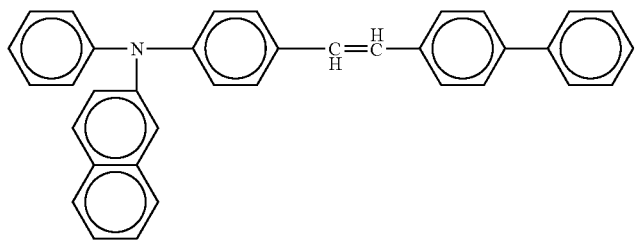
(A)-182
EM53
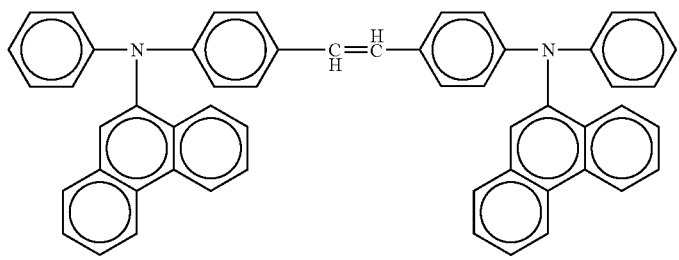
(A)-183
EM54
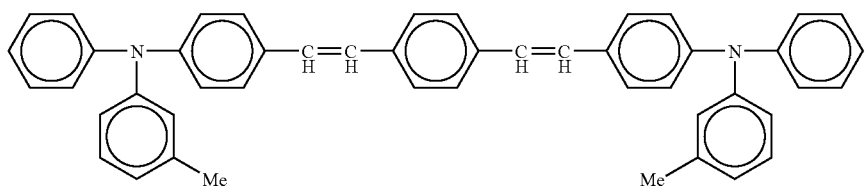
(A)-184

-continued
EM55
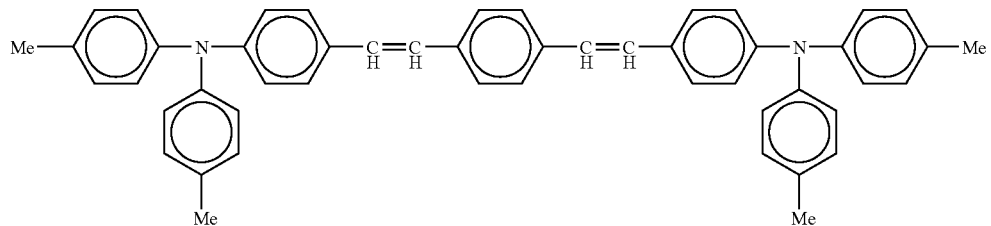
(A)-185
[Chemical Formula 48]
EM56
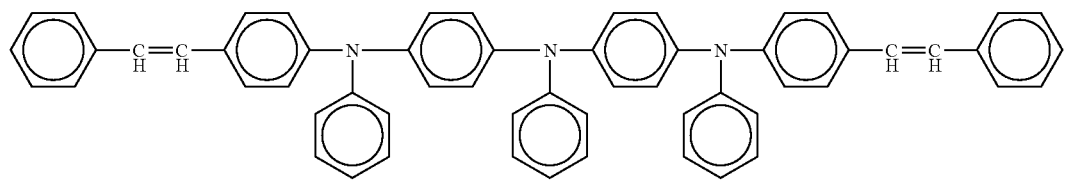
(A)-186
EM57
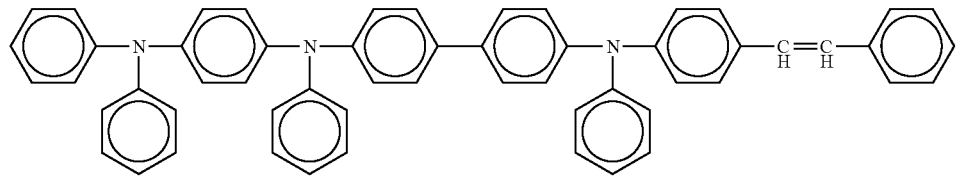
(A)-187
EM58
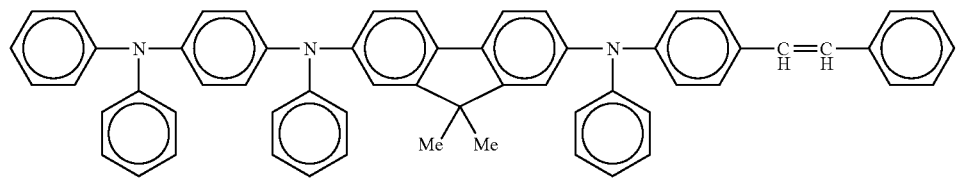
(A)-188
EM59
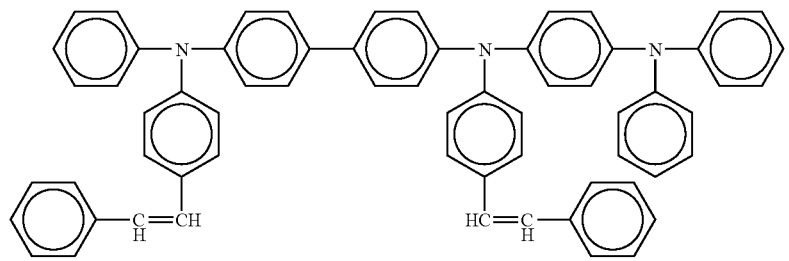
(A)-189
EM60
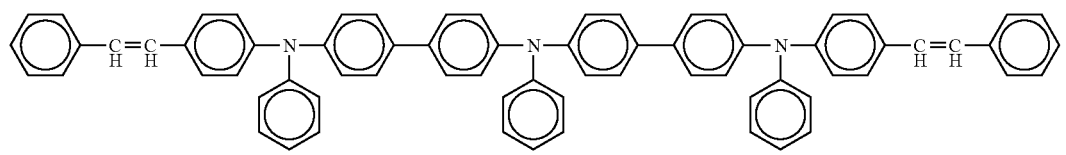
(A)-190

EM61
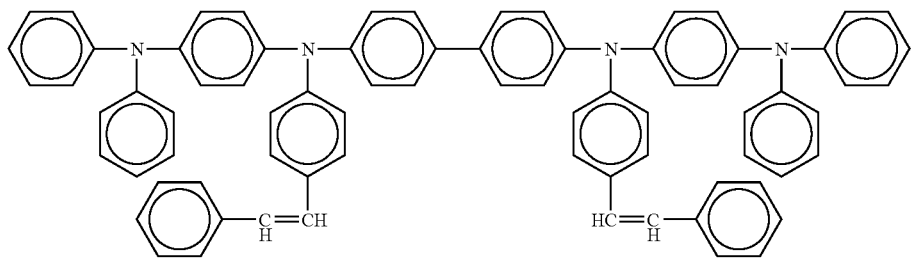
(A)-191
EM62
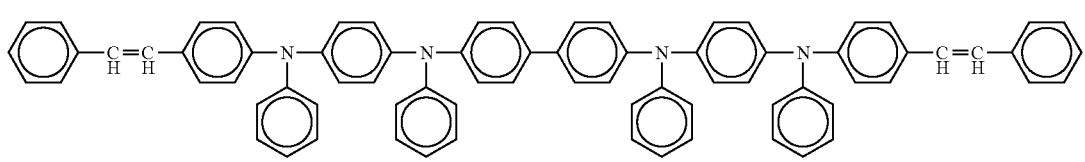
(A)-192
[Chemical Formula 49]
EM63
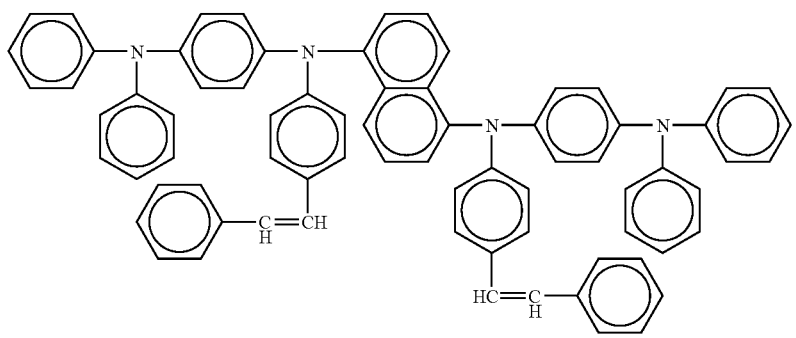
(A)-193
EM64
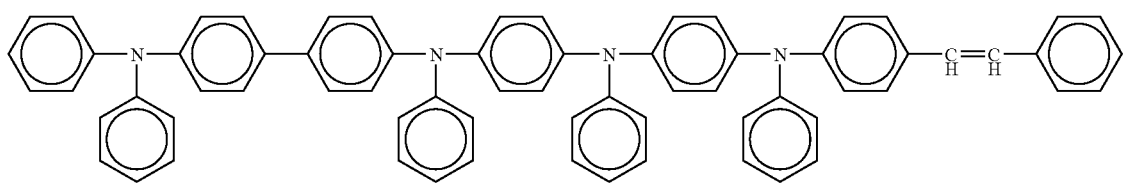
(A)-194
EM65
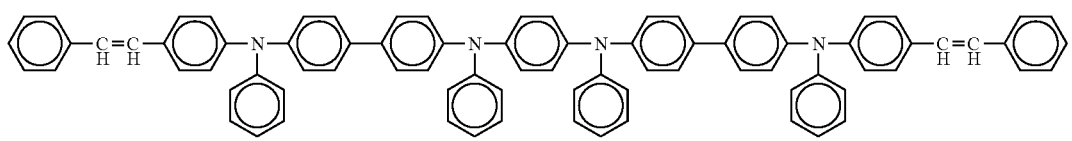
(A)-195
[Chemical Formula 50]
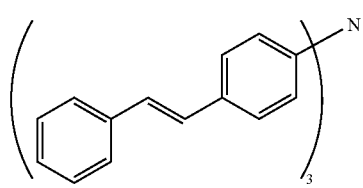
(A)-196
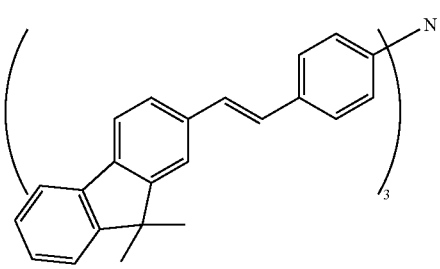
(A)-197

-continued

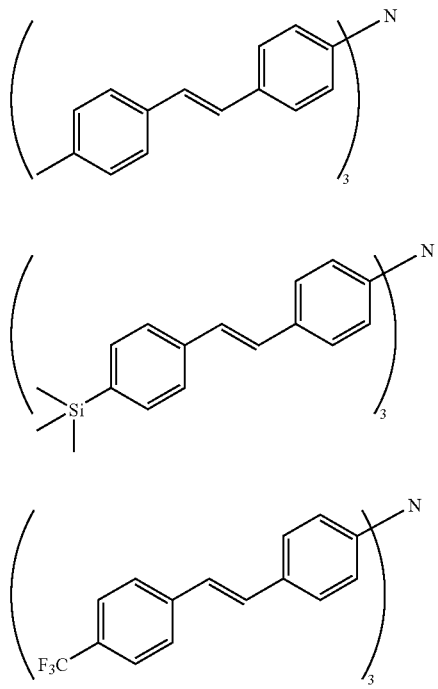
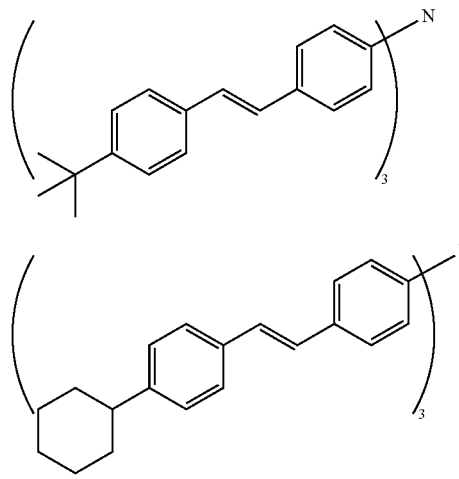
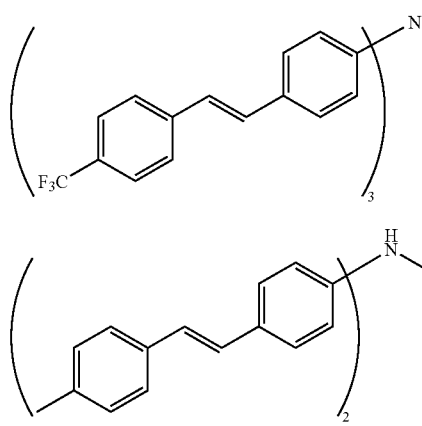
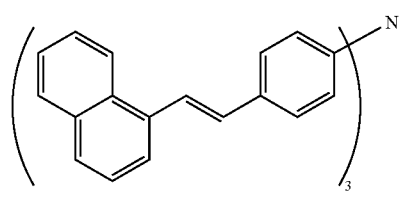
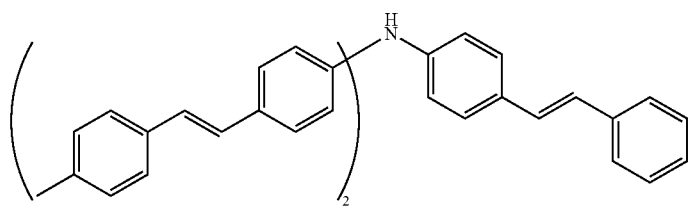
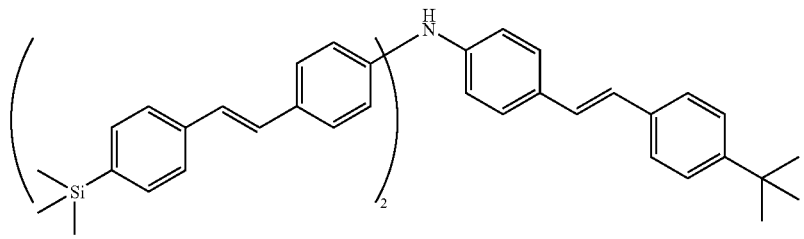

(4.3) Charge Blocking Layer

When the fluorescent-emitting layer is provided adjacently to the cathode as in this exemplary embodiment (FIG. 1), the charge blocking layer blocks the electrons injected into the fluorescent-emitting layer from being injected toward the charge blocking layer from the fluorescent-emitting layer, and also injects the holes from the phosphorescent-emitting layer into the fluorescent-emitting layer.

For instance, by differentiating the affinity level and electron mobility, the charge blocking layer can block the injection of the electrons toward the charge blocking layer from the fluorescent-emitting layer.

In particular, the charge blocking layer preferably exhibits a smaller affinity level than the fluorescent host, and the affinity level $Af_{EB}$ of the charge blocking layer and the affinity level $Af_{FH}$ of the fluorescent host preferably satisfy the following formula (2).

$$Af_{EB} < Af_{FH} - 0.1 \text{ eV} \quad (2)$$

In addition, for the same reason, the thickness of the charge blocking layer is preferably 3 nm or more.

The holes to be injected into the fluorescent-emitting layer from the phosphorescent-emitting layer via the charge blocking layer are injected into HOMO of the fluorescent host. Accordingly, the thickness of the charge blocking layer is preferably 9 nm or less.

The charge blocking layer also exhibits a greater triplet energy gap than the fluorescent dopant. Accordingly, the transfer of the excited triplet energy to the fluorescent dopant can be prevented.

Examples of the material used as the fluorescent host and the charge blocking layer are the compounds represented by the formulae (101) to (105) and the following compounds. The materials for the phosphorescent host and the hole transporting layer can also be selected from these compounds.

The phosphorescent host, the hole transporting layer, the fluorescent host and the charge blocking layer may be made of the same material.

[Chemical Formula 51]
TCTA
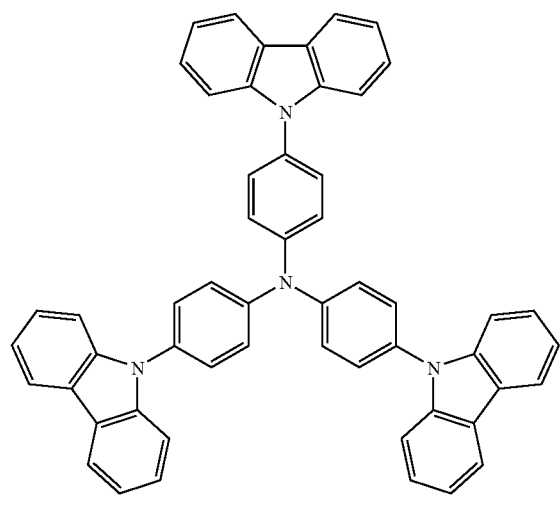
CBP
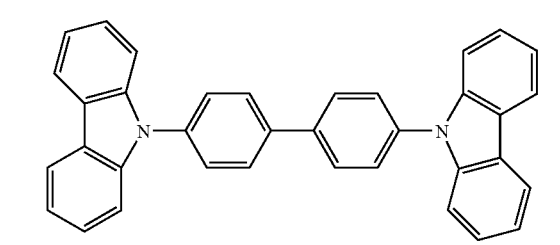
NPD
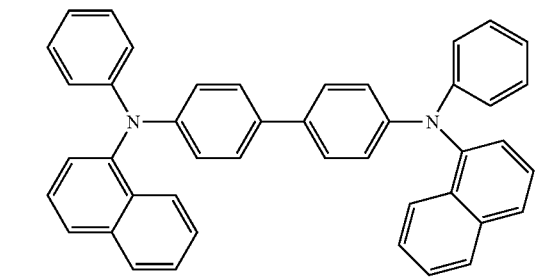
CDBP
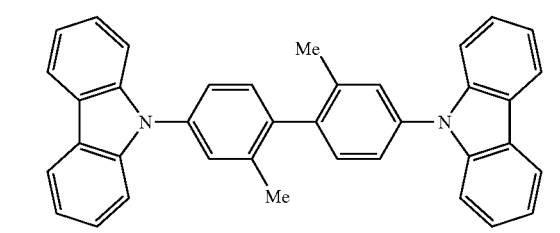
mCP
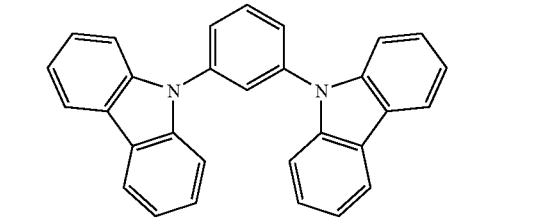
-continued
A-1
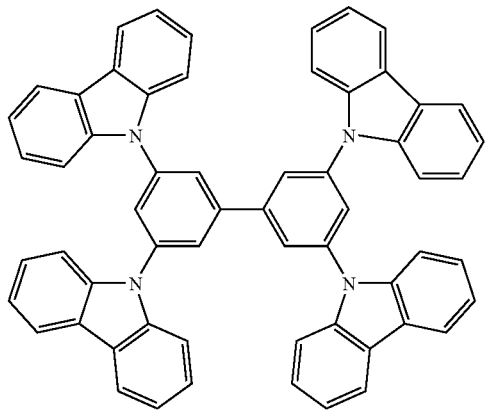
A-2
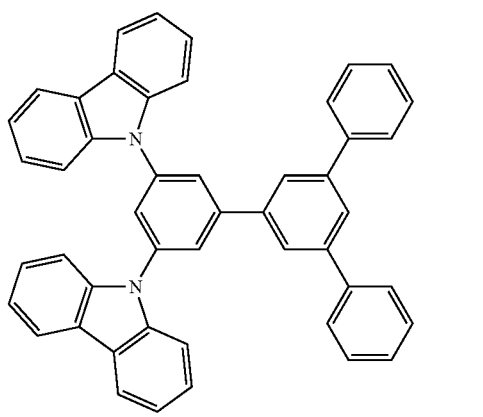
A-3
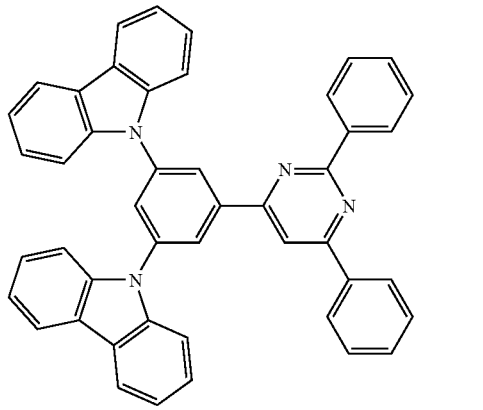
A-4
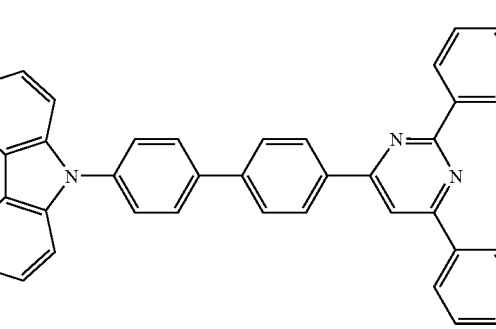

[Chemical Formula 52]
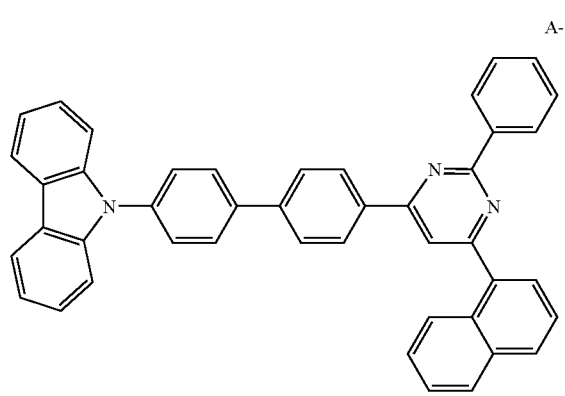
A-5
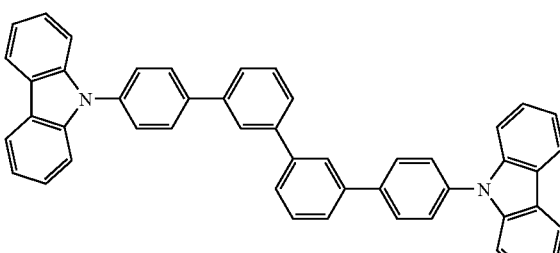
A-6
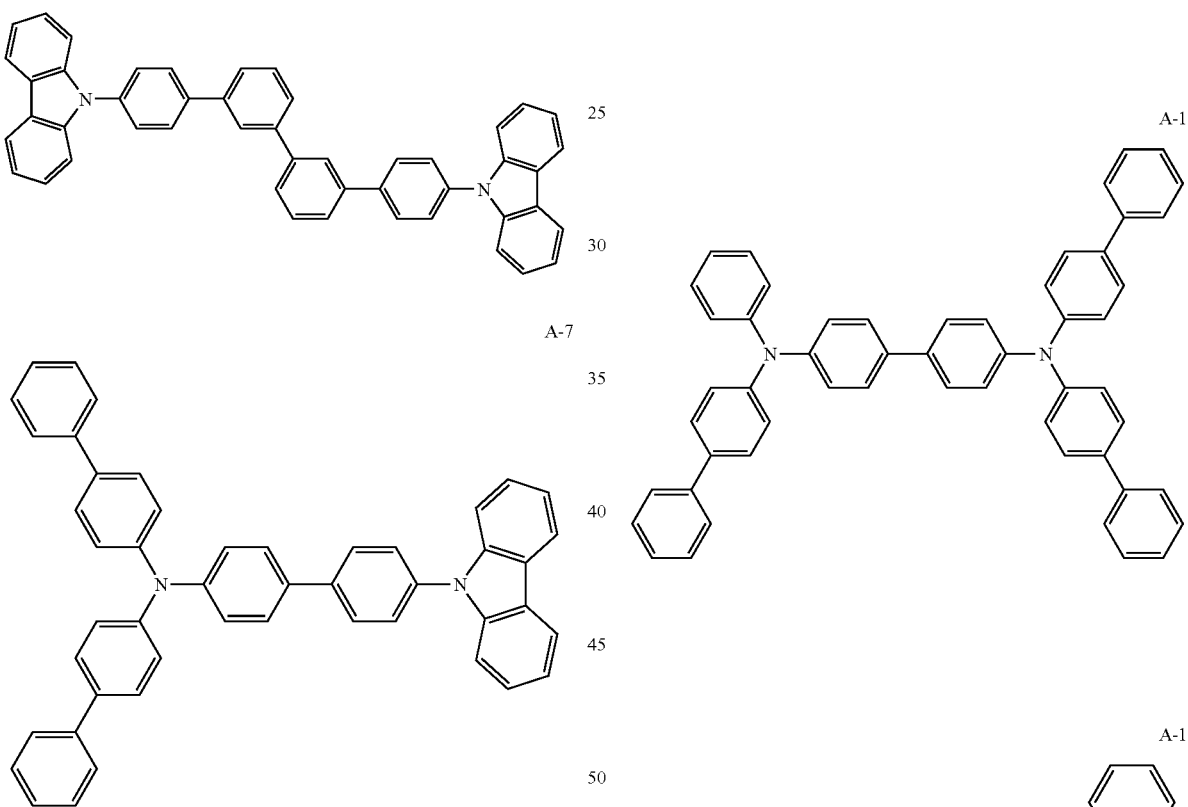
A-7
A-8
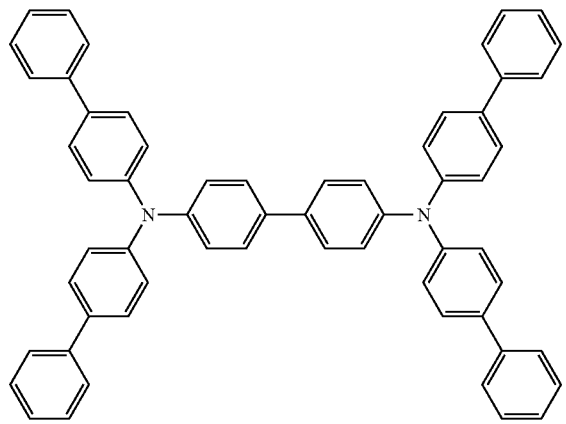
A-9
A-10
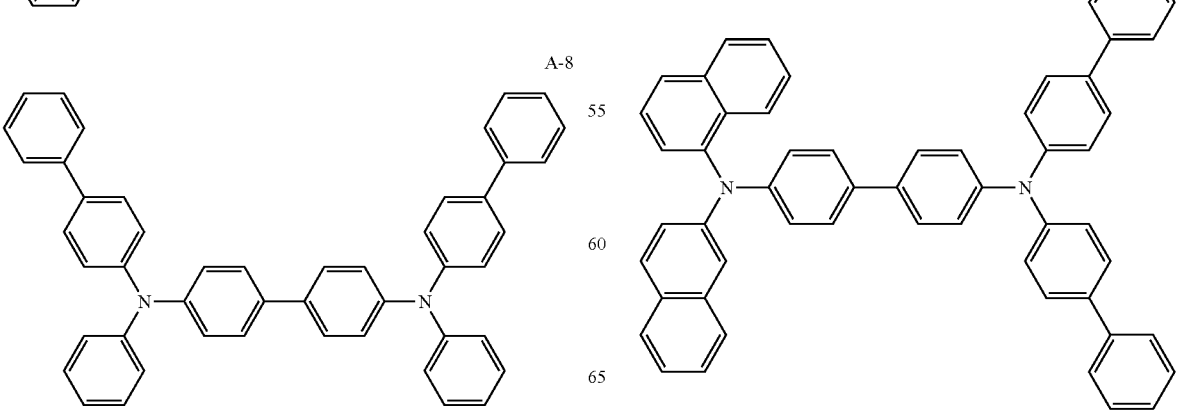
A-11

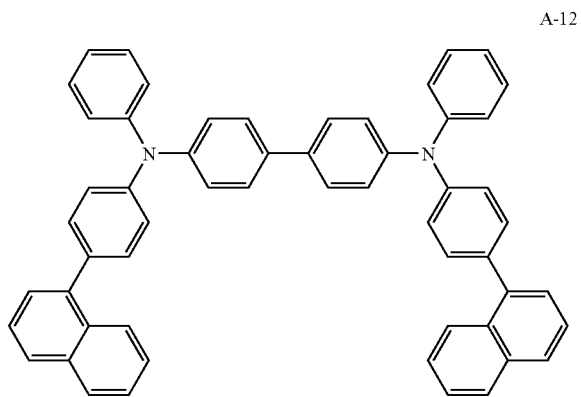
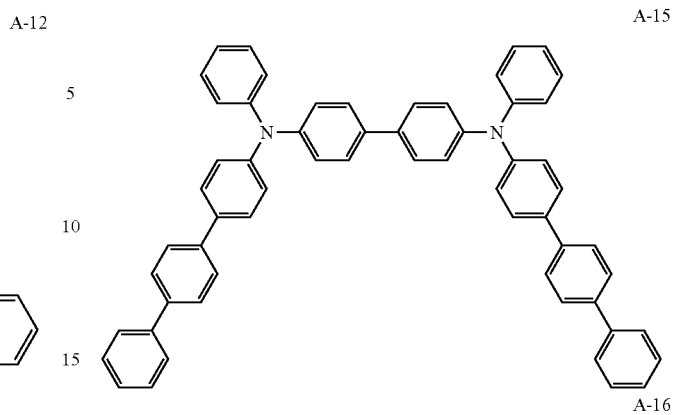
[Chemical Formula 53]

In view of the formulae (1) and (2), the compounds used as the fluorescent host and the charge blocking layer are selected from these compounds.

Combinations of the compounds used as the fluorescent host and the charge blocking layer, the triplet energy gaps of the compounds and numeric values of the affinity level (Af) will be shown in Table 1.

the formulae (1) and (2) are satisfied. Accordingly, by using CDBP and the compound A-1 as the fluorescent host and the charge blocking layer respectively, the organic EL device according to the aspect of the invention can be (provided.

When: A-3 is used as the fluorescent host; and the compound A-2 is used as the charge blocking layer, the formula (2) is not satisfied. However, since the formula (1) is satisfied,

TABLE 1

|  |  | Charge Blocking Layer | | | | | | | | | | |
|---|---|---|---|---|---|---|---|---|---|---|---|---|
|  |  | CDBP | A-3 | A-2 | A-1 | A-6 | CBP | A-7 | A-4 | A-9 | A-5 | A-8 | NPD |
| Fluorescent | CDBP | — | B | B | B | B | B | B | B | B | B | B | B |
| Host | A-3 | C | — | B | A | A | B | B | B | A | B | A | B |
|  | A-2 | C | B | — | A | B | B | B | B | B | B | B | B |
|  | A-1 | C | B | B | — | B | B | B | B | B | B | B | B |
|  | A-6 | C | C | C | C | — | B | B | B | B | B | B | B |
|  | CBP | C | C | C | C | A | — | B | B | A | B | A | B |
|  | A-7 | C | C | C | C | C | C | — | B | B | B | B | B |
|  | A-4 | C | C | C | C | C | C | C | — | A | B | A | B |
|  | A-9 | C | C | C | C | C | C | C | B | — | B | B | B |
|  | A-5 | C | C | C | C | C | C | C | C | C | — | A | A |
|  | A-8 | C | C | C | C | C | C | C | C | C | B | — | B |
|  | NPD | C | C | C | C | C | C | C | C | C | B | A | — |
|  | A-10 | C | C | C | C | C | C | C | C | C | C | C | C |
|  | A-15 | C | C | C | C | C | C | C | C | C | C | C | C |
|  | A-13 | C | C | C | C | C | C | C | C | C | C | C | C |
|  | A-11 | C | C | C | C | C | C | C | C | C | C | C | C |
|  | A-14 | C | C | C | C | C | C | C | C | C | C | C | C |
|  | A-16 | C | C | C | C | C | C | C | C | C | C | C | C |
|  | A-17 | C | C | C | C | C | C | C | C | C | C | C | C |
|  | A-12 | C | C | C | C | C | C | C | C | C | C | C | C |

|  |  | Charge Blocking Layer | | | | | | | | | |
|---|---|---|---|---|---|---|---|---|---|---|---|
|  |  | A-10 | A-15 | A-13 | A-11 | A-14 | A-16 | A-17 | A-12 | Eg (eV) | Af (eV) |
| Fluorescent | CDBP | B | B | B | B | B | B | B | B | 3.1 | 2.3 |
| Host | A-3 | A | A | B | A | A | B | A | A | 2.9 | 2.5 |
|  | A-2 | B | B | B | A | A | B | B | A | 2.9 | 2.4 |
|  | A-1 | B | B | B | B | B | B | B | B | 2.9 | 2.2 |
|  | A-6 | B | B | B | B | B | B | B | B | 2.8 | 2.3 |
|  | CBP | A | A | B | A | A | B | A | A | 2.8 | 2.5 |
|  | A-7 | B | B | B | A | A | B | B | A | 2.7 | 2.4 |
|  | A-4 | A | A | B | A | A | B | A | A | 2.6 | 2.5 |
|  | A-9 | B | B | B | B | B | B | B | B | 2.6 | 2.3 |
|  | A-5 | A | A | A | A | A | B | A | A | 2.5 | 2.7 |
|  | A-8 | B | B | B | B | B | B | B | B | 2.5 | 2.3 |
|  | NPD | A | A | B | A | A | B | A | A | 2.5 | 2.5 |
|  | A-10 | — | B | B | A | A | B | B | B | 2.4 | 2.3 |
|  | A-15 | B | — | B | B | B | B | B | B | 2.4 | 2.3 |
|  | A-13 | B | B | — | A | A | B | B | A | 2.4 | 2.4 |
|  | A-11 | C | C | C | — | B | B | B | B | 2.3 | 2.2 |
|  | A-14 | C | C | C | B | — | B | B | B | 2.3 | 2.2 |
|  | A-16 | C | C | C | A | A | — | A | A | 2.3 | 2.8 |
|  | A-17 | C | C | C | C | C | C | — | B | 2.2 | 2.3 |
|  | A-12 | C | C | C | C | C | C | B | — | 2.2 | 2.2 |

In Table 1, when the triplet energy gap $Eg_{EB}$ of the charge blocking layer and the triplet energy gap $Eg_{FH}$ of the fluorescent host satisfy the above formula (1) (i.e., $Eg_{EB} \leq Eg_{FH}$), such combinations are rated as B. When not satisfied, such combinations are rated as C. When: the above formula (1) is satisfied; and the affinity level $Af_{EB}$ of the charge blocking layer and the affinity level $Af_{FH}$ of the fluorescent host of the fluorescent-emitting layer satisfy the above formula (2) (i.e., $Af_{EB} < Af_{FH} - 0.1$ eV), such combinations are rated as A. The combinations rated as A and B are combinations preferable for forming the organic EL device according to the aspect of the invention. The combinations rated as C are non-preferable combinations. Particularly, the combinations rated A are preferable.

For instance, when: A-3 is used as the fluorescent host; and the compound A-1 is used as the charge blocking layer, both the organic EL device according to the aspect of the invention can be provided.

However, when: the compound A-3 is used as the fluorescent host; and CDBP is used as the charge blocking layer, neither the formula (1) nor (2) is satisfied, so that the organic EL device according to the aspect of the invention cannot be provided.

(5) At Least One of Hole Injecting Layer and Hole Transporting Layer (Hole Transporting Zone)

The hole transporting layer will be described below.

The hole transporting layer may be provided between the anode and the phosphorescent-emitting layer. The hole injecting layer may be provided between the hole transporting layer and the anode.

At least one of the hole injecting layer and the hole transporting layer helps injection of the holes and transports the holes, in which the hole mobility is high and the energy of ionization is typically small (5.5 eV or smaller).

At least one of the hole injecting layer and the hole transporting layer is preferably made of a material for transporting the holes into the emitting layer with a low field intensity, and is more preferably made of a material for transporting the holes with the hole mobility of, for example, at least $1.0 \times 10^{-5}$ cm²/Vs when the electrical field of $1.0 \times 10^4$ to $1.0 \times 10^6$ V/cm is applied.

According to the aspect of the invention, the exciton generation in the host of the fluorescent-emitting layer is important.

The charge blocking layer and the phosphorescent-emitting layer are provided to the fluorescent-emitting layer adjacently to the anode. Accordingly, more layers than usual are layered between the anode and the fluorescent-emitting layer.

Thus, the hole transporting layer in which the hole mobility is high is preferable. For example, the hole mobility is preferably $1.0 \times 10^{-5}$ cm²/Vs or more, more preferably $1.0 \times 10^{-4}$ cm²/V or more, further more preferably $1.0 \times 10^{-3}$ cm²/Vs or more, in the electrical field of $1.0 \times 10^4$ to $1.0 \times 10^6$ V/cm.

Examples of hole transporting materials are CBP ($1.0 \times 10^{-3}$ cm²/Vs), TCTA ($4.0 \times 10^{-4}$ cm²/Vs) and NPD ($6.0 \times 10^{-4}$ cm²/Vs) in descending order of the hole mobility when the electrical field of $1.0 \times 10^4$ to $1.0 \times 10^6$ V/cm is applied.

It is important to increase the probability of the exciton generation in the fluorescent-emitting layer by transporting the holes into the fluorescent-emitting layer. On the other hand, the holes need to be injected not into the phosphorescent dopant but into the phosphorescent host when the holes are injected into the phosphorescent-emitting layer from the hole transporting layer.

Thus, ionization potential $Ip_{HT}$ of the hole transporting layer is preferably at least larger than ionization potential $Ip_{PD}$ of the phosphorescent dopant of the phosphorescent-emitting layer.

It is because, when the ionization potential $Ip_{HT}$ of the hole transporting layer is smaller than the ionization potential $Ip_{PD}$ of the phosphorescent dopant, the holes would be easily injected into the phosphorescent dopant from the hole transporting layer.

Further, in order to increase the probability of injecting the holes into the phosphorescent host, instead of the phosphorescent dopant, from the hole transporting layer, the ionization potential $Ip_{PH}$ of the phosphorescent host of the phosphorescent-emitting layer, the ionization potential $Ip_{PD}$ of the phosphorescent dopant of the phosphorescent-emitting layer, and the ionization potential $Ip_{HT}$ of the hole transporting layer preferably satisfy the following formula (3).

$$(Ip_{PH} + Ip_{PD})/2 < Ip_{HT} \quad (3)$$

When the relationship represented by the formula (3) is satisfied, the ionization potential $Ip_{HT}$ of the hole injecting layer is more approximate to the ionization potential $Ip_{PH}$ of the phosphorescent host than the intermediate level ($(Ip_{PH} + Ip_{PD})/2$) between the ionization potential $Ip_{PD}$ of the phosphorescent dopant and the ionization potential $Ip_{PH}$ of the phosphorescent host.

Thus, the holes form the hole transporting layer becomes easily injectable in the phosphorescent host, thereby reducing the consumption of the charges by the phosphorescent dopant.

Then, the holes become easily injectable from the phosphorescent host into the fluorescent-emitting layer via the charge blocking layer. Accordingly, the probability of the exciton generation in the fluorescent-emitting layer can be increased and the luminance efficiency can be considerably enhanced.

Incidentally, when a plurality of phosphorescent-emitting layers are provided, the ionization potential $Ip_{PH}$ of the phosphorescent host of the phosphorescent-emitting layer indicates ionization potential of the phosphorescent host of the phosphorescent-emitting layer closest to the hole transporting layer.

From the relationship of the ionization potentials as described above, the ionization potential (Ip) of each compound and applicability as the hole transporting layer are shown in Table 2 as follows.

TABLE 2

|  |  | Ip(eV) | Applicability as Hole Transporting Layer |
|---|---|---|---|
| Hole Transporting Layer | A-3 | 6.1 | A |
|  | A-2 | 6.0 | A |
|  | CDBP | 6.0 | A |
|  | A-5 | 5.9 | A |
|  | A-16 | 5.9 | A |
|  | CBP | 5.9 | A |
|  | mCP | 5.9 | A |
|  | A-1 | 5.8 | A |
|  | A-4 | 5.8 | A |
|  | A-6 | 5.8 | A |
|  | TCTA | 5.8 | A |
|  | A-7 | 5.6 | B |
|  | A-9 | 5.5 | B |
|  | A-10 | 5.5 | B |
|  | NPD | 5.5 | B |
|  | A-8 | 5.4 | B |
|  | A-12 | 5.4 | B |
|  | A-13 | 5.4 | B |
|  | A-15 | 5.4 | B |
|  | A-11 | 5.3 | B |
|  | A-14 | 5.3 | B |
|  | A-17 | 5.3 | B |

(Phosphorescent dopant: Ir(ppy)₃, Ip = 5.2 eV)
(Phosphorescent Host: A-3, Ip = 6.1 eV)

In Table 2, the applicability as the hole transporting layer is rated as A or B under condition that Ir(ppy)₃ is used as the phosphorescent dopant and the compound A-3 is used as the phosphorescent host. The rating of B is given to the compounds that: exhibit larger Ip than Ip of Ir(ppy)₃ (i.e., the phosphorescent dopant); and are capable of injecting the holes into HOMO of the phosphorescent host when used as the hole transporting layer. The rating of A is given to the compounds that: exhibit Ip more approximate to Ip of the compound A-3 (i.e., the phosphorescent host) than Ip of Ir(ppy)₃ (i.e., the phosphorescent dopant); and are capable of more reliably injecting the holes into HOMO of the phosphorescent host.

For example, when the compound A-3 is used as the hole transporting layer, its Ip(6.1 eV) is larger than Ip(5.2 eV) of Ir(ppy)₃ used as the phosphorescent dopant. Since the phosphorescent host is made of the compound A-3 (i.e., the same material as the hole transporting layer), Ip of both layers areequal. Thus, the applicability of the compound A-3 as the hole transporting layer is rated as A.

When the compound A-7 is used as the hole transporting layer, its Ip(5.4 eV) is larger than Ip(5.2 eV) of Ir(ppy)₃ used as the phosphorescent dopant, but is more approximate to Ip(5.2 eV) of Ir(ppy)₃ used as the phosphorescent dopant than Ip(6.1 eV) of the compound A-3 used as the phosphorescent host. Thus, the applicability of the compound A-7 as the hole transporting layer is rated as B.

As described above, the fluorescent host, charge blocking layer, phosphorescent host and hole transporting layer are provided by suitably combining materials such that the triplet energy gap Eg, affinity level Af and ionization potential Ip of each of the layers satisfy a predetermined relationship.

Examples of a material used for at least one of the hole injecting layer and the hole transporting layer are as follows.

The examples are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, U.S. Pat. No. 3,820, 989 and U.S. Pat. No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961 and U.S. Pat. No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The material for the hole injecting layer, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, NPD having in the molecule two fused aromatic rings disclosed in U.S. Pat. Nos. 5,061,569, 4,4',4"-tris (N-(3-methylphenyl)-N-phenylamino) triphenylamine (hereinafter, abbreviated as MTDATA) in which three triphenylamine units disclosed in JP-A-04-308688 are bonded in a starbust form and the like may also be used.

The hole injecting layer and hole transporting layer help injection of the holes into the emitting layer and transport the holes into the emitting region, in which the hole mobility is large and the energy of ionization is typically small (5.5 eV or smaller). The hole injecting layer and hole transporting layer are preferably made of materials capable of transporting the holes into the emitting layer with a low field intensity, and are more preferably made of materials capable of transporting the holes with the hole mobility of, for example, $1.0 \times 10^{-4}$ cm$^2$/V·sec or more when the electrical field of $1.0 \times 10^4$ to $1.0 \times 10^6$ V/cm is applied.

The material used for the hole injecting layer and hole transporting layer are not specifically limited. Any material typically used for transporting charges of the holes in photoconducting materials or any material known to be applicable to the hole injecting layer and hole transporting layer of the organic EL device may be used.

For example, an aromatic amine derivative represented by formula as follows can be used for the hole injecting layer and hole transporting layer.

[Chemical Formula 54]

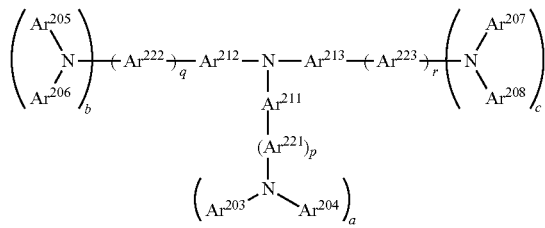

In the above formula, $Ar^{211}$ to $Ar^{213}$ and $Ar^{221}$ to $Ar^{223}$ each represent a substituted or unsubstituted arylene group having 6 to 50 ring carbon atoms, or a substituted or unsubstituted heteroarylene group having 5 to 50 ring atoms. $Ar^{203}$ to $Ar^{208}$ each represent a substituted or unsubstituted aryl group having 6 to 50 ring carbon atoms, or a substituted or unsubstituted heteroaryl group having 5 to 50 ring atoms. a to c and p to r each are an integer of 0 to 3. $Ar^{203}$ and $Ar^{204}$, $Ar^{205}$ and $Ar^{206}$, and $Ar^{207}$ and $Ar^{208}$ may be respectively bonded together to form a saturated or unsaturated ring.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

Examples of the substituted or unsubstituted arylene group having 6 to 50 ring carbon atoms include a group derived by removing 1 hydrogen atom from the aryl group.

Examples of the substituted or unsubstituted heteroaryl group having 5 to 50 ring atoms are a 1-pyroryl group, 2-pyroryl group, 3-pyroryl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2' phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted heteroarylene group having 6 to 50 ring carbon atoms are a group derived by removing 1 hydrogen atom from the heteroaryl group and the like.

The hole injecting layer and hole transporting layer may contain the compound represented by the following formula.

[Chemical Formula 55]

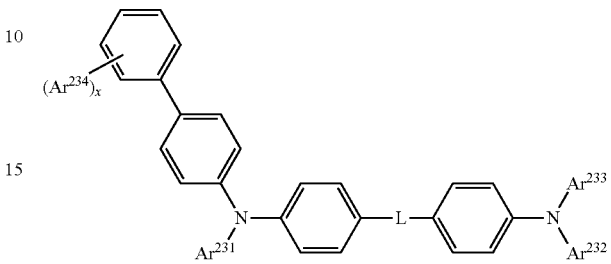

In the above formula, $Ar^{231}$ to $Ar^{234}$ each represent a substituted or unsubstituted aryl group having 6 to 50 ring carbon atoms, or a substituted or unsubstituted heteroaryl group having 5 to 50 ring atoms. L is a bonding group and is a single bond, a substituted or unsubstituted arylene group having 6 to 50 ring carbon atoms, or a substituted or unsubstituted heteroarylene group having 5 to 50 ring atoms. x is an integer of 0 to 5. $Ar^{232}$ and $Ar^{233}$ may be bonded together to form a saturated or unsaturated ring. Examples of the substituted or unsubstituted aryl group and arylene group each having 6 to 50 ring carbon atoms, or the substituted or unsubstituted heteroaryl group and heteroarylene group each having 5 to 50 ring atoms are the same as described above.

Examples of the materials for the hole injecting layer and hole transporting layer are triazole derivative, oxadiazole derivative, imidazole derivative, polyarylalkane derivative, pyrazoline derivative, pyrazolone derivative, phenylenediamine derivative, arylamine derivative, amino-substituted chalcone derivative, oxazole derivative, styrylanthracene derivative, fluorenone derivative, hydrazone derivative, stilbene derivative, silazane derivative, aniline copolymer, conductive high-molecular oligomer (especially thiophene oligomer) and the like.

The above can be used as the materials for the hole injecting layer and hole transporting layer, but preferably porphyrin compound, aromatic tertiary amine compound or styrylamine compound may be used. Especially, aromatic tertiary amine compound may be preferably used.

In addition, the compound which contains two fused aromatic rings within the molecule, for example, NPD, 4,4',4"-tris(N-(3-methylphenyl)-N-phenylamino) triphenylamine (hereinafter, abbreviated as MTDATA) in which three triphenylamine units are bonded in a starbust form, may be preferably used.

As another example, a nitrogen-containing heterocyclic derivative represented by the following formula may be used.

[Chemical Formula 56]

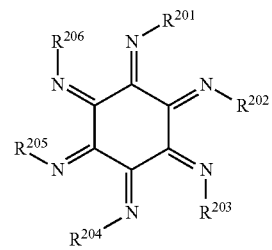

In the above formula, $R^{201}$ to $R^{206}$ each represent a substituted or unsubstituted alkyl group having 1 to 50 carbon atoms, a substituted or unsubstituted aryl group having 6 to 50 ring carbon atoms, a substituted or unsubstituted aralkyl group having 7 to 50 carbon atoms, or a substituted or unsubstituted heterocyclic group having 5 to 50 ring atoms. $R^{201}$ and $R^{202}$, $R^{203}$ and $R^{204}$, $R^{205}$ and $R^{206}$, $R^{201}$ and $R^{206}$, $R^{202}$ and $R^{203}$, or $R^{204}$ and $R^{205}$ may form a fused ring.

Further, the compound represented by the following formula may be used.

[Chemical Formula 57]

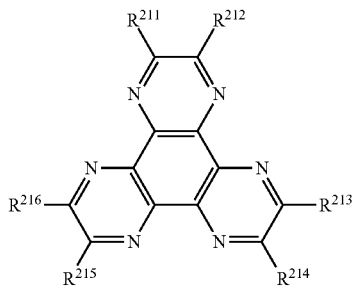

$R^{211}$ to $R^{216}$ each represent a substituent, a preferable example of which is an electron-attracting group such as a cyano group, a nitro group, a sulfonyl group, a carbonyl group, a trifluoromethyl group and halogen.

Alternatively, inorganic compounds such as p-type Si and p-type SiC can also be used as the materials for the hole injecting layer and hole transporting layer. The hole injecting layer and hole transporting layer can be formed by forming thin films from the compounds listed above by known methods such as vacuum deposition, spin coating, casting and LB method.

The thickness of the hole injecting layer and hole transporting layer is not particularly limited, but typically in the range of 5 nm to 5 μm. The hole injecting layer and hole transporting layer may be of a single layer structure formed of at least one of the above materials. Alternatively, a plurality of hole injecting layers and hole transporting layers formed of different compounds may be layered.

Further, inorganic compounds such as p-type Si and p-type SiC can also be used as the materials for the hole injecting layer.

The compound represented by the following formula may also be used for the hole injecting layer.

[Chemical Formula 58]

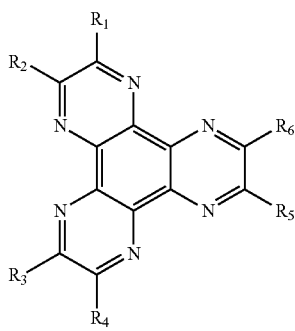

In the above formula, $R_1$ to $R_6$ each represent halogen, cyano group, nitro group, alkyl group or trifluoromethyl group, and may be mutually the same or different. Incidentally, $R_1$ to $R_6$ are preferably cyano group.

The hole injecting layer can be formed by forming thin films from the compounds listed above by known method such as vacuum deposition, spin coating, casting, and LB method.

The thickness of the hole injecting layer is not particularly limited, but typically in the range of 5 nm to 5 μm.

(6) At Least One of Electron Injecting Layer and Electron Transporting Layer (Electron Transporting Zone)

At least one of the electron injecting layer and electron transporting layer may further be layered between the organic emitting layer and the cathode. At least one of the electron injecting layer and the electron transporting layer aids injection of the electrons into the emitting layer and has a high electron mobility.

It is known that, in the organic EL, since light emitted by the organic EL is reflected by an electrode (the cathode, in this case), light directly taken out from the anode and light taken out after being reflected by the electrode interfere with each other. In order to efficiently utilize the interference, the thickness of the electron transporting layer is properly selected from the range of several nanometers to several micrometers. However, especially when the thickness of the layer is large, it is preferable that the electron mobility is at least $1.0 \times 10^{-5}$ $cm^2/Vs$ or higher when the electrical field of $1.0 \times 10^4$ to $1.0 \times 10^6$ V/cm is applied to prevent voltage rise.

As a material used for at least one of the electron injecting layer and electron transporting layer, 8-hydroxyquinoline or a metal complex of its derivative is preferable. Examples of the 8-hydroxyquinoline or the metal complex of its derivative may include metal chelate oxynoid compounds containing a chelate of oxine (typically 8-quinolinol or 8-hydroxyquinoline). For example, Alq having Al as its central metal can be used for at least one of the electron injecting layer and electron transporting layer.

An oxadiazole derivative represented by the following formula is also preferable as the material for the electron injecting (transporting) layer.

[Chemical Formula 59]

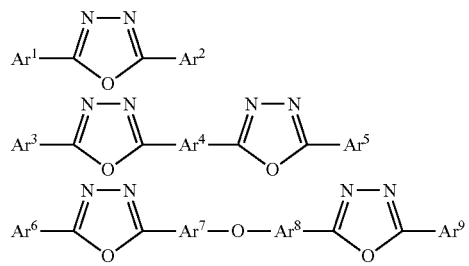

In the above formula, $Ar^1$, $Ar^2$, $Ar^3$, $Ar^5$, $Ar^6$ and $Ar^9$ each represent a substituted or unsubstituted aryl group, which may be mutually the same or different. $Ar^4$, $Ar^7$ and $Ar^8$ each represent a substituted or unsubstituted arylene group, which may be mutually the same or different.

Examples of the aryl group are a phenyl group, a biphenyl group, an anthranil group, a perylenyl group, and a pyrenyl group. The arylene group is exemplified by a phenylene group, a naphtylene group, a biphenylene group, an anthranylene group, a perylenylene group and a pyrenylene group. The substituent group is exemplified by an alkyl group having 1 to 10 carbon atoms, and an alkoxy group or cyano group having 1 to 10 carbon atoms. The electron transporting compounds are preferably compounds that exhibit favorable performance in forming a thin film.

Examples of the electron transporting compounds are as follows.

[Chemical Formula 60]

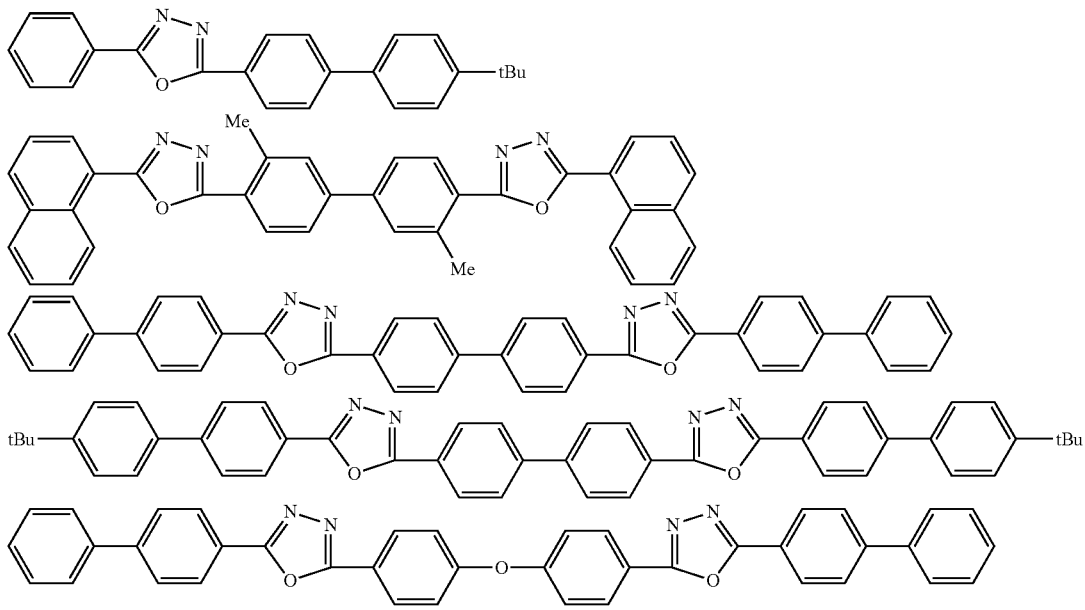

A nitrogen-containing heterocycle derivative represented by the formula below is also preferable as the material for the electron injecting (transporting) layer.

[Chemical Formula 61]

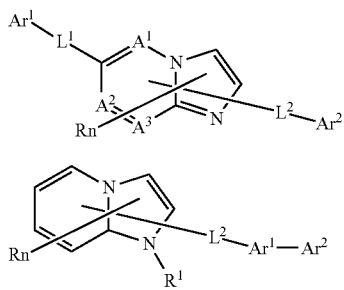

In the formula, $A^1$ to $A^3$ each represent a nitrogen atom or a carbon atom; R represents a substituted or unsubstituted aryl group having 6 to 60 carbon atoms, a substituted or unsubstituted heteroaryl group having 3 to 60 carbon atoms, an alkyl group having 1 to 20 carbon atoms, a haloalkyl group having 1 to 20 carbon atoms or an alkoxy group having 1 to 20 carbon atoms; and n represents an integer of 0 to 5. A plurality of R may be mutually the same or different when n is an integer equal to or larger than two.

In addition, a plurality of adjacent R may be bonded to each other to form a substituted or unsubstituted carbocyclic aliphatic ring or a substituted or unsubstituted carbocyclic aromatic ring.

$Ar^1$ represents a substituted or unsubstituted aryl group having 6 to 60 carbon atoms or a substituted or unsubstituted heteroaryl group having 3 to 60 carbon atoms; and $Ar^2$ represents a hydrogen atom, an alkyl group having 1 to 20 carbon atoms, a haloalkyl group having 1 to 20 carbon atoms, an alkoxy group having 1 to 20 carbon atoms, a substituted or unsubstituted aryl group having 6 to 60 carbon atoms or a substituted or unsubstituted heteroaryl group having 3 to 60 carbon atoms. However, one of $Ar^1$ and $Ar^2$ is a substituted or unsubstituted fused ring group having 10 to 60 carbon atoms or a substituted or unsubstituted fused heterocyclic group having 3 to 60 carbon atoms.

$L^1$ and $L^2$ each represent a single bond, a substituted or unsubstituted fused ring having 6 to 60 carbon atoms, a substituted or unsubstituted fused heterocycle having 3 to 60 carbon atoms or a substituted or unsubstituted fluorenylene group.

$$HAr-L^1-Ar^1—Ar^2$$ [Chemical Formula 62]

In the formula, HAr represents a substituted or unsubstituted nitrogen-containing ring having 3 to 40 carbon atoms; $L^1$ represents a single-bond, a substituted or unsubstituted arylene group having 6 to 60 carbon atoms, a substituted or unsubstituted heteroarylene group having 3 to 60 carbon atoms or a substituted or unsubstituted fluorenylene group; $Ar^1$ represents a substituted or unsubstituted divalent aromatic hydrocarbon group having 6 to 60 carbon atoms; and $Ar^2$ represents a substituted or unsubstituted aryl group having 6 to 60 carbon atoms or a substituted or unsubstituted heteroaryl group having 3 to 60 carbon atoms.

A silacyclopentadiene derivative represented by the formula below is also preferable as the material for the electron injecting (transporting) layer.

[Chemical Formula 63]

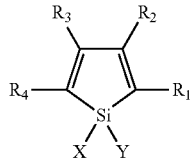

In the formula, X and Y each independently represent a saturated or unsaturated hydrocarbon group having 1 to 6 carbon atoms, an alkoxy group, an alkenyloxy group, an alkynyloxy group, a hydroxy group, a substituted or unsubstituted aryl group or a substituted or unsubstituted heterocycle. Alternatively, X and Y may be bonded together to form a saturated or unsaturated ring.

$R_1$ to $R_4$ each represent hydrogen, halogen, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or cyano group. Alternatively, an adjacent set of $R_1$ to $R_4$ may be fused to form a substituted or unsubstituted ring.

A silacyclopentadiene derivative represented by the formula below is also preferable as the material for the electron injecting (transporting) layer.

[Chemical Formula 64]

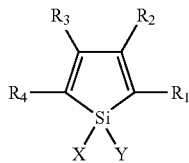

In the formula, X and Y each independently represent a saturated or unsaturated hydrocarbon group having 1 to 6 carbon atoms, an alkoxy group, an alkenyloxy group, an alkynyloxy group, a substituted or unsubstituted aryl group or a substituted or unsubstituted heterocycle. Alternatively, X and Y may be bonded together to form a saturated or unsaturated ring.

$R_1$ to $R_4$ each represent hydrogen, halogen, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or cyano group. Alternatively, an adjacent set of $R_1$ to $R_4$ may be fused to form a substituted or unsubstituted ring.

It should be noted that: when $R_1$ and $R_4$ are phenyl groups, X and Y are neither alkyl groups nor phenyl groups; when $R_1$ and $R_4$ are thienyl groups, X and Y being a monovalent hydrocarbon group is not concurrent with $R_2$ and $R_3$ being an alkyl group, an aryl group or an alkenyl group, or X and Y being a monovalent hydrocarbon group is not concurrent with $R_2$ and $R_3$ being aliphatic groups bonded to form a ring; when $R_1$ and $R_4$ are silyl groups, $R_2$, $R_3$, X and Y each independently are not a monovalent hydrocarbon group having 1 to 6 carbon atoms or a hydrogen atom; and when benzene rings are fused at $R_1$ and $R_2$, X and Y are neither alkyl groups nor phenyl groups.

A borane derivative represented by the formula below is also preferable as the material for the electron injecting (transporting) layer.

[Chemical Formula 65]

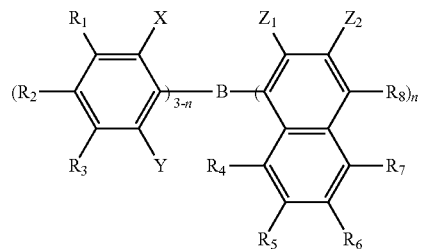

In the formula, $R_1$ to $R_8$ and $Z_2$ each independently represent a hydrogen atom, a saturated or unsaturated hydrocarbon group, an aromatic group, a heterocyclic group, a substituted amino group, a substituted boryl group, an alkoxy group or an aryloxy group; X, Y and $Z_1$ each independently represent a saturated or unsaturated hydrocarbon group, an aromatic group, a heterocyclic group, a substituted amino group, an alkoxy group or an aryloxy group; substituent groups of $Z_1$ and $Z_2$ may be bonded together to form a fused ring; and n represents an integer of 1 to 3. When n is equal to or larger than two, $Z_1$ and $Z_2$ may be mutually different.

However, a condition in which n is 1, X, Y and $R_2$ are the methyl group and $R_8$ is the hydrogen atom or the substituted boryl group and a condition in which n is 3 and $Z_1$ is the methyl group are excluded.

A gallium complex represented by the formula below is also preferable as the material for the electron injecting (transporting) layer.

[Chemical Formula 66]

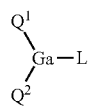

In the above formula, $Q^1$ and $Q^2$ each independently represent a ligand shown by the formula below. L represents a ligand which may be a halogen atom, a substituted or unsubstituted alkyl group, a substituted or unsubstituted cycloalkyl group, a substituted or unsubstituted aryl group, a substituted or unsubstituted heterocyclic group, —$OR^1$ ($R_1$ representing a hydrogen atom, a substituted or unsubstituted alkyl group, a substituted or unsubstituted cycloalkyl group, a substituted or unsubstituted aryl group or a substituted or unsubstituted heterocyclic group);

or —O—Ga-$Q^3(Q^4)$ ($Q^3$ and $Q^4$ being the same as $Q^1$ and $Q^2$).

In the formula, $Q^1$ to $Q^4$ each represent a residue represented by the formula below, which may be exemplified by, but not limited to, a residue of quinoline such as 8-hydroxyquinoline and 2-methyl-8-hydroxyquinoline.

[Chemical Formula 67]

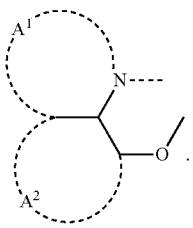

Rings A¹ and A² are substituted or unsubstituted aryl rings bonded to each other or heterocyclic structures.

The metal complex shown above exhibits a strong property as an n-type semiconductor and has a large electron injection capability. In addition, formation energy required when forming the complex is low, so that bonding between the metal and the ligand in the formed metal complex becomes strong, thus exhibiting a large fluorescence quantum efficiency as an emitting material.

Examples of the substituent groups of the ring A¹ and the ring A² that form the ligand in the formula above are: halogen atoms such as chlorine, bromine, iodine and fluorine; substituted or unsubstituted alkyl groups such as a methyl group, an ethyl group, a propyl group, a butyl group, a sec-butyl group, a tert-butyl group, a pentyl group, a hexyl group, a heptyl group, an octyl group, a stearyl group and a trichloromethyl group; substituted or unsubstituted aryl groups such as a phenyl group, a naphthyl group a 3-methylphenyl group, a 3-methoxyphenyl group, a 3-fluorophenyl group, a 3-trichloromethylphenyl group, a 3-trifluoromethylphenyl group and a 3-nitrophenyl group; substituted or unsubstituted alkoxy groups such as a methoxy group, a n-butoxy group, a tert-butoxy group, a trichloromethoxy group, a trifluoroethoxy group, a pentafluoropropoxy group, a 2,2,3,3-tetrafluoropropoxy group, a 1,1,1,3,3,3-hexafluoro-2-propoxy group and a 6-(perfluorohethyl)hexyloxy group; substituted or unsubstituted aryloxy groups such as a phenoxy group, a p-nitrophenoxy group, a p-tert-butylphenoxy group, a 3-fluorophenoxy group, a pentafluorophenyl group and a 3-trifluoromethylphenoxy group; substituted or unsubstituted alkylthio groups such as a methylthio group, an ethylthio group, a tert-butylthio group, a hexylthio group, an octylthio group and a trifluoromethylthio group; substituted or unsubstituted arylthio groups such as a phenylthio group, a p-nitrophenylthio group, a p-tert-butylphenylthio group, a 3-fluorophenylthio group, a pentafluorophenylthio group and a 3-trifluoromethylphenylthio group; mono- or di-substituted amino groups such as a cyano group, a nitro group, an amino group, a methylamino group, a diethylamino group, an ethylamino group, a diethylamino group, a dipropylamino group, a dibutylamino group and a diphenylamino group; acylamino groups such as a bis(acetoxymethyl)amino group, a bis(acetoxyethyl)amino group, a bis(acetoxypropyl)amino group and a bis(acetoxybutyl)amino group; a hydroxyl group; a siloxy group; an acyl group; carbamoyl groups such as a methylcarbamoyl group, a dimethylcarbamoyl group, an ethylcarbamoyl group, a diethylcarbamoyl group, a propylcarbamoyl group, a butylcarbamoyl group, and a phenylcarbamoyl group; a carboxylic acid group; a sulfonic acid group; an imide group; cycloalkyl groups such as a cyclopentane group and a cyclohexyl group; aryl groups such as a phenyl group, a naphthyl group, a biphenyl group, an anthranil group, a phenanthryl group, a fluorenyl group and a pyrenyl group; and heterocyclic groups such as a pyridyl group, a pyrazinyl group, a pyrimidinyl group, a pyridazinyl group, a triazinyl group, an indolinyl group, a quinolyl group, an acridinyl group, a pyrrolidinyl group, a dioxanyl group, a piperidinyl group, a morpholidinyl group, a piperazinyl group, a carbazolyl group, a furanyl group, a thiophenyl group, an oxazolyl group, an oxadiazolyl group, a benzoxazolyl group, a thiazolyl group, a thiadiazolyl group, a benzothiazolyl group, a triazolyl group, an imidazolyl group and a benzoimidazolyl group. In addition, the substituent groups listed above may be bonded to each other to form a 6-membered aryl ring or a heterocycle.

As a preferred embodiment of the organic EL device, there is known a device containing a reductive dopant at a boundary between a region transporting the electron or the cathode and an organic layer. Here, the reductive dopant is defined as a substance capable of reducing an electron transporting compound. Accordingly, various materials are utilized as long as the material possesses proper reductive property. For example, at least one material selected from a group of alkali metal, alkali earth metal, rare earth metal, oxide of alkali metal, halogenide of alkali metal, oxide of alkali earth metal, halogenide of alkali earth metal, oxide of rare earth metal, halogenide of rare earth metal, organic complexes of alkali metal, organic complexes of alkali earth metal, and organic complexes of rare earth metal may suitably be utilized.

Specifically, a preferable reductive dopant has work function of 2.9 eV or less, which is at least one alkali metal selected from a group of Li (work function: 2.9 eV), Na (work function: 2.36 eV), K (work function: 2.28 eV), Rb (work function: 2.16 eV) and Cs (work function: 1.95 eV), or at least one alkali earth metal selected from a group of Ca (work function: 2.9 eV), Sr (work function: 2.0 to 2.5 eV) and Ba (work function: 2.52 eV). Among the above, a more preferable reductive dopant is at least one alkali metal selected from a group of K, Rb and Cs. A further more preferable reductive dopant is Rb or Cs. The most preferable reductive dopant is Cs. Since the above alkali metals have particularly high reducibility, addition of a relatively small amount of these alkali metals to an electron injecting zone can enhance luminance intensity and lifetime of the organic EL device. As a reductive dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reductive dopant containing Cs in a combining manner can efficiently exhibit reducibility. Addition of the reductive dopant to the electron injecting zone can enhance luminance intensity and lifetime of the organic EL device.

An electron injecting layer formed from an insulator or a semiconductor may be provided between the cathode and the organic layer. With the arrangement, leak of electric current can be effectively prevented and the electron injecting capability can be enhanced. As the insulator, it is preferable to use at least one metal compound selected from a group of an alkali metal chalcogenide, an alkali earth metal chalcogenide, a halogenide of alkali metal and a halogenide of alkali earth metal. A configuration in which the electron injecting layer is formed by these alkaline metal chalcogenide and the like is advantageous in that the electron injecting property is further improved. Specifically, preferable examples of the alkali metal chalcogenide are $Li_2O$, $K_2O$, $Na_2S$, $Na_2Se$ and $Na_2O$, while preferable examples of the alkali earth metal chalcogenide are CaO, BaO, SrO, BeO, BaS and CaSe. Preferable examples of the halogenide of the alkali metal are LiF, NaF, KF, LiCl, KCl and NaCl. Preferable examples of the halogenide of the alkali earth metal are fluorides such as $CaF_2$, $BaF_2$, $SrF_2$, $MgF_2$ and $BeF_2$, and halogenides other than the fluoride.

Examples of the semiconductor are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron transporting layer is preferably a microcrystalline or amorphous insulating film. When the electron transporting layer is formed of such insulating film, more uniform thin film can be formed, thereby reducing pixel defects such as a dark spot. Examples of such an inorganic compound are the above-described alkali metal chalcogenide, alkali earth metal chalcogenide, halogenide of the alkali metal and halogenide of the alkali earth metal.

(7) Cathode

In the cathode, metals, alloys, electrically conductive compounds and mixtures of the above, which each have a small work function (4 eV or lower), are used as an electrode material, in order to inject the electrons to at least one of the electron injecting layer and electron transporting layer or the emitting layer. Examples of such electrode materials include sodium, sodium-potassium alloy, magnesium, lithium, magnesium-silver alloy, aluminum/aluminum oxide, aluminum-lithium alloy, indium, rare earth metal, and the like.

The cathode may be made by forming a thin film from the electrode material by vapor deposition and sputtering.

When emission of the emitting layer is transmitted through the cathode, the cathode preferably transmits 10% or more of the emission.

The sheet resistance as the cathode is preferably several hundreds Ω/square or lower, and the thickness of the film is typically in the range from 10 nm to 1 μm, preferably 50 to 200 nm.

(8) Insulating Layer

Since the electrical field is applied to ultra thin films in the organic EL device, pixel defects resulted from leak or short circuit are likely to occur. In order to prevent such defects, it is preferable to interpose an insulating thin film layer between a pair of electrodes.

Examples of a material used for the insulating layer are aluminum oxide, lithium fluoride, lithium oxide, cesium fluoride, cesium oxide, magnesium oxide, magnesium fluoride, calcium oxide, calcium fluoride, aluminium nitride, titanium oxide, silicon oxide, germanium oxide, silicon nitride, boron nitride, molybdenum oxide, ruthenium oxide, vanadium oxide and the like.

Mixtures or laminates thereof may also be used.

(9) Manufacturing Method of Organic EL Device

The organic EL device can be manufactured by forming the anode, the hole transporting layer (as necessary), the emitting layer, the electron injecting layer (as necessary) and the cathode from the materials listed above by the above-described formation methods. Alternatively, the organic EL device can be also manufactured in the reverse order of the above (i.e., from the cathode to the anode).

A preparation example of the organic EL device 1 of the first exemplary embodiment will be described below. As shown in FIG. 1, the organic EL device 1 includes an anode 3, a hole transporting layer 4, a red phosphorescent-emitting layer 51, a green phosphorescent-emitting layer 52, a charge blocking layer 6, a fluorescent-emitting layer 7, an electron transporting layer 8 and a cathode 9, which are sequentially provided on a light-transmissive substrate 2.

In FIG. 1, the red phosphorescent-emitting layer 51 contains a red phosphorescent host and a red phosphorescent dopant. The green phosphorescent-emitting layer 52 contains a green phosphorescent host and a green phosphorescent dopant.

In manufacturing the organic EL device 1, a thin film made of anode material is initially formed on a suitable light-transmissive substrate 2 to be 1 μm thick or less, preferably 10 to 200 nm thick, by a method such as vapor deposition or sputtering, through which the anode 3 is manufactured.

Next, the hole transporting layer 4 is provided on the anode 3. The hole transporting layer 4 can be formed by vacuum deposition, spin coating, casting, LB method or the like. The thickness of the hole transporting layer 4 may be suitably determined preferably in the range of 5 nm to 5 μm.

Next, the red phosphorescent-emitting layer 51 and the green phosphorescent-emitting layer 52, which are to be formed on the hole transporting layer 4, can be formed by forming an organic emitting material into thin films by dry processing such as vacuum deposition or by wet processing such as spin coating or casting.

The charge blocking layer 6 is subsequently provided on the green phosphorescent-emitting layer 52. The charge blocking layer 6 may be formed exemplarily by vacuum deposition.

The fluorescent-emitting layer 7 is subsequently provided on the charge blocking layer 6. The fluorescent-emitting layer 7 can be formed by the same method as the red phosphorescent-emitting layer 51 and the green phosphorescent-emitting layer 52.

Next, the electron transporting layer 8 is provided on the fluorescent-emitting layer 7. The electron transporting layer 8 can be formed by vacuum deposition, spin coating, casting, LB method or the like. The thickness of the electron transporting layer 8 may be suitably determined preferably in the range of 5 nm to 5 μm.

Lastly, the cathode 9 is layered thereon, so that the organic EL device 1 can be obtained. The cathode 9 is formed of metal, for formation of which vapor deposition and sputtering are usable. However, in order to protect the underlying organic layer from damages at the time of film forming, vacuum deposition is preferable.

A method of forming each of the layers in the organic EL device 1 is not particularly limited.

Conventionally-known methods such as vacuum deposition and spin coating are usable. Specifically, the organic thin-film layer may be formed by a conventional coating method such as vacuum deposition, molecular beam epitaxy (MBE method) and coating methods using a solution such as a dipping, spin coating, casting, bar coating, roll coating and ink jetting.

Though the thickness of each organic layer of the organic EL device 1 is not particularly limited, the thickness is typically preferably in a range of several nanometers to 1 μm because an excessively-thinned film is likely to entail defects such as a pin hole while an excessively-thickened film requires application of high voltage and deteriorates efficiency.

(10) Operations of Organic EL Device

The operations of the organic EL device 1 arranged as in FIG. 1 will be described with reference to the band diagram of the organic EL device 1 shown in FIG. 2.

Figure 2:
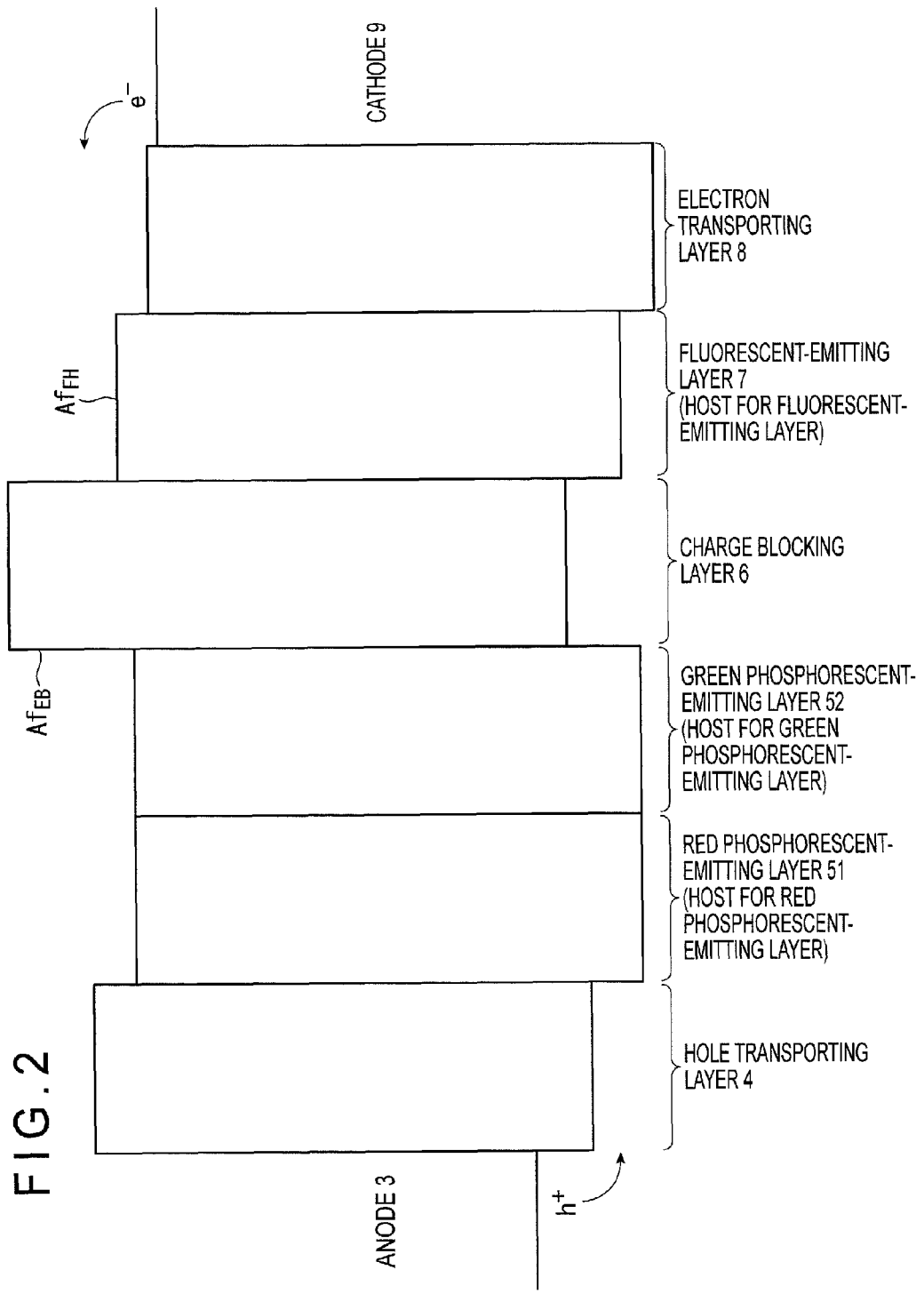
FIG. 2 shows a band diagram of the organic EL device according to the first exemplary embodiment of the invention.

Six rectangles shown in FIG. 2 represent the hole transporting layer 4, the red phosphorescent-emitting layer 51, the green phosphorescent-emitting layer 52, the charge blocking layer 6, the fluorescent-emitting layer 7 and the electron transporting layer 8, respectively. The upper side of each rectangle represents an affinity level of each layer, while the lower side of each rectangle represents an ionization potential (substantially equals to HOMO energy) of each layer. However, the upper sides of the red phosphorescent-emitting layer 51, the green phosphorescent-emitting layer 52 and the fluorescent-emitting layer 7 respectively represent affinity levels of their hosts, not affinity levels of their layers as the whole.

When a voltage is applied to the organic EL device 1, holes $h^+$ are injected into the hole transporting layer 4 from the anode 3. Also, electrons $e^-$ are injected into the fluorescent host via the electron transporting layer 8 from the cathode 9.

The charge blocking layer 6 has a smaller affinity level $Af_{EB}$ than the fluorescent host, and the affinity level $Af_{EB}$ of the charge blocking layer 6 and the affinity level $Af_{FH}$ of the fluorescent host satisfy the above formula (2). Accordingly, the electrons $e^-$ become less injectable from the fluorescent host toward the charge blocking layer 6 and are trapped in the fluorescent-emitting layer 7.

On the other hand, the holes $h^+$ injected into the hole transporting layer 4 are injected into HOMO of the fluorescent host via the red phosphorescent host, green phosphorescent host, and charge blocking layer 6.

At this time, ionization potential $Ip_{PH}$ of the red phosphorescent host of the red phosphorescent-emitting layer 51, ionization potential $Ip_{PD}$ of the red phosphorescent dopant of the red phosphorescent-emitting layer 51, and ionization potential $Ip_{HT}$ of the hole transporting layer 4 preferably satisfy the above formula (3). Then, the holes $h^+$ are not easily injected directly from the anode 3 into the phosphorescent dopant of the red phosphorescent-emitting layer 51, and are injected into the red phosphorescent host.

Also, since the thickness of the charge blocking layer 6 is 3 to 9 nm, the electrons $e^-$ can be blocked from being injected toward the charge blocking layer 6 from the fluorescent-emitting layer 7 while the holes $h^+$ from the green phosphorescent-emitting layer 52 can be injected into HOMO of the fluorescent host.

Consequently, exciton (i.e., single exciton and triplet exciton) is efficiently generated in the fluorescent host of the fluorescent-emitting layer 7.

Excited singlet energy of the fluorescent host is transferred to the fluorescent dopant.
The transferred energy is emitted as blue fluorescence. Since the excited singlet has a short lifetime, it is less likely that the excited singlet energy is transferred to the green phosphorescent-emitting layer 52 through the charge blocking layer 6. Thus, the excited singlet energy of the fluorescent host can be efficiently transferred to the fluorescent dopant and emitted as blue fluorescence.

Figure 3:
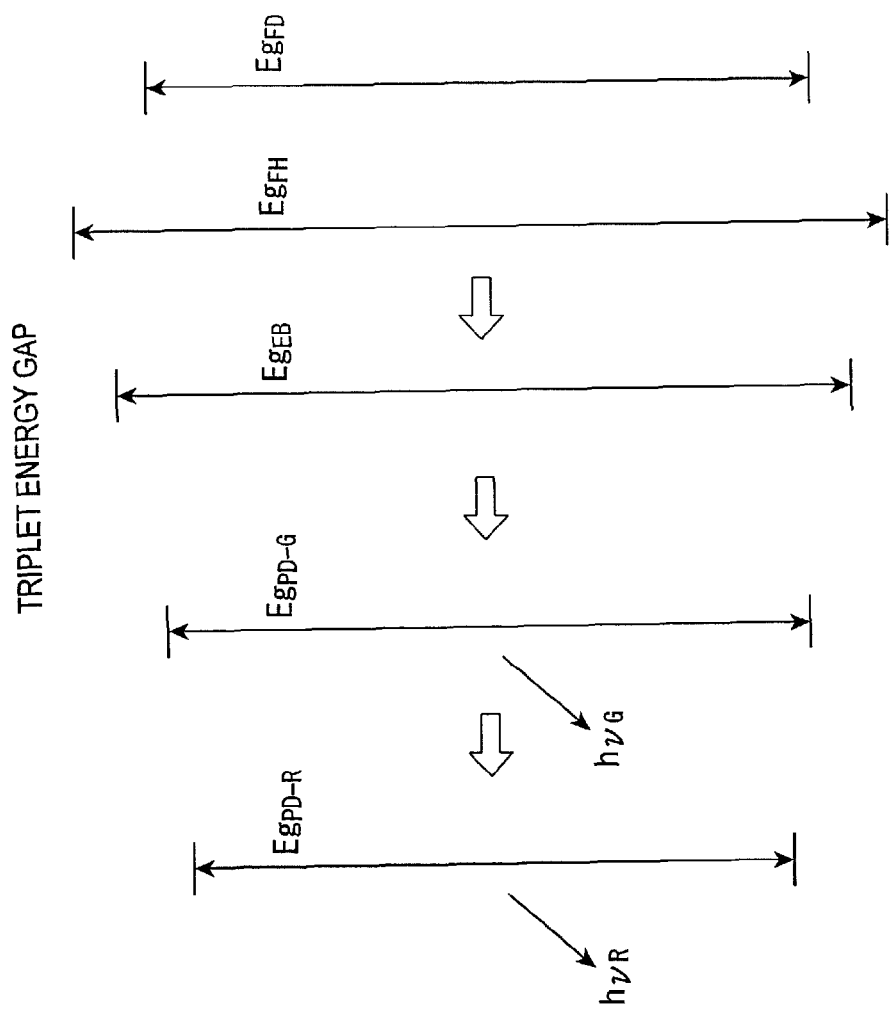
FIG. 3 shows triplet energy gaps of layers in the organic EL device according to the first exemplary embodiment of the invention.

FIG. 3 shows a triplet energy gap of a host or dopant of each layer.

As shown in FIG. 3, a triplet energy gap $Eg_{PD-R}$ of the red phosphorescent dopant of the red phosphorescent-emitting layer 51, a triplet energy gap $Eg_{PD-G}$ of the green phosphorescent dopant of the green phosphorescent-emitting layer 52, a triplet energy gap $Eg_{EB}$ of the charge blocking layer 6, and a triplet energy gap $Eg_{FH}$ of the fluorescent host of the fluorescent-emitting layer 7 satisfy a formula as follows.

$$Eg_{PD-R} < Eg_{PD-G} < Eg_{EB} \leq Eg_{FH}$$

Because $Eg_{EB}$ is equal to or smaller than $Eg_{FH}$, the excited triplet energy is transferable from the fluorescent host to the charge blocking layer 6. In addition, because $Eg_{PD-G}$ is smaller than $Eg_{EB}$, the excited triplet energy is transferable from the charge blocking layer 6 to the green phosphorescent dopant.

By the above-described transfer of the excited triplet energy of the fluorescent host, the excited triplet of the green phosphorescent dopant is generated, from which the green phosphorescence $hv_G$ is obtained.

Also, a part of the excited triplet energy of the green phosphorescent dopant does not contribute to emission of the green phosphorescence but is transferred to the red phosphorescent dopant. The triplet energy is transferred from the green phosphorescent dopant to the red phosphorescent dopant because $Eg_{PD-R}$ is smaller than $Eg_{PD-G}$.

Red phosphorescence $hv_R$ is obtainable from the excited triplet of the red phosphorescent dopant generated as described above.

Since the triplet energy gap $Eg_{EB}$ of the charge blocking layer 6 is greater than the triplet energy gap $Eg_{FD}$ of the fluorescent dopant as shown in FIG. 3, the excited triplet energy of the fluorescent host is transferred more easily to the charge blocking layer 6 than to the fluorescent dopant.

Thus, the excited triplet energy of the fluorescent host can be prevented from being transferred to the fluorescent dopant and deactivated without contributing to the emission.

The blue fluorescence obtained from the fluorescent-emitting layer 7, the green phosphorescence obtained from the green phosphorescent-emitting layer 52 and the red phosphorescence obtained from the red phosphorescent-emitting layer 51 are emitted to the outside of the organic EL device 1 from the light-transmissive substrate 2. Then, white-color light in which the light emitted by the above emitting layers are mixed together is obtained.

At this time, in the organic EL device 1, all excitation energy generated in the fluorescent host contributes to the emission. Thus, luminous efficiency can be enhanced compared to a conventional organic EL device for mixed-color emission.

Second Exemplary Embodiment

Figure 4:
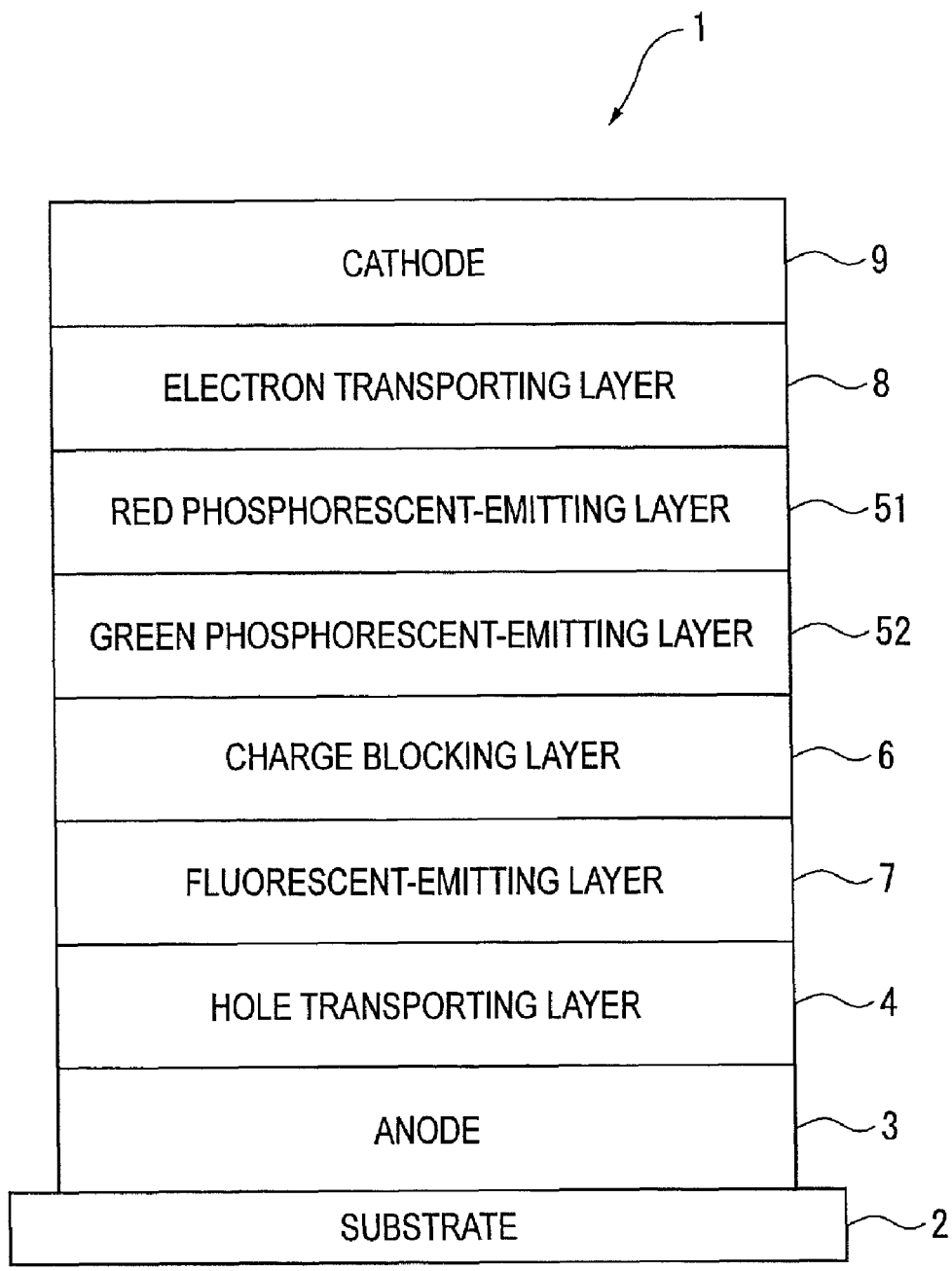
FIG. 4 shows an arrangement of an organic EL device according to a second exemplary embodiment of the invention.

As shown in FIG. 4, an organic EL device of the second exemplary embodiment includes the anode 3, the hole transporting layer 4, the fluorescent-emitting layer 7, the charge blocking layer 6, the green phosphorescent-emitting layer 52, the red phosphorescent-emitting layer 51, the electron transporting layer 8 and the cathode 9, which are sequentially provided on the light-transmissive substrate 2.

Materials and manufacturing process are the same as in the first exemplary embodiment, but the second exemplary embodiment is different from the first exemplary embodiment in the following points.

The charge blocking layer 6 blocks the holes injected into the fluorescent-emitting layer 7 from being injected toward the charge blocking layer 6 from the fluorescent-emitting layer 7, and injects the electrons from the phosphorescent-emitting layers 51 and 52 into the fluorescent-emitting layer 7.

Specifically, a triplet energy gap $Eg_{PD}$ of the phosphorescent dopant, a triplet energy gap $Eg_{HB}$ of the charge blocking layer 6 and a triplet energy gap $Eg_{FH}$ of the fluorescent host satisfy the following formula (4).

$$Eg_{PD} < Eg_{HB} \leq Eg_{FH} \qquad (4)$$

Thus, the electrons are injected into the fluorescent-emitting layer 7 from the phosphorescent-emitting layers 51 and 52 via the charge blocking layer 6.

Also, the charge blocking layer 6 has smaller ionization potential than the fluorescent host. When ionization potential $Ip_{HB}$ of the charge blocking layer 6 and ionization potential $Ip_{FH}$ of the fluorescent host satisfy the following formula (5), the holes are blocked.

$$Ip_{HB} > Ip_{FH} - 0.1 \text{ eV} \tag{5}$$

The electron mobility of the phosphorescent host is preferably $1.0 \times 10^{-5}$ cm$^2$/Vs or more in an electric field of $1.0 \times 10^4$ to $1.0 \times 10^6$ V/cm. Since the phosphorescent host has high electron mobility, transporting ability of the electrons is enhanced. Accordingly, the electrons can be injected into the fluorescent-emitting layer 7 via the charge blocking layer 6.

The red phosphorescent-emitting layer 51 is provided closer to the cathode 9 than the green phosphorescent-emitting layer 52.

Table 3 will show combinations of the compounds used as the fluorescent host and the charge blocking layer, triplet energy gaps (Eg) of the compounds and numeric values of the ionization potential (Ip) in the second exemplary embodiment.

In Table 3, when the triplet energy gap $Eg_{EB}$ of the charge blocking layer and the triplet energy gap $Eg_{FH}$ of the fluorescent host satisfy the above formula (4) (i.e., $Eg_{HB} \leq Eg_{FH}$), such combinations are rated as B. When not satisfied, such combinations are rated as C. When: the above formula (4) is satisfied; and the ionization potential $Ip_{HB}$ of the charge blocking layer and the ionization potential $Ip_{FH}$ of the fluorescent host of the fluorescent-emitting layer satisfy the above formula (5) (i.e., $Ip_{HB} > Ip_{FH} - 0.1$ eV), such combinations are rated as A. The combinations rate as A and B are combinations preferable for forming the organic EL device according to the aspect of the invention. The combinations rated as C are non-preferable combinations. Particularly, the combinations rated A are preferable.

For example, when CDBP is used as the fluorescent host and the compound A-3 is used as the charge blocking layer, both the above formulae (4) and (5) are satisfied. Accordingly, the organic EL device according to the aspect of the invention can be provided by using CDBP as the fluorescent host and the compound A-3 as the charge blocking layer.

When CDBP is used as the fluorescent host and the compound A-1 is used as the charge blocking layer, the above

TABLE 3

| | | Charge Blocking Layer | | | | | | | | | | |
|---|---|---|---|---|---|---|---|---|---|---|---|---|
| | | CDBP | A-3 | A-2 | A-1 | A-6 | CBP | A-7 | A-4 | A-9 | A-5 | A-8 | NPD |
| Fluorescent Host | CDBP | — | A | A | B | B | B | B | B | B | B | B | B |
| | A-3 | C | — | B | B | B | B | B | B | B | B | B | B |
| | A-2 | C | A | — | B | B | B | B | B | B | B | B | B |
| | A-1 | C | A | A | — | A | A | B | A | B | A | B | B |
| | A-6 | C | C | C | C | — | A | B | A | B | A | B | B |
| | CBP | C | C | C | C | B | — | B | B | B | A | B | B |
| | A-7 | C | C | C | C | C | C | — | A | B | A | B | B |
| | A-4 | C | C | C | C | C | C | C | — | B | A | B | B |
| | A-9 | C | C | C | C | C | C | C | A | — | A | B | A |
| | A-5 | C | C | C | C | C | C | C | C | C | — | B | B |
| | A-8 | C | C | C | C | C | C | C | C | C | A | — | A |
| | NPD | C | C | C | C | C | C | C | C | C | A | B | — |
| | A-10 | C | C | C | C | C | C | C | C | C | C | C | C |
| | A-15 | C | C | C | C | C | C | C | C | C | C | C | C |
| | A-13 | C | C | C | C | C | C | C | C | C | C | C | C |
| | A-11 | C | C | C | C | C | C | C | C | C | C | C | C |
| | A-14 | C | C | C | C | C | C | C | C | C | C | C | C |
| | A-16 | C | C | C | C | C | C | C | C | C | C | C | C |
| | A-17 | C | C | C | C | C | C | C | C | C | C | C | C |
| | A-12 | C | C | C | C | C | C | C | C | C | C | C | C |

| | | Charge Blocking Layer | | | | | | | | | |
|---|---|---|---|---|---|---|---|---|---|---|---|
| | | A-10 | A-15 | A-13 | A-11 | A-14 | A-16 | A-17 | A-12 | Eg (eV) | Ip (eV) |
| Fluorescent Host | CDBP | B | B | B | B | B | B | B | B | 3.1 | 6.0 |
| | A-3 | B | B | B | B | B | B | B | B | 2.9 | 6.1 |
| | A-2 | B | B | B | B | B | B | B | B | 2.9 | 6.0 |
| | A-1 | B | B | B | B | B | A | B | B | 2.9 | 5.8 |
| | A-6 | B | B | B | B | B | A | B | B | 2.8 | 5.8 |
| | CBP | B | B | B | B | B | A | B | B | 2.8 | 5.9 |
| | A-7 | B | B | B | B | B | A | B | B | 2.7 | 5.6 |
| | A-4 | B | B | B | B | B | A | B | B | 2.6 | 5.8 |
| | A-9 | A | B | B | B | B | A | B | B | 2.6 | 5.5 |
| | A-5 | B | B | B | B | B | A | B | B | 2.5 | 5.9 |
| | A-8 | A | A | A | B | B | A | B | A | 2.5 | 5.4 |
| | NPD | A | B | B | B | B | A | B | B | 2.5 | 5.5 |
| | A-10 | — | B | B | B | B | A | B | B | 2.4 | 5.5 |
| | A-15 | A | — | A | B | B | A | B | A | 2.4 | 5.4 |
| | A-13 | A | A | — | B | B | A | B | A | 2.4 | 5.4 |
| | A-11 | C | C | C | — | A | A | A | A | 2.3 | 5.3 |
| | A-14 | C | C | C | A | — | A | A | A | 2.3 | 5.3 |
| | A-16 | C | C | C | B | B | — | B | B | 2.3 | 5.9 |
| | A-17 | C | C | C | C | C | C | — | A | 2.2 | 5.3 |
| | A-12 | C | C | C | C | C | C | B | — | 2.2 | 5.4 | formula (5) is not satisfied. However, since the above formula (4) is satisfied, the organic EL device according to the aspect of the invention can be provided.

In contrast, when the compound A-2 is used as the fluorescent host and CDBP is used as the charge blocking layer, neither the formula (4) nor (5) is satisfied. Accordingly, the organic EL device according to the aspect of the invention cannot be provided.

The operations of the organic EL device 1 arranged as in FIG. 4 will be described with reference to the band diagram of the organic EL device 1 shown in FIG. 5.

Six rectangles shown in FIG. 5 represent the hole transporting layer 4, the fluorescent-emitting layer 7, the charge blocking layer 6, the green phosphorescent-emitting layer 52, the red phosphorescent-emitting layer 51 and the electron transporting layer 8, respectively. The upper side of each rectangle represents an affinity level (substantially equals to HOMO energy) of each layer, while the lower side of each rectangle represents ionization potential of each layer. However, the upper sides of the red phosphorescent-emitting layer 51, the green phosphorescent-emitting layer 52 and the fluorescent-emitting layer 7 represent affinity levels of their hosts, not affinity levels of their layers as the whole.

When a voltage is applied to the organic EL device 1, the holes $h^+$ are injected into the fluorescent host from the anode 3 via the hole transporting layer 4. Also, electrons $e^-$ are injected into the electron transporting layer 8 from the cathode 9.

The charge blocking layer 6 has smaller ionization potential $Ip_{HB}$ than the fluorescent host, and ionization potential $Ip_{HB}$ of the charge blocking layer 6 and ionization potential $Ip_{FH}$ of the fluorescent host satisfy the above formula (5). Accordingly, the holes $h^+$ become less injectable from the fluorescent host toward the charge blocking layer 6 and are trapped in the fluorescent-emitting layer 7.

On the other hand, the electrons $e^-$ injected into the electron transporting layer 8 are injected into LUMO of the fluorescent host via the red phosphorescent host, the green phosphorescent host and the charge blocking layer 6.

Also, since the thickness of the charge blocking layer 6 is 3 to 9 nm, the holes $h^+$ are blocked from being injected toward the charge blocking layer 6 from the fluorescent-emitting layer 7 while the electrons $e^-$ of the green phosphorescent-emitting layer 52 are injected into LUMO of the fluorescent host.

Consequently, exciton (i.e., single exciton and triplet exciton) is efficiently generated in the fluorescent host of the fluorescent-emitting layer 7.

Excited singlet energy of the fluorescent host is transferred to the fluorescent dopant. The transferred energy is emitted as blue fluorescence. Since the excited singlet has a shorter lifetime, it is less likely that the excited singlet energy is transferred to the green phosphorescent-emitting layer 52 through the charge blocking layer 6. Thus, the excited singlet energy of the fluorescent host can be efficiently transferred to the fluorescent dopant and emitted as blue fluorescence.

FIG. 6 shows a triplet energy gap of a host or dopant of each layer.

As shown in FIG. 6, a triplet energy gap $Eg_{PD-R}$ of the red phosphorescent dopant of the red phosphorescent-emitting layer 51, a triplet energy gap $Eg_{PD-G}$ of the green phosphorescent dopant of the green phosphorescent-emitting layer 52, a triplet energy gap $Eg_{HB}$ of the charge blocking layer 6, and a triplet energy gap $Eg_{FH}$ of the fluorescent host of the fluorescent-emitting layer 7 satisfy a formula as follows.

$$Eg_{PD-R} < Eg_{PD-G} < Eg_{HB} \leq Eg_{FH}$$

Because $Eg_{HB}$ is equal to or smaller than $Eg_{FH}$, the excited triplet energy is transferable from the fluorescent host to the charge blocking layer 6. In addition, because $Eg_{PD-G}$ is smaller than $Eg_{HB}$, the excited triplet energy is transferable from the charge blocking layer 6 to the green phosphorescent dopant.

By the above-described transfer of the excited triplet energy of the fluorescent host, the excited triplet of the green phosphorescent dopant is generated, from which the green phosphorescence $hv_G$ is obtainable.

Also, a part of the excited triplet energy of the green phosphorescent dopant does not contribute to emission of the green phosphorescence but is transferred to the red phosphorescent dopant. The triplet energy is transferred from the green phosphorescent dopant to the red phosphorescent dopant because $Eg_{PD-R}$ is smaller than $Eg_{PD-G}$. Red phosphorescence $hv_R$ is obtainable from the excited triplet of the red phosphorescent dopant generated as described above.

Since the triplet energy gap $Eg_{HB}$ of the charge blocking layer 6 is greater than the triplet energy gap $Eg_{FD}$ of the fluorescent dopant as shown in FIG. 6, the excited triplet energy of the fluorescent host is transferred more easily to the charge blocking layer 6 than to the fluorescent dopant. Thus, the excited triplet energy of the fluorescent host is prevented from being transferred to the fluorescent dopant and deactivated without contributing to the emission.

The blue fluorescence obtained from the fluorescent-emitting layer 7, the green phosphorescence obtained from the green phosphorescent-emitting layer 52, the red phosphorescence obtained from the red phosphorescent-emitting layer 51 are emitted to the outside of the organic EL device 1 from the light-transmissive substrate 2. Then, white-color light in which the light emitted by the above emitting layers are mixed together is obtained.

At this time, in the organic EL device 1, all excitation energy generated in the fluorescent host contributes to the emission. Thus, luminous efficiency can be enhanced compared to a conventional organic EL device for mixed-color emission.

EXAMPLE(S)

Next, the invention will be described in further detail by exemplifying Example(s) and Comparative(s). However, the invention is not limited by the description of Example(s).

Manufacturing of Organic EL Device

Example 1

A glass substrate (size: 25 mm×75 mm×1.1 mm) having an ITO transparent electrode (manufactured by Geomatec Co., Ltd.) was ultrasonic-cleaned in isopropyl alcohol for five minutes, and then UV (Ultraviolet)/ozone-cleaned for 30 minutes.

After the glass substrate having the transparent electrode was cleaned, the glass substrate was mounted on a substrate holder of a vacuum deposition apparatus, and a hole transporting layer was initially formed by vapor-depositing 50-nm-thick TCTA (4,4',4"-Tris(carbazol-9-yl)triphenylamine) to cover a surface of the glass substrate where a transparent electrode line was provided. The hole mobility of TCTA was $4 \times 10^{-4}$ cm$^2$/Vs in an electric field of $1.0 \times 10^{-4}$ to $1.0 \times 10^{-6}$ V/cm.

A red phosphorescent-emitting layer was obtained by co-depositing CBP (4,4'-bis(N-carbazolyl)biphenyl) used as the red phosphorescent host and PQIr used as the red phosphorescent dopant onto the hole transporting layer to be 6 nm thick. The concentration of PQIr was 1 mass %.

Next, 5 nm thickness of CBP was deposited on the red phosphorescent-emitting layer to obtain an intermediate layer.

A green phosphorescent-emitting layer was obtained by co-depositing CBP used as the green phosphorescent host and Ir(ppy)$_3$ used as the green phosphorescent dopant onto the intermediate layer to be 14 nm thick. The concentration of Ir(ppy)$_3$ was 5 mass %.

Further, a charge blocking layer was obtained by depositing the compound A-9 onto the green phosphorescent-emitting layer to be 6 nm thick. The hole mobility of the compound A-9 was $5\times10^{-4}$ cm$^2$/Vs in an electric field of $1.0\times10^{-4}$ to $1.0\times10^{-6}$ V/cm.

A fluorescent-emitting layer was obtained by co-depositing CBP used as the phosphorescent host and BczVBi used as the phosphorescent dopant onto the charge blocking layer to be 10 nm thick. The concentration of BCzVBi was 2 mass %.

Then, 40-nm-thick BCP (2,9-dimethyl-4,7-diphenyl-1,10-phenanthroline), 1-nm-thick LiF and 150-nm-thick metal Al are sequentially layered to obtain a cathode. Incidentally, LiF, which is an electron injectable electrode, was formed at a speed of 1 Å/min.

Examples 2 and 3

Except that the thicknesses of the charge blocking layers were respectively 3 nm and 12 nm, the organic EL devices according to Examples 2 and 3 were prepared in the same manner as the Example 1.

Example 4

Except that NPD was used instead of TCTA, the organic EL device according to Example 4 was prepared in the same manner as the Example 1. The hole mobility of NPD was $6\times10^{-4}$ cm$^2$/Vs in an electric field of $1.0\times10^{-4}$ to $1.0\times10^{-6}$ V/cm.

Example 5

Except that CBP was used instead of TCTA, the organic EL device according to Example 5 was prepared in the same manner as the Example 1. The hole mobility of CBP was $1\times10^{-3}$ cm$^2$/Vs in an electric field of $1.0\times10^{-4}$ to $1.0\times10^{-6}$ V/cm.

Example 6

Except that no intermediate layer was provided, the organic EL device according to Example 6 was prepared in the same manner as the Example 1.

Example 7

Except that A-2 was used instead of CBP as the red phosphorescent host, intermediate layer and green phosphorescent host, the organic EL device according to Example 7 was prepared in the same manner as the Example 1.

The hole mobility of A-2 was $1\times10^{-4}$ cm$^2$/Vs in an electric field of $1.0\times10^{-4}$ to $1.0\times10^{6}$ V/cm.

Example 8

Except that the concentration of the red phosphorescent dopant (PQIr) was 4 mass %, the organic EL device according to Example 8 was prepared in the same manner as the Example 1.

Example 9

In Example 1, Ir(piq)$_3$ was used as the red phosphorescent dopant instead of PQIr and Ir(Ph-ppy)$_3$ was used as the green phosphorescent dopant instead of Ir(ppy)$_3$. Also, A-7 was used as the charge blocking layer instead of A-9.

Example 10

In Example 1, the intermediate layer and the green phosphorescent-emitting layer were not provided. Also, A-6 was used as the red phosphorescent host and fluorescent host instead of CBP. Further, A-11 was used as the charge blocking layer instead of A-9.

Example 11

In Example 9, a single-layered phosphorescent-emitting layer (200 nm thickness) was provided instead of the red phosphorescent-emitting layer, intermediate layer and green phosphorescent-emitting layer. In the phosphorescent-emitting layer, A-2 containing 5 mass % of Ir(Ph-ppy)$_3$ as the green phosphorescent host and 0.1 mass % of PQIr as the red phosphorescent host was used for the phosphorescent host.

[Comparative 1]

The charge blocking layer was not provided. Instead, CBP (i.e., compound disclosed in the non-patent document 1) was deposited to be 6 nm thick. Except for the above, the organic EL device according to Comparative 1 was prepared in the same manner as Example 1.

[Comparative 2]

The charge blocking layer was not provided. Instead, NPD (i.e., compound disclosed in US2002/0197511) was deposited to be 6 nm thick. Except for the above, the organic EL device according to Comparative 2 was prepared in the same manner as Example 1.

Structures of the devices according to Examples 1 to 11 and Comparatives 1 and 2 are shown in Table 4.

Further, the hole mobility and the electron mobility of the hole transporting layer and the phosphorescent host are shown in Table 5.

TABLE 4

|  | Hole Transporting Layer | Red Phosphorescent-Emitting Layer | Intermediate Layer | Green Phosphorescent-Emitting Layer | Charge Blocking Layer | Fluorescent-Emitting Layer |
|---|---|---|---|---|---|---|
| Example 1 | TCTA | CBP 1% PQIr | CBP | CBP 5% Ir(ppy)$_3$ | A-9 (6 nm) | CBP 2% BCzVBi |

TABLE 4-continued

|  | Hole Transporting Layer | Red Phosphorescent-Emitting Layer | Intermediate Layer | Green Phosphorescent-Emitting Layer | Charge Blocking Layer | Fluorescent-Emitting Layer |
|---|---|---|---|---|---|---|
| Example 2 | TCTA | CBP 1% PQIr | CBP | CBP 5% Ir(ppy)$_3$ | A-9 (3 nm) | CBP 2% BCzVBi |
| Example 3 | TCTA | CBP 1% PQIr | CBP | CBP 5% Ir(ppy)$_3$ | A-9 (12 nm) | CBP 2% BCzVBi |
| Example 4 | NPD | CBP 1% PQIr | CBP | CBP 5% Ir(ppy)$_3$ | A-9 (6 nm) | CBP 2% BCzVBi |
| Example 5 | CBP | CBP 1% PQIr | CBP | CBP 5% Ir(ppy)$_3$ | A-9 (6 nm) | CBP 2% BCzVBi |
| Example 6 | TCTA | CBP 1% PQIr | CBP | CBP 5% Ir(ppy)$_3$ | A-9 (6 nm) | CBP 2% BCzVBi |
| Example 7 | TCTA | A-2 1% PQIr | A-2 | A-2 5% Ir(ppy)$_3$ | A-9 (6 nm) | CBP 2% BCzVBi |
| Example 8 | TCTA | CBP 4% PQIr | CBP | CBP 5% Ir(ppy)$_3$ | A-9 (6 nm) | CBP 2% BCzVBi |
| Example 9 | TCTA | CBP 1% Ir(piq)$_3$ | CBP | CBP 5% Ir(Ph-ppy)$_3$ | A-7 (6 nm) | CBP 2% BCzVBi |
| Example 10 | TCTA | A-6 5% PQIr | | | A-11 (6 nm) | A-6 2% BCzVBi |
| Example 11 | TCTA | Single-layered Phosphorescet-Emitting Layer: A-2 (20 nm) 5% Ir(Ph-ppy)$_3$ 0.1% PQIr | | | A-7 (6 nm) | CBP 2% BCzVBi |
| Comparative 1 | TCTA | CBP 1% PQIr | CBP | CBP 5% Ir(ppy)$_3$ | CBP (6 nm) | CBP 2% BCzVBi |
| Comparative 2 | TCTA | CBP 1% PQIr | CBP | CBP 5% Ir(ppy)$_3$ | NPD (6 nm) | CBP 2% BCzVBi |

TABLE 5

|  | Hole Mobility | Electron Mobility |
|---|---|---|
| CBP | $1 \times 10^{-3}$ | $2 \times 10^{-4}$ |
| TCTA | $4 \times 10^{-4}$ | |
| NPD | $6 \times 10^{-4}$ | |
| A-2 | $1 \times 10^{-4}$ | $5 \times 10^{-5}$ |
| A-9 | $5 \times 10^{-4}$ | |

Unit: cm$^2$/Vs (when applied with $10^4$ to $10^6$ V/cm)

The carrier (hole, electron) mobilities of the above materials were measured as follows.

A glass substrate (size: 25 mm×75 mm×1.1 mm) having an ITO transparent electrode (manufactured by Asahi Glass Co., Ltd) was ultrasonic-cleaned in isopropyl alcohol for five minutes, and then UV/ozone-cleaned for 30 minutes.

After the glass substrate was cleaned, the glass substrate was mounted on a substrate holder of a vacuum deposition apparatus, and a measurement material was initially formed by resistance heating vapor deposition onto the ITO transparent electrode as 3 to 5-µm-thick film.

Subsequently, a translucent electrode was formed by depositing metal (Al) onto the film to be 10 nm thick.

In the device formed as described above, the carrier (hole, electrode) mobility at the electric intensity of $1.0 \times 10^4$ to $1.0 \times 10^6$ V/cm was measured by a time-of-flight measuring apparatus TOF-401 manufactured by OPTEL Co., Ltd.

Light from 377 nm of nitrogen-laser was used as excitation light.

A photo-electric current (I)-time (t) curve line was double-logarithmically plotted. A folding point was referred to as tr, and a mobility µ was calculated by the formula of $\mu = L^2/(tr \times V)$. Here, L is a thickness of a sample while V represents an applied voltage.

[Evaluation of Organic EL Device]

The organic EL devices each manufactured as described above were driven by direct-current electricity of 1 mA/cm$^2$ to emit light, so that emission chromaticity, luminescence (L) and voltage were measured. Based on the measurements, current efficiency (L/J) and luminance efficiency η (lm/W) were obtained. The results are shown in Table 6.

TABLE 6

|  | Voltage (V) | Chromaticity (CIE Color System) x | Chromaticity (CIE Color System) y | Current Efficiency L/J (cd/A) | Luminous Efficiency η (lm/W) |
|---|---|---|---|---|---|
| Example 1 | 6.22 | 0.385 | 0.409 | 29.59 | 14.95 |
| Example 2 | 6.09 | 0.401 | 0.424 | 26.84 | 13.84 |
| Example 3 | 6.16 | 0.369 | 0.385 | 24.39 | 12.44 |
| Example 4 | 6.60 | 0.419 | 0.381 | 15.89 | 7.56 |
| Example 5 | 7.20 | 0.450 | 0.353 | 28.02 | 12.22 |
| Example 6 | 6.11 | 0.395 | 0.372 | 25.93 | 13.34 |
| Example 7 | 6.93 | 0.535 | 0.430 | 30.71 | 13.91 |
| Example 8 | 6.37 | 0.415 | 0.335 | 20.45 | 10.09 |
| Example 9 | 6.58 | 0.403 | 0.395 | 28.33 | 13.52 |
| Example 10 | 6.94 | 0.389 | 0.332 | 25.13 | 11.37 |
| Example 11 | 6.94 | 0.375 | 0.405 | 28.18 | 12.75 |
| Comparative 1 | 7.05 | 0.462 | 0.356 | 25.81 | 11.50 |
| Comparative 2 | 6.42 | 0.352 | 0.246 | 12.17 | 5.96 |

As is clear from the Table 6, the organic EL devices according to Examples 1 to 11 exhibited excellent luminous efficiency and color purity as compared to the organic EL devices according to Comparatives 1 and 2.

On the other hand, in Comparative 1, relationships of $Eg_{FH} = Eg_{EB} > Eg_{PD-G}$ and $Af_{EB} = Af_{FH}$, were observed. Also, CBP disposed on the charge blocking layer was bipolar. Accordingly, exciton was generated in the green phosphorescent-emitting layer and the red phosphorescent-emitting layer, so that the intensity of green and red emissions was enhanced while the intensity of blue emission was lowered. Thus, a favorable white emission was notobtainable.

In Comparative 2, a relationship of $Eg_{FH} > Eg_{PD-G} > Eg_{EB} > Eg_{PD-R}$ was observed. Because $Eg_{EB}$ was greater than $Eg_{PD-R}$, energy was transferable from the charge blocking layer to the red phosphorescent dopant. However, because $Eg_{PD-G}$ was greater than $Eg_{EB}$, the energy was not easily transferable from the charge blocking layer to the green phosphorescent dopant. Thus, in the organic EL device according to Comparative 2, the green emission was not obtainable, and only the blue fluorescent-emission and the red phosphorescent-emission were obtained.

Since Ip of NPD used for the hole transporting layer was more approximate to Ip of the phosphorescent dopant than Ip of the phosphorescent host in Example 4, the holes were partially injected into the phosphorescent dopant to generate the red phosphorescence, thereby enhancing the intensity of red emission. Thus, the obtained while emission was reddish as compared to Examples 1 to 3. Since the fluorescent-emission was reduced by the holes injected into the phosphorescent dopant, the organic EL device according to Example 4 exhibited reduced luminous efficiency as compared to the organic EL devices according to Examples 1 to 3.

Since there was a great difference between Ip of CBP used for the hole transporting layer and Ip of ITO used for the anode in Example 5, higher driving voltage was necessary as compared to Examples 1 to 3.

In Example 6, the energy was easily transferred to the red phosphorescent-emitting layer from the green phosphorescent-emitting layer since the intermediate layer was not provided. Thus, the intensity of red emission was enhanced, so that the obtained while-color emission was reddish in the organic EL device according to Example 6 as compared to the organic EL devices according to Examples 1 to 3.

In contrast, in the organic EL devices according to Examples 1 to 3, high luminous efficiency and extremely favorable while-color emission were obtained.

Comparing luminous efficiencies in the organic EL devices according to Examples 1 to 3, the highest luminous efficiency was exhibited when the 6-nm-thick charge blocking layer was provided as in Example 1. At this time, blocking of the electrons and injection of the holes into the fluorescent-emitting layer were found optimally balanced. In contrast, the electrons were not favorably blocked when the charge blocking layer was thin as in Example 2. Accordingly, the electrons were injected also into the phosphorescent-emitting layer and thus luminous efficiency and chromaticity were not favorable. When the charge blocking layer was thick as in Example 3, luminous efficiency was reduced as compared to Example 1 because of the hole injection performance. However, from Example 3, where chromaticity was favorable, it is understood that chromaticity is adjustable by thickening the charge blocking layer and adjusting emission intensity of the phosphorescent-emitting layer.

Comparing Example 1 to Example 7, a phosphorescent host (CBP) having higher hole mobility was used in Example 1. In addition, the device of Example 1 exhibited higher luminous efficiency and more white chromaticity. In contrast, in Example 7 in which A-2 having $1.0 \times 10^{-4}$ cm$^2$/Vs of the hole mobility (when $1.0 \times 10^4$ to $1.0 \times 10^6$ V/cm was applied) was used for the phosphorescent host, the obtained emission was reddish.

It has been found preferable that the hole mobility of the host of the phosphorescent-emitting layer is high, in order to inject the holes into the host of the fluorescent-emitting layer via the phosphorescent-emitting layer and the charge blocking layer and obtain high luminous efficiency and balanced-color emission.

Comparing Example 8 to Example 1, the concentrations of the phosphorescent dopants of the red phosphorescent-emitting layers were different from each other. The dopant concentration was 1 mass % in Example 1 while the dopant concentration was 4 mass % in Example 8. Consequently, emission was not white but reddish in Example 8, thereby reducing luminous efficiency.

Since the concentration of red phosphorescent dopant was high in Example 8, the charges were directly consumed in the phosphorescent dopant and thus recombination probability was reduced in the fluorescent-emitting layer, i.e., region where a recombination was primarily supposed to take place.

Accordingly, it has been found preferable that the dopant concentration of the phosphorescent-emitting layer positioned closer to the anode (the red phosphorescent-emitting layer in Example 8) was low, for example, 4 mass % or less.

Example 12

A glass substrate (size: 25 mm×75 mm×1.1 mm) having an ITO transparent electrode (manufactured by Geomatec Co., Ltd.) was ultrasonic-cleaned in isopropyl alcohol for five minutes, and then UV (Ultraviolet)/ozone-cleaned for 30 minutes.

After the glass substrate having the transparent electrode was cleaned, the glass substrate was mounted on a substrate holder of a vacuum deposition apparatus, and a hole transporting layer was initially formed by depositing A-9 onto the substrate to be 50 nm thick to cover a surface of the glass substrate where a transparent electrode line was provided. The hole mobility of A-9 was $5 \times 10^{-4}$ cm$^2$/Vs in an electric field of $1.0 \times 10^{-4}$ to $1.0 \times 10^{-6}$ V/cm.

A fluorescent-emitting layer was obtained by co-depositing CBP used as the phosphorescent host and BczVBi used as the phosphorescent dopant onto the hole transporting layer to be 10 nm thick. The concentration of BCzVBi was 2 mass %.

Next, CBP was deposited onto the fluorescent-emitting layer to be 6 nm thick, and a charge blocking layer was obtained. The electron mobility of CBP was $2 \times 10^{-4}$ cm$^2$/Vs in an electric field of $1.0 \times 10^{-4}$ to $1.0 \times 10^{-6}$ V/cm.

A green phosphorescent-emitting layer was obtained by co-depositing A-6 used as the green phosphorescent host and Ir(Ph-ppy)$_3$ used as the green phosphorescent dopant onto the charge blocking layer to be 14 nm thick. The concentration of Ir(Ph-ppy)$_3$ was 5 mass %.

Next, a red phosphorescent-emitting layer was obtained by co-depositing A-6 used as the red phosphorescent host and PQIr used as the red phosphorescent dopant to be 6 nm thick. The concentration of PQIr was 1 mass %.

Then, 40-nm-thick BCP (2,9-dimethyl-4,7-diphenyl-1,10-phenanthroline), 1-nm-thick LiF and 150-nm-thick metal (Al) were sequentially layered to obtain a cathode. Incidentally, LiF, which is an electron injectable electrode, was formed at a speed of 1 Å/min.

Example 13

Except that an intermediate layer was formed by depositing A-6 between the green phosphorescent-emitting layer and the red phosphorescent-emitting layer to be 5 nm thick and that Ir(piq)$_3$ was used as the red phosphorescent dopant instead of PQIr, the organic EL device according to Example 13 was prepared in the same manner as Example 12.

Example 14

Except that A-2 was used as the fluorescent host instead of A-6, that A-3 was used as the charge blocking layer instead of CBP and that A-3 was used as the green phosphorescent host and the red phosphorescent host instead of A-6, the organic EL device according to Example 14 was prepared in the same manner as Example 12.

[Comparative 3]

Except that CBP was used instead of A-6 as the fluorescent host, the green phosphorescent host and the red phosphorescent host, the organic EL device according to Comparative 3 was manufactured in the same manner as Example 12.

Structures of the devices according to the Examples 12 to 14 and Comparative 3 are shown in Table 7.

TABLE 7

| | Hole Transporting Layer | Fluorescent-Emitting Layer | Charge Blocking Layer | Green Phosphorescent-Emitting Layer | Intermediate Layer | Red Phosphorescent-Emitting Layer |
|---|---|---|---|---|---|---|
| Example 12 | A-9 | A-6 2% BCzVBi | CBP | A-6 5% Ir(Ph-ppy)$_3$ | | A-6 1% PQIr |
| Example 13 | A-9 | A-6 2% BCzVBi | CBP | A-6 5% Ir(Ph-ppy)$_3$ | A-6 (6 nm) | A-6 1% Ir(piq)$_3$ |
| Example 14 | A-9 | A-2 2% BCzVBi | A-3 | A-3 5% Ir(Ph-ppy)$_3$ | | A-3 1% PQIr |
| Comparative 3 | A-9 | CBP 2% BCzVBi | CBP | CBP 5% Ir(Ph-ppy)$_3$ | | CBP 1% PQIr |

[Evaluation of Organic EL Device]

The organic EL devices each manufactured as described in the Examples 12 to 14 and Comparative 3 were driven by direct-current electricity of 1 mA/cm$^2$ to emit light, so that emission chromaticity, luminescence (L) and voltage were measured. Based on the measurements, current efficiency (L/J) and luminance efficiency η (lm/W) were obtained. The results are shown in Table 8.

TABLE 8

| | Voltage (V) | Chromaticity (CIE Color System) x | y | Current Efficiency L/J (cd/A) | Luminous Efficiency η (lm/W) |
|---|---|---|---|---|---|
| Example 12 | 7.33 | 0.445 | 0.423 | 29.12 | 12.47 |
| Example 13 | 7.48 | 0.382 | 0.391 | 28.54 | 11.98 |
| Example 14 | 7.55 | 0.420 | 0.439 | 32.67 | 13.59 |
| Comparative 3 | 7.35 | 0.448 | 0.472 | 26.28 | 11.23 |

As is clear from the Table 8, the organic EL devices according to Examples 12 to 14 exhibited excellent luminous efficiency and color purity as compared to the organic EL device according to the Comparative 3.

On the other hand, in Comparative 3, relationships of $Eg_{FH}=Eg_{EB}>Eg_{PD-G}$ and $Ip_{HB}s=Ip_{FH}$ were observed. Also, CBP disposed on the charge blocking layer was bipolar. Accordingly, exciton was generated in the green phosphorescent-emitting layer and the red phosphorescent-emitting layer, so that the intensity of green and red emissions was enhanced while the intensity of blue emission was lowered. Thus, favorable white emission was not obtainable.

The invention claimed is:

1. An organic electroluminescence device, comprising: an anode for injecting holes; a phosphorescent-emitting layer; a charge blocking layer; a fluorescent-emitting layer; and a cathode for injecting electrons, in this order, the phosphorescent-emitting layer containing a phosphorescent host and a phosphorescent dopant for providing phosphorescence, the fluorescent-emitting layer containing a fluorescent host and a fluorescent dopant for providing fluorescence, the charge blocking layer blocking the electrons injected into the fluorescent-emitting layer from being injected toward the charge blocking layer from the fluorescent-emitting layer, the charge blocking layer also injecting the holes into the fluorescent-emitting layer from the phosphorescent-emitting layer, a triplet energy gap $Eg_{PD}$ of the phosphorescent dopant, a triplet energy gap $Eg_{EB}$ of the charge blocking layer and a triplet energy gap $Eg_{FH}$ of the fluorescent host satisfying a formula (1) as follows, $$Eg_{PD}<Eg_{EB}<Eg_{FH} \quad (1).$$

2. The organic electroluminescence device according to claim 1, wherein the charge blocking layer exhibits a smaller affinity level than the fluorescent host, and an affinity level $Af_{EB}$ of the charge blocking layer and an affinity level $Af_{FH}$ of the fluorescent host satisfy a formula (2) as follows, $$Af_{EB}<Af_{FH}-0.1 \text{ eV} \quad (2).$$

3. The organic electroluminescence device according to claim 1, wherein the holes injected into the fluorescent-emitting layer from the phosphorescent-emitting layer via the charge blocking layer are injected into HOMO of the fluorescent host.

4. The organic electroluminescence device according to claim 3, wherein a hole mobility of the phosphorescent host is $1.0 \times 10^{-5}$ cm$^2$/Vs or more in an electric field of $1.0 \times 10^4$ to $1.0 \times 10^6$ V/cm.

5. The organic electroluminescence device according to claim 1, further comprising a hole transporting layer provided between the anode and the phosphorescent-emitting layer, wherein ionization potential of the hole transporting layer is greater than ionization potential of the phosphorescent dopant.

6. The organic electroluminescence device according to claim 5, wherein ionization potential $Ip_{PH}$ of the phosphorescent host of the phosphorescent-emitting layer, ionization potential $Ip_{PD}$ of the phosphorescent dopant of the phosphorescent-emitting layer and ionization potential $Ip_{HT}$ of the hole transporting layer satisfy a formula (3) as follows, $$(Ip_{PH}+Ip_{PD})/2<Ip_{HT} \quad (3).$$

7. The organic electroluminescence device according to claim 1, wherein the fluorescent-emitting layer is a blue emitting layer, the phosphorescent-emitting layer comprises: a red phosphorescent-emitting layer for providing red emission; and a green phosphorescent-emitting layer for providing green emission, and the red phosphorescent-emitting layer is closer to the anode than the green phosphorescent-emitting layer.

8. The organic electroluminescence device according to claim 1, wherein
the fluorescent-emitting layer is a blue emitting layer, and
the phosphorescent-emitting layer contains: the phosphorescent host; a red phosphorescent dopant for providing red phosphorescence; and a green phosphorescent dopant for providing green phosphorescence.

9. The organic electroluminescence device according to claim 1, wherein
the phosphorescent-emitting layer comprises: a red phosphorescent-emitting layer for providing red emission; and a green phosphorescent-emitting layer for providing green emission,
the red phosphorescent-emitting layer contains a red phosphorescent host and a red phosphorescent dopant for providing red phosphorescence, and
the green phosphorescent-emitting layer contains a green phosphorescent host and a green phosphorescent dopant for providing green phosphorescence.

10. The organic electroluminescence device according to claim 9, wherein the red phosphorescent host of the red phosphorescent-emitting layer and the green phosphorescent host of the green phosphorescent-emitting layer are made of the same material.

11. The organic electroluminescence device according claim 9, further comprising an intermediate layer between the red phosphorescent-emitting layer and the green phosphorescent-emitting layer, the intermediate layer containing no phosphorescent material.

12. The organic electroluminescence device according to claim 1, wherein a thickness of the charge blocking layer is 3 to 9 nm.

13. The organic electroluminescence device according to claim 1, wherein
a wavelength of emission of the fluorescent-emitting layer is shorter than a wavelength of emission of the phosphorescent-emitting layer,
the fluorescent-emitting layer provides emission of a wavelength of 430 to 500 nm, and
the phosphorescent-emitting layer provides emission of a wavelength of 500 to 650 nm.

14. An organic electroluminescence device, comprising:
an anode for injecting holes; a fluorescent-emitting layer; a charge blocking layer; a phosphorescent-emitting layer; and a cathode for injecting electrons, in this order,
the phosphorescent-emitting layer containing a phosphorescent host and a phosphorescent dopant for providing phosphorescence,
the fluorescent-emitting layer containing a fluorescent host and a fluorescent dopant for providing fluorescence,
the charge blocking layer blocking the holes injected into the fluorescent-emitting layer from being injected toward the charge blocking layer from the fluorescent-emitting layer, the charge blocking layer also injecting the electrons into the fluorescent-emitting layer from the phosphorescent-emitting layer,
a triplet energy gap $Eg_{PD}$ of the phosphorescent dopant, a triplet energy gap $Eg_{HB}$ of the charge blocking layer and a triplet energy gap $Eg_{FH}$ of the fluorescent host satisfying a formula (4) as follows, $$Eg_{PD} < Eg_{EB} < Eg_{FH} \qquad (4).$$

15. The organic electroluminescence device according to claim 14, wherein
the charge blocking layer exhibits a smaller ionization potential than the fluorescent host, and
ionization potential $Ip_{HB}$ of the charge blocking layer and ionization potential $Ip_{FH}$ of the fluorescent host satisfy a formula (5) as follows, $$Ip_{HB} > Ip_{FH} - 0.1 \text{ eV} \qquad (5).$$

16. The organic electroluminescence device according to claim 14, wherein the electrons injected into the fluorescent-emitting layer from the phosphorescent-emitting layer via the charge blocking layer are injected into LUMO of the fluorescent host.

17. The organic electroluminescence device according to claim 16, wherein an electron mobility of the phosphorescent host is $1.0 \times 10^{-5}$ cm$^2$/Vs or more in an electric field of $1.0 \times 10^4$ to $1.0 \times 10^6$ V/cm.

18. The organic electroluminescence device according to claim 14, wherein
the fluorescent-emitting layer is a blue emitting layer,
the phosphorescent-emitting layer comprises: a red phosphorescent-emitting layer for providing red emission; and a green phosphorescent-emitting layer for providing green emission, and
the red phosphorescent-emitting layer is closer to the cathode than the green phosphorescent-emitting layer.

19. The organic electroluminescence device according to claim 14, wherein
the fluorescent-emitting layer is a blue emitting layer, and
the phosphorescent-emitting layer contains: the phosphorescent host; a red phosphorescent dopant for providing red phosphorescence; and a green phosphorescent dopant for providing green phosphorescence.

20. The organic electroluminescence device according to claim 14, wherein
the phosphorescent-emitting layer comprises: a red phosphorescent-emitting layer for providing red emission; and a green phosphorescent-emitting layer for providing green emission,
the red phosphorescent-emitting layer contains a red phosphorescent host and a red phosphorescent dopant for providing red phosphorescence, and
the green phosphorescent-emitting layer contains a green phosphorescent host and a green phosphorescent dopant for providing green phosphorescence.

21. The organic electroluminescence device according to claim 20, wherein the red phosphorescent host of the red phosphorescent-emitting layer and the green phosphorescent host of the green phosphorescent-emitting layer are made of the same material.

22. The organic electroluminescence device according claim 20, further comprising an intermediate layer between the red phosphorescent-emitting layer and the green phosphorescent-emitting layer, the intermediate layer containing no phosphorescent material.

23. The organic electroluminescence device according to claim 14, wherein a thickness of the charge blocking layer is 3 to 9 nm.

24. The organic electroluminescence device according to claim 14, wherein
a wavelength of emission of the fluorescent-emitting layer is shorter than a wavelength of emission of the phosphorescent-emitting layer,
the fluorescent-emitting layer provides emission of a wavelength of 430 to 500 nm, and
the phosphorescent-emitting layer provides emission of a wavelength of 500 to 650 nm.

* * * * *